United States Patent
Jeon et al.

(10) Patent No.: US 10,937,974 B2
(45) Date of Patent: Mar. 2, 2021

(54) ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Aram Jeon, Suwon-si (KR); Seungyeon Kwak, Suwon-si (KR); Sungjun Kim, Seongnam-si (KR); Kum Hee Lee, Suwon-si (KR); Yongsuk Cho, Hwaseong-si (KR); Whail Choi, Seoul (KR); Yoonhyun Kwak, Seoul (KR); Ohyun Kwon, Seoul (KR)

(73) Assignee: SAMSUNG ELECTRONICS CO; LTD., Gyeonggi-Do (KR)

( * ) Notice: Subject to any disclaimer, the term of this patent is extended or adjusted under 35 U.S.C. 154(b) by 356 days.

(21) Appl. No.: 15/957,292

(22) Filed: Apr. 19, 2018

(65) Prior Publication Data

US 2018/0309071 A1    Oct. 25, 2018

(30) Foreign Application Priority Data

Apr. 21, 2017    (KR) .......... 10-2017-0051884

(51) Int. Cl.
*H01L 51/00* (2006.01)
*C07F 15/00* (2006.01)
(Continued)

(52) U.S. Cl.
CPC ...... *H01L 51/0087* (2013.01); *C07F 15/0086* (2013.01); *C09K 11/06* (2013.01);
(Continued)

(58) Field of Classification Search
None
See application file for complete search history.

(56) References Cited

U.S. PATENT DOCUMENTS

2017/0040555 A1* 2/2017 Li ............ C09K 11/06
2018/0090707 A1    3/2018 Jeon et al.

FOREIGN PATENT DOCUMENTS

CN    101805375 A    8/2010
JP    2014-099538 A    5/2014
(Continued)

OTHER PUBLICATIONS

Jimenez et al. "Synthesis, Characterization, and Electrochemical Studies of New pi-Extended Metalloporphyrins" Eur. J. Org. Chem. 2009, 5725-5730. (Year: 2009).*

(Continued)

*Primary Examiner* — Robert S Loewe
(74) *Attorney, Agent, or Firm* — Cantor Colburn LLP

(57) ABSTRACT

An organometallic compound represented by Formula 1:

(Continued)

10

| 19 |
|----|
| 15 |
| 11 | wherein, in Formula 1, groups and variables are the same as described in the specification.

20 Claims, 1 Drawing Sheet

(51) Int. Cl.
  *C09K 11/06* (2006.01)
  *H01L 51/50* (2006.01)
(52) U.S. Cl.
  CPC .......... *C09K 2211/1029* (2013.01); *C09K 2211/185* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 51/5096* (2013.01)

(56) References Cited

FOREIGN PATENT DOCUMENTS

| JP | 2014-110354 A | | 6/2014 | |
|---|---|---|---|---|
| KR | 2012088644 | * | 7/2012 | ........... C07D 209/82 |
| KR | 10-2012-0088644 A | | 8/2012 | |
| KR | 10-2018-0034115 A | | 4/2018 | |
| WO | 2010-086089 A1 | | 8/2010 | |

OTHER PUBLICATIONS

Akhigbe et al. "Mono- and Bisquinoline-Annulated Porphyrins from Porphyin beta,beta'-Dione Oximes" J. Org. Chem. 2015, 80, 499-511. (Year: 2015).*

Maeda et al. "Synthesis and Characterization of Novel Fused Porphyrinoids Based on Cyclic Carbazole[2]indolones" Org. Lett. 2012, 14, 2122-2125. (Year: 2012).*

Reimers et al. "Rigid Fused Oligoporphyrins as Potential Versatile Molecular Wires. 2. B3LYP and SCF Calculated Geometric and Electronic Properties of 98 Oligoporphyrin and Related Molecules" J. Phys. Chem. A 1999, 103, 4385-4397. (Year: 1999).*

David C. Marelius et al. "Hydrogen-Bonding Pincer Complexes with Two Protic N-Heterocyclic Carbenes from Direct Metalation of a 1,8-Bis(imidazol-1-yl)carbazole by Platinum, Palladium, and Nickel", Chem. Eur. J. 2015, 21(31), 10988-10992.

Leigh J. K. Boerner et al. Spin-state control of thermal and photochemical Bergman cyclization, Chem. Commun., 2013, 49(21), 2145-2147.

Extended European Search Report issued by the European Patent Office dated Sep. 18, 2018, in the examination of the European Patent Application No. 18167993.7-1109.

* cited by examiner

10

| 19 |
|----|
| 15 |
| 11 |

ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

CROSS-REFERENCE TO RELATED APPLICATION

This application claims priority to Korean Patent Application No. 10-2017-0051884, filed on Apr. 21, 2017, in the Korean Intellectual Property Office, and all the benefits accruing therefrom under 35 U.S.C. § 119, the content of which is incorporated herein in its entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices, which have superior characteristics in terms of a viewing angle, a response time, brightness, a driving voltage, and a response speed, and which produce full-color images.

A typical organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescent compounds may be used to monitor, sense, or detect a variety of biological materials including cells and proteins. An example of the luminescent compounds includes a phosphorescent luminescent compound.

Various types of organic light emitting devices are known. However, there still remains a need in OLEDs having low driving voltage, high efficiency, high brightness, and long lifespan.

SUMMARY

Aspects of the present disclosure provide an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

An aspect of the present disclosure provides an organometallic compound represented by Formula 1:

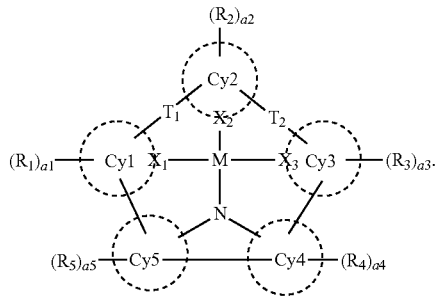

Formula 1

In Formula 1,

M may be Pt or Pd, $X_1$ to $X_3$ may each independently be C or N, two bonds selected from a bond between $X_1$ and M, a bond between $X_2$ and M, and a bond between $X_3$ and M may each be a coordinate bond, and the other thereof may be a covalent bond, Cy1 to Cy5 may each independently be selected from a $C_6$-$C_{30}$ carbocyclic group and a $C_1$-$C_{30}$ heterocyclic group, $T_1$ and $T_2$ may each independently be selected from a single bond, *—N[($L_6$)$_{b6}$-($R_6$)]—*', *—B($R_6$)—*', *—P($R_6$)—*', *—C($R_6$)($R_7$)—*', *—Si($R_6$)($R_7$)—*', *—Ge($R_6$)($R_7$)—*', *—S—*', *—Se—*', *—O-', *—C(=O)—*', *—S(=O)—*', *—S(=O)$_2$—*', *—C($R_6$)=*', *=C($R_6$)—*', *—C($R_6$)=C($R_7$)—*', *—C(=S)—*', and *—C≡C—*', $L_6$ may be selected from a single bond, a substituted or unsubstituted $C_6$-$C_{30}$ carbocyclic group, and a substituted or unsubstituted $C_1$-$C_{30}$ heterocyclic group, b6 may be selected from 1 to 3, wherein, when b6 is two or more, two or more groups $L_6$ may be identical to or different from each other, $R_6$ and $R_7$ may optionally be linked via a first linking group to form a substituted or unsubstituted $C_5$-$C_{30}$ carbocyclic group or a substituted or unsubstituted $C_1$-$C_{30}$ heterocyclic group, $R_1$ to $R_7$ may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), and —B($Q_6$)($Q_7$c0)($Q_8$)($Q_9$), a1 to a5 may each independently be 0, 1, 2, 3, 4, or 5, two of groups $R_1$ in the number of a1, groups $R_2$ in the number of a2, groups $R_3$ in the number of a3, groups $R_4$ in the number of a4, and groups $R_5$ in the number of a5 may optionally be linked to form a substituted or unsubstituted $C_5$-$C_{30}$ carbocyclic group or a substituted or unsubstituted $C_1$-$C_{30}$ heterocyclic group, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $O_2$—$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $O_6$—$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

Another aspect of the present disclosure provides an organic light-emitting device including:

a first electrode, a second electrode, and an organic layer disposed between the first electrode and the second electrode, wherein the organic layer includes an emission layer, and wherein the organic layer includes at least one organometallic compound described above.

The organometallic compound in the organic layer may act as a dopant.

Another aspect of the present disclosure provides a diagnostic composition including at least one organometallic compound described above.

BRIEF DESCRIPTION OF THE DRAWING

These and/or other aspects will become apparent and more readily appreciated from the following description of the embodiments, taken in conjunction with the FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound is provided. The organometallic compound according to an embodiment may be represented by Formula 1 below:

Formula 1

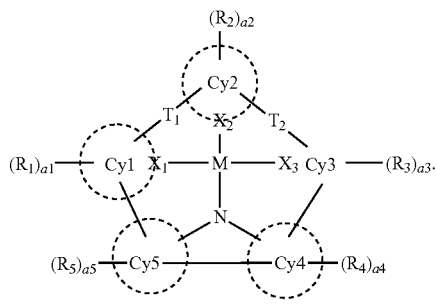

M in Formula 1 may be selected from a first-row transition metal of the Periodic Table of Elements, a second-row transition metal of the Periodic Table of Elements, and a third-row transition metal of the Periodic Table of Elements.

For example, M in Formula 1 may be platinum (Pt) or palladium (Pd).

In an embodiment, M in Formula 1 may be Pt, but embodiments of the present disclosure are not limited thereto.

The organometallic compound represented by Formula 1 may be a compound that does not consist of an ion pair of a cation and an anion.

$X_1$ to $X_3$ in Formula 1 may each independently be C or N.

For example, $X_1$ to $X_3$ in Formula 1 may each be N. In an embodiment, $X_1$ and $X_2$ may each be N, and $X_3$ may be C. In one or more embodiments, $X_1$ and $X_3$ may each be N, and $X_2$ may be C. In one or more embodiments, $X_2$ and $X_3$ may each be N, and $X_1$ may be C, but embodiments of the present disclosure are not limited thereto.

In Formula 1, two bonds selected from a bond between $X_1$ and M, a bond between $X_2$ and M, and a bond between $X_3$ and M may each be a coordinate bond, and the other thereof may be a covalent bond.

In an embodiment, in Formula 1, $X_1$ to $X_3$ may each be N, a bond between $X_1$ and M and a bond between $X_3$ and M may each be a coordinate bond, and a bond between $X_2$ and M may be a covalent bond;

$X_1$ and $X_2$ may each be N, $X_3$ may be C, a bond between $X_1$ and M and a bond between $X_2$ and M may each be a coordinate bond, and a bond between $X_3$ and M may be a covalent bond;

$X_1$ and $X_3$ may each be N, $X_2$ may be C, a bond between $X_1$ and M and a bond between $X_3$ and M may each be a coordinate bond, and a bond between $X_2$ and M may be a covalent bond; or $X_2$ and $X_3$ may each be N, $X_1$ may be C, a bond between $X_2$ and M and a bond between $X_3$ and M may each be a coordinate bond, and a bond between $X_1$ and M may be a covalent bond.

Cy1 to Cy5 in Formula 1 may each independently be selected from a $C_5$-$C_{30}$ carbocyclic group and a $C_1$-$C_{30}$ heterocyclic group.

For example, Cy1 to Cy5 in Formula 1 may each independently be selected from a 5-membered ring, a 6-membered ring, a condensed ring with a 5-membered ring and a 6-membered ring, a condensed ring with two 6-membered rings, and a condensed ring with one 5-membered ring and two 6-membered rings.

In an embodiment, Cy1 to Cy5 in Formula 1 may each independently be selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a pyrrole group, a thiophene group, a furan group, an indole group, an iso-indole group, a benzoborol group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzooxadiazole group, a benzothiadiazole group, a 5,6,7,8-tetrahydroisoquinoline group, and a 5,6,7,8-tetrahydroquinoline group.

In one or more embodiments, Cy1 to Cy5 in Formula 1 may each independently be a benzene group, a naphthalene group, an indole group, an iso-indole group, a dibenzothiophene group, a dibenzofuran group, an azadibenzothiophene group, an azadibenzofuran group, a pyridine group, a pyrimidine group, a pyrazine group, a pyridazine group, a quinoline group, an isoquinoline group, a pyrazole group, an imidazole group, or a benzimidazole group, but embodiments of the present disclosure are not limited thereto.

"An azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" as used herein mean hetero-rings that respectively have the same backbones as "a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group", provided that at least one of carbons forming rings thereof is substituted with nitrogen.

In Formula 1, $T_1$ and $T_2$ may each independently be selected from a single bond, *—N[$(L_6)_{b6}$-$(R_6)$]—*', *—B$(R_6)$—*', *—P$(R_6)$—*', *—C$(R_6)(R_7)$—*', *—Si$(R_6)$$(R_7)$—*', *—Ge$(R_6)(R_7)$—*', *—S—*', *—Se—*', *—O—*', *—C(=O)—*', *—S(=O)—*', *—S(=O)$_2$—*', *—C$(R_6)$=*', *=C$(R_6)$—*', *—C$(R_6)$=C$(R_7)$—*', *—C(=S)—*', and *—C≡C—*', and * and *' each indicate a binding site to a neighboring atom. $R_6$ and $R_7$ are the same as described below.

$L_6$ may be selected from a single bond, a substituted or unsubstituted $C_5$-$C_{30}$ carbocyclic group, and a substituted or unsubstituted $C_1$-$C_{30}$ heterocyclic group, and b6 may be selected from 1 to 3 (for example, b6 may be 1), wherein, when b6 is two or more, two or more groups $L_6$ may be identical to or different from each other.

In an embodiment, $L_6$ may be selected from:
a phenylene group, a naphthylene group, a fluorenylene group, a pyridinylene group, a pyrimidinylene group, and a carbazolylene group; and
a phenylene group, a naphthylene group, a fluorenylene group, a pyridinylene group, a pyrimidinylene group, and a carbazolylene group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a biphenyl group, and a terphenyl group,
but embodiments of the present disclosure are not limited thereto.

$R_6$ and $R_7$ may optionally be linked via a first linking group to form a substituted or unsubstituted $C_5$-$C_{30}$ carbocyclic group or a substituted or unsubstituted $C_1$-$C_{30}$ heterocyclic group (for example, a $C_5$-$C_6$ 5-membered to 7-membered cyclic group; or a $C_5$-$C_6$ 5-membered to 7-membered cyclic group substituted with at least one selected from deuterium, a cyano group, —F, a $C_1$-$C_{10}$ alkyl group, and a $C_6$-$C_{14}$ aryl group).

In an embodiment, $T_1$ and $T_2$ in Formula 1 may each independently be a single bond, *—N[$(L_6)_{b6}$-$(R_6)$]—*', *—C$(R_6)(R_7)$—*', *—Si$(R_6)(R_7)$—*', *—S—*', or *—O—*', but embodiments of the present disclosure are not limited thereto.

In one or more embodiments, $T_1$ and $T_2$ may each independently be selected from a single bond, *—C$(R_6)$$(R_7)$—*', *—Si$(R_6)(R_7)$—*', and *—Ge$(R_6)(R_7)$—*',
$R_6$ and $R_7$ may be linked via a single bond or a first linking group,
the first linking group may be selected from *—N[$(L_8)_{b8}$-$(R_8)$]—*', *—B$(R_8)$—*', *—P$(R_8)$—*', *—C$(R_8)(R_9)$—*', *—Si$(R_8)(R_9)$—*', *—Ge$(R_8)(R_9)$—*', *—S—*', *—Se—*', *—O—', *—S(=O)—*', *—S(=O)$_2$-', *—C$(R_8)$=*', *—C$(R_8)$=C$(R_9)$—*', *—C(=S)—*', and *—C≡C—*'. $L_8$, b8, $R_8$, and $R_9$ are the same as described in connection with $L_6$, b6, $R_6$, and $R_7$, and * and *' each indicate a binding site to a neighboring atom, but embodiments of the present disclosure are not limited thereto.

In one or more embodiments, $T_1$ and $T_2$ may each be a single bond, but embodiments of the present disclosure are not limited thereto.

$R_1$ to $R_7$ may each independently be selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$). $Q_1$ to $Q_9$ are the same as described herein.

For example, $R_1$ to $R_7$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azadibenzofuranyl group, and an azadibenzothiophenyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azadibenzofuranyl group, and an azadibenzothiophenyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azadibenzofuranyl group, and an azadibenzothiophenyl group; and —N($Q_1$)($Q_2$), —Si($Q_3$)($Q_4$)($Q_5$), —B($Q_6$)($Q_7$), and —P(=O)($Q_5$)($Q_9$), and $Q_1$ to $Q_9$ may each independently be selected from:
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CH_3$, —$CD_2CD_2H$, and —$CD_2CDH_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

In an embodiment, $R_1$ to $R_7$ may each independently be selected from:

hydrogen, deuterium, —F, a cyano group, a nitro group, —$SF_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, a dibenzothiophenyl group, an azadibenzofuranyl group, and an azadibenzothiophenyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, a dibenzothiophenyl group, an azadibenzofuranyl group, and an azadibenzothiophenyl group, each substituted with at least one selected from deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a carbazolyl group, a dibenzofuranyl group, a dibenzothiophenyl group, an azadibenzofuranyl group, and an azadibenzothiophenyl group; and —$N(Q_1)(Q_2)$, —$Si(Q_3)(Q_4)(Q_5)$, —$B(Q_6)(Q_7)$, and —$P(=O)(Q_8)(Q_9)$, and $Q_1$ to $Q_9$ are the same as described herein.

In one or more embodiments, $R_1$ to $R_7$ may each independently be selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-22, groups represented by Formulae 10-1 to 10-144, and —$Si(Q_3)(Q_4)(Q_5)$ (wherein $Q_3$ to $Q_5$ are the same as described herein), but embodiments of the present disclosure are not limited thereto:

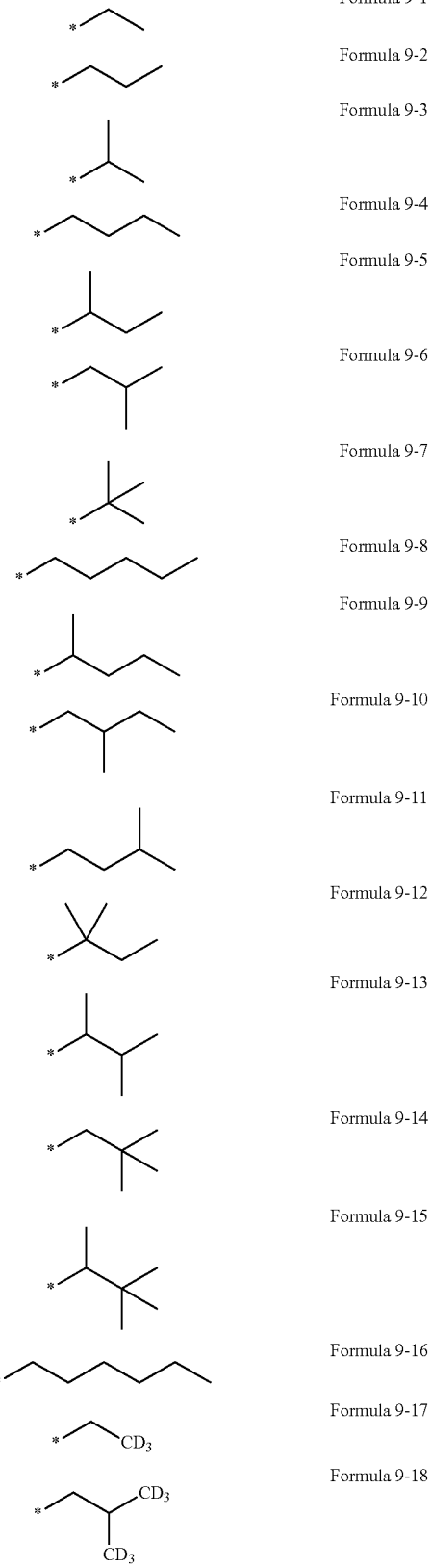

-continued
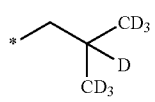
Formula 9-19
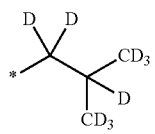
Formula 9-20
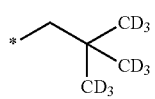
Formula 9-21
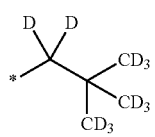
Formula 9-22
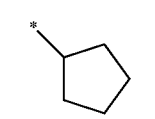
Formula 10-1
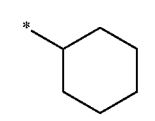
Formula 10-2
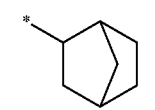
Formula 10-3
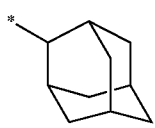
Formula 10-4
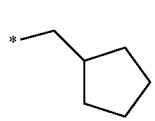
Formula 10-5
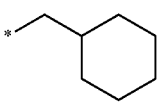
Formula 10-6
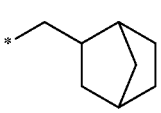
Formula 10-7
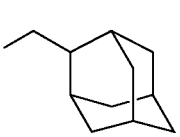
Formula 10-8
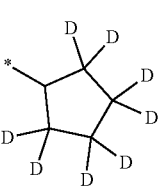
Formula 10-9
Formula 10-10
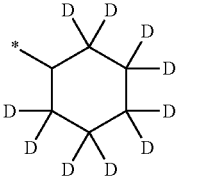
Formula 10-11
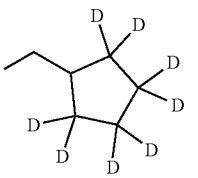
Formula 10-12
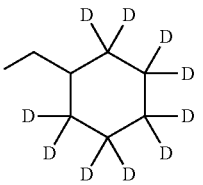
Formula 10-13
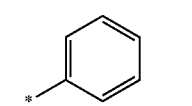
Formula 10-14
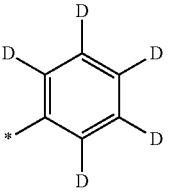
Formula 10-15
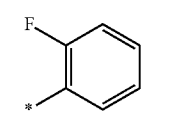
Formula 10-16
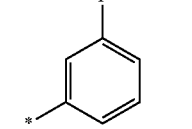
Formula 10-17
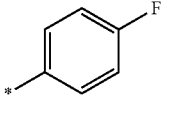
Formula 10-18
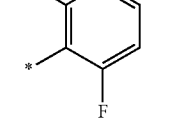
Formula 10-19
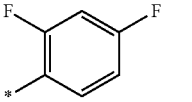

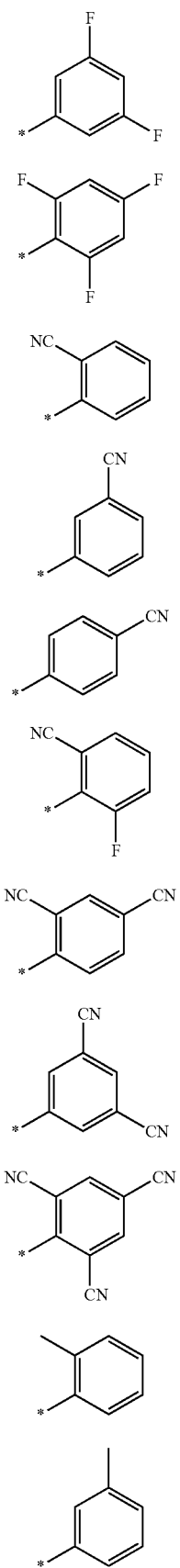

-continued
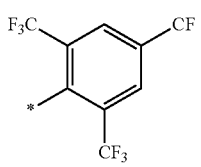
Formula 10-42
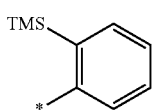
Formula 10-43
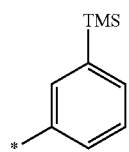
Formula 10-44
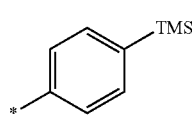
Formula 10-45
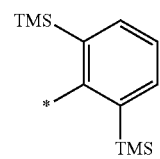
Formula 10-46
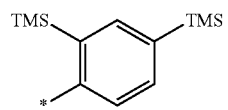
Formula 10-47
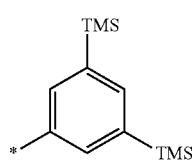
Formula 10-48
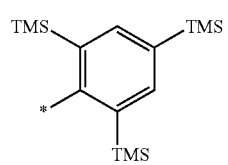
Formula 10-49
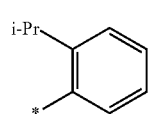
Formula 10-50
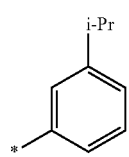
Formula 10-51
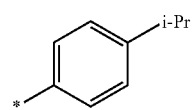
Formula 10-52
-continued
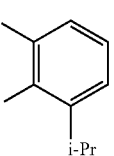
Formula 10-53
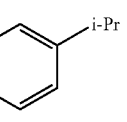
Formula 10-54
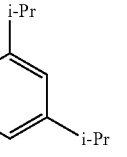
Formula 10-55
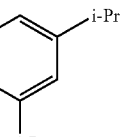
Formula 10-56
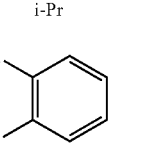
Formula 10-57
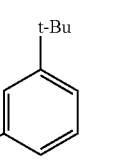
Formula 10-58
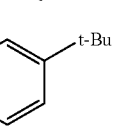
Formula 10-59
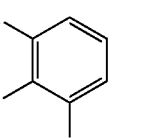
Formula 10-60
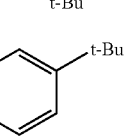
Formula 10-61
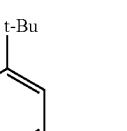
Formula 10-62
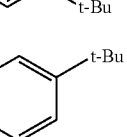
Formula 10-63

-continued
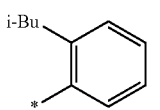 Formula 10-64
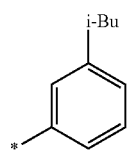 Formula 10-65
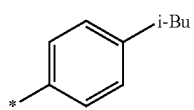 Formula 10-66
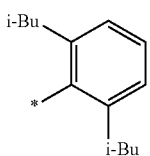 Formula 10-67
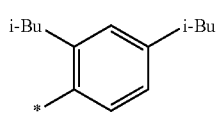 Formula 10-68
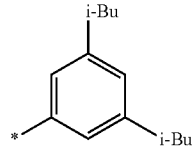 Formula 10-69
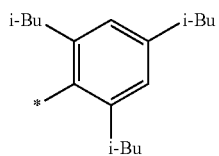 Formula 10-70
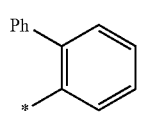 Formula 10-71
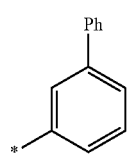 Formula 10-72
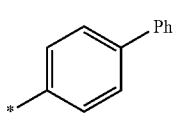 Formula 10-73
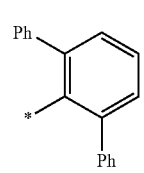 Formula 10-74
-continued
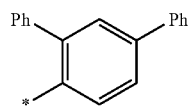 Formula 10-75
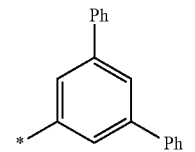 Formula 10-76
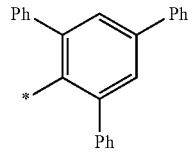 Formula 10-77
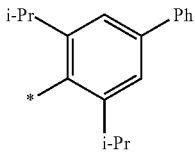 Formula 10-78
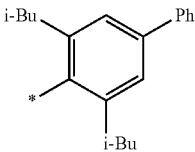 Formula 10-79
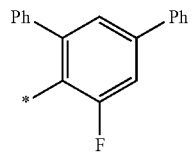 Formula 10-80
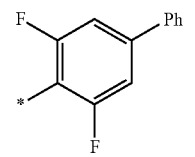 Formula 10-81
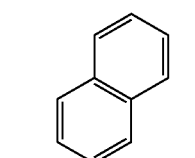 Formula 10-82
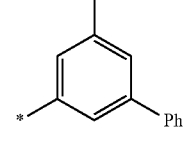 Formula 10-83
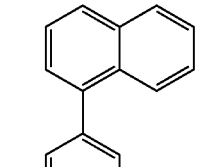

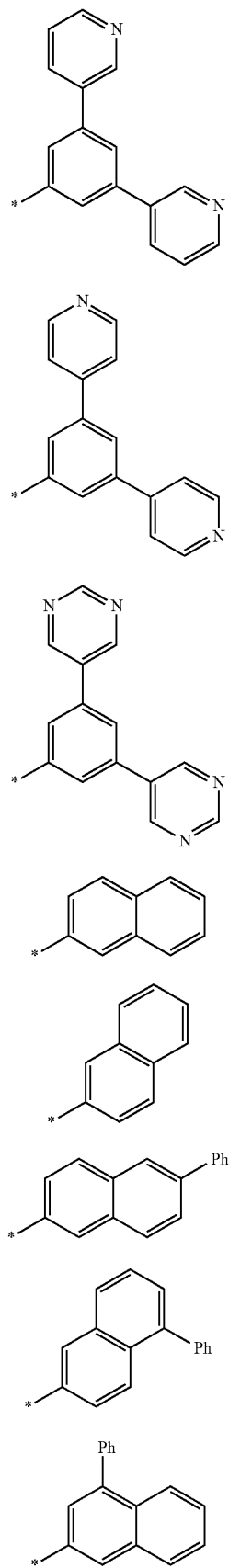
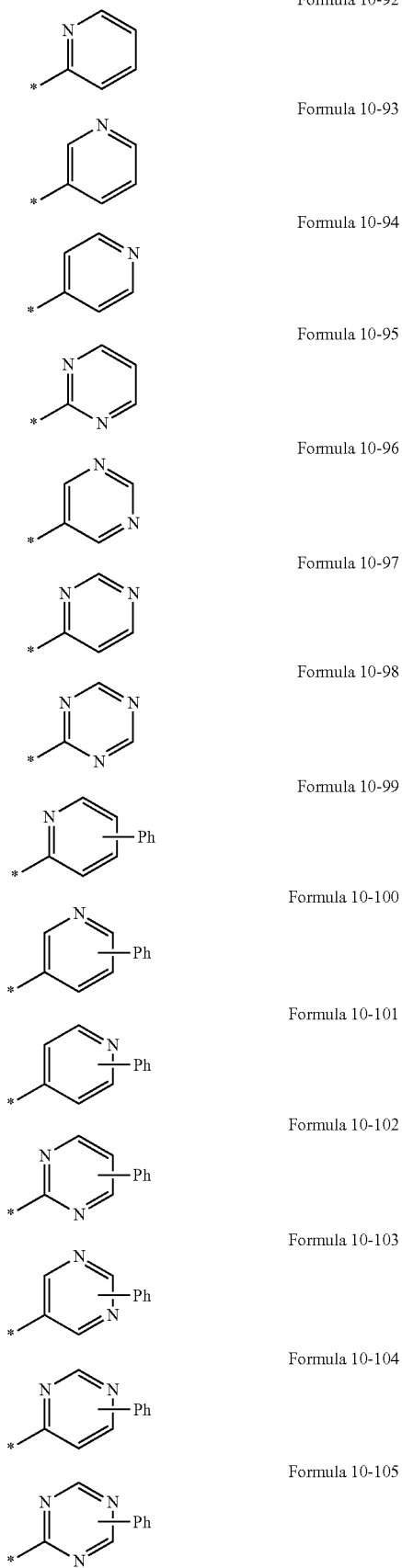
Formula 10-84
Formula 10-85
Formula 10-86
Formula 10-87
Formula 10-88
Formula 10-89
Formula 10-90
Formula 10-91
Formula 10-92
Formula 10-93
Formula 10-94
Formula 10-95
Formula 10-96
Formula 10-97
Formula 10-98
Formula 10-99
Formula 10-100
Formula 10-101
Formula 10-102
Formula 10-103
Formula 10-104
Formula 10-105

Formula 10-106
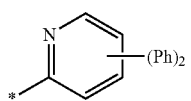
Formula 10-107
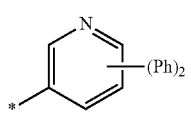
Formula 10-108
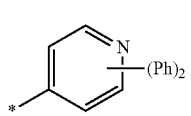
Formula 10-109
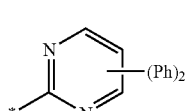
Formula 10-110
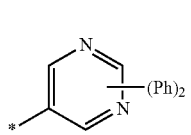
Formula 10-111
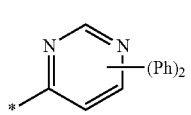
Formula 10-112
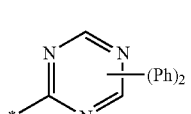
Formula 10-113
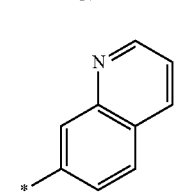
Formula 10-114
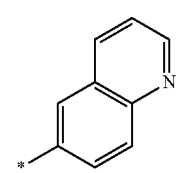
Formula 10-115
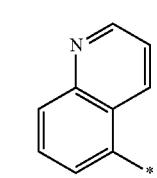
Formula 10-116
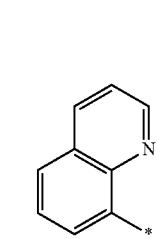
Formula 10-117
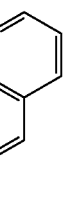
Formula 10-118
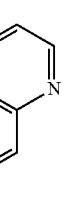
Formula 10-119
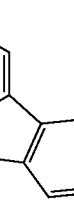
Formula 10-120
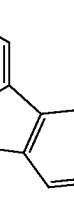
Formula 10-121
Formula 10-122
Formula 10-123
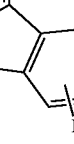

Formula 10-124
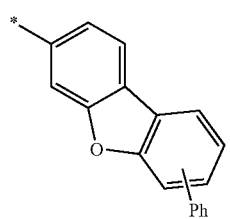
Formula 10-125
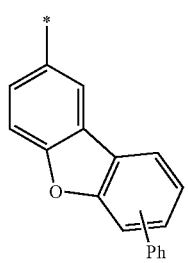
Formula 10-126
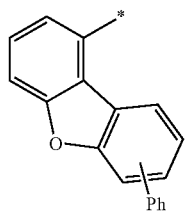
Formula 10-127
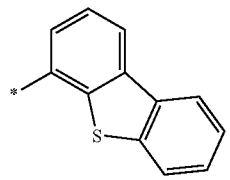
Formula 10-128
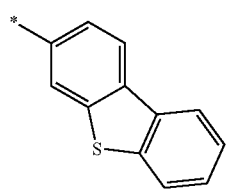
Formula 10-129
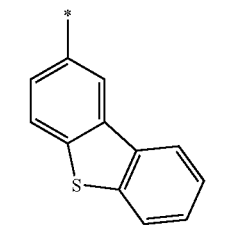
Formula 10-130
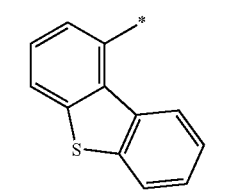
Formula 10-131
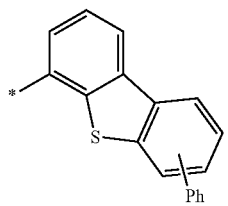
Formula 10-132
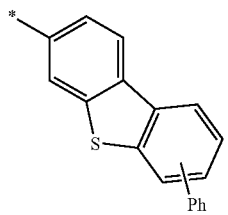
Formula 10-133
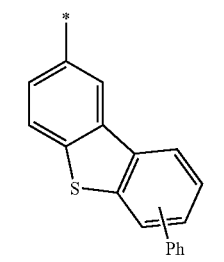
Formula 10-134
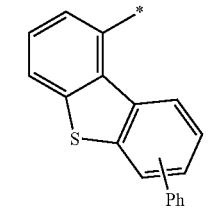
Formula 10-135
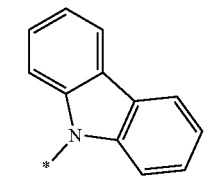
Formula 10-136
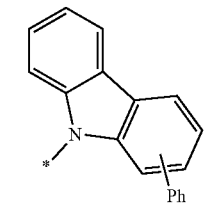
Formula 10-137
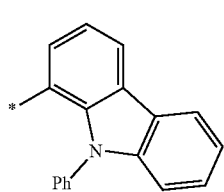

27

-continued

Formula 10-138
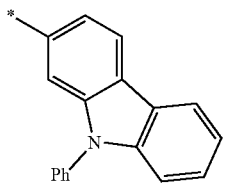

Formula 10-139
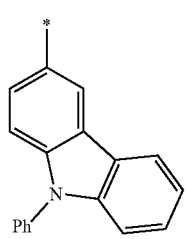

Formula 10-140
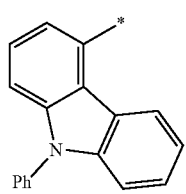

Formula 10-141
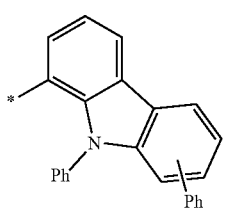

Formula 10-142
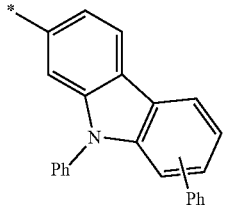

Formula 10-143
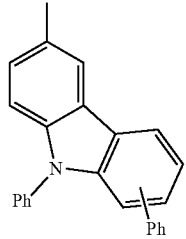

Formula 10-144
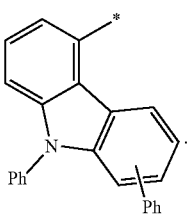

In Formulae 9-1 to 9-22 and 10-1 to 10-144, "i-Pr" indicates an iso-propyl group, "i-Bu" indicates an isobutyl group, "t-Bu" indicates a tert-butyl group, "TMS" indicates a trimethylsilyl group, "Ph" indicates a phenyl group, and "*" indicates a binding site to a neighboring atom.

In one or more embodiments, at least one of $R_1$ to $R_5$ in Formula 1 may not be hydrogen.

a1, a2, a3, a4, and a5 in Formula 1 respectively indicate the number of groups $R_1$, the number of groups $R_2$, the number of groups $R_3$, the number of groups $R_4$, and the number of groups $R_5$ and may each independently be 0, 1, 2, 3, 4, or 5. When a1 is two or more, two or more groups $R_1$ may be identical to or different from each other, when a2 is two or more, two or more groups $R_2$ may be identical to or different from each other, when a3 is two or more, two or more groups $R_3$ may be identical to or different from each other, when a4 is two or more, two or more groups $R_4$ may be identical to or different from each other, and when a5 is two or more, two or more groups $R_5$ may be identical to or different from each other, but embodiments of the present disclosure are not limited thereto.

In an embodiment, in Formula 1, a1, a2, a3, a4, and a5 may each independently be 0, 1, or 2, but embodiments of the present disclosure are not limited thereto.

In Formula 1, two of groups $R_1$ in the number of a1, groups $R_2$ in the number of a2, groups $R_3$ in the number of a3, groups $R_4$ in the number of a4, and groups $R_5$ in the number of a5 may optionally be linked to form a substituted or unsubstituted $C_5$-$C_{30}$ carbocyclic group or a substituted or unsubstituted $C_1$-$C_{30}$ heterocyclic group.

For example, two of groups $R_1$ in the number of a1 may optionally be linked to form a substituted or unsubstituted $C_5$-$C_{30}$ carbocyclic group or a substituted or unsubstituted $C_1$-$C_{30}$ heterocyclic group, two of groups $R_2$ in the number of a2 may optionally be linked to form a substituted or unsubstituted $C_5$-$C_{30}$ carbocyclic group or a substituted or unsubstituted $C_1$-$C_{30}$ heterocyclic group, two of groups $R_3$ in the number of a3 may optionally be linked to form a substituted or unsubstituted $C_5$-$C_{30}$ carbocyclic group or a substituted or unsubstituted $C_1$-$C_{30}$ heterocyclic group, two of groups $R_4$ in the number of a4 may optionally be linked to form a substituted or unsubstituted $C_5$-$C_{30}$ carbocyclic group or a substituted or unsubstituted $C_1$-$C_{30}$ heterocyclic group, two of groups $R_5$ in the number of a5 may optionally be linked to form a substituted or unsubstituted $C_5$-$C_{30}$ carbocyclic group or a substituted or unsubstituted $C_1$-$C_{30}$ heterocyclic group, $R_1$ and $R_2$ may optionally be linked to form a substituted or unsubstituted $C_5$-$C_{30}$ carbocyclic group or a substituted or unsubstituted $C_1$-$C_{30}$ heterocyclic group, $R_2$ and $R_3$ may optionally be linked to form a substituted or unsubstituted $C_5$-$C_{30}$ carbocyclic group or a substituted or unsubstituted $C_1$-$C_{30}$ heterocyclic group, $R_3$ and $R_4$ may optionally be linked to form a substituted or unsubstituted $C_5$-$C_{30}$ carbocyclic group or a substituted or unsubstituted $C_1$-$C_{30}$ heterocyclic group, and $R_1$ and $R_5$ may optionally be linked to form a substituted or unsubstituted $C_5$-$C_{30}$ carbocyclic group or a substituted or unsubstituted $C_1$-$C_{30}$ heterocyclic group.

For example, i) a substituted or unsubstituted $C_5$-$C_{30}$ carbocyclic group or a substituted or unsubstituted $C_1$-$C_{30}$ heterocyclic group, formed by linking two of groups $R_1$ in the number of a1, ii) a substituted or unsubstituted $C_5$-$C_{30}$ carbocyclic group or a substituted or unsubstituted $C_1$-$C_{30}$ heterocyclic group, formed by linking two of groups $R_2$ in the number of a2, iii) a substituted or unsubstituted $C_5$-$C_{30}$ carbocyclic group or a substituted or unsubstituted $C_1$-$C_{30}$ heterocyclic group, by linking two of groups $R_3$ in the number of a3, iv) a substituted or unsubstituted $C_5$-$C_{30}$ carbocyclic group or a substituted or unsubstituted $C_1$-$C_{30}$ heterocyclic group, formed by linking two of groups $R_4$ in the number of a4, v) a substituted or unsubstituted $C_5$-$C_{30}$ carbocyclic group or a substituted or unsubstituted $C_1$-$C_{30}$ heterocyclic group, formed by linking two of groups $R_5$ in the number of a5, vi) a substituted or unsubstituted $C_5$-$C_{30}$ carbocyclic group or a substituted or unsubstituted $C_1$-$C_{30}$ heterocyclic group, formed by linking $R_1$ and $R_2$, vii) a substituted or unsubstituted $C_5$-$C_{30}$ carbocyclic group or a substituted or unsubstituted $C_1$-$C_{30}$ heterocyclic group, formed by linking $R_2$ and $R_3$, viii) a substituted or unsubstituted $C_5$-$C_{30}$ carbocyclic group or a substituted or unsubstituted $C_1$-$C_{30}$ heterocyclic group, by linking $R_3$ and $R_4$, and ix) a substituted or unsubstituted $C_5$-$C_{30}$ carbocyclic group or a substituted or unsubstituted $C_1$-$C_{30}$ heterocyclic group, formed by linking $R_1$ and $R_5$ in Formula 1 may each independently be selected from:

a pentadiene group, a cyclohexane group, a cycloheptane group, an adamantane group, a bicycloheptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group;

a pentadiene group, a cyclohexane group, a cycloheptane group, an adamantane group, a bicycloheptane group, a bicyclo-octane group, a benzene group, a pyridine group, a pyrimidine group, a pyrazine group, a pyridazine group, a naphthalene group, an anthracene group, a tetracene group, a phenanthrene group, a dihydronaphthalene group, a phenalene group, a benzothiophene group, a benzofuran group, an indene group, an indole group, a benzosilole group, an azabenzothiophene group, an azabenzofuran group, an azaindene group, an azaindole group, and an azabenzosilole group, each substituted with at least one $R_{10}$, but embodiments of the present disclosure are not limited thereto.

$R_{10}$ is the same as described in connection with $R_1$.

In an embodiment, a moiety represented by

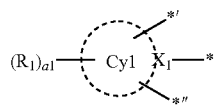

in Formula 1 may be selected from groups represented by Formulae Cy1-1 to Cy1-39 (for example, groups represented by Formulae Cy1-1 to Cy1-4 and Cy1-12 to Cy1-15):

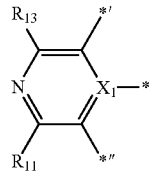

Formula Cy1-1

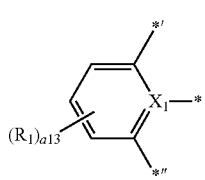

Formula Cy1-2

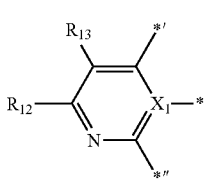

Formula Cy1-3

Formula Cy1-4

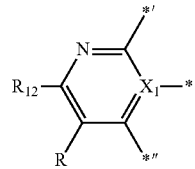

Formula Cy1-5

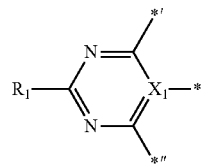

Formula Cy1-6

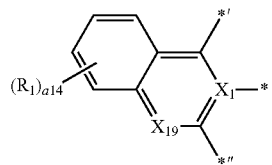

Formula Cy1-7

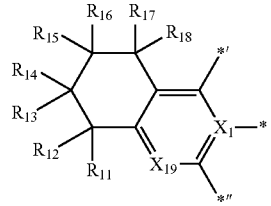

Formula Cy1-8

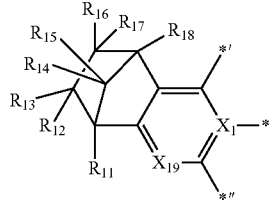

Formula Cy1-9

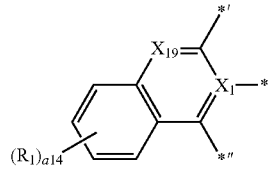

Formula Cy1-10

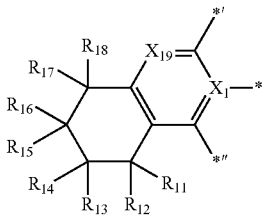

-continued
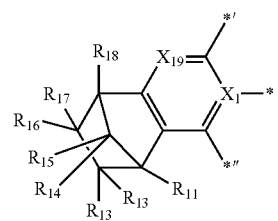
Formula Cy1-11
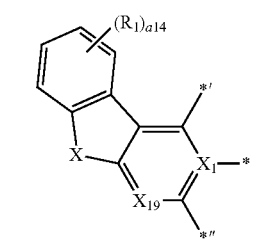
Formula Cy1-12
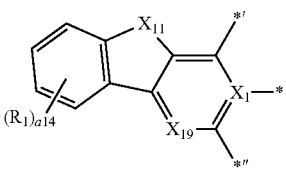
Formula Cy1-13
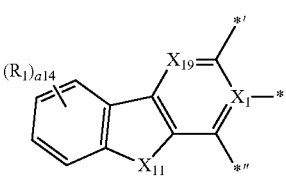
Formula Cy1-14
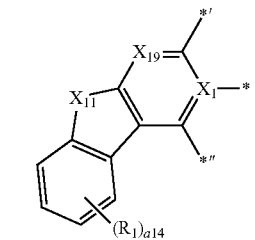
Formula Cy1-15
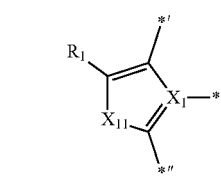
Formula Cy1-16
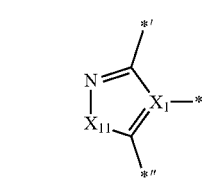
Formula Cy1-17
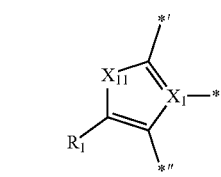
Formula Cy1-18
-continued
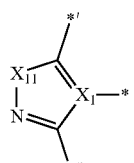
Formula Cy1-19
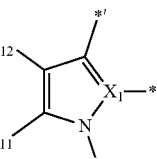
Formula Cy1-20
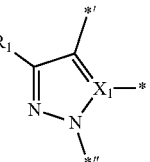
Formula Cy1-21
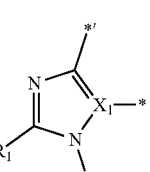
Formula Cy1-22
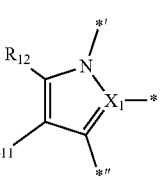
Formula Cy1-23
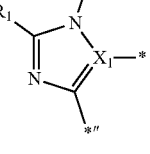
Formula Cy1-24
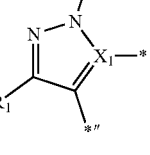
Formula Cy1-25
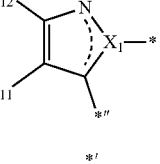
Formula Cy1-26
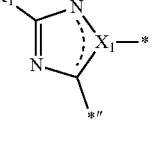
Formula Cy1-27

Formula Cy1-28
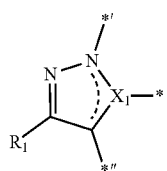

Formula Cy1-29
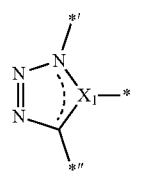

Formula Cy1-30
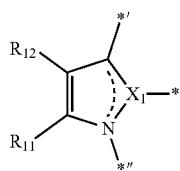

Formula Cy1-31
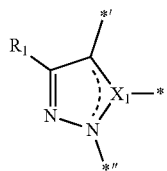

Formula Cy1-32
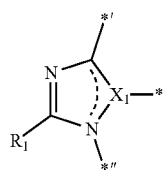

Formula Cy1-33
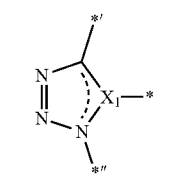

Formula Cy1-34
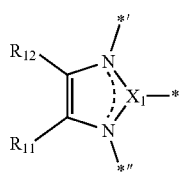

Formula Cy1-35
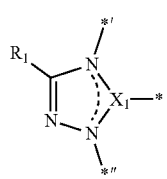

Formula Cy1-36
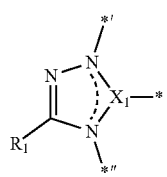

Formula Cy1-37
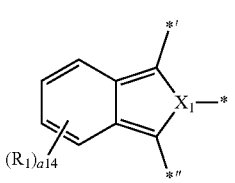

Formula Cy1-38
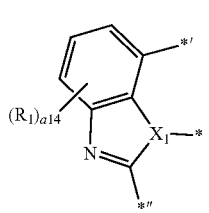

Formula Cy1-39
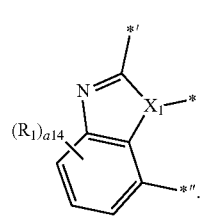

In Formulae Cy1-1 to Cy1-39, $X_1$ and $R_1$ are the same as described herein, $X_{11}$ may be O, S, $N(R_{11})$, or $C(R_{11})(R_{12})$, $X_{19}$ may be $C(R_{19})$ or N, $R_{11}$ to $R_{19}$ are the same as described in connection with $R_1$, a13 may be an integer from 0 to 3, a14 may be an integer from 0 to 4, and

*, *', and *" each indicate a binding site to a neighboring atom.

In one or more embodiments, a moiety represented by

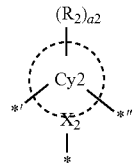

in Formula 1 may be selected from groups represented by Formulae Cy2-1 to Cy2-39 (for example, groups represented by Formulae Cy2-1, Cy2-12 to Cy2-15, Cy2-37, and Cy2-39):

Formula Cy2-1
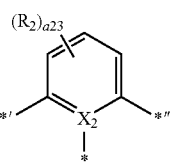

Formula Cy2-2
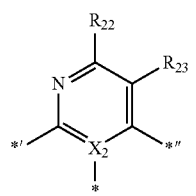
Formula Cy2-3
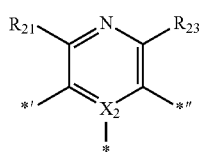
Formula Cy2-4
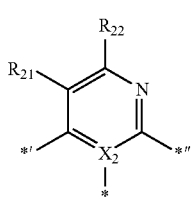
Formula Cy2-5
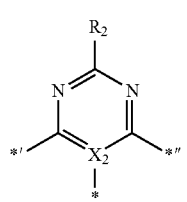
Formula Cy2-6
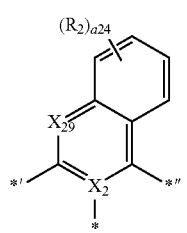
Formula Cy2-7
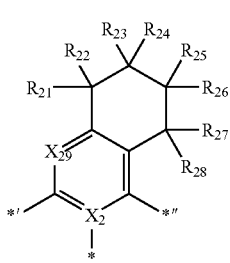
Formula Cy2-8
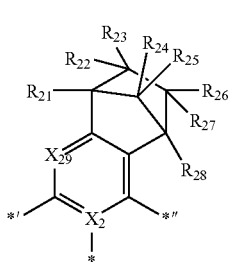
Formula Cy2-9
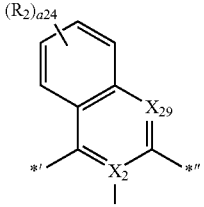
Formula Cy2-10
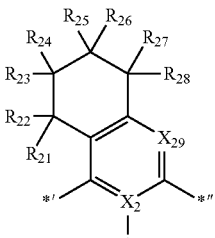
Formula Cy2-11
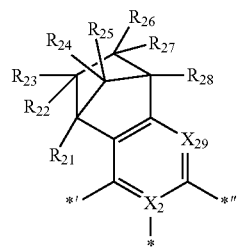
Formula Cy2-12
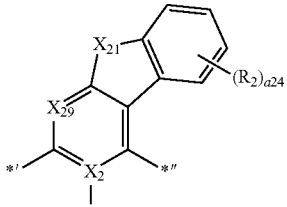
Formula Cy2-13
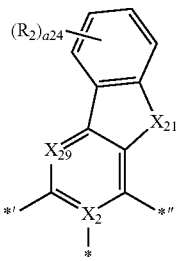
Formula Cy2-14
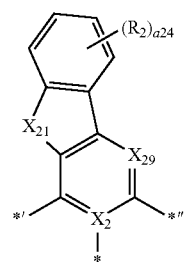

-continued
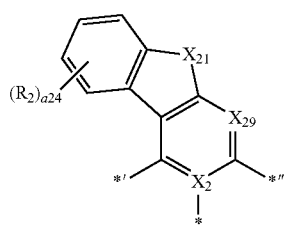
Formula Cy2-15
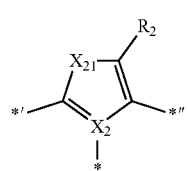
Formula Cy2-16
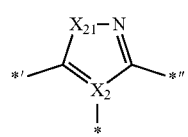
Formula Cy2-17
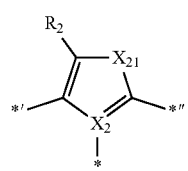
Formula Cy2-18
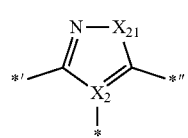
Formula Cy2-19
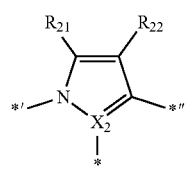
Formula Cy2-20
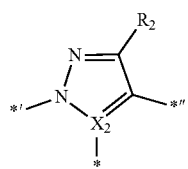
Formula Cy2-21
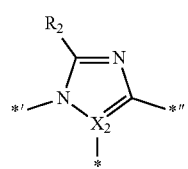
Formula Cy2-22
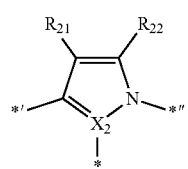
Formula Cy2-23
-continued
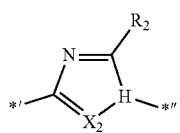
Formula Cy2-24
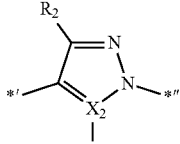
Formula Cy2-25
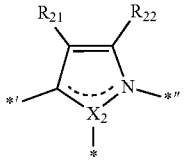
Formula Cy2-26
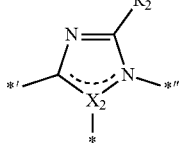
Formula Cy2-27
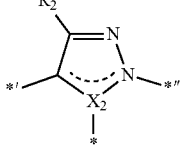
Formula Cy2-28
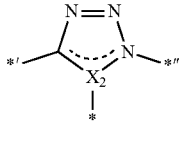
Formula Cy2-29
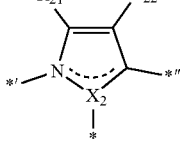
Formula Cy2-30
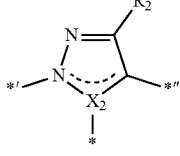
Formula Cy2-31
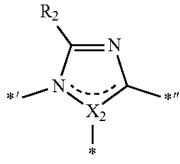
Formula Cy2-32

-continued

Formula Cy2-33
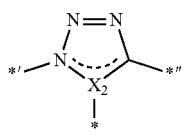

Formula Cy2-34
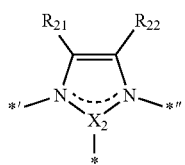

Formula Cy2-35
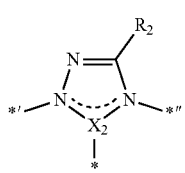

Formula Cy2-36
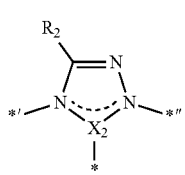

Formula Cy2-37
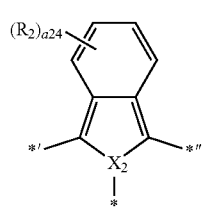

Formula Cy2-38
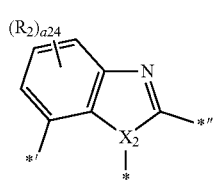

Formula Cy2-39
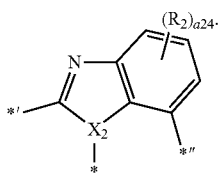

In Formulae Cy2-1 to Cy2-39, $X_2$ and $R_2$ are the same as described herein, $X_{21}$ may be O, S, $N(R_{21})$, or $C(R_{21})(R_{22})$, $X_{29}$ may be $C(R_{29})$ or N, $R_{21}$ to $R_{29}$ are the same as described in connection with $R_2$, a23 may be an integer from 0 to 3, a24 may be an integer from 0 to 4, and

*, *', and *" each indicate a binding site to a neighboring atom.

In one or more embodiments, a moiety represented by

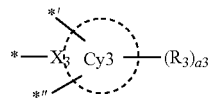

in Formula 1 may be selected from groups represented by Formulae Cy3-1 to Cy3-39 (for example, groups represented by Formulae Cy3-1 to Cy3-4 and Cy3-12 to Cy3-15):

Formula Cy3-1
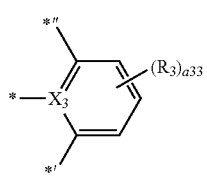

Formula Cy3-2
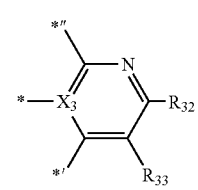

Formula Cy3-3
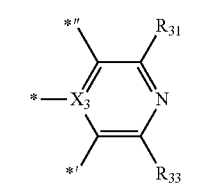

Formula Cy3-4
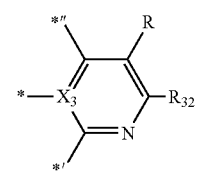

Formula Cy3-5
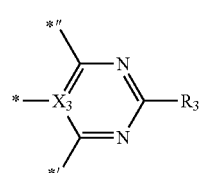

Formula Cy3-6
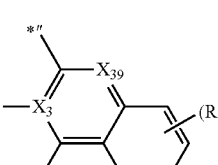

Formula Cy3-7
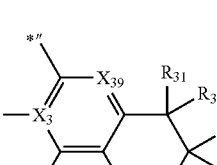
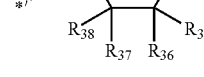

Formula Cy3-8
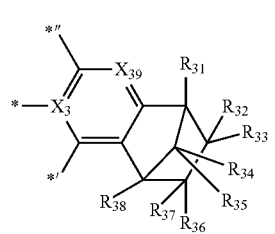
Formula Cy3-9
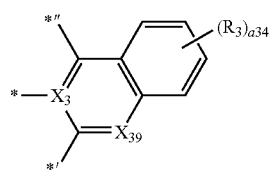
Formula Cy3-10
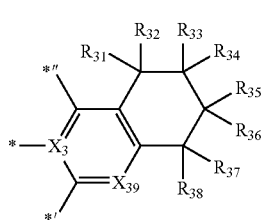
Formula Cy3-11
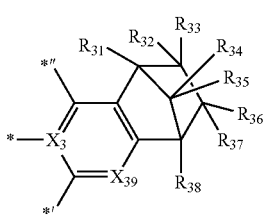
Formula Cy3-12
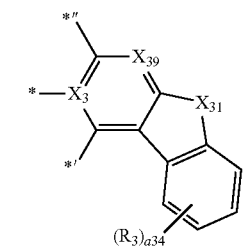
Formula Cy3-13
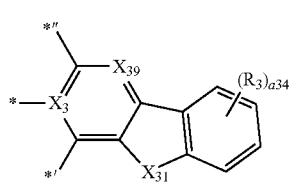
Formula Cy3-14
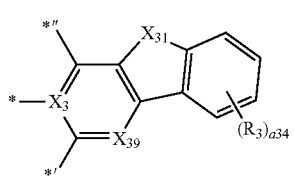
Formula Cy3-15
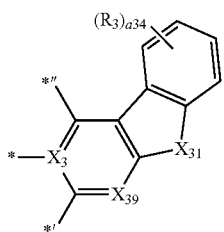
Formula Cy3-16
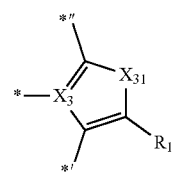
Formula Cy3-17
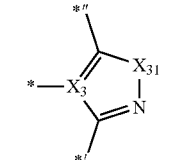
Formula Cy3-18
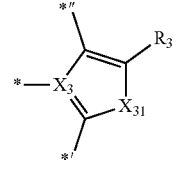
Formula Cy3-19
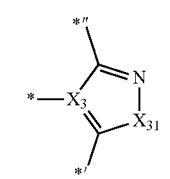
Formula Cy3-20
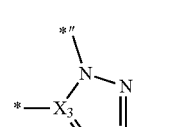
Formula Cy3-21
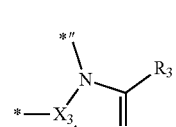
Formula Cy3-22

-continued

Formula Cy3-23
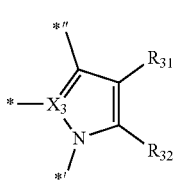

Formula Cy3-24
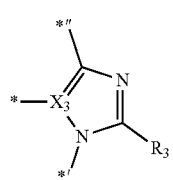

Formula Cy3-25
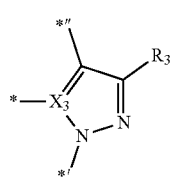

Formula Cy3-26
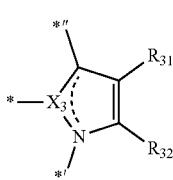

Formula Cy3-27
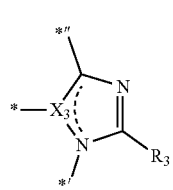

Formula Cy3-28
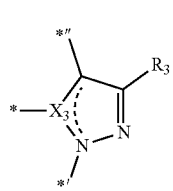

Formula Cy3-29
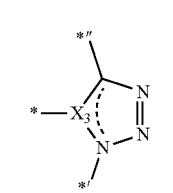

Formula Cy3-30
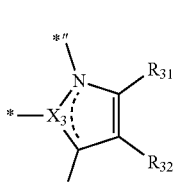

Formula Cy3-31
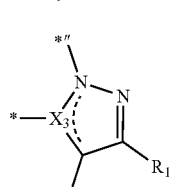

-continued

Formula Cy3-32
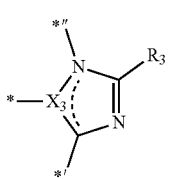

Formula Cy3-33
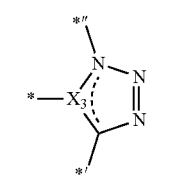

Formula Cy3-34
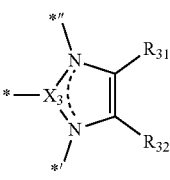

Formula Cy3-35
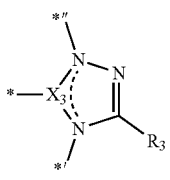

Formula Cy3-36
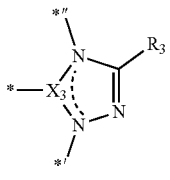

Formula Cy3-37
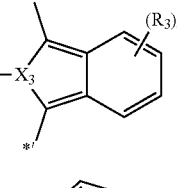

Formula Cy3-38
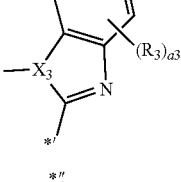

Formula Cy3-39
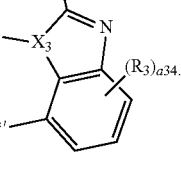

In Formulae Cy3-1 to Cy3-39,
$X_3$ and $R_3$ are the same as described herein,
$X_{31}$ may be O, S, N($R_{31}$), or C($R_{31}$)($R_{32}$),
$X_{39}$ may be C($R_{39}$) or N,
$R_{31}$ to $R_{39}$ are the same as described in connection with $R_3$, a33 may be an integer from 0 to 3,
a34 may be an integer from 0 to 4, and
*, *', and *" each indicate a binding site to a neighboring atom.

In one or more embodiments, a moiety represented by

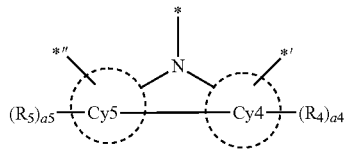

in Formula 1 may be selected from groups represented by Formulae Cz-1 to Cz-27 (for example, groups represented by Formulae Cz-1, Cz-11, and Cz-25):

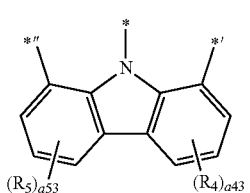
Formula Cz-1

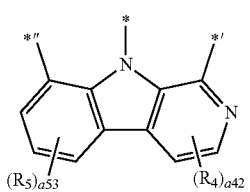
Formula Cz-2

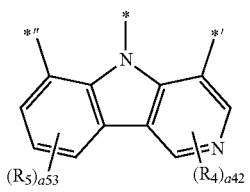
Formula Cz-3

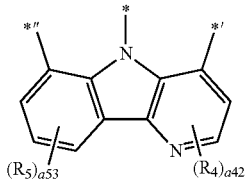
Formula Cz-4

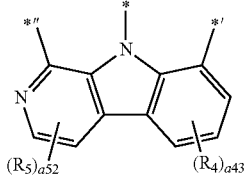
Formula Cz-5

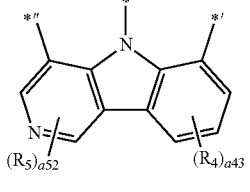
Formula Cz-6

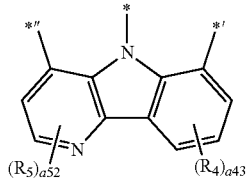
Formula Cz-7

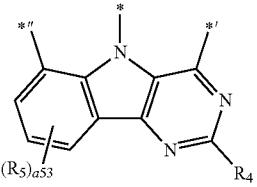
Formula Cz-8

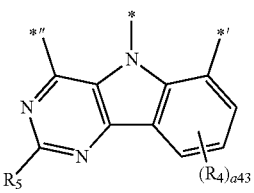
Formula Cz-9

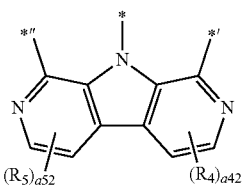
Formula Cz-10

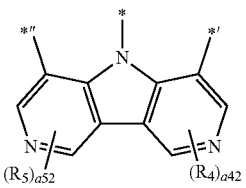
Formula Cz-11

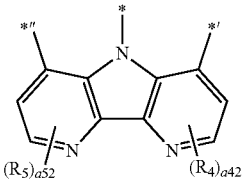
Formula Cz-12

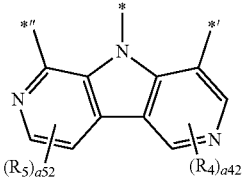
Formula Cz-13

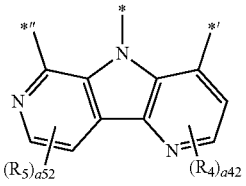
Formula Cz-14

-continued

Formula Cz-15
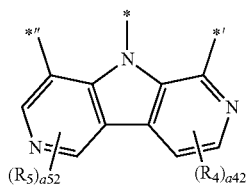

Formula Cz-16
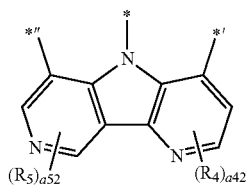

Formula Cz-17
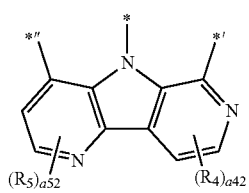

Formula Cz-18
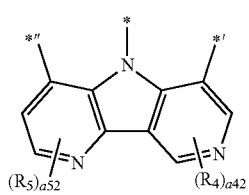

Formula Cz-19
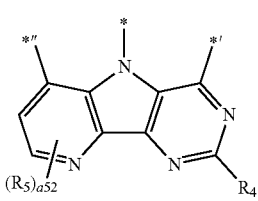

Formula Cz-20
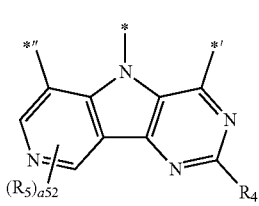

Formula Cz-21
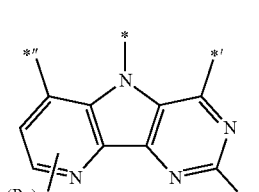

Formula Cz-22
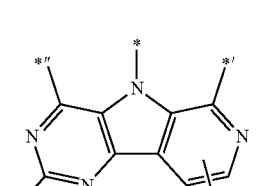

-continued

Formula Cz-23
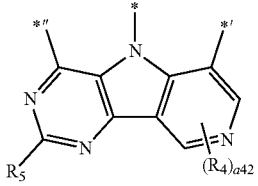

Formula Cz-24
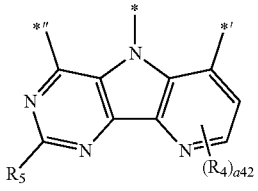

Formula Cz-25
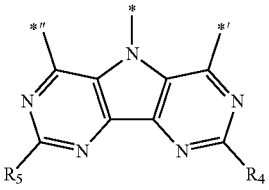

Formula Cz-26
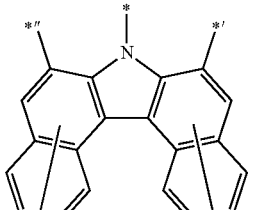

Formula Cz-27
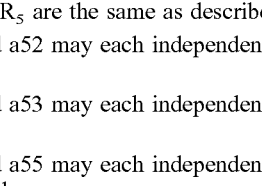

In Formulae Cz-1 to Cz-27, $R_4$ and $R_5$ are the same as described herein, a42 and a52 may each independently be an integer from 0 to 2, a43 and a53 may each independently be an integer from 0 to 3, a45 and a55 may each independently be an integer from 0 to 5, and \*, \*', and \*'' each indicate a binding site to a neighboring atom.

In one or more embodiments, a moiety represented by

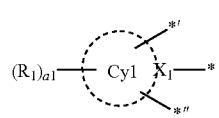

in Formula 1 may be selected from groups represented by Formulae Cy1(1) to Cy1(26), a moiety represented by

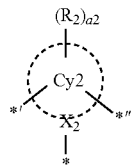

in Formula 1 may be selected from groups represented by Formulae Cy2(1) to Cy2(15), a moiety represented by

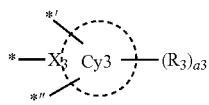

in Formula 1 may be selected from groups represented by Formulae Cy3(1) to Cy3(26), and/or a moiety represented by

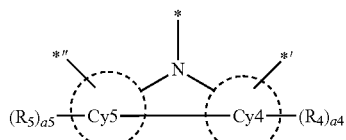

in Formula 1 may be selected from groups represented by Formulae Cz(1) to Cz(21), but embodiments of the present disclosure are not limited thereto:

Formula Cy1(1)

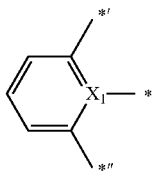

Formula Cy1(2)

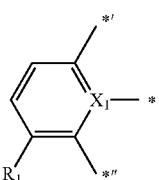

Formula Cy1(3)

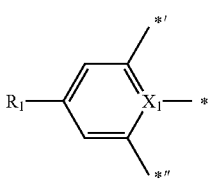

Formula Cy1(4)

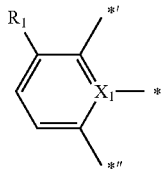

Formula Cy1(5)

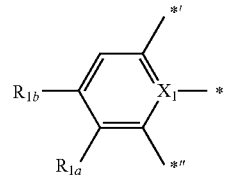

Formula Cy1(6)

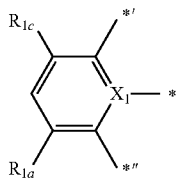

Formula Cy1(7)

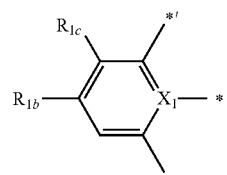

Formula Cy1(8)

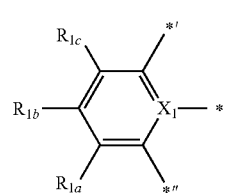

Formula Cy1(9)

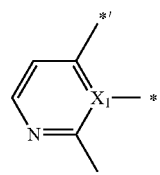

Formula Cy1(10)

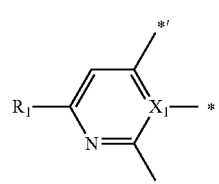

Formula Cy1(11)

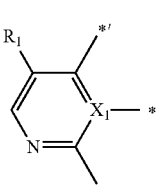

Formula Cy1(12)
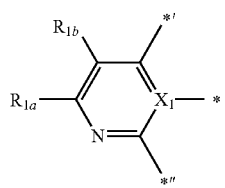
Formula Cy1(13)
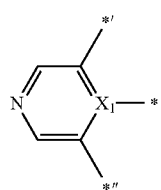
Formula Cy1(14)
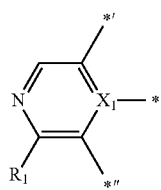
Formula Cy1(15)
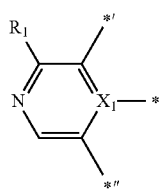
Formula Cy1(16)
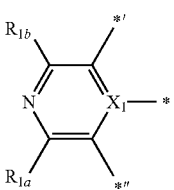
Formula Cy1(17)
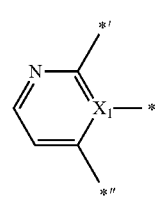
Formula Cy1(18)
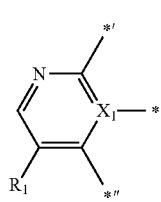
Formula Cy1(19)
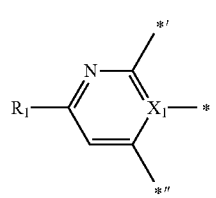
Formula Cy1(20)
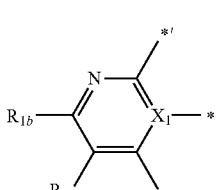
Formula Cy1(21)
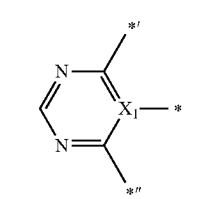
Formula Cy1(22)
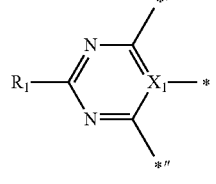
Formula Cy1(23)
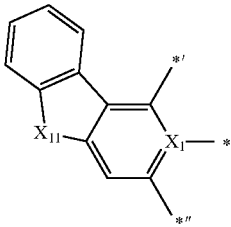
Formula Cy1(24)
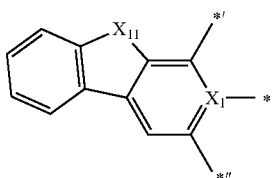
Formula Cy1(25)
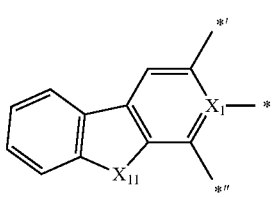

Formula Cy1(26)
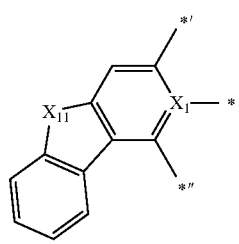
Formula Cy2(1)
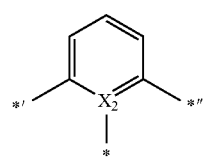
Formula Cy2(2)
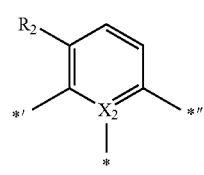
Formula Cy2(3)
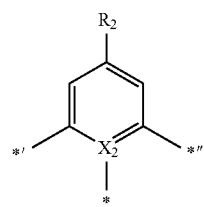
Formula Cy2(4)
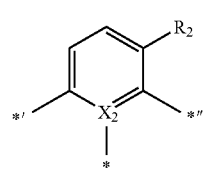
Formula Cy2(5)
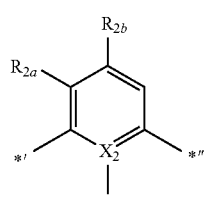
Formula Cy2(6)
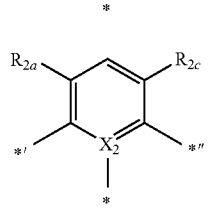
Formula Cy2(7)
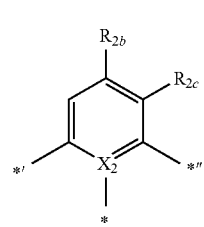
Formula Cy2(8)
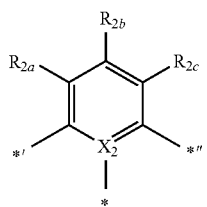
Formula Cy2(9)
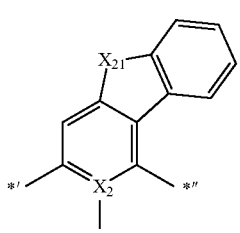
Formula Cy2(10)
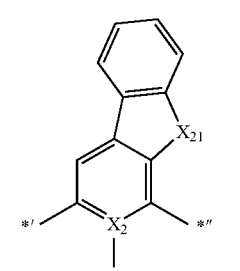
Formula Cy2(11)
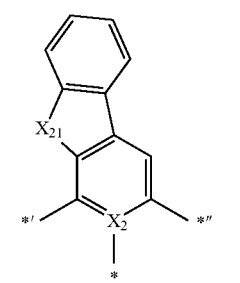
Formula Cy2(12)
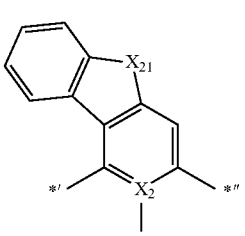
Formula Cy2(13)
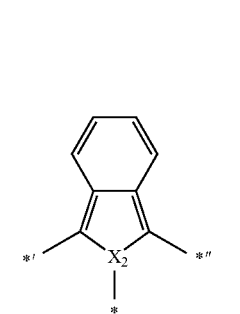

-continued
Formula Cy2(14)
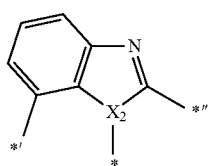
Formula Cy2(15)
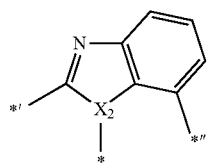
Formula Cy3(1)
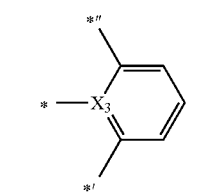
Formula Cy3(2)
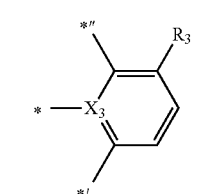
Formula Cy3(3)
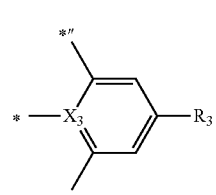
Formula Cy3(4)
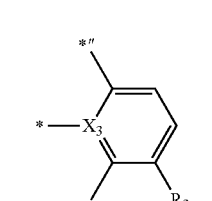
Formula Cy3(5)
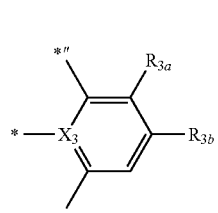
Formula Cy3(6)
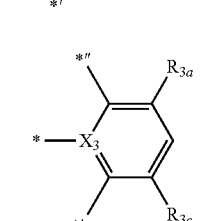
-continued
Formula Cy3(7)
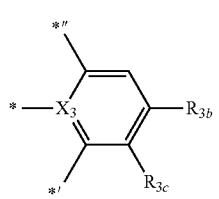
Formula Cy3(8)
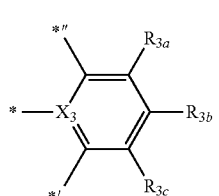
Formula Cy3(9)
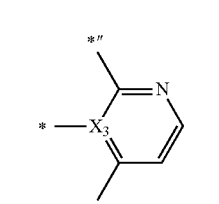
Formula Cy3(10)
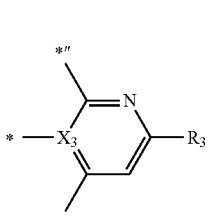
Formula Cy3(11)
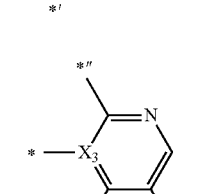
Formula Cy3(12)
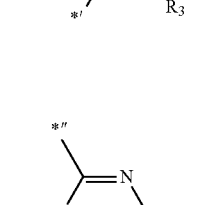
Formula Cy3(13)
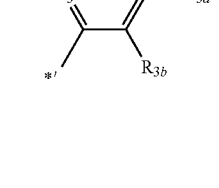
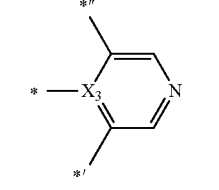

Formula Cy3(14)
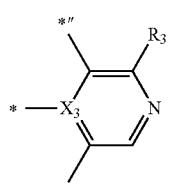
Formula Cy3(15)
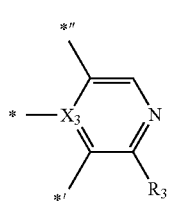
Formula Cy3(16)
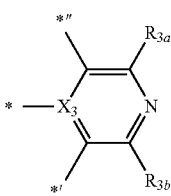
Formula Cy3(17)
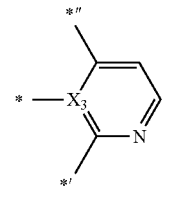
Formula Cy3(18)
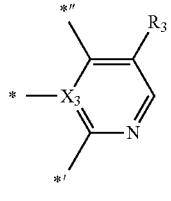
Formula Cy3(19)
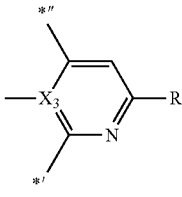
Formula Cy3(20)
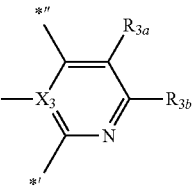
Formula Cy3(21)
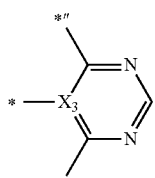
Formula Cy3(22)
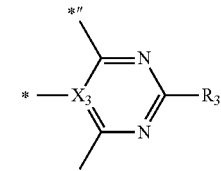
Formula Cy3(23)
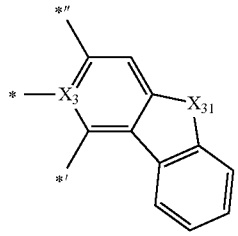
Formula Cy3(24)
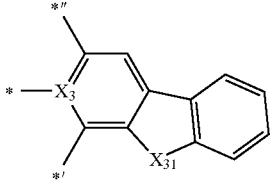
Formula Cy3(25)
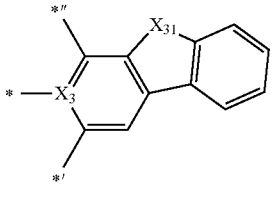
Formula Cy3(26)
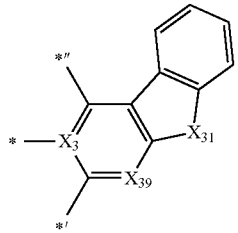
Formula Cz(1)
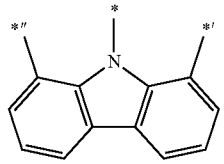

-continued
Formula Cz(2)
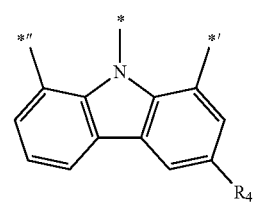
Formula Cz(3)
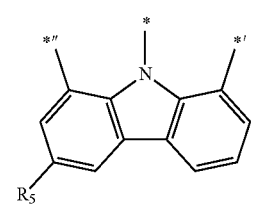
Formula Cz(4)
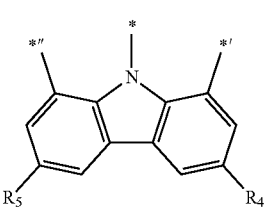
Formula Cz(5)
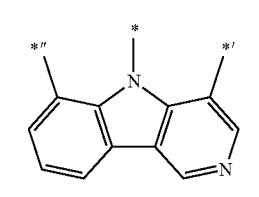
Formula Cz(6)
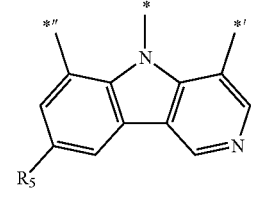
Formula Cz(7)
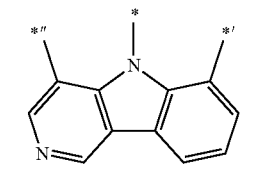
Formula Cz(8)
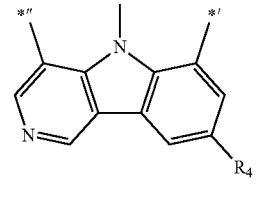
Formula Cz(9)
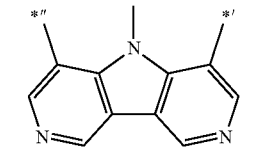
-continued
Formula Cz(10)
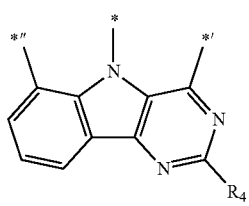
Formula Cz(11)
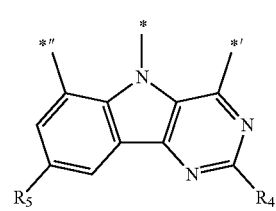
Formula Cz(12)
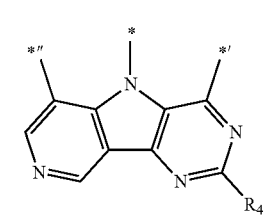
Formula Cz(13)
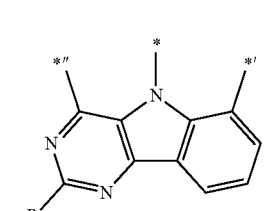
Formula Cz(14)
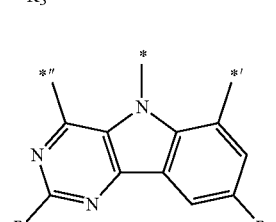
Formula Cz(15)
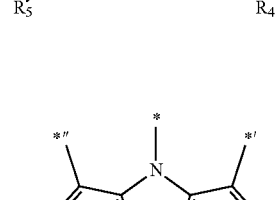
Formula Cz(16)
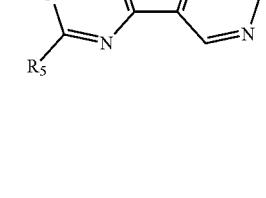
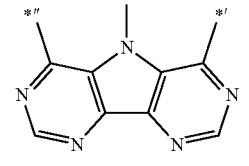

Formula Cz(17)
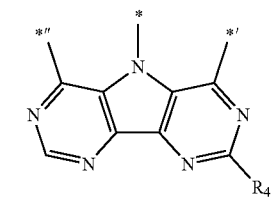

Formula Cz(18)
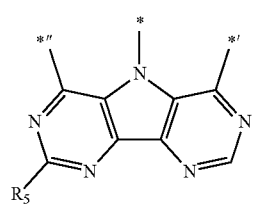

Formula Cz(19)
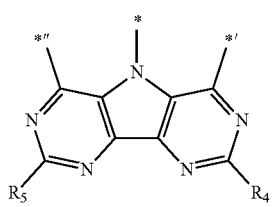

Formula Cz(20)
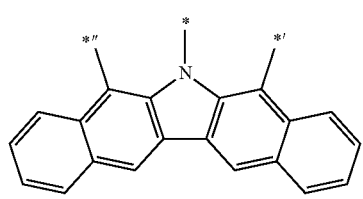

Formula Cz(21)
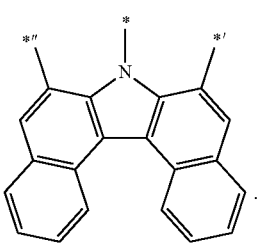

In Formulae Cy1(1) to Cy1(26), Cy2(1) to Cy2(15), Cy3(1) to Cy3(26), and Cz(1) to Cz(21), $X_1$ to $X_3$ and $R_1$ to $R_5$ are the same as described herein, $X_{11}$ may be O, S, $N(R_{11})$, or $C(R_{11})(R_{12})$, $X_{21}$ may be O, S, $N(R_{21})$, or $C(R_{21})(R_{22})$, $X_{31}$ may be O, S, $N(R_{31})$, or $C(R_{31})(R_{32})$, $R_{1a}$ to $R_{1c}$, $R_{11}$, and $R_{12}$ are the same as described in connection with $R_1$, $R_{2a}$ to $R_{2c}$, $R_{21}$, and $R_{22}$ are the same as described in connection with $R_2$, $R_{3a}$ to $R_{3c}$, $R_{31}$, and $R_{32}$ are the same as described in connection with $R_3$, $R_1$, $R_{1a}$ to $R_{1c}$, $R_2$, $R_{2a}$ to $R_{2c}$, $R_3$, $R_{3a}$ to $R_{3c}$, $R_4$, and $R_5$ may not be hydrogen, and

*, *', and *" each indicate a binding site to a neighboring atom.

For example, the organometallic compound may be represented by one of Formulae 1-1 to 1-32:

Formula 1-1
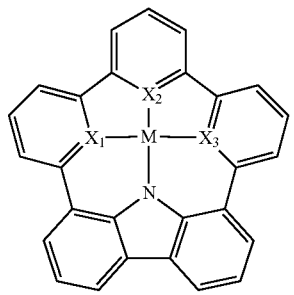

Formula 1-2
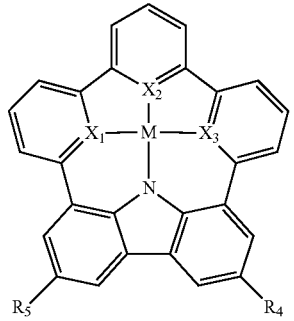

Formula 1-3
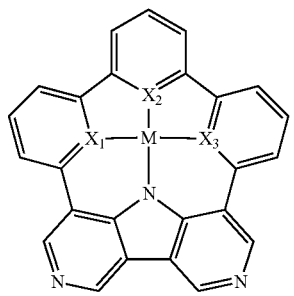

Formula 1-4
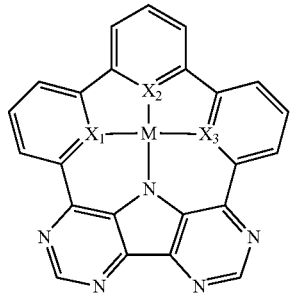

Formula 1-5
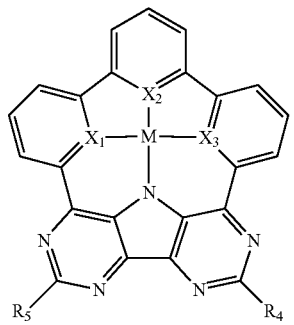

Formula 1-6
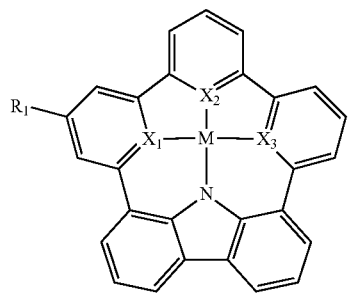
Formula 1-7
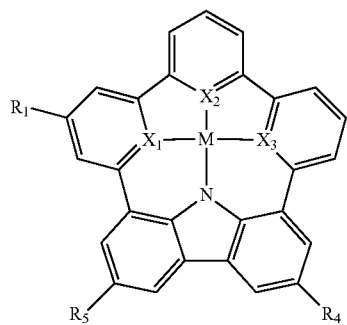
Formula 1-8
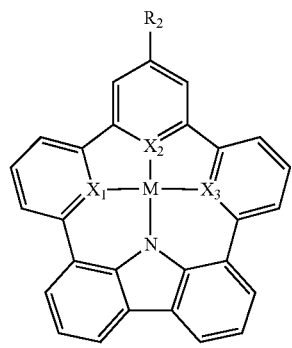
Formula 1-9
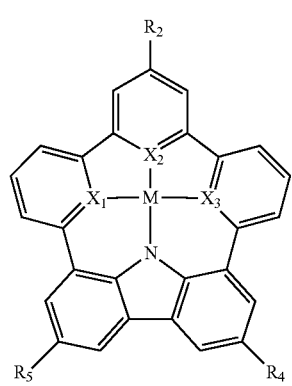
Formula 1-10
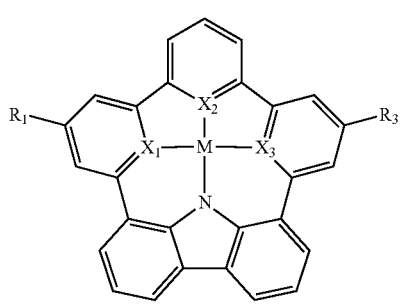
Formula 1-11
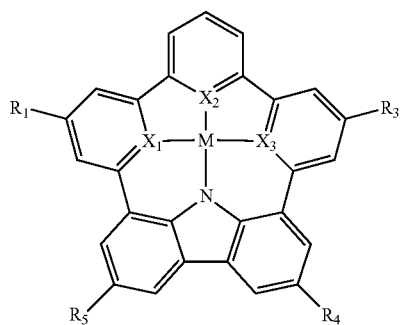
Formula 1-12
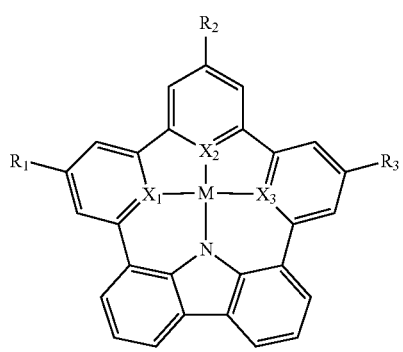
Formula 1-13
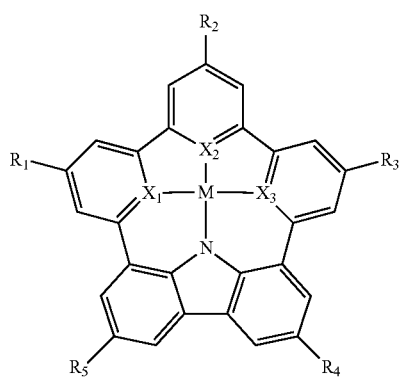
Formula 1-14
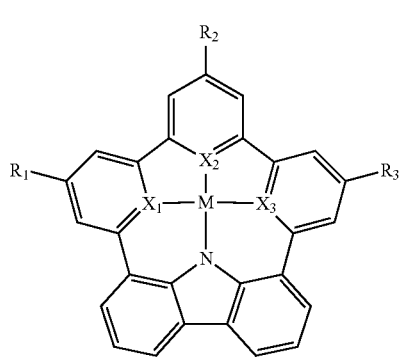

Formula 1-15
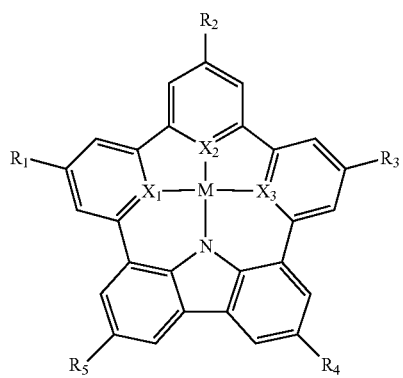
Formula 1-16
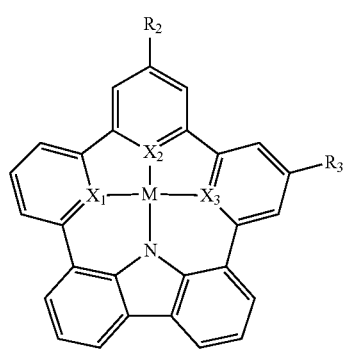
Formula 1-17
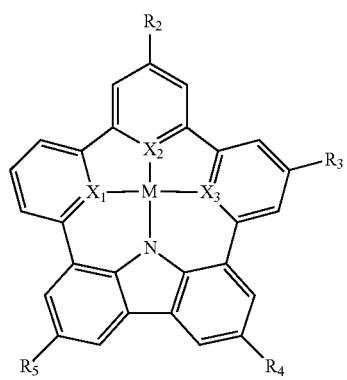
Formula 1-18
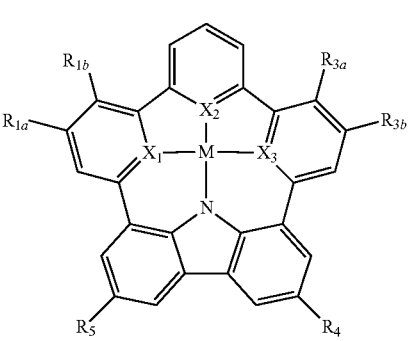
Formula 1-19
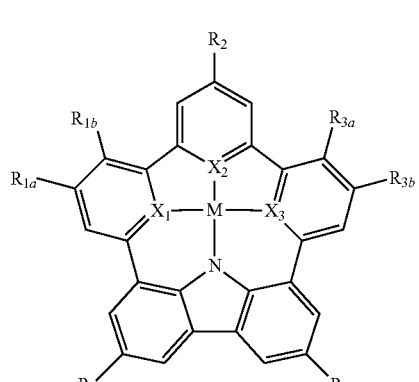
Formula 1-20
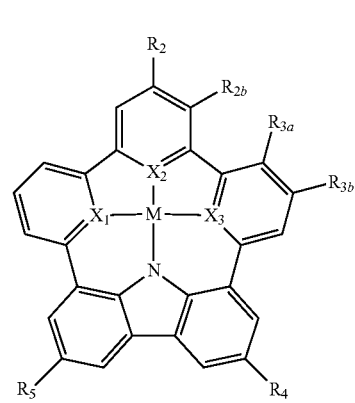
Formula 1-21
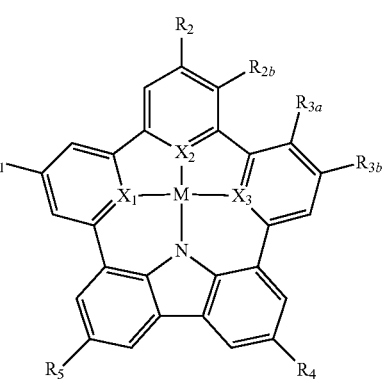
Formula 1-22
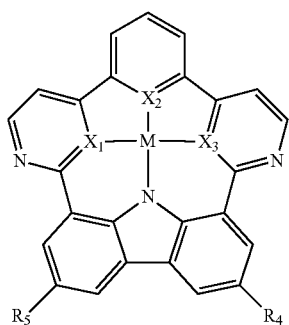

Formula 1-23
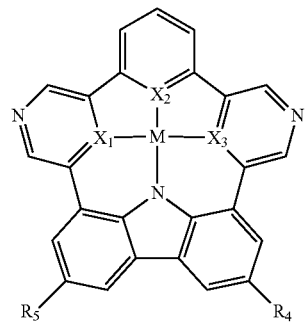
Formula 1-24
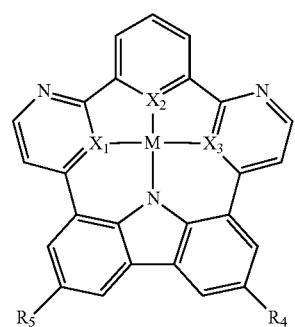
Formula 1-25
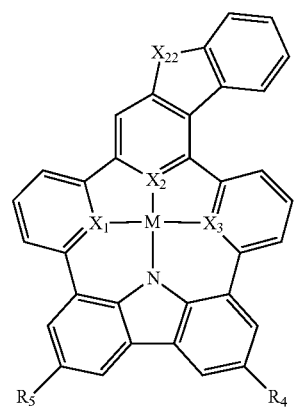
Formula 1-26
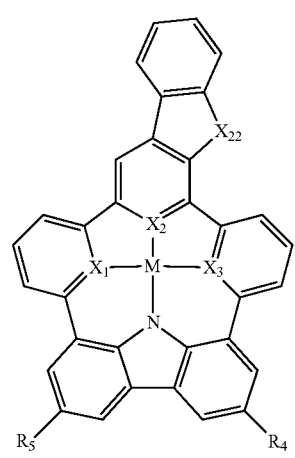
Formula 1-27
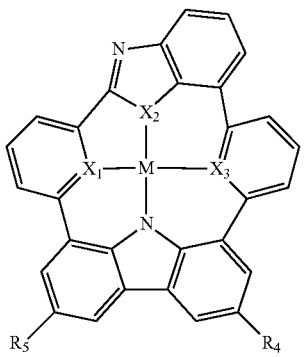
Formula 1-28
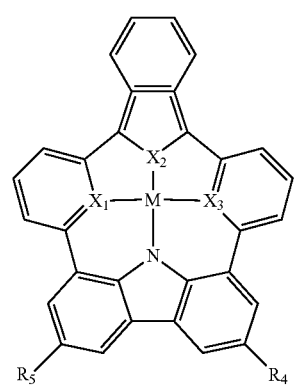
Formula 1-29
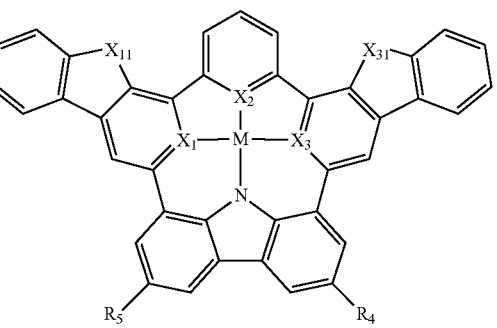
Formula 1-30
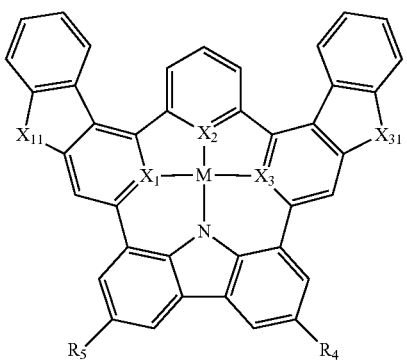

Formula 1-31

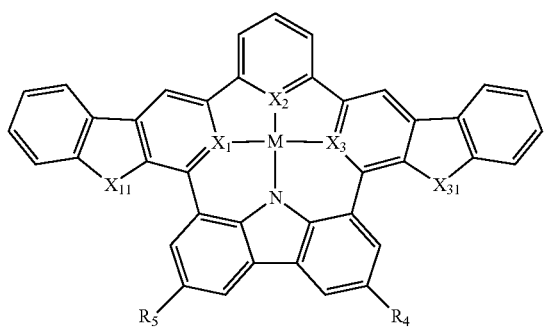

Formula 1-32

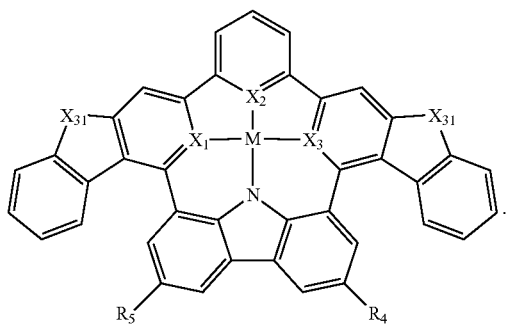

In Formulae 1-1 to 1-32,

M, $X_1$ to $X_3$, and $R_1$ to $R_5$ are the same as described herein, $X_{11}$ may be O, S, $N(R_{11})$, or $C(R_{11})(R_{12})$, $X_{21}$ may be O, S, $N(R_{21})$, or $C(R_{21})(R_{22})$, $X_{31}$ may be O, S, $N(R_{31})$, or $C(R_{31})(R_{32})$, $R_{1a}$, $R_{1b}$, $R_{11}$, and $R_{12}$ are the same as described in connection with $R_1$, $R_{2a}$, $R_{2b}$, $R_{21}$, and $R_{22}$ are the same as described in connection with $R_2$, and $R_{3a}$, $R_{3b}$, $R_{31}$, and $R_{32}$ are the same as described in connection with $R_3$.

The organometallic compound represented by Formula 1 may be selected from Compounds 1 to 120, but embodiments of the present disclosure are not limited thereto:

1

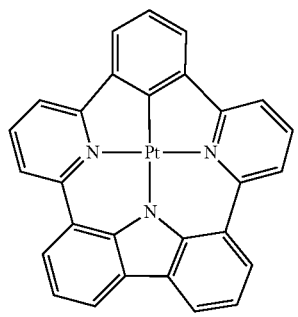

2

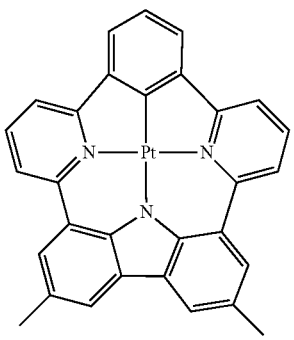

3

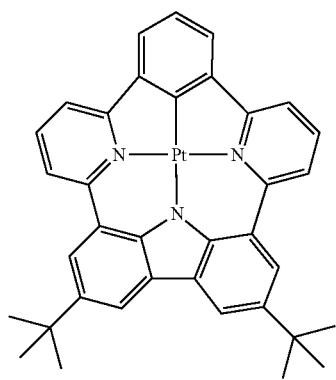

4

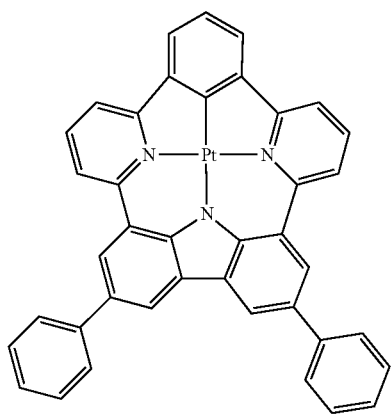

-continued
5
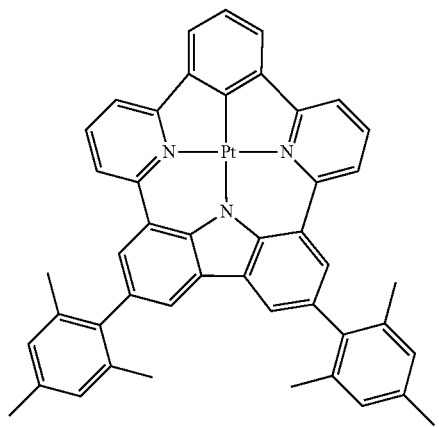
6
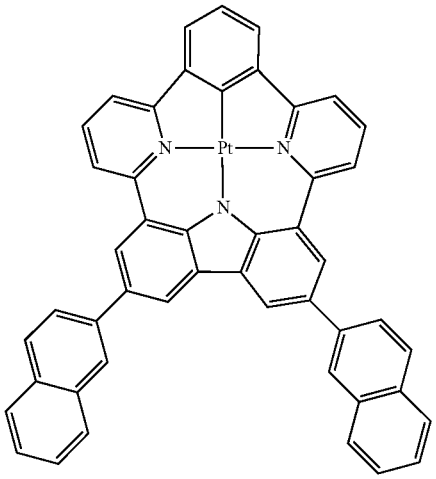
7
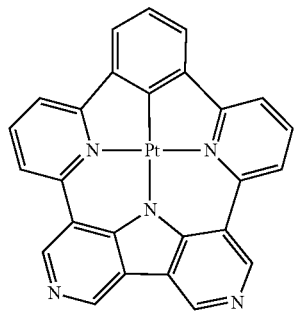
8
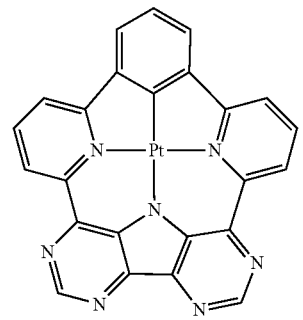
9
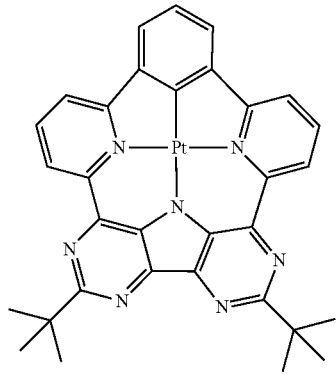
10
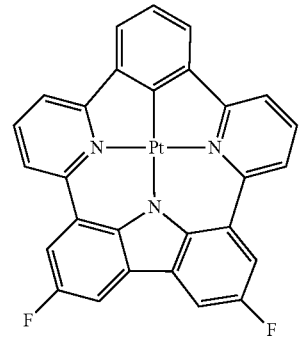
11
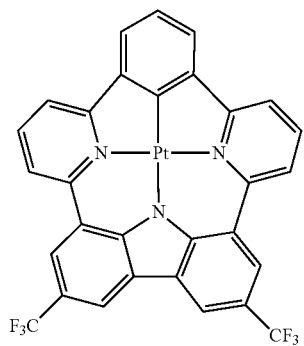
12
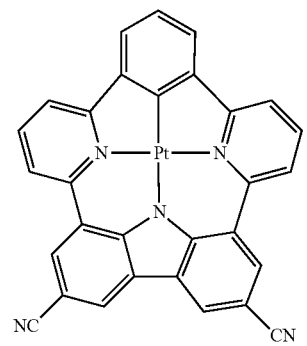

-continued
13
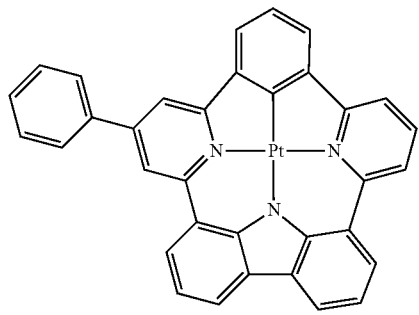
14
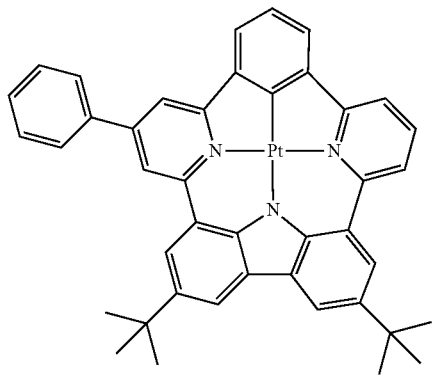
15
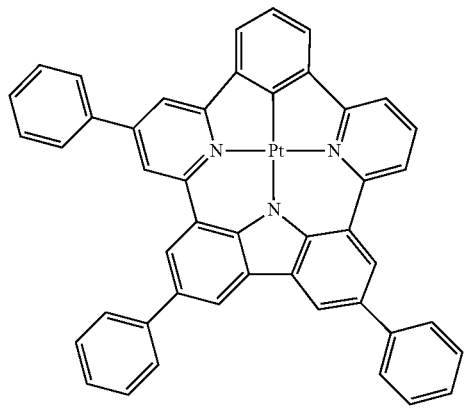
16
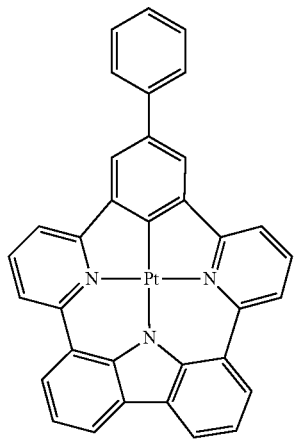
17
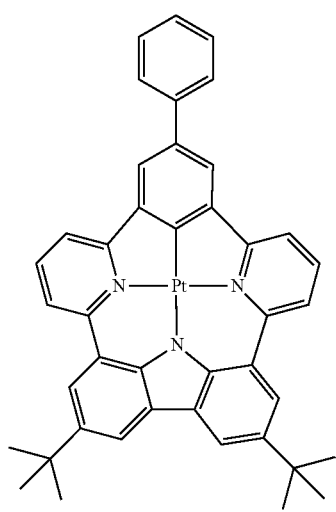
18
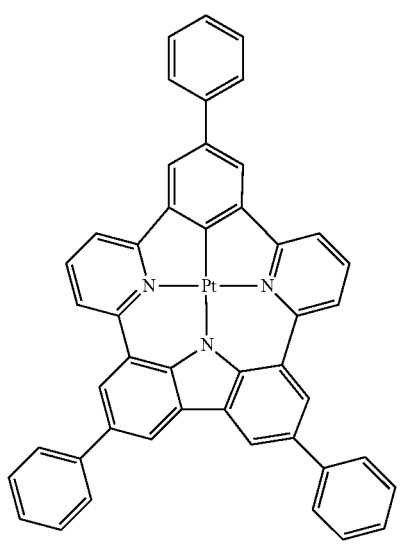

-continued
19
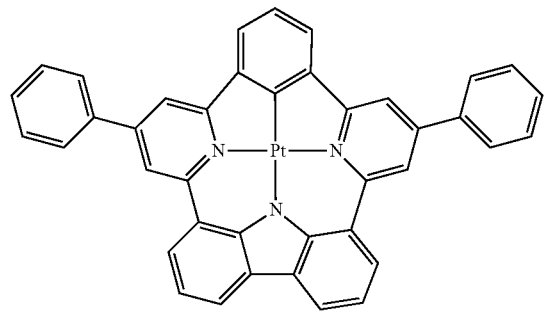
20
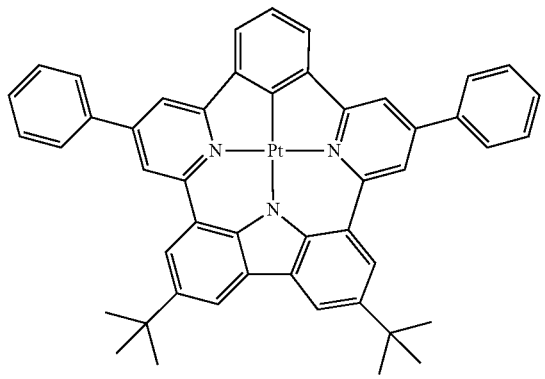
21
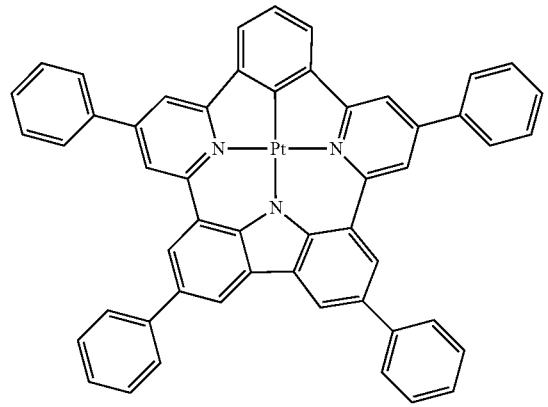
22
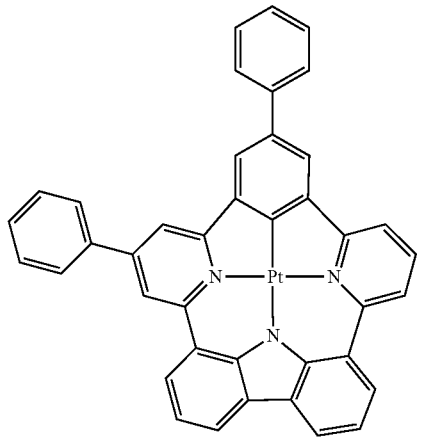
23
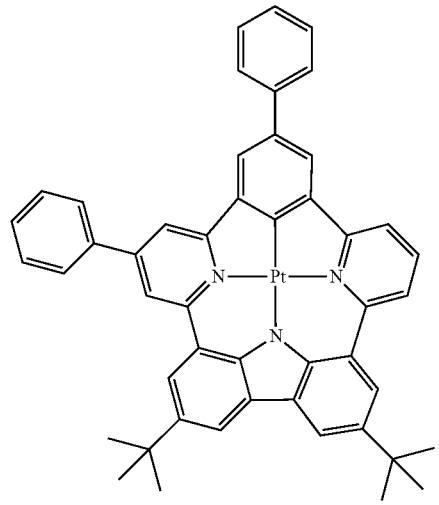
24
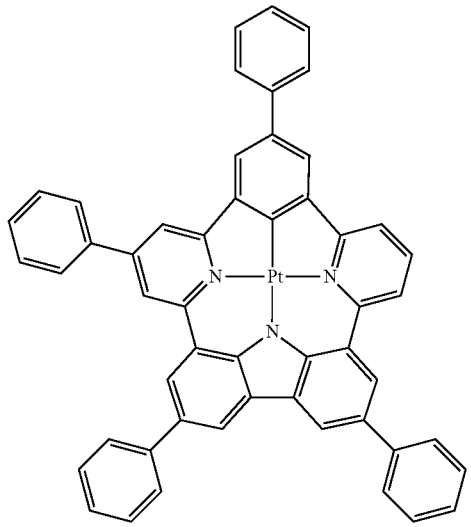

25
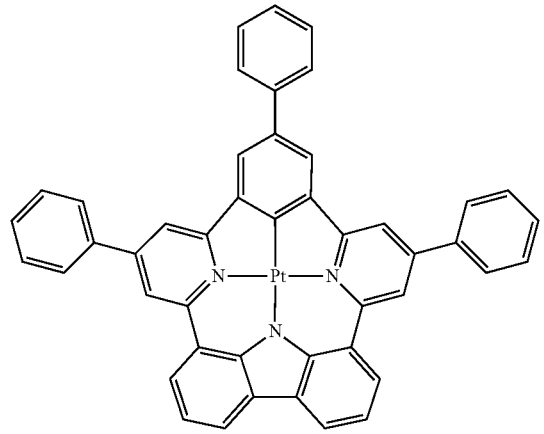
26
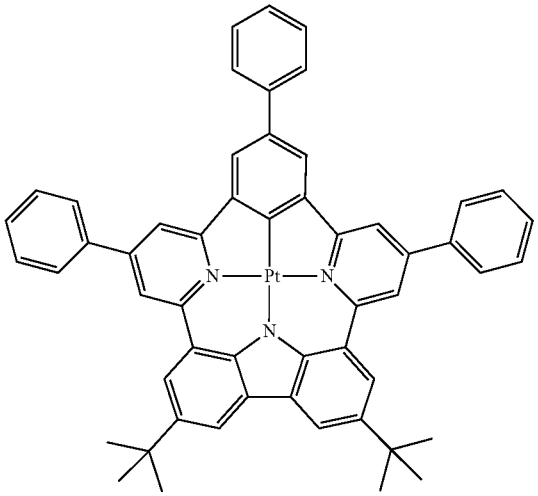
27
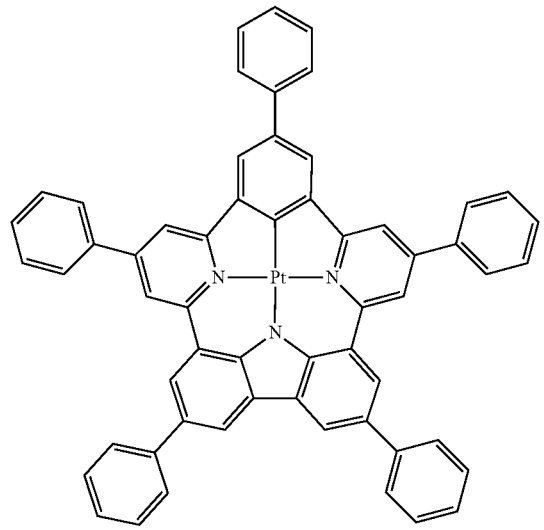
28
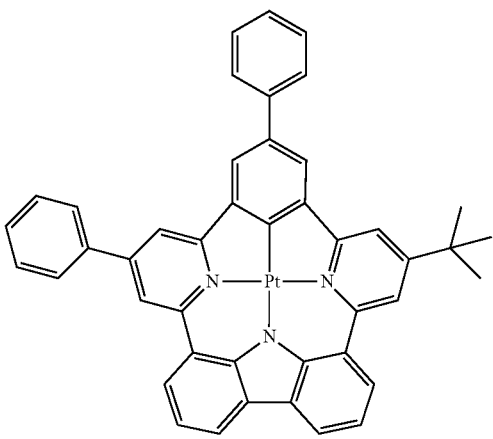
29
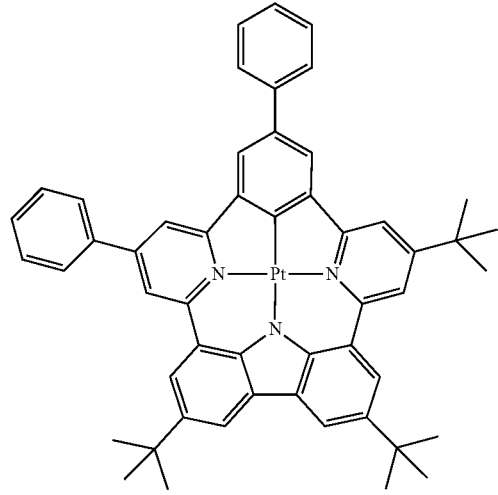
30
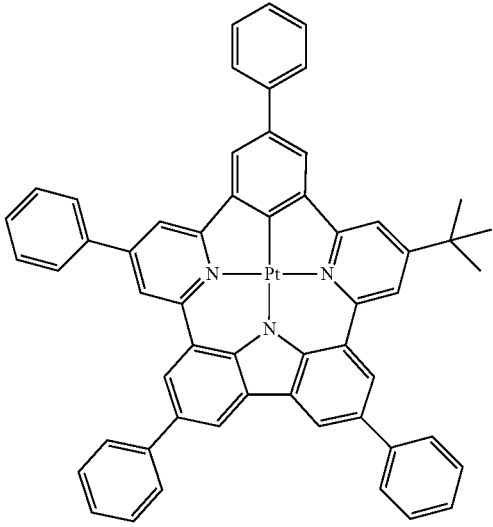

-continued
31
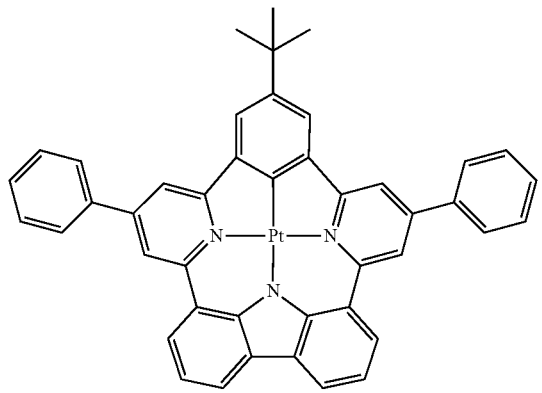
32
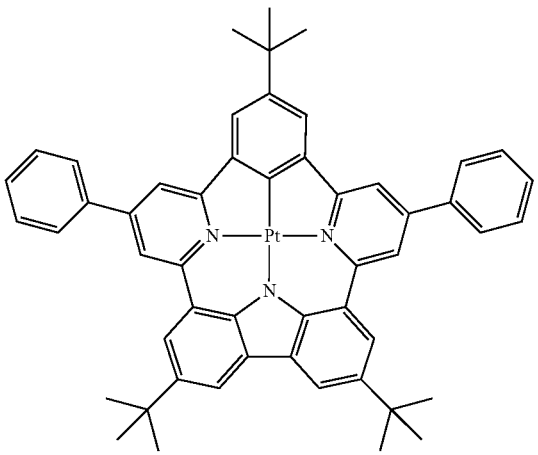
33
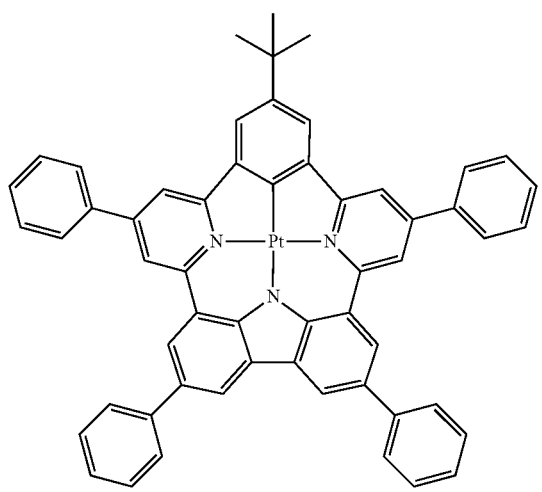
34
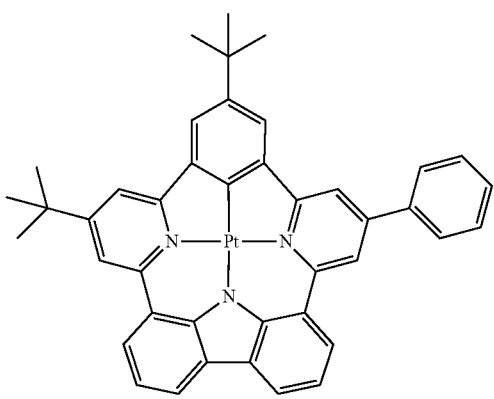
35
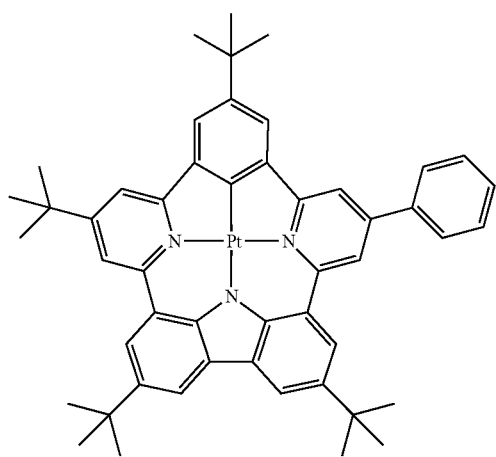
36
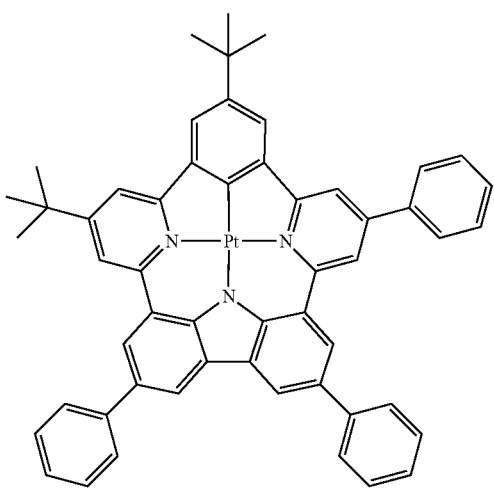

-continued
37
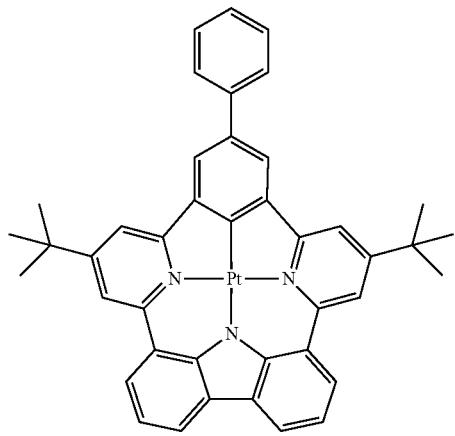
38
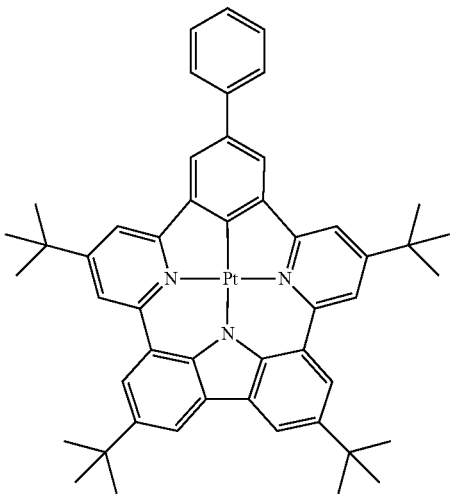
39
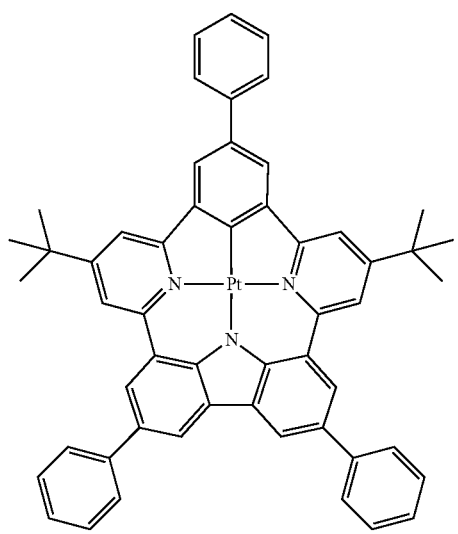
40
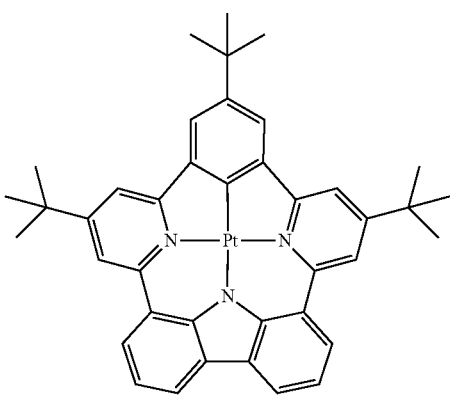
41
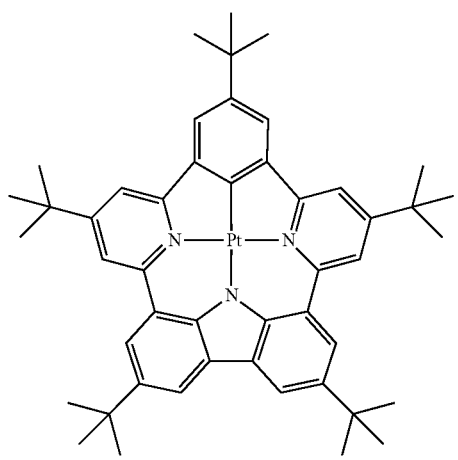
42
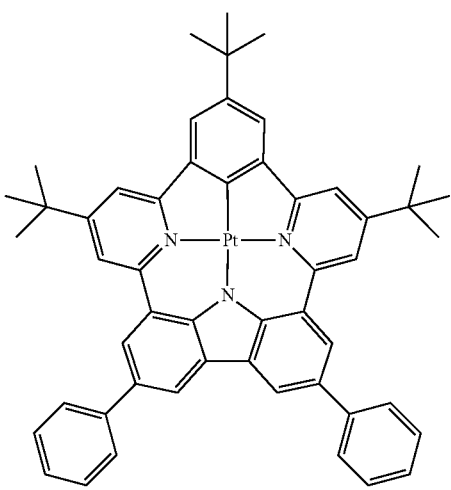

-continued
43
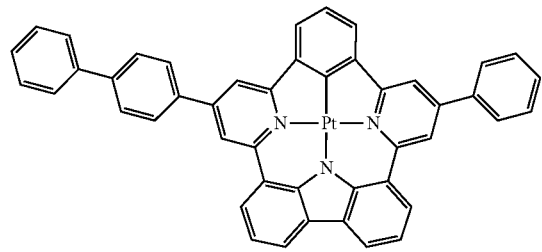
44
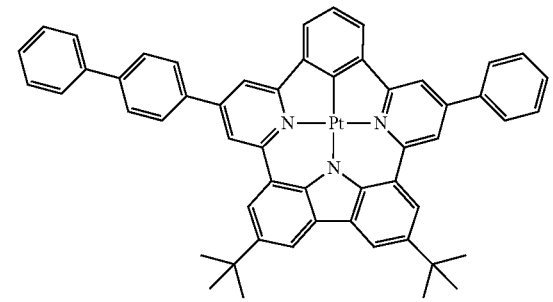
45
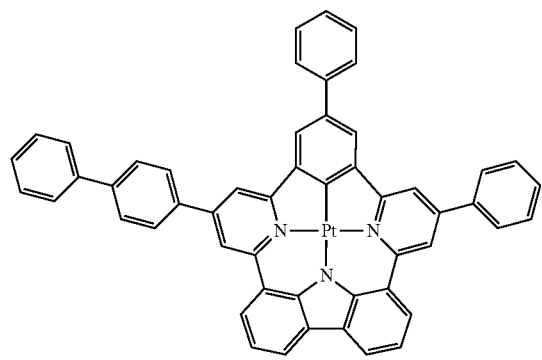
46
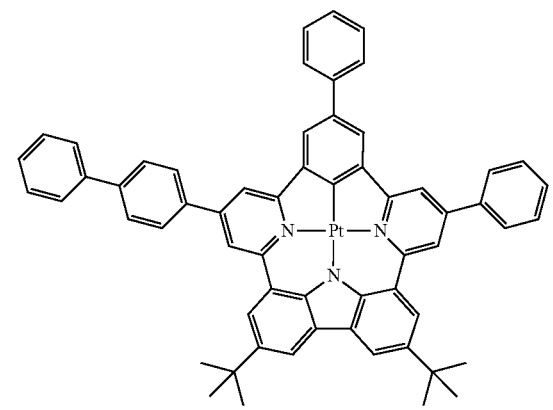
47
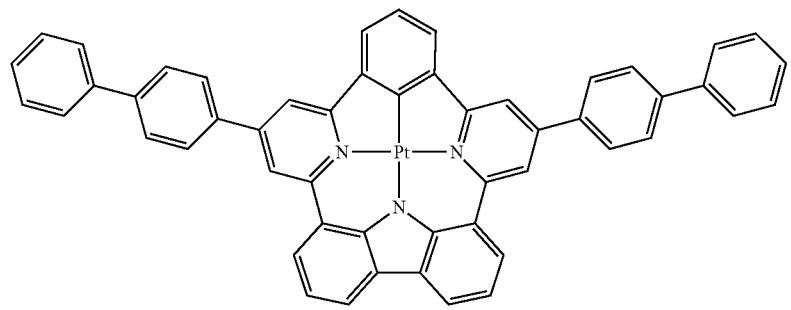
48
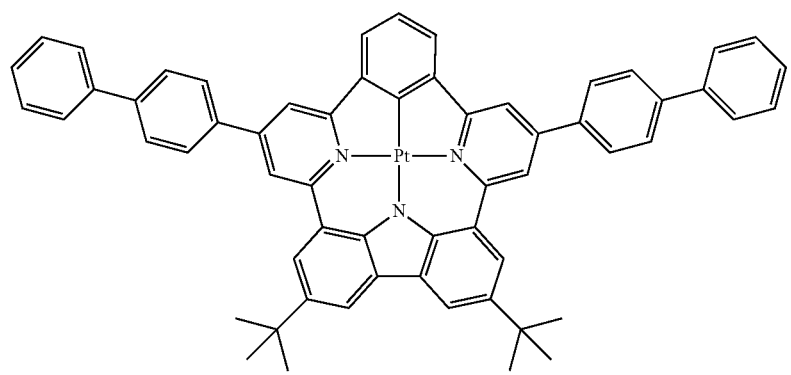

49
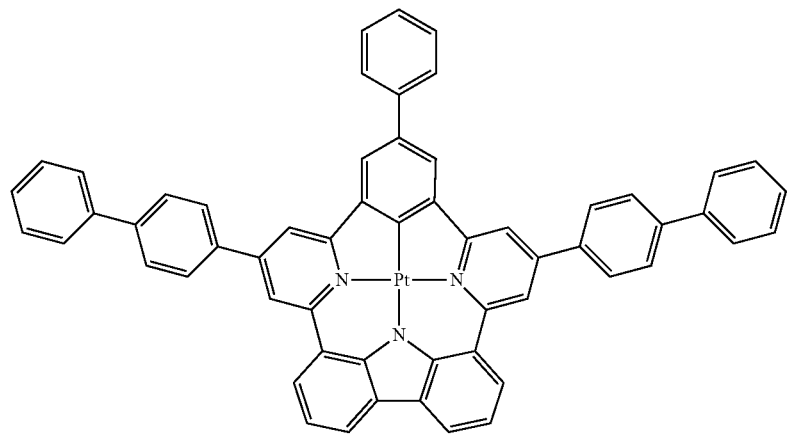
50
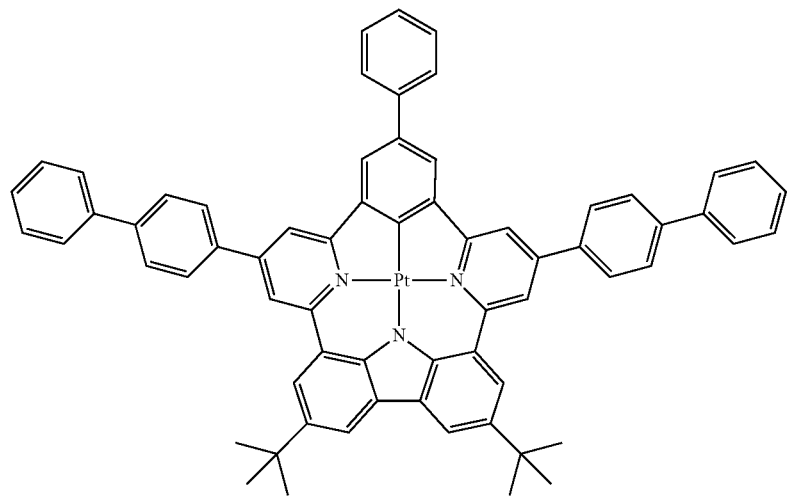
51
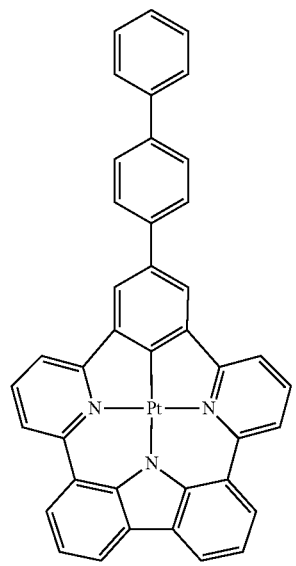
52
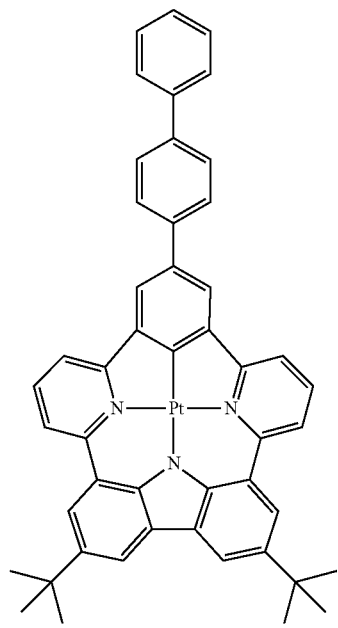

-continued
53
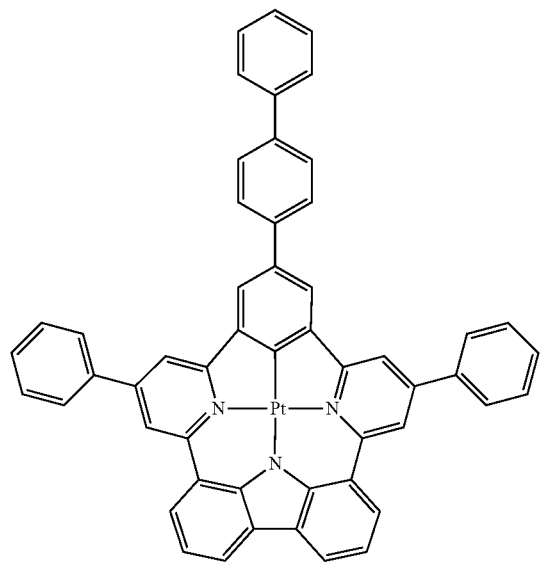
54
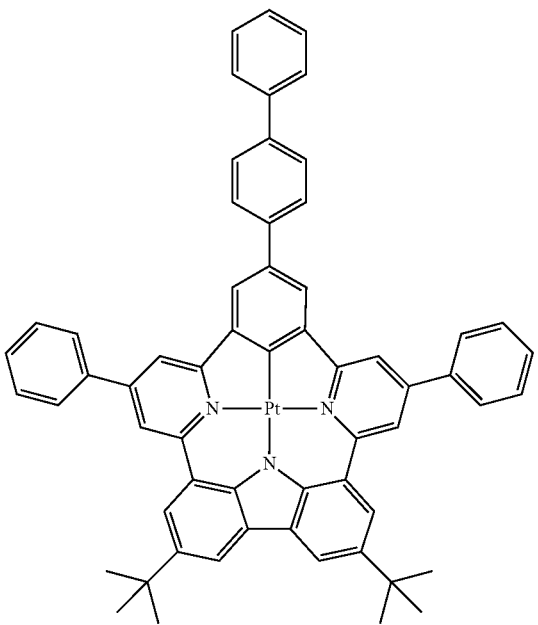
55
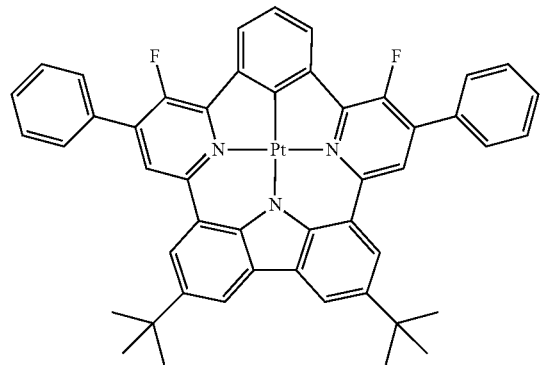
56
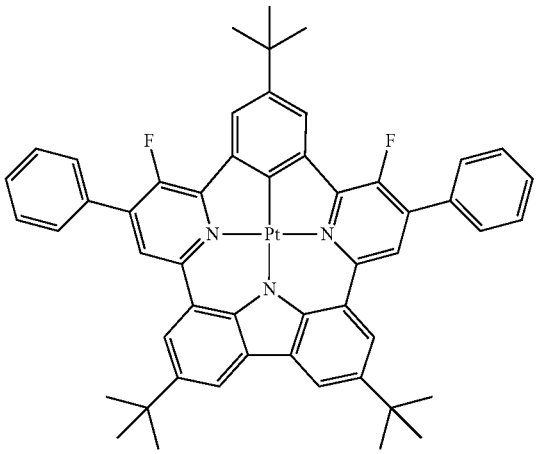
57
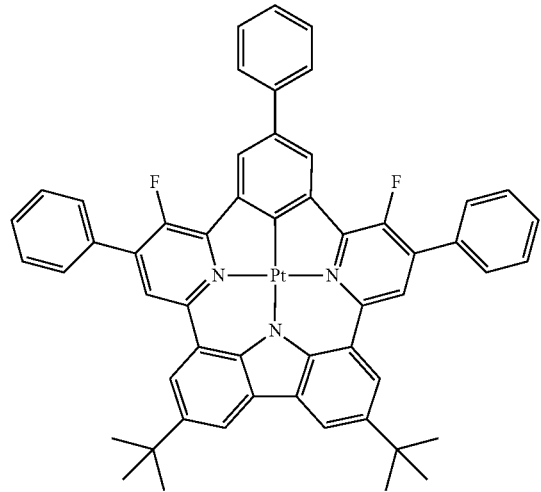
58
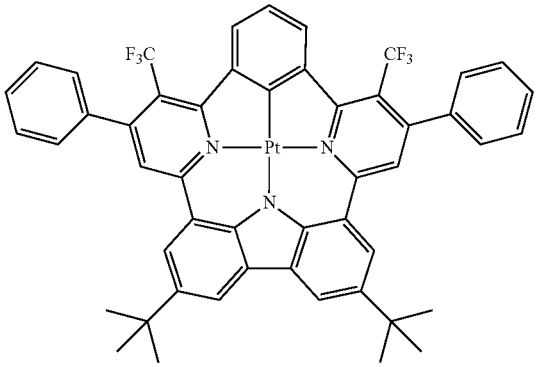

-continued
59
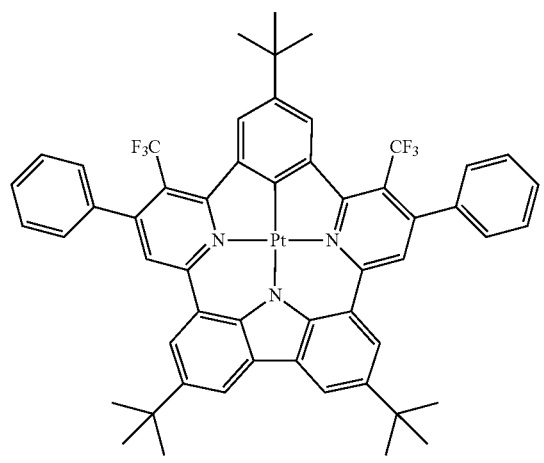
60
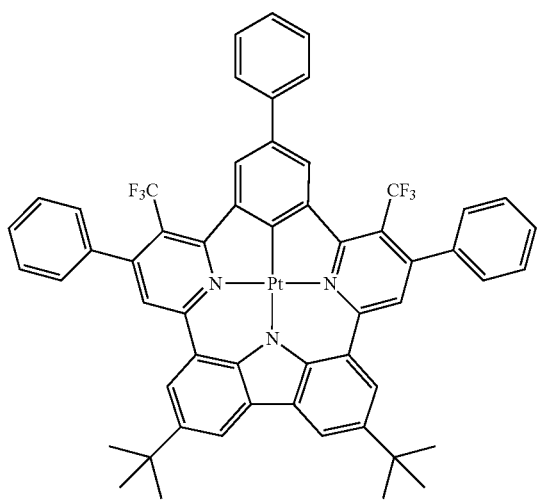
61
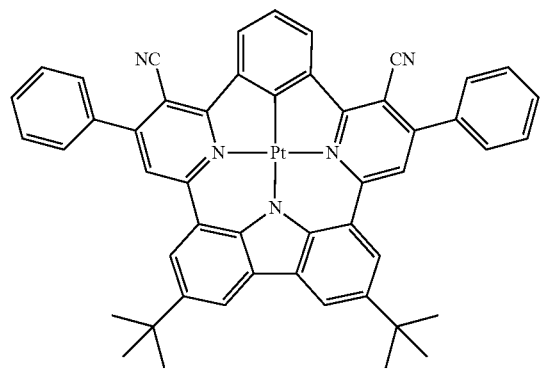
62
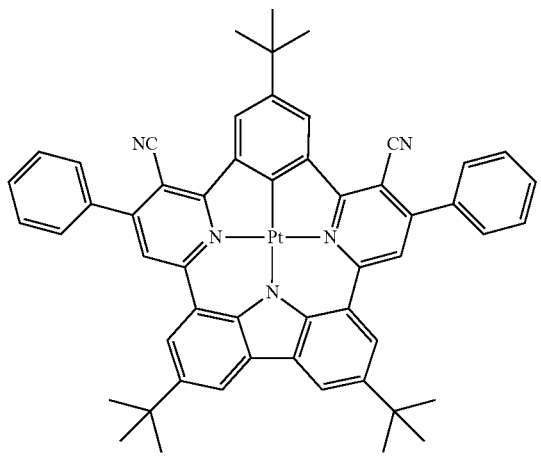
63
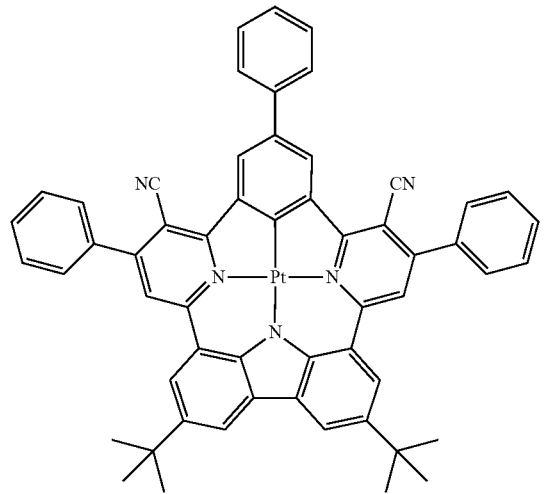
64
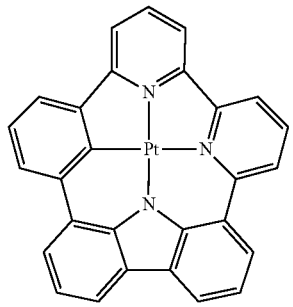

-continued
65
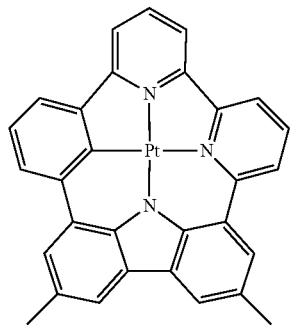
66
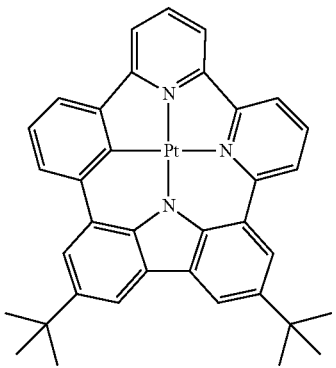
67
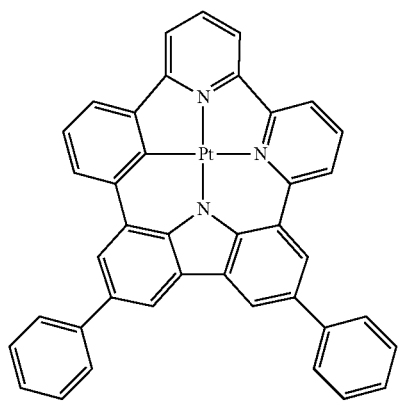
68
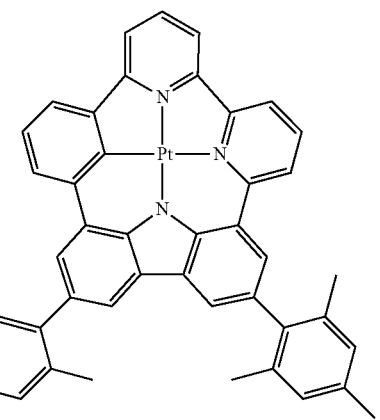
69
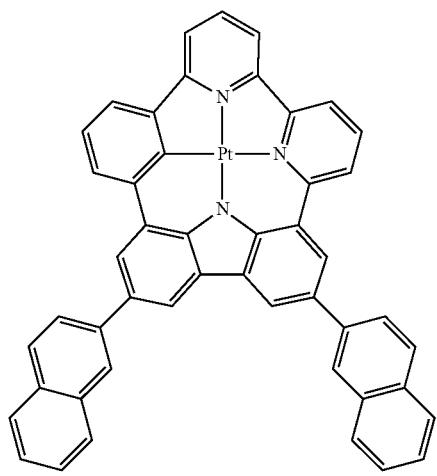
70
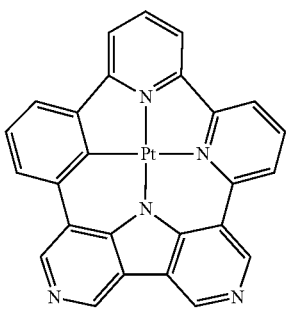
71
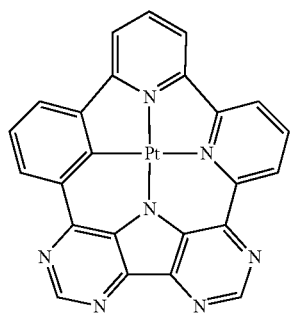
72
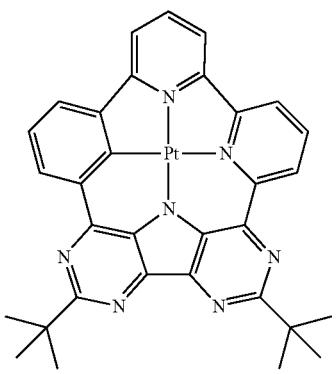

-continued
73
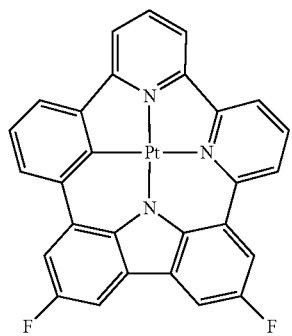
74
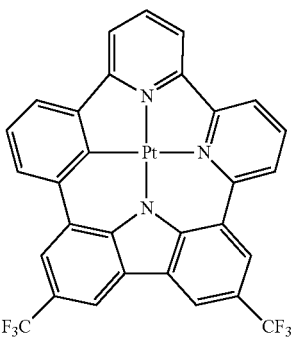
75
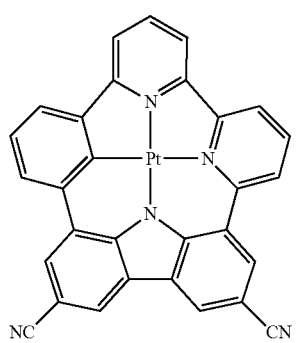
76
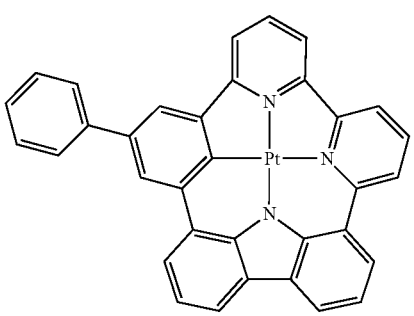
77
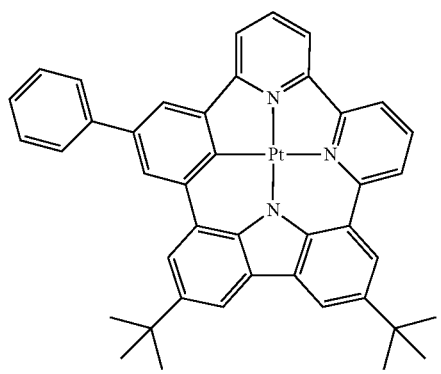
78
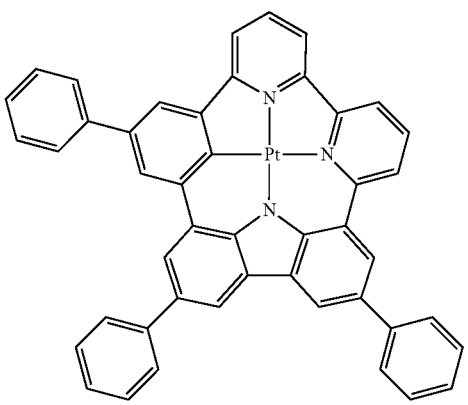
79
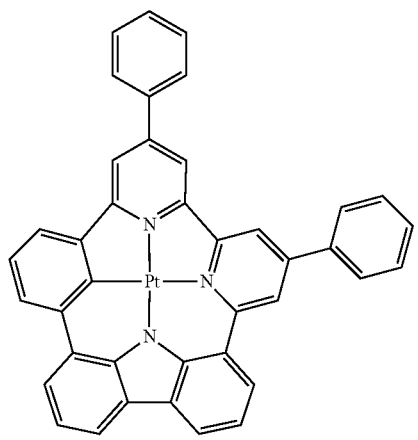
80
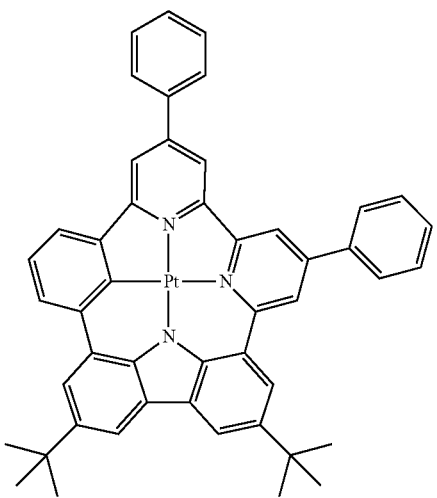

-continued
81
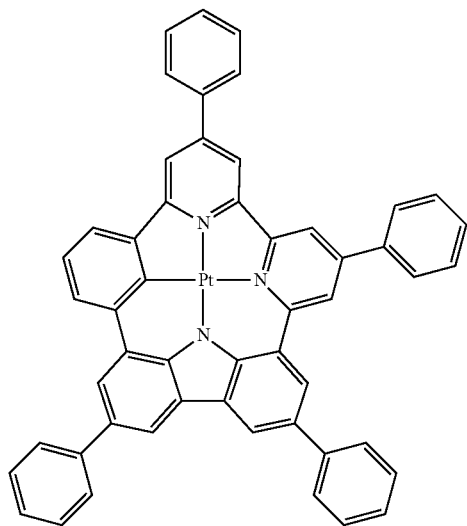
82
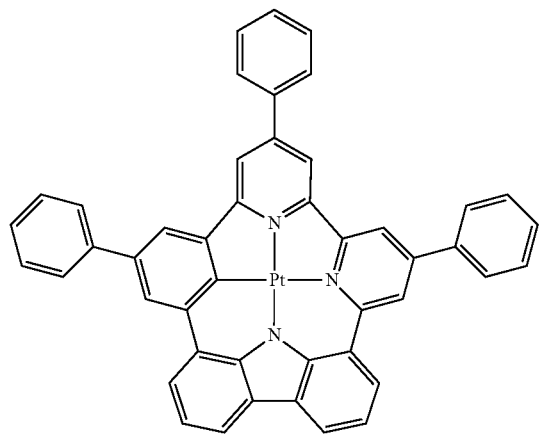
83
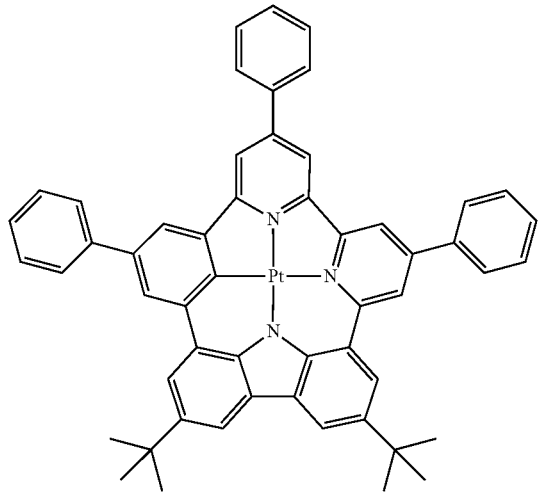
84
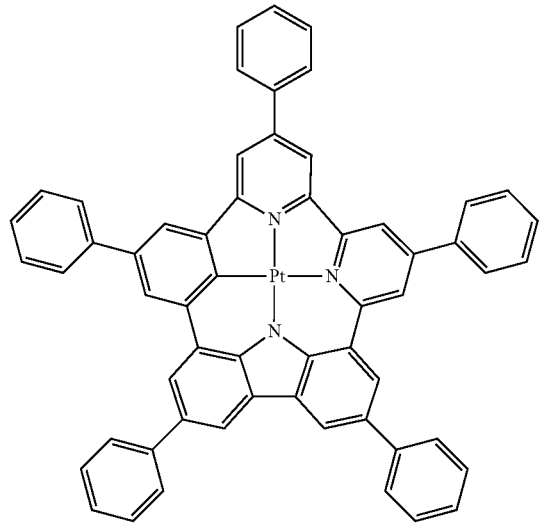
85
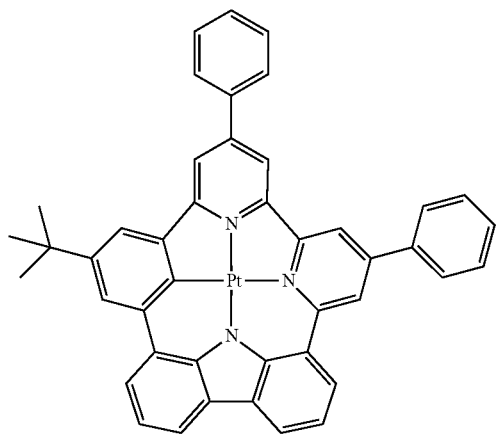
86
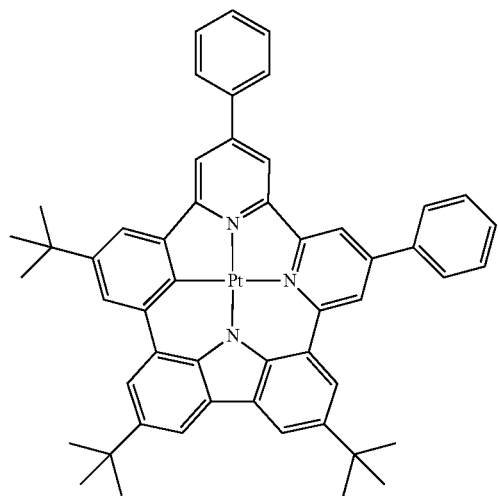

-continued
87
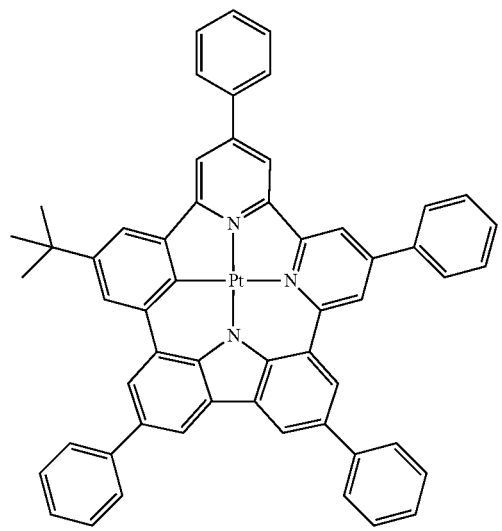
88
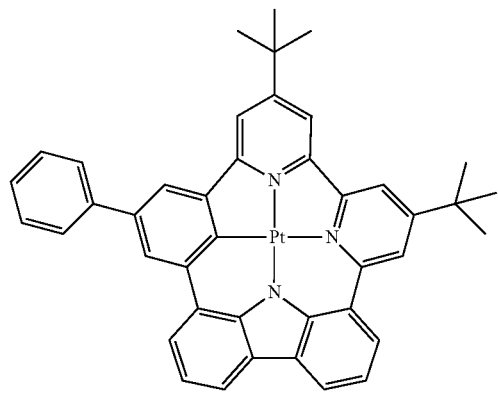
89
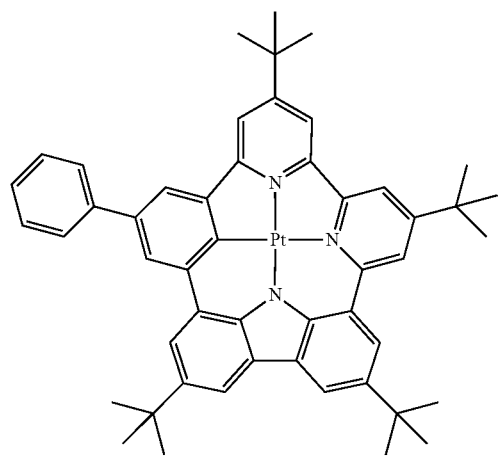
90
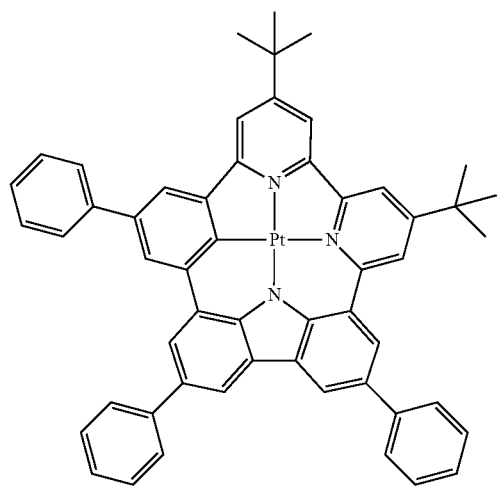
91
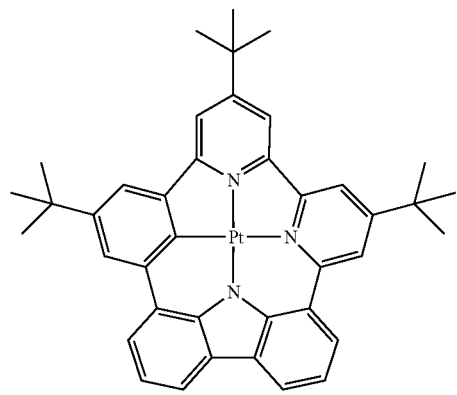
92
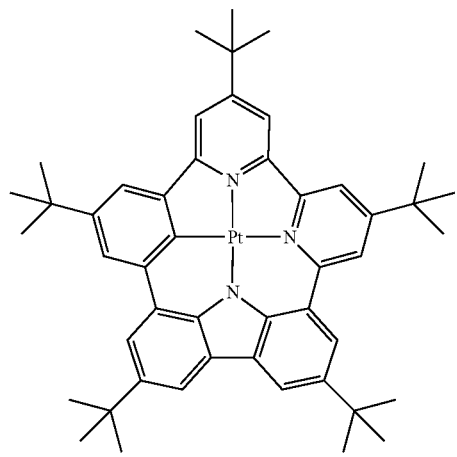

-continued
93
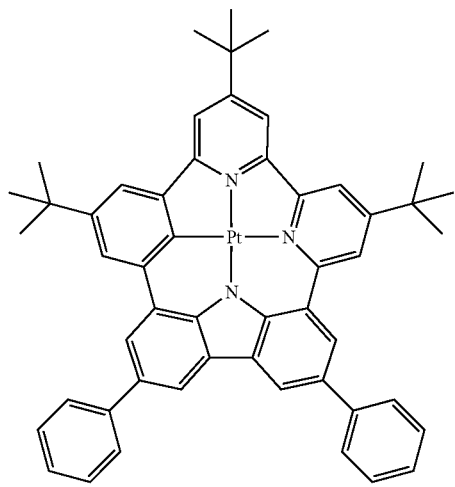
94
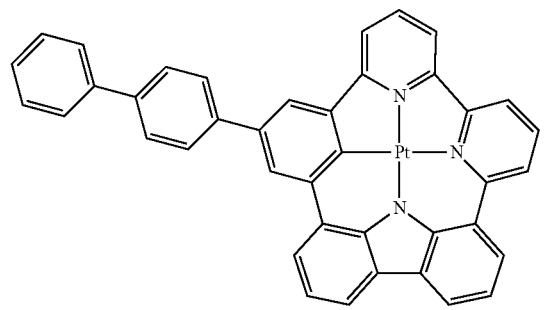
95
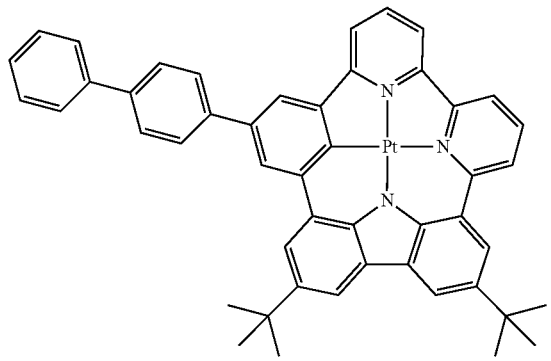
96
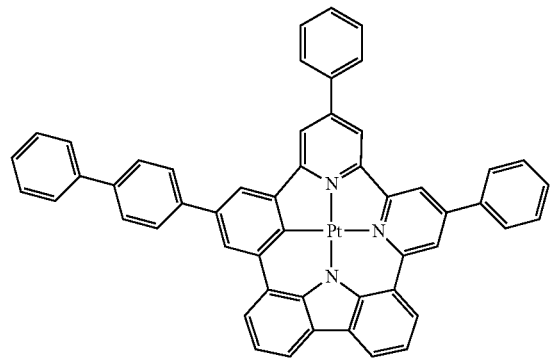
97
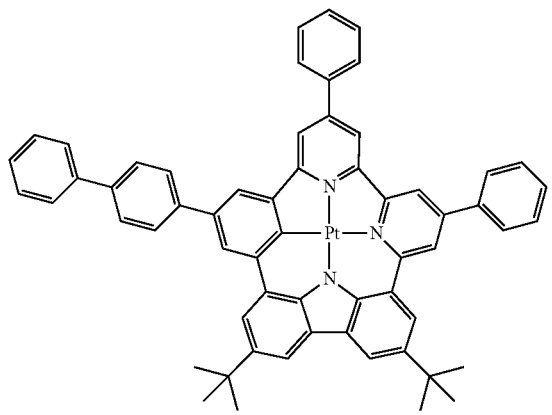
98
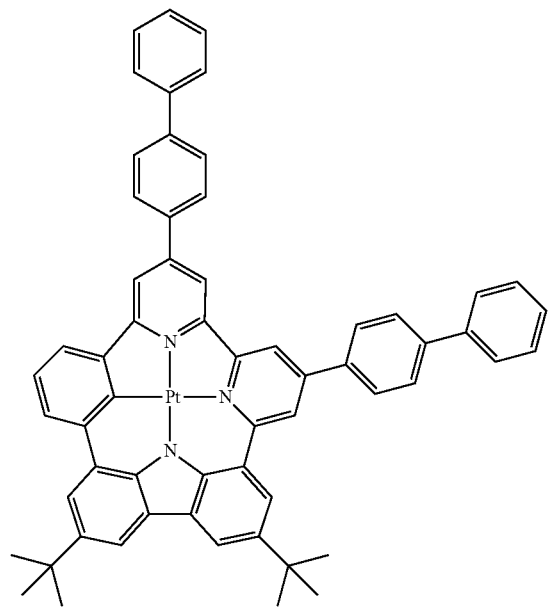

99
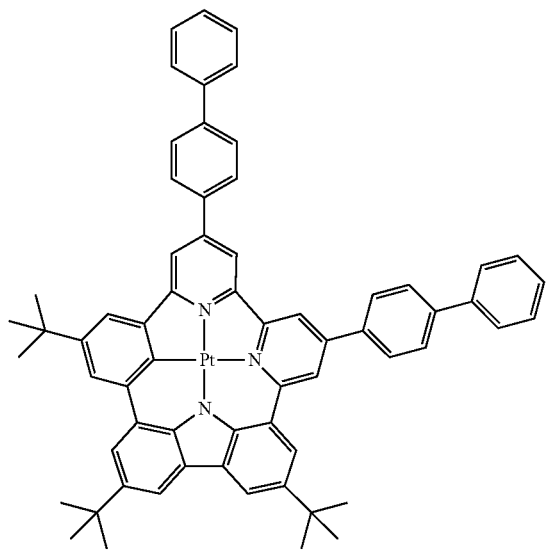
100
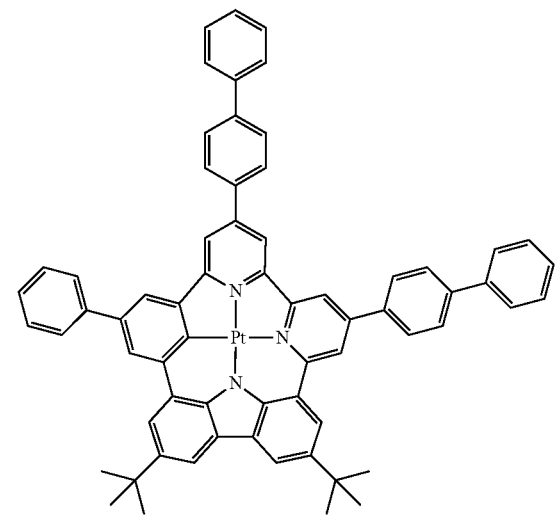
101
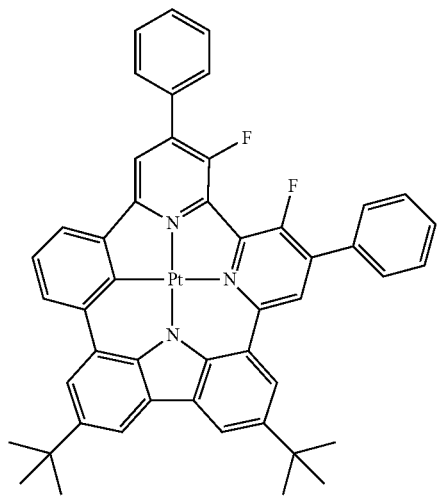
102
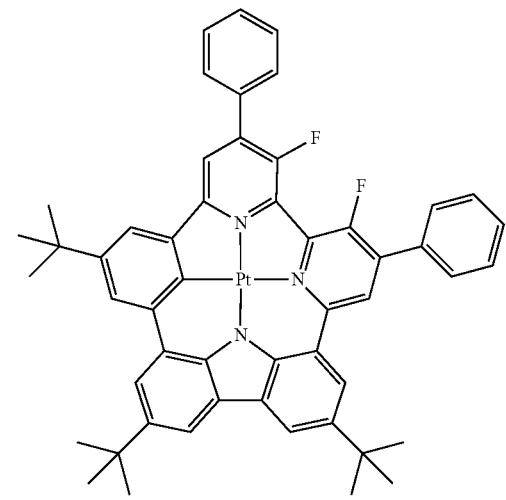
103
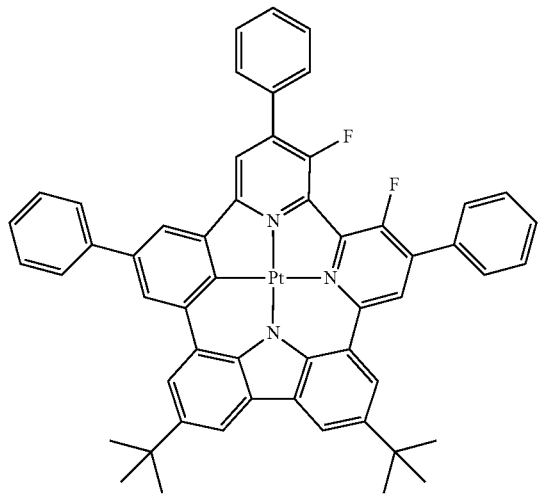
104
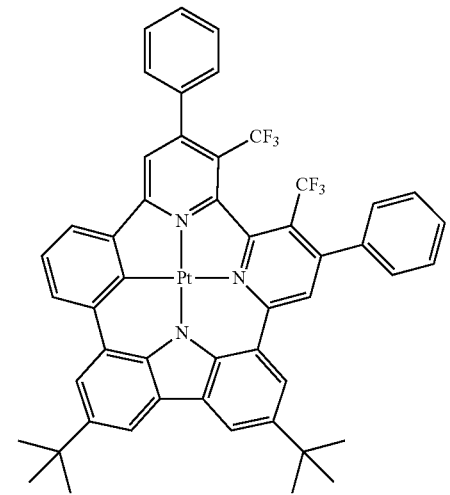

103                                      104
-continued
105                                      106
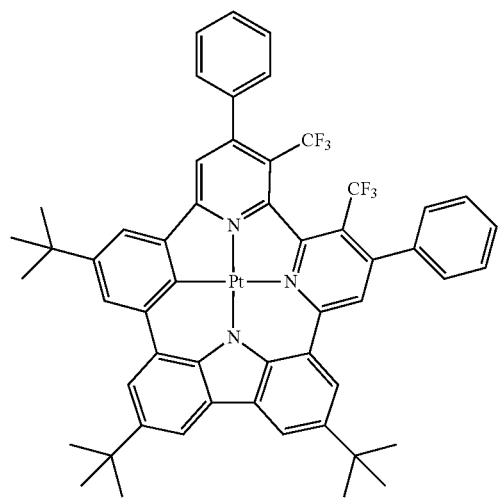            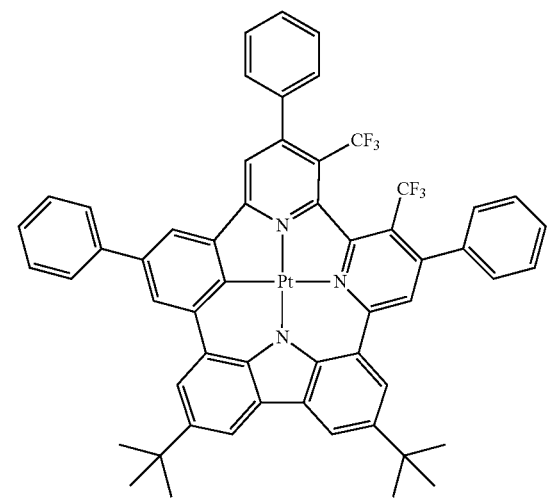
107                                      108
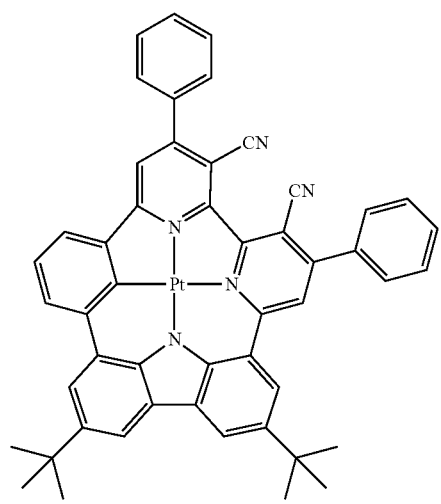            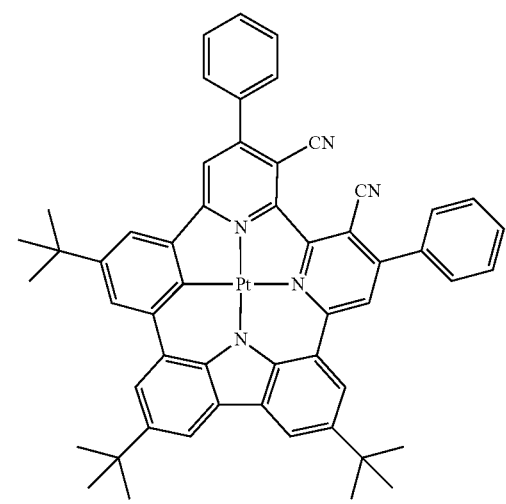
109                                      110
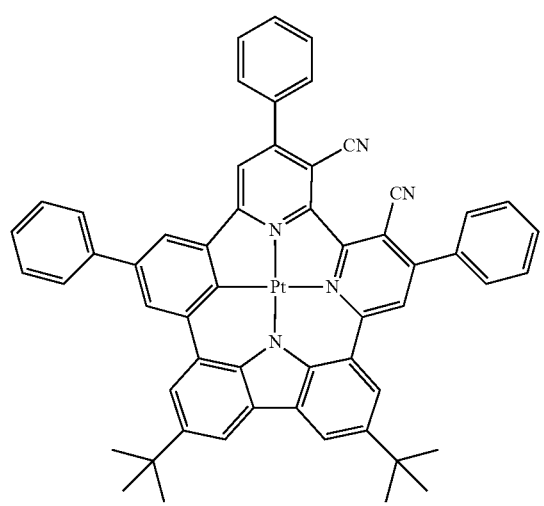            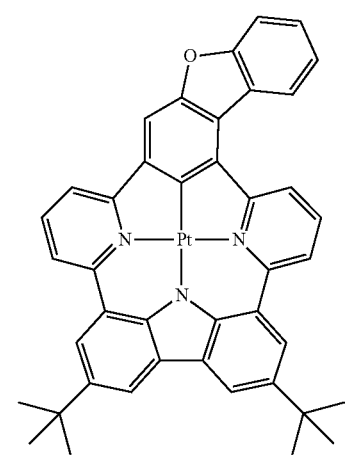

-continued
111
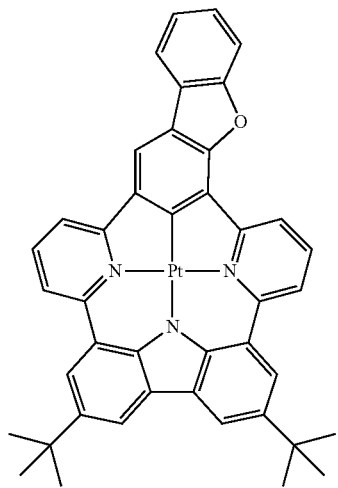
112
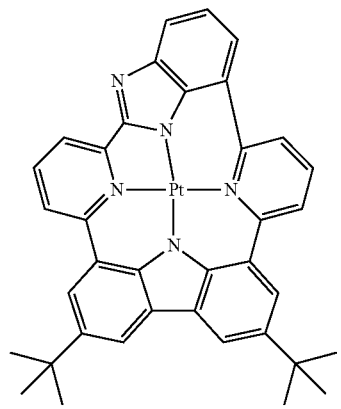
113
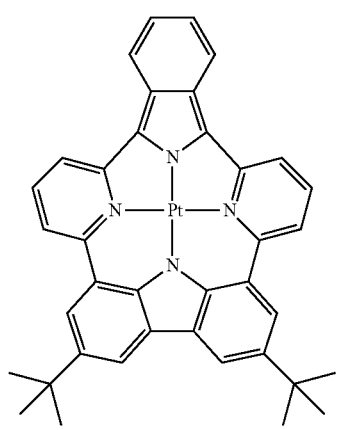
114
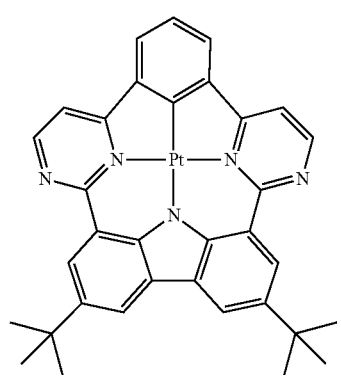
115
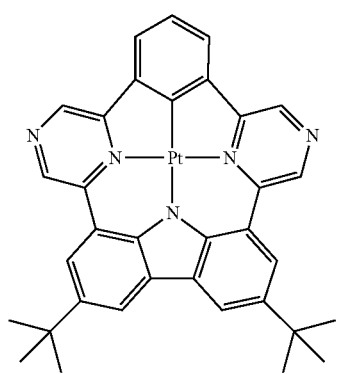
116
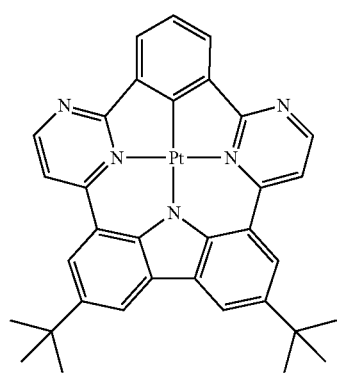

117
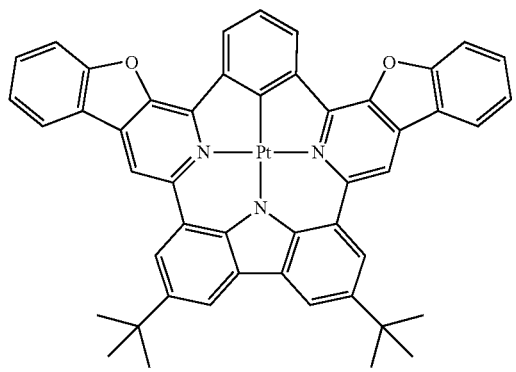

118
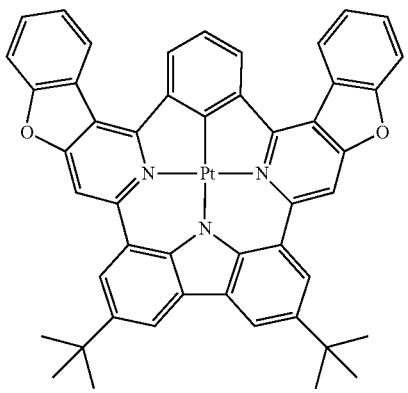

119
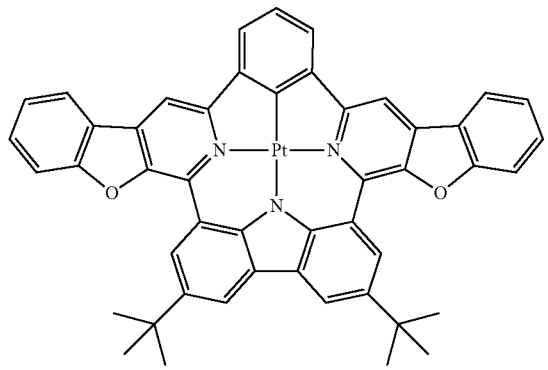

120
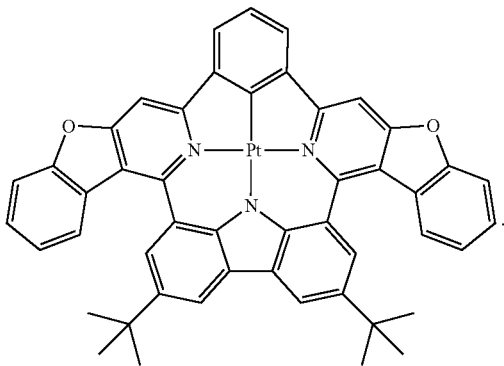

The organometallic compound represented by Formula 1 has an emission wavelength that is easily adjustable according to a type of a substituent, and has electrical characteristics (for example, a highest occupied molecular orbital (HOMO) energy level, a lowest unoccupied molecular orbital (LUMO) energy level, a triplet ($T_1$) energy level, or the like) suitable for use in an electronic device, for example, an organic light-emitting device. Thus, an electronic device, for example, an organic light-emitting device, which includes the organometallic compound, may have excellent emission efficiency, lifespan, and/or roll-off ratio characteristics.

For example, a HOMO energy level, a LUMO energy level, and a triplet ($T_1$) energy level of some Compounds and Compound A were evaluated by a density functional theory (DFT) of a Gaussian program (B3LYP, structurally optimized at a level of 6-31G(d,p)). Evaluation results thereof are shown in Table 1.

TABLE 1

| Compound No. | HOMO (eV) | LUMO (eV) | $T_1$ energy level (eV) |
|---|---|---|---|
| 1 | −4.888 | −1.925 | 2.122 |
| 3 | −4.755 | −1.867 | 2.046 |
| 48 | −4.646 | −1.776 | 2.067 |
| 55 | −4.755 | −1.857 | 2.046 |
| 61 | −5.082 | −2.275 | 1.997 |
| 66 | −4.567 | −2.137 | 1.633 |
| A | −4.418 | −1.584 | 1.971 |

TABLE 1-continued

| Compound No. | HOMO (eV) | LUMO (eV) | $T_1$ energy level (eV) |
|---|---|---|---|

A

Referring to Table 1, it has been confirmed that the organometallic compound represented by Formula 1 has such electrical characteristics that are suitable for use in an electronic device, for example, for use as a dopant for an organic light-emitting device. For example, it is confirmed that the organometallic compound represented by Formula 1 has a relatively low LUMO energy level (that is, a large absolute value of a LUMO energy level).

Synthesis methods of the organometallic compound represented by Formula 1 may be recognizable by those of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is disposed between the first electrode and the second electrode, wherein the organic layer includes an emission layer and at least one organometallic compound represented by Formula 1.

The organic light-emitting device may have, due to the inclusion of an organic layer including the organometallic compound represented by Formula 1, low driving voltage, high light emission efficiency, high quantum light emission efficiency, and low roll-off ratios.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression "(an organic layer) includes at least one organometallic compound" as used herein may include an embodiment in which "(an organic layer) includes identical compounds represented by Formula 1" and an embodiment in which "(an organic layer) includes two or more different organometallic compounds represented by Formula 1."

For example, the organic layer may include, as the organometallic compound, only Compound 1. In this embodiment, Compound 1 may be included in an emission layer of the organic light-emitting device. In one or more embodiments, the organic layer may include, as the organometallic compound, Compound 1 and Compound 2. In this embodiment, Compound 1 and Compound 2 may be included in an identical layer (for example, Compound 1 and Compound 2 all may be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes a hole injection layer, a hole transport layer, an electron blocking layer, a buffer layer, or any combination thereof, and wherein the electron transport region includes a hole blocking layer, an electron transport layer, an electron injection layer, or any combination thereof.

The term "organic layer" as used herein refers to a single layer and/or a plurality of layers between the first electrode and the second electrode of the organic light-emitting device. The "organic layer" may include, in addition to an organic compound, an organometallic complex including metal.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201 below, and a compound represented by Formula 202 below:

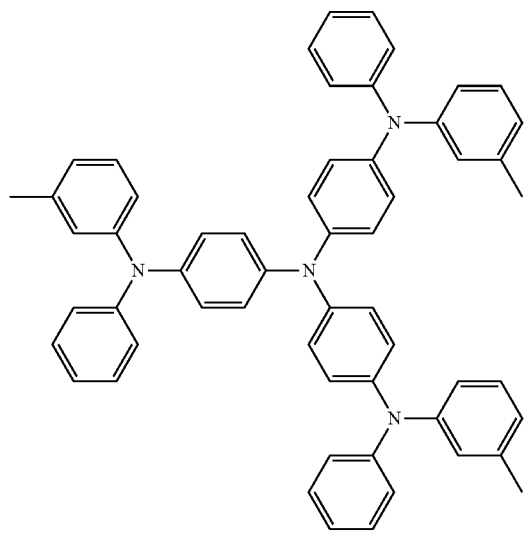

m-MTDATA

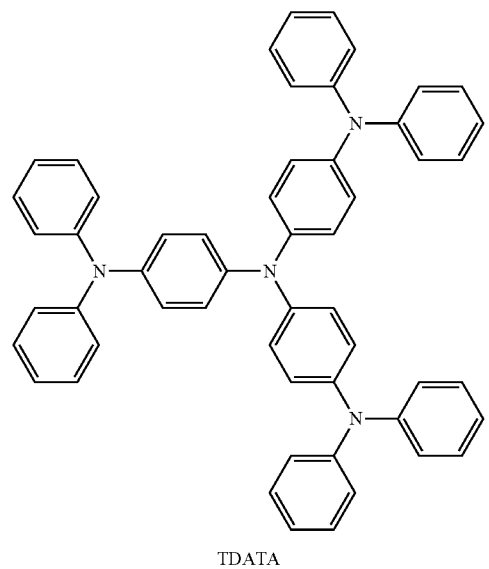

TDATA

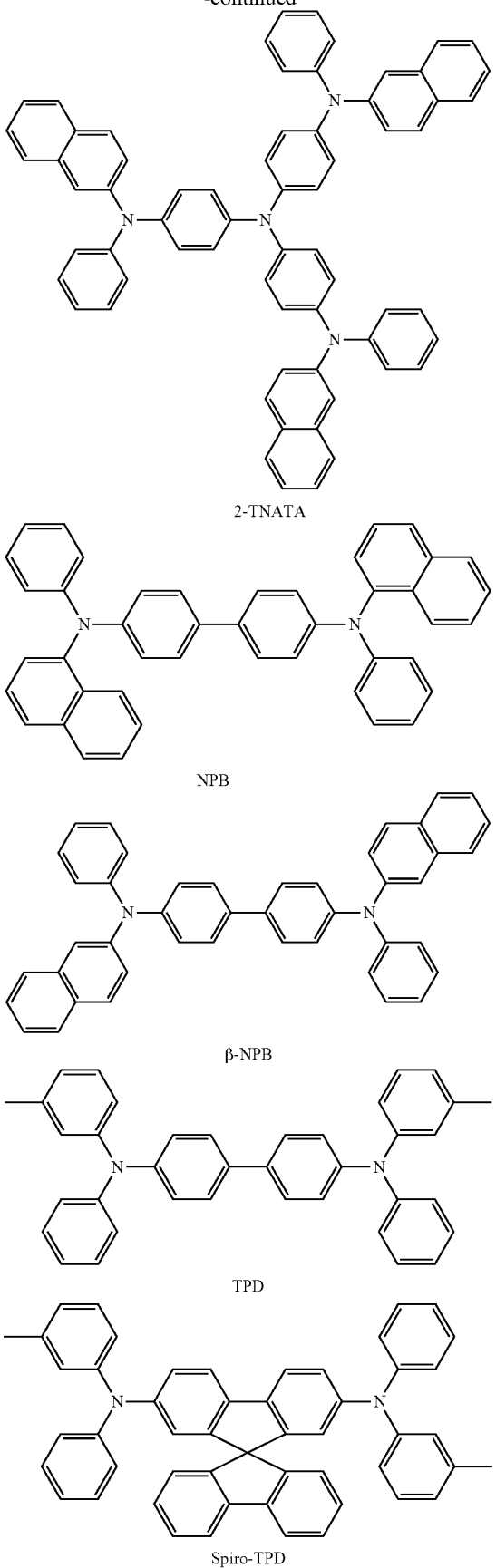

2-TNATA

NPB

β-NPB

TPD

Spiro-TPD

-continued

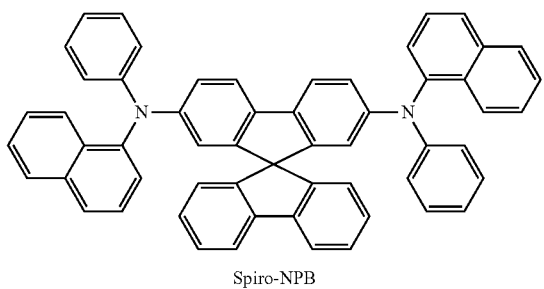

Spiro-NPB

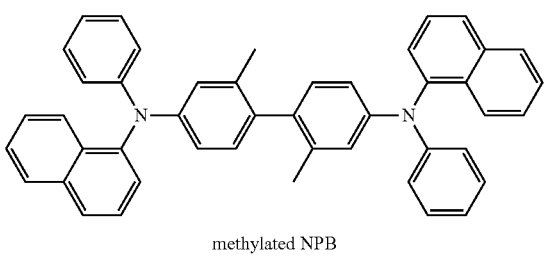

methylated NPB

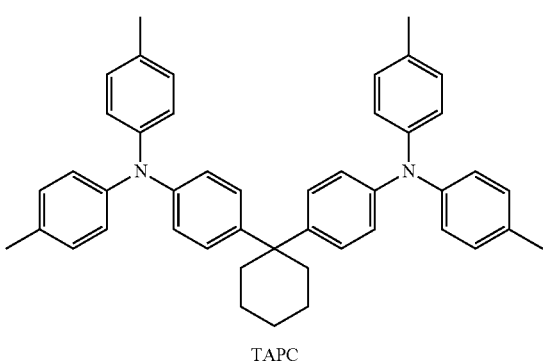

TAPC

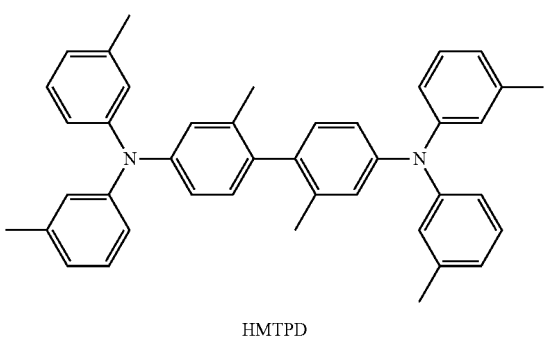

HMTPD

-continued

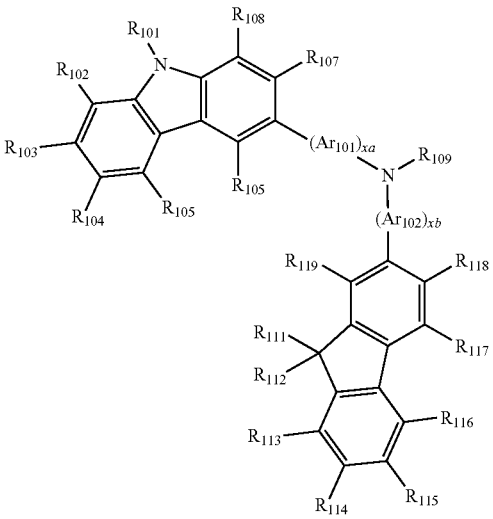

Formula 201

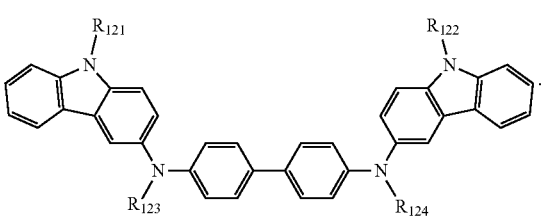

Formula 202

$Ar_{101}$, and $Ar_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

xa and xb in Formula 201 may each independently be an integer from 0 to 5, or may each independently be 0, 1, or 2. For example, xa may be 1, and xb may be 0, but embodiments of the present disclosure are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, and so on), and a $C_1$-$C_{10}$ alkoxy group (for example, a methoxy group, an ethoxy group, a propoxy group, a butoxy group, a pentoxy group, and so on);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A below, but embodiments of the present disclosure are not limited thereto:

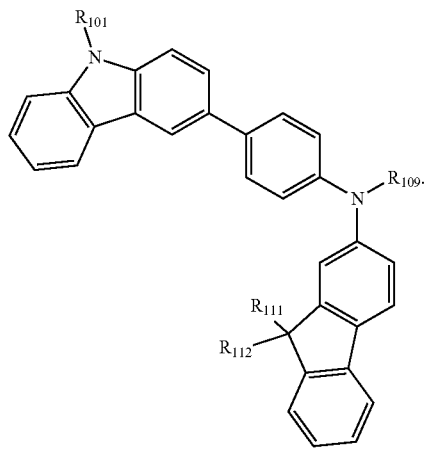

Formula 201A $R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but embodiments of the present disclosure are not limited thereto:

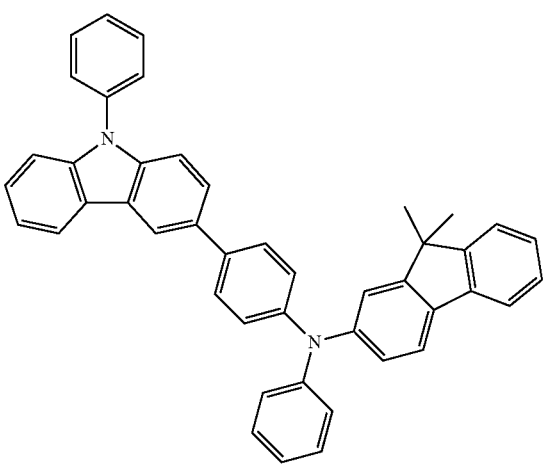

HT1

HT2
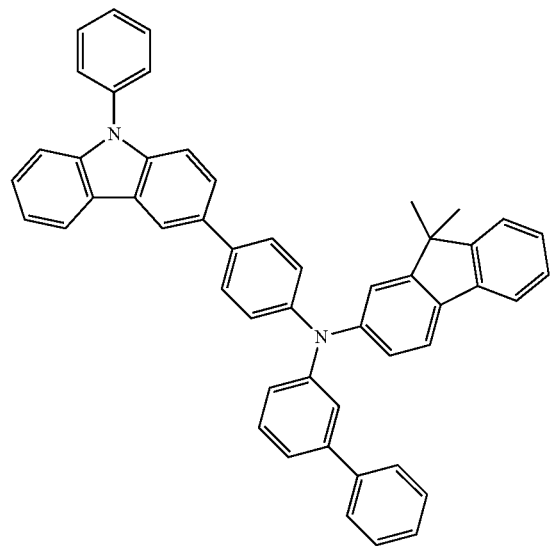
HT4
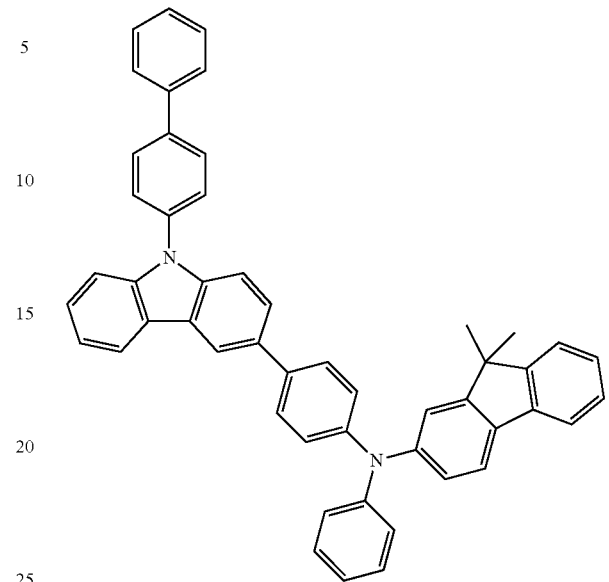
HT3
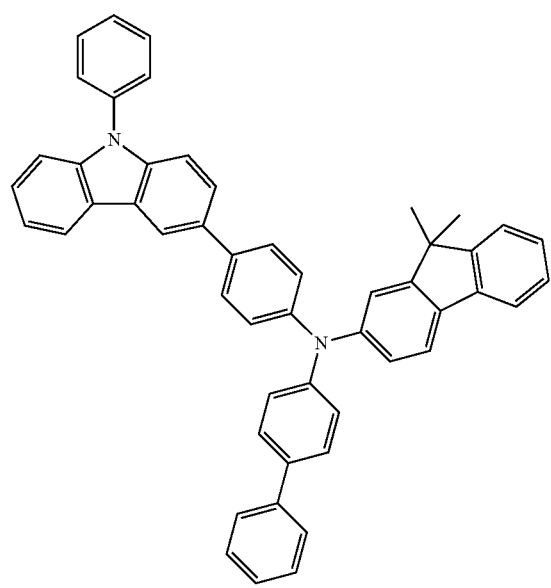
HT5
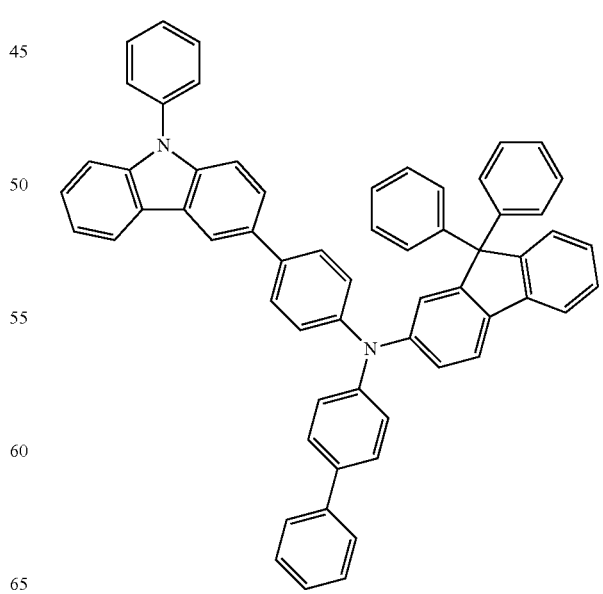

HT6
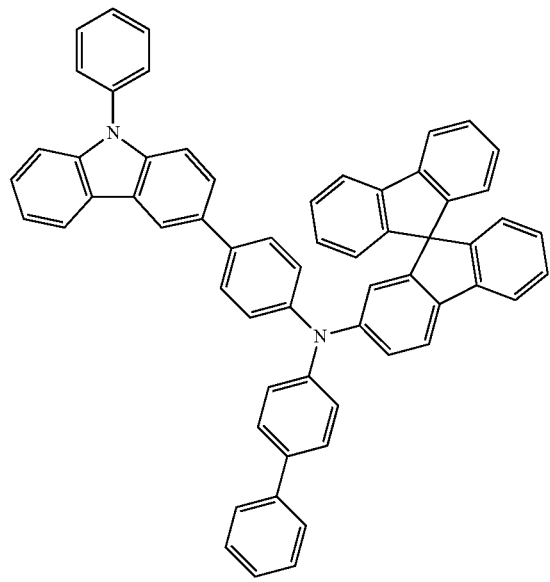
HT7
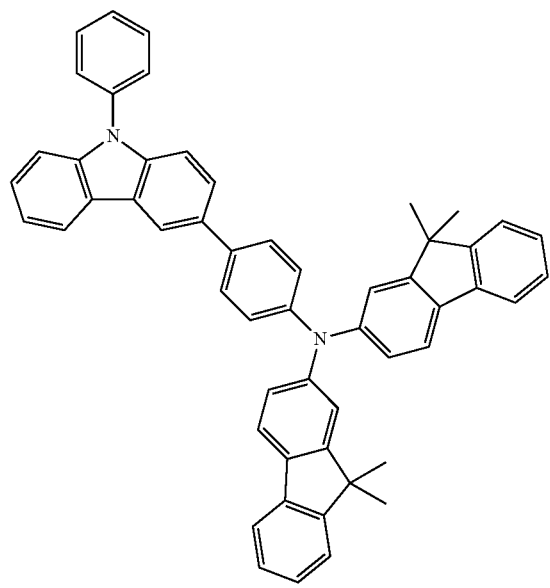
HT8
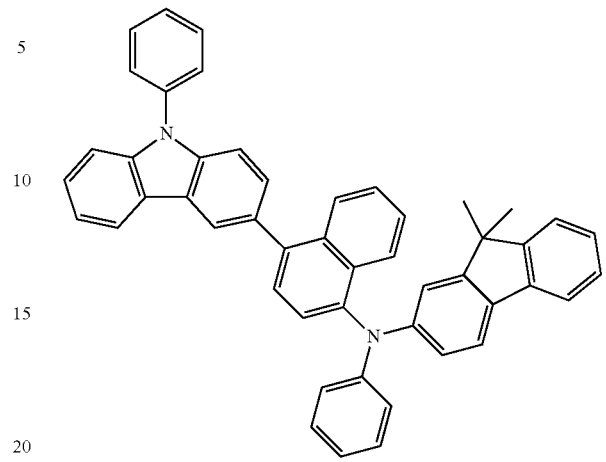
HT9
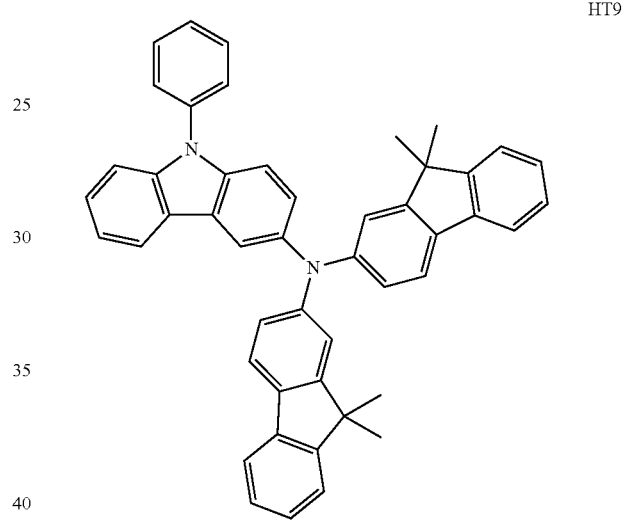
HT10
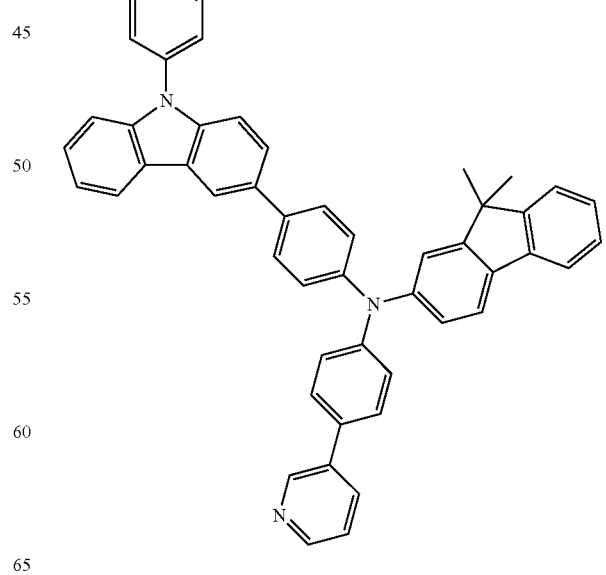

HT11
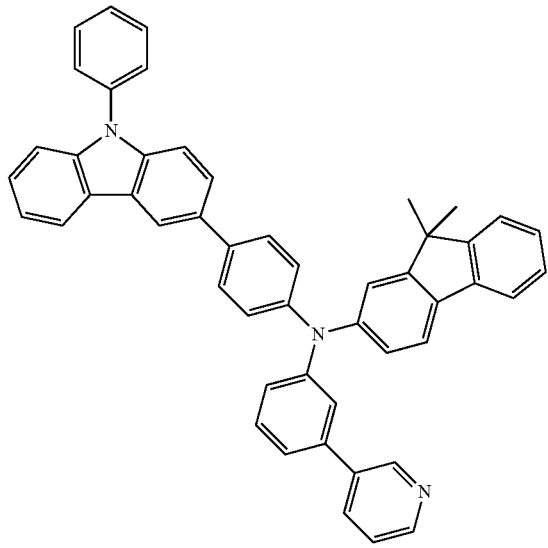
HT14
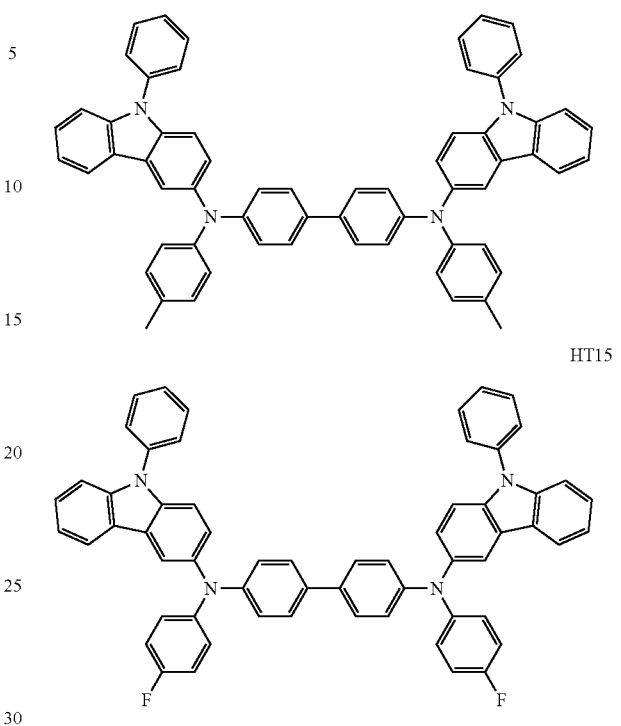
HT15
HT12
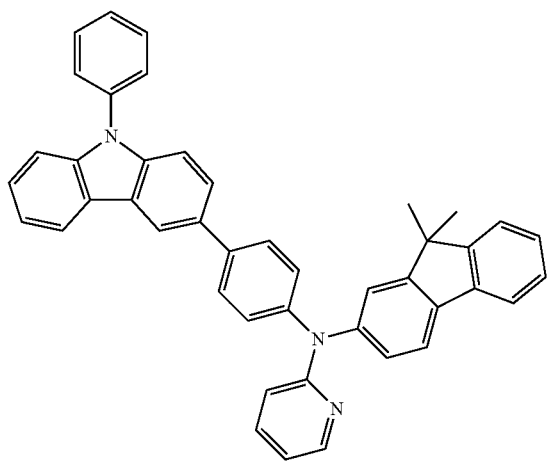
HT16
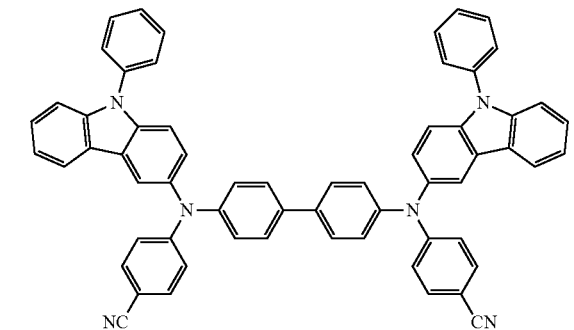
HT13
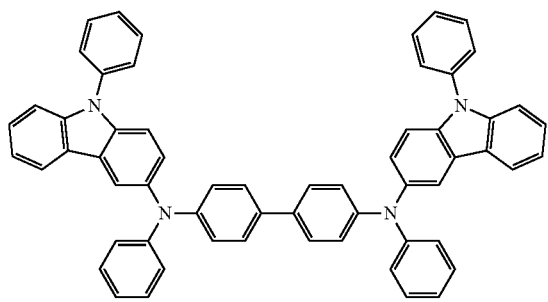
HT17
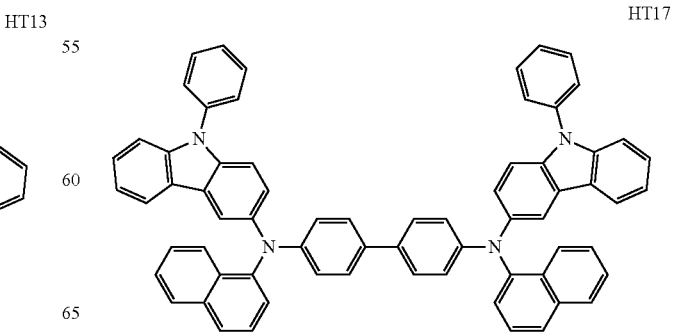

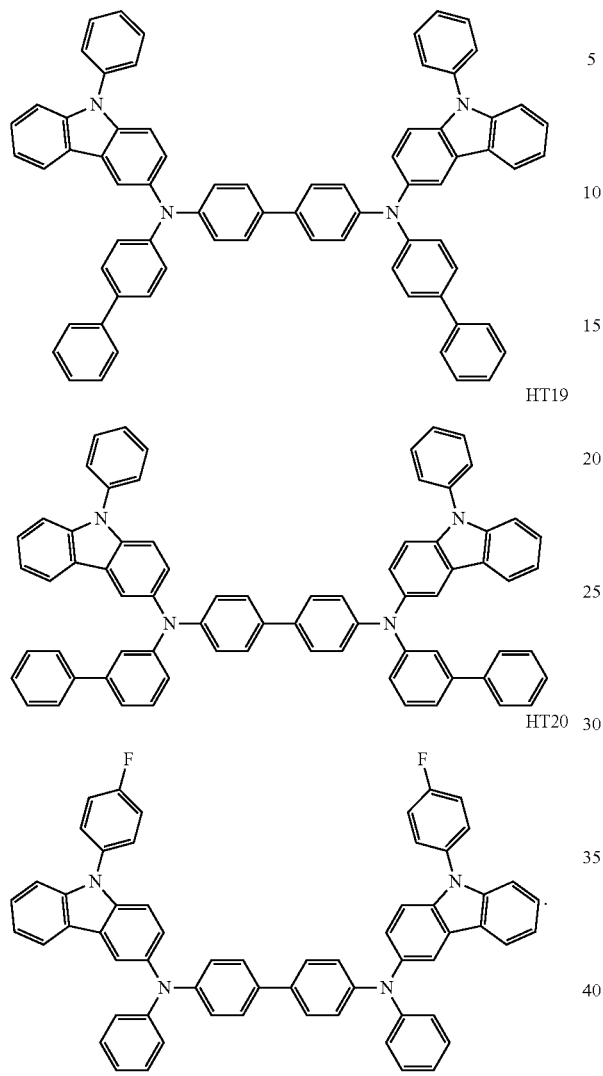

HT18

HT19

HT20

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto:

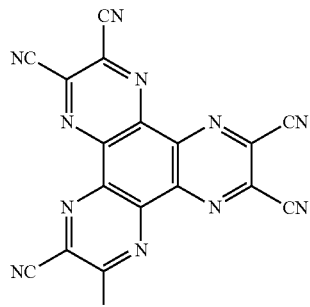

Compound HT-D1

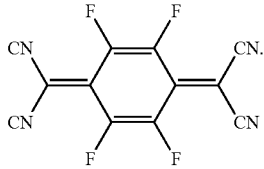

F4-TCNQ

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1 or the composition containing the organometallic compound described above.

The host may include at least one selected from TPBi, TBADN, ADN (also referred to as "DNA"), CBP, CDBP, TCP, mCP, Compound H50, Compound H51, and Compound H52:

TPBi
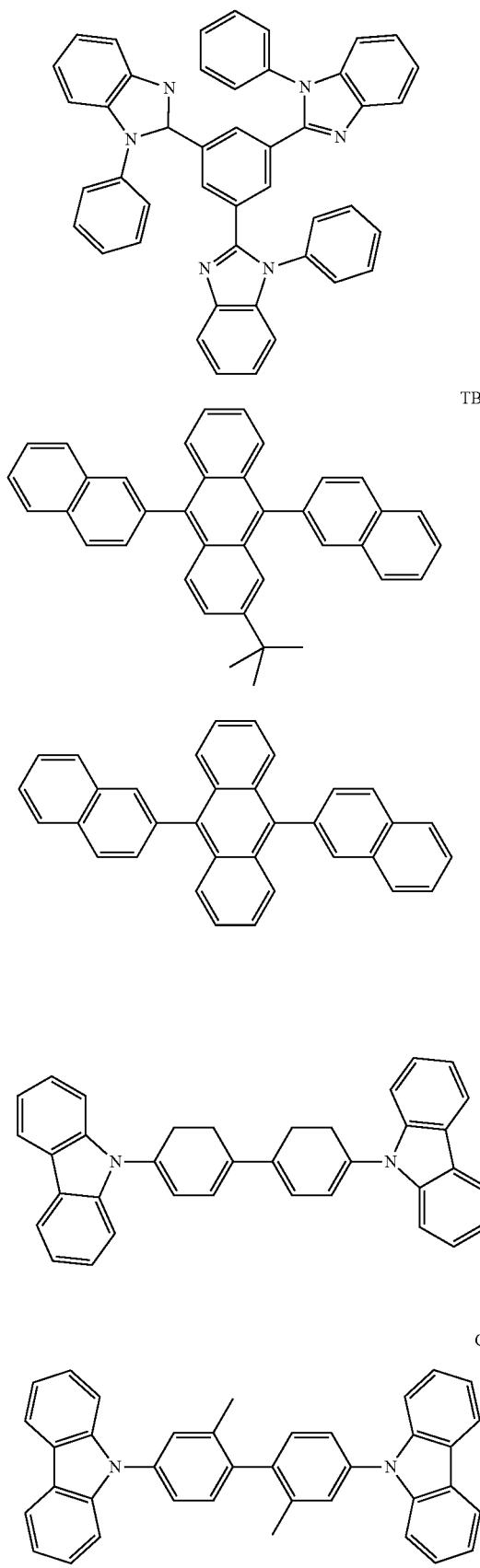
TBADN
ADN
CBP
CDBP
TCP
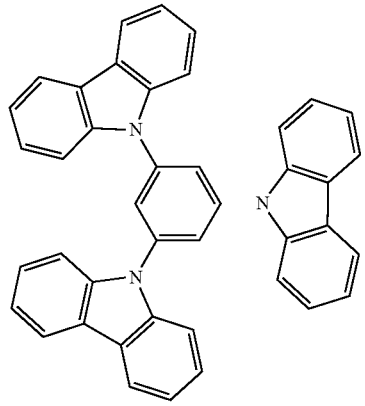
mCP
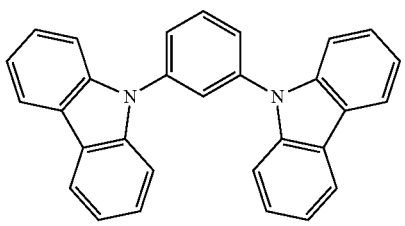
Compound H50
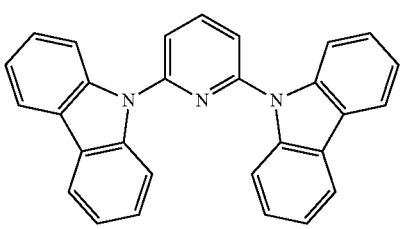
Compound H51
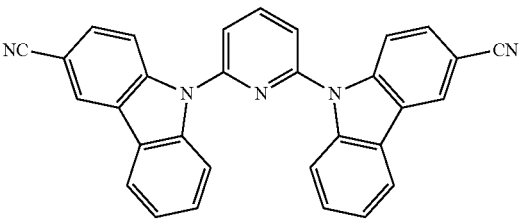
Compound H52
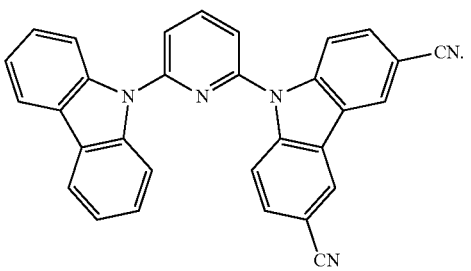
In one or more embodiments, the host may further include a compound represented by Formula 301 below:

Formula 301

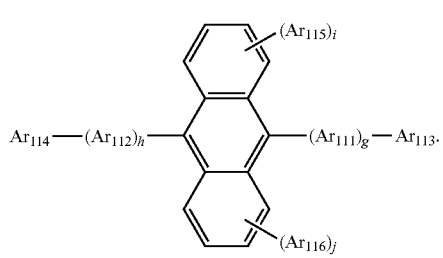

Ar$_{111}$ and Ar$_{112}$ in Formula 301 may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

Ar$_{113}$ to Ar$_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, l, and j in Formula 301 may each independently be an integer from 0 to 4, for example, 0, 1, or 2.

Ar$_{113}$ to Ar$_{116}$ in Formula 301 may each independently be selected from:

a $C_1$-$C_{10}$ alkyl group substituted with at least one selected from a phenyl group, a naphthyl group, and an anthracenyl group;

a phenyl group, a naphthyl group, an anthracenyl group, a pyrenyl group, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

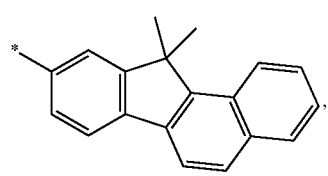 [SMILES: *c1ccc2c(c1)C(C)(C)c1c-2ccc2ccccc12]

but embodiments of the present disclosure are not limited thereto.

In one or more embodiments, the host may include a compound represented by Formula 302 below:

Formula 302

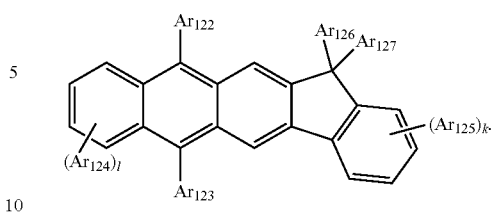

Ar$_{122}$ to Ar$_{125}$ in Formula 302 are the same as described in detail in connection with Ar$_{113}$ in Formula 301.

Ar$_{126}$ and Ar$_{127}$ in Formula 302 may each independently be a $C_1$-$C_{10}$ alkyl group (for example, a methyl group, an ethyl group, or a propyl group).

k and l in Formula 302 may each independently be an integer from 0 to 4. For example, k and l may be 0, 1, or 2.

The compound represented by Formula 301 and the compound represented by Formula 302 may include Compounds H1 to H42 illustrated below, but are not limited thereto:

H1

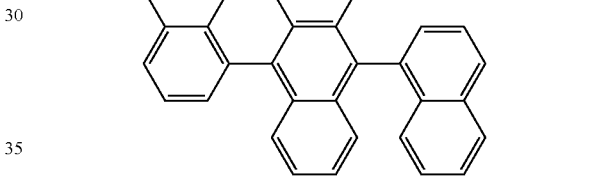

H2

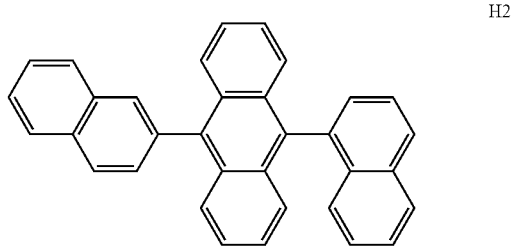

H3

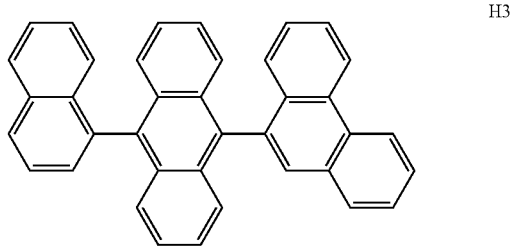

H4

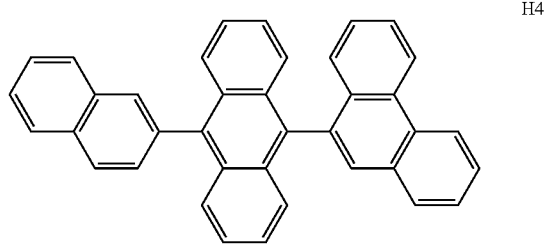

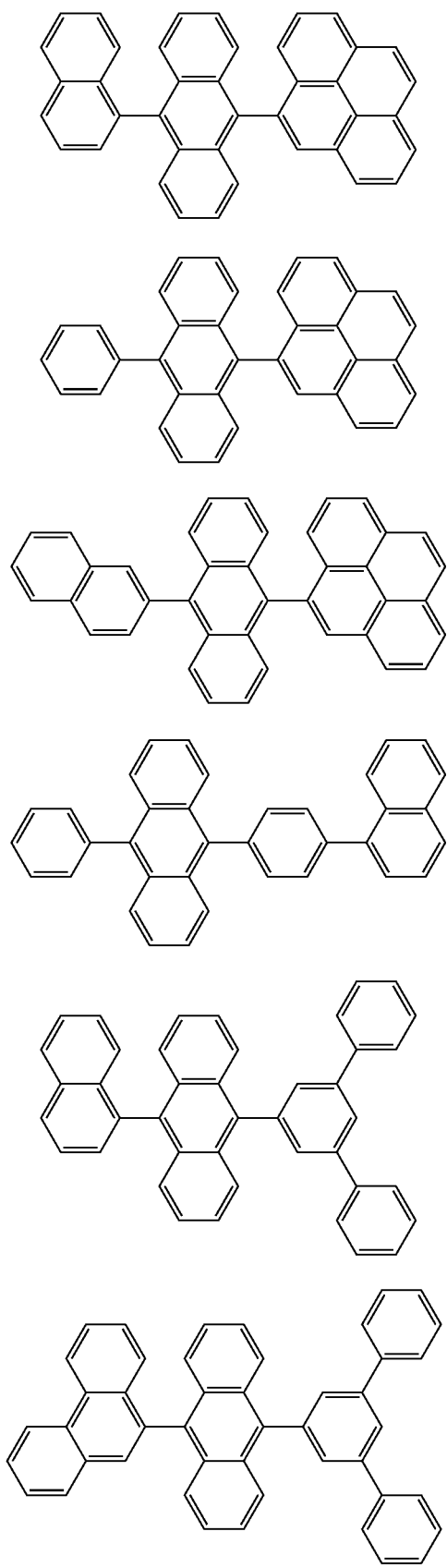
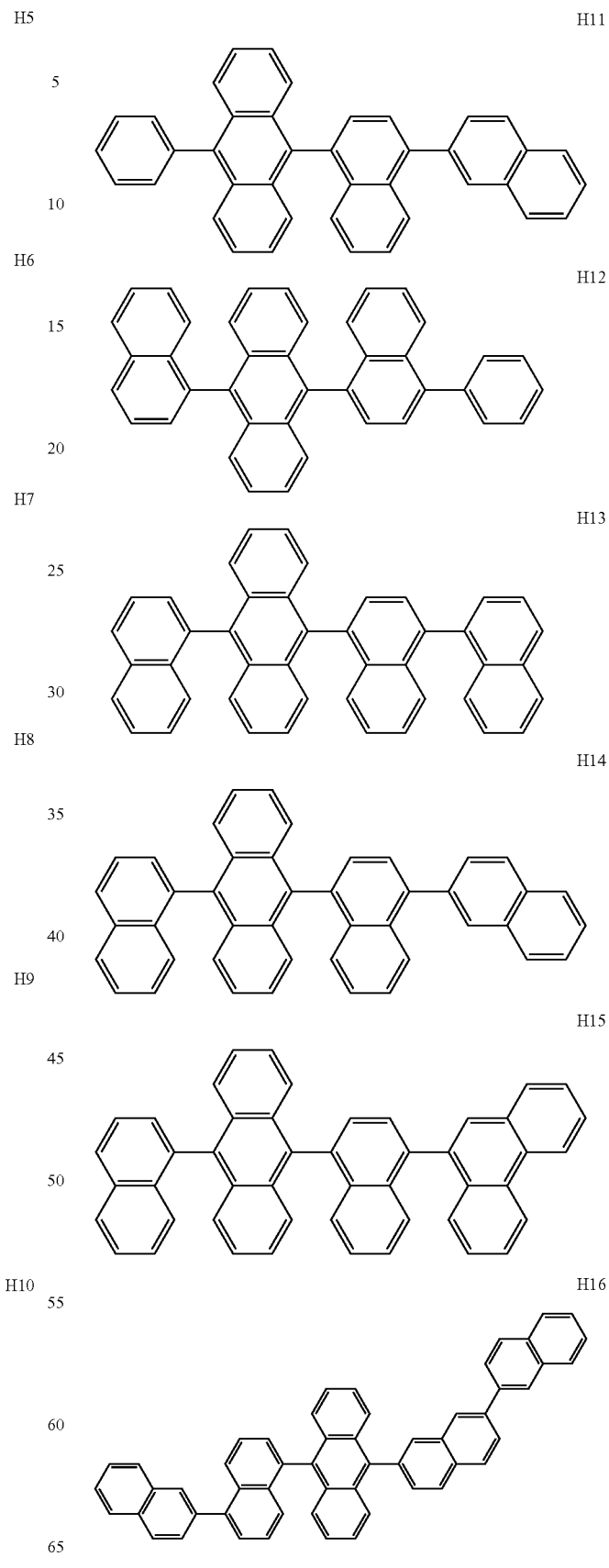

H17
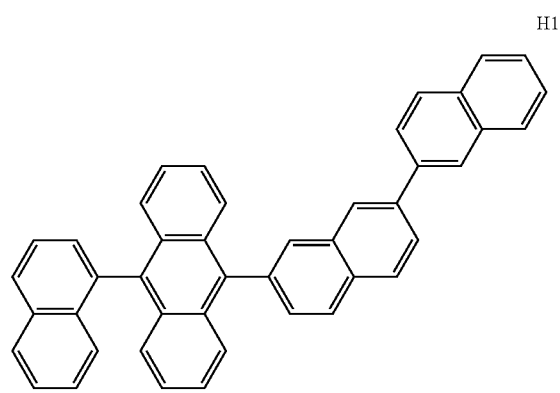
H18
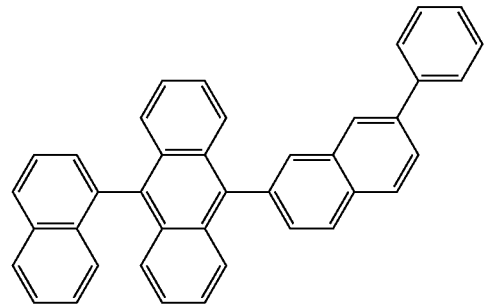
H19
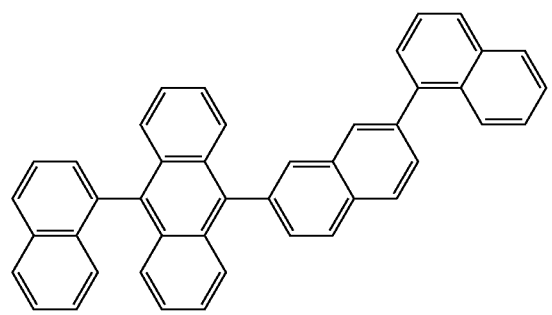
H20
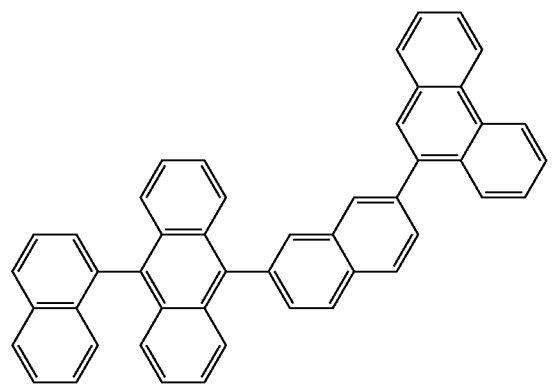
H21
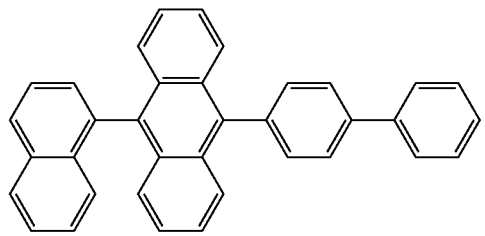
H22
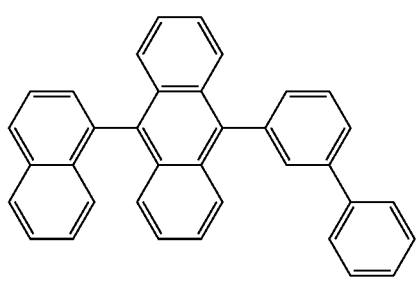
H23
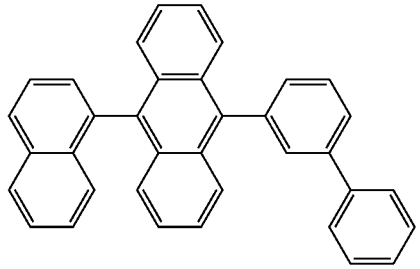
H24
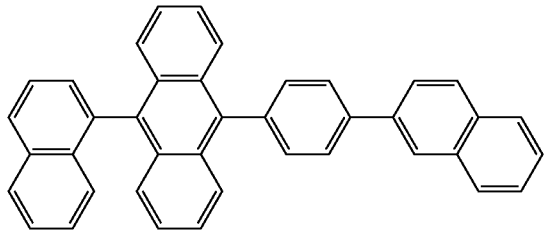
H25
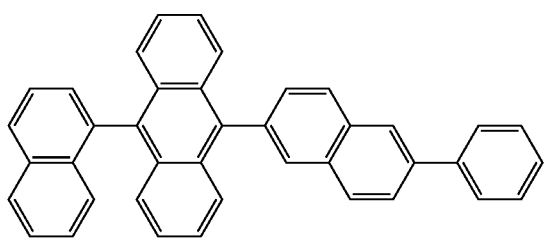
H26
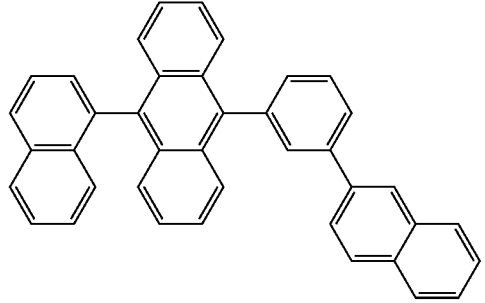

H27
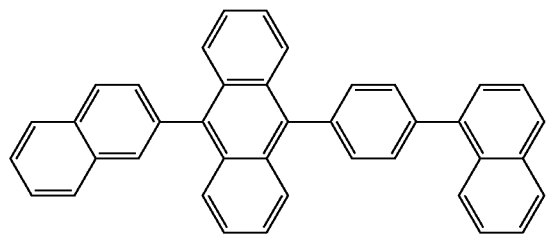
H28
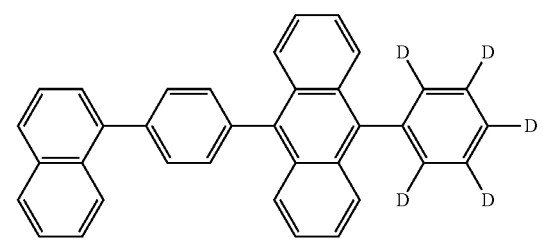
H29
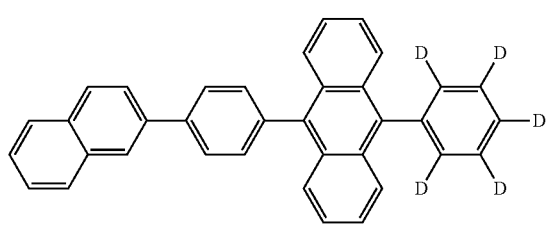
H30
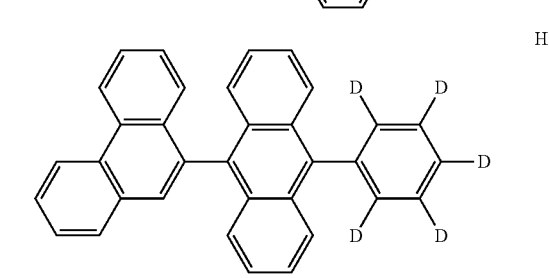
H31
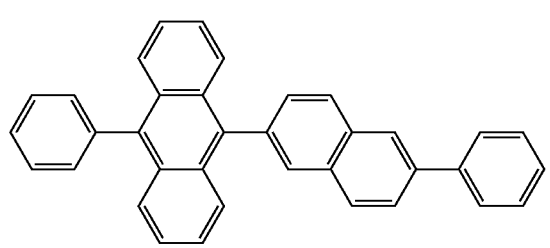
H32
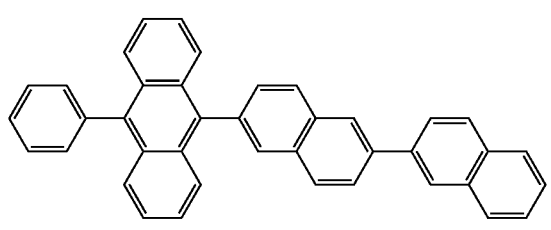
H33
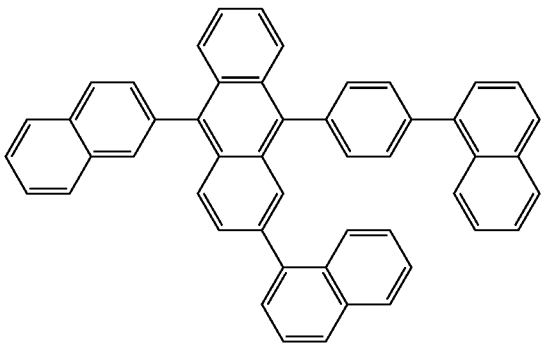
H34
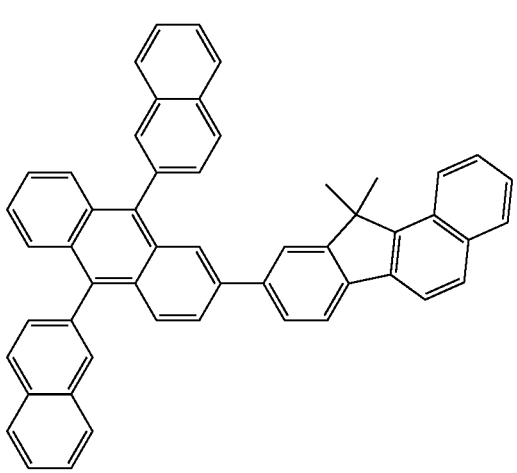
H35
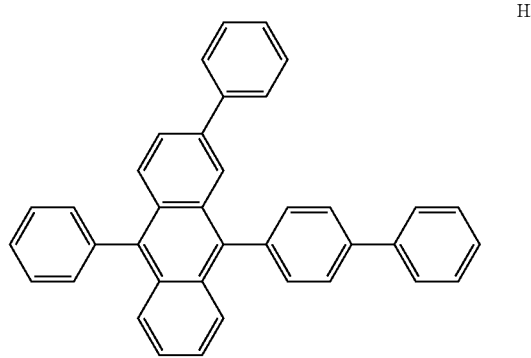

135
-continued
H36
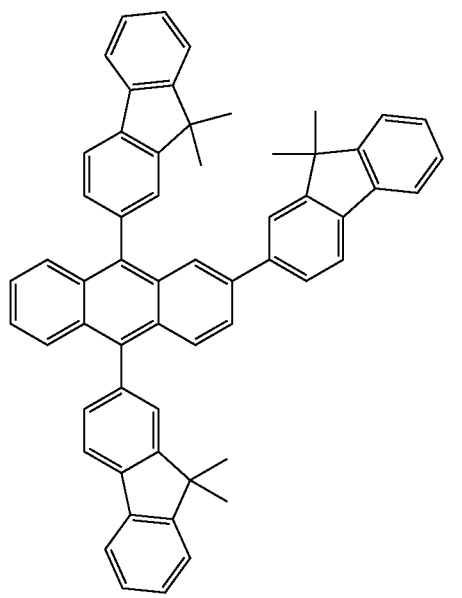
H37
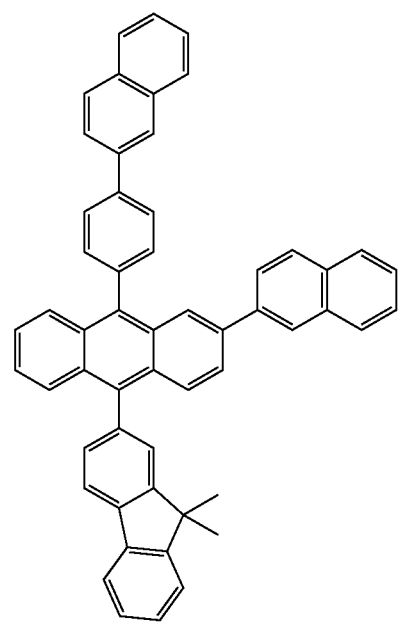
H38
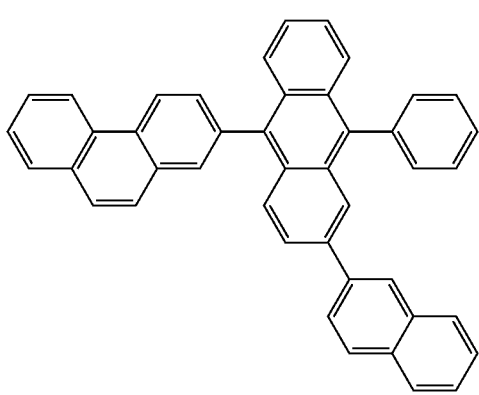
136
-continued
H39
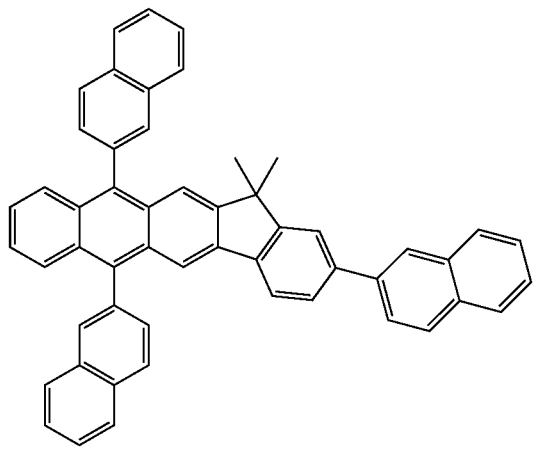
H40
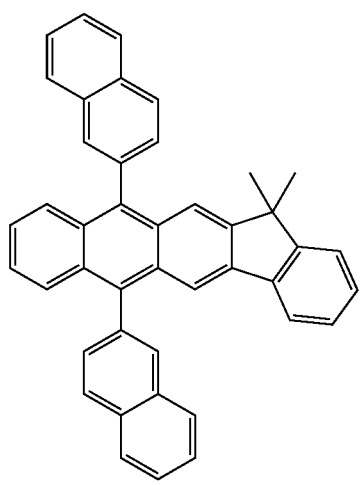
H41
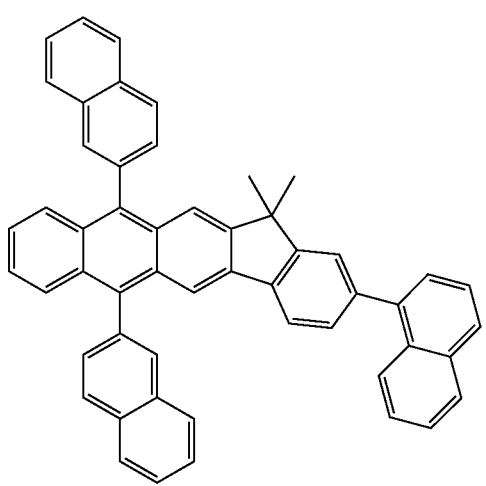

H42

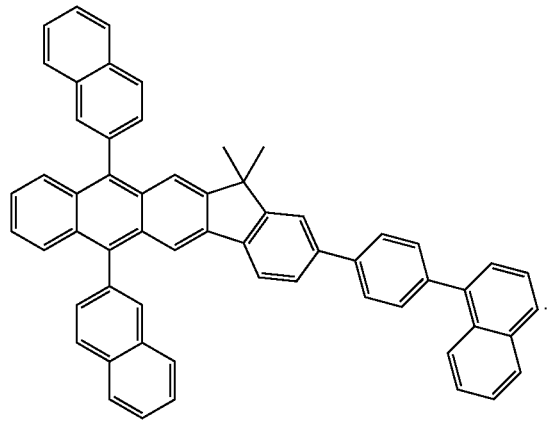

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto:

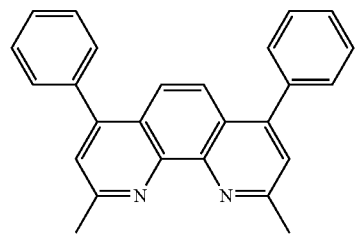

BCP

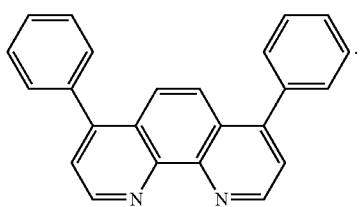

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have excellent hole blocking characteristics without a substantial increase in driving voltage.

The electron transport layer may include at least one selected from BCP, Bphen, Alq$_3$, BAlq, TAZ, and NTAZ:

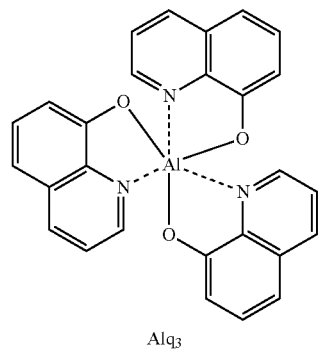

Alq$_3$

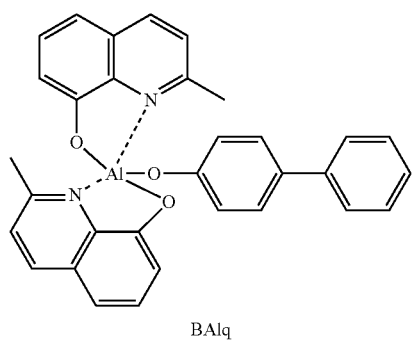

BAlq

-continued
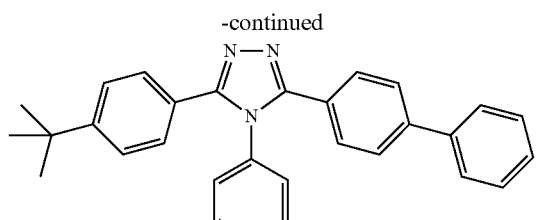
TAZ
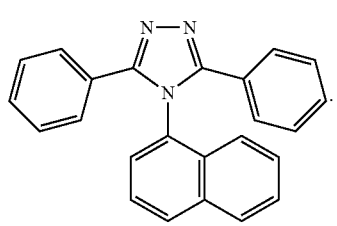
NTAZ
In one or more embodiments, the electron transport layer may include at least one of ET1 to ET25, but are not limited thereto:
ET1
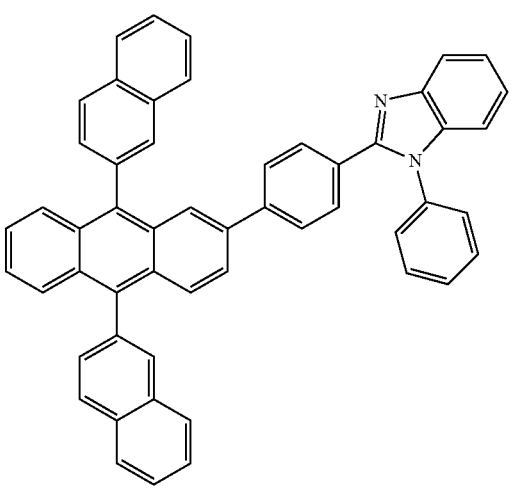
ET2
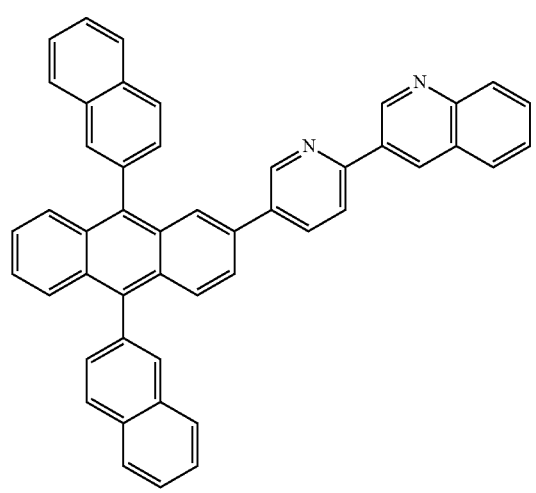
-continued
ET3
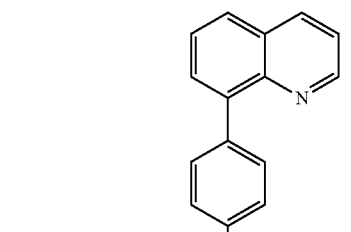
ET4
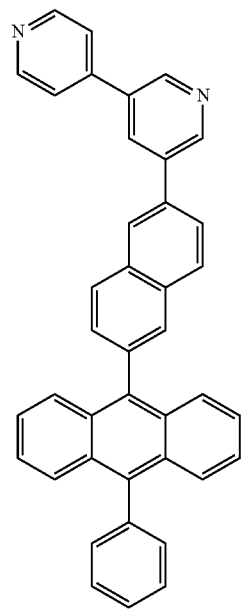
ET5
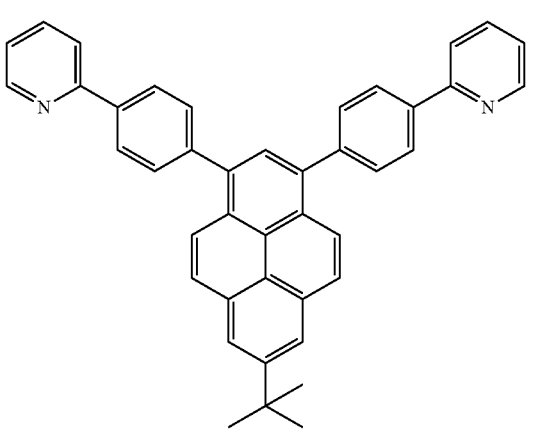

ET6
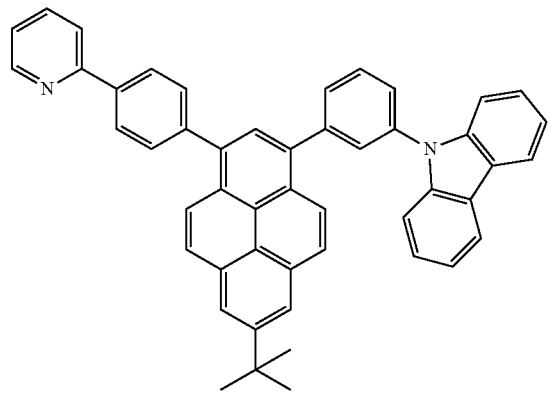
ET7
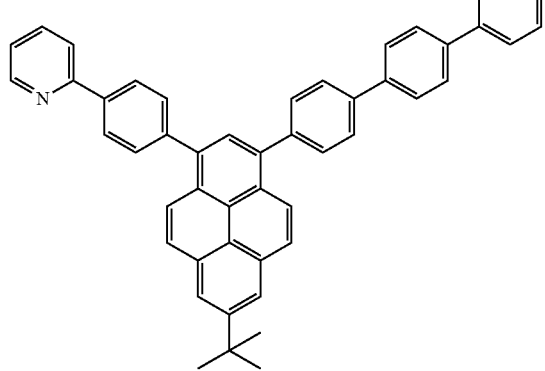
ET8
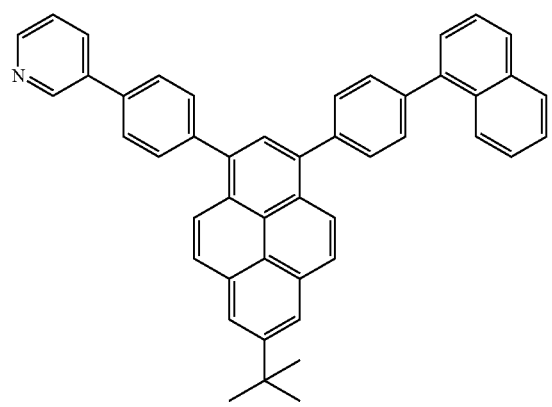
ET9
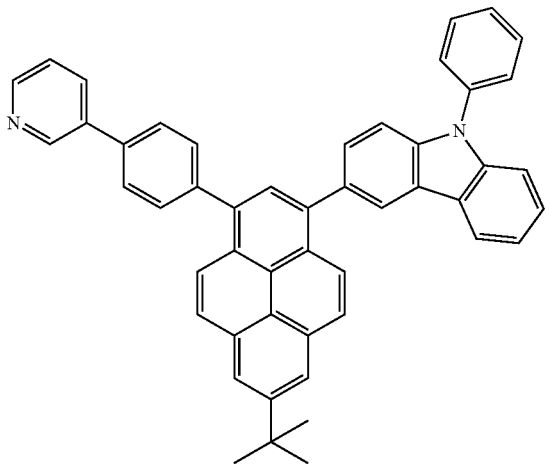
ET10
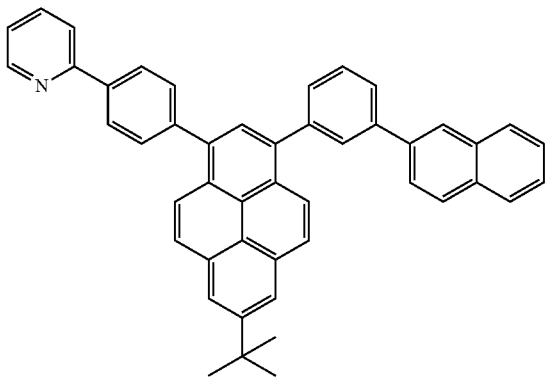
ET11
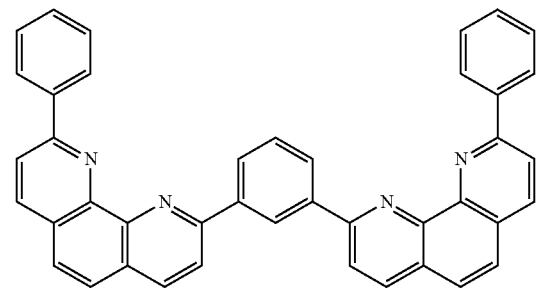
ET12

ET13
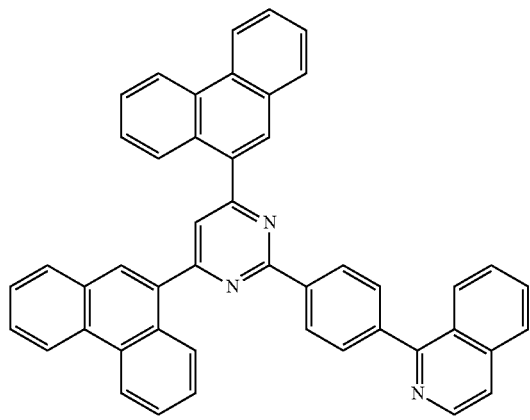
ET14
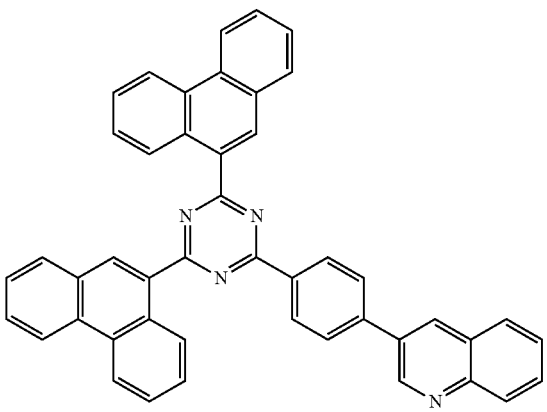
ET15
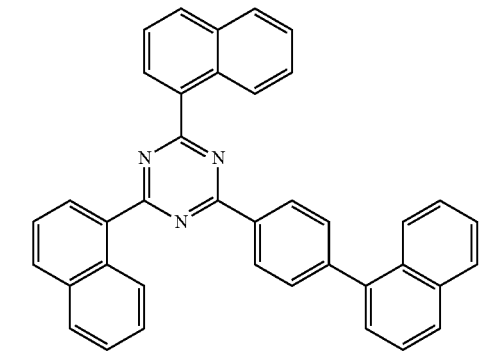
ET16
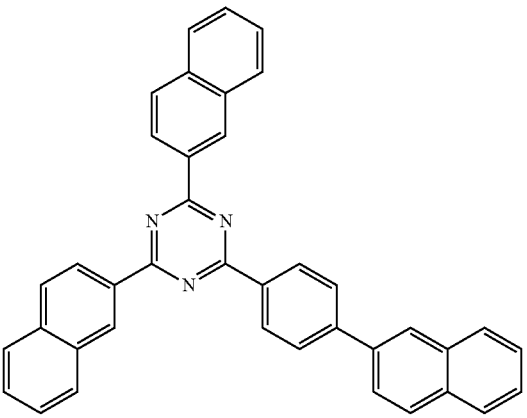
ET17
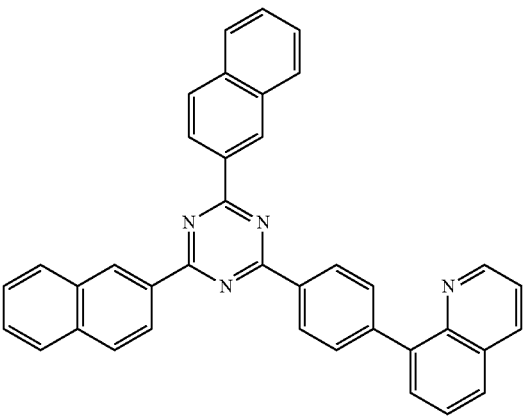
ET18
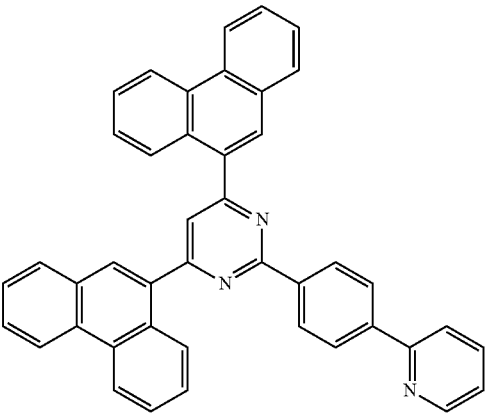

ET19
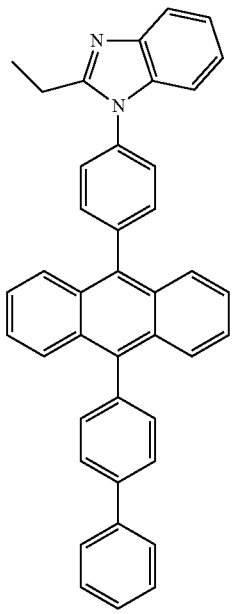
ET20
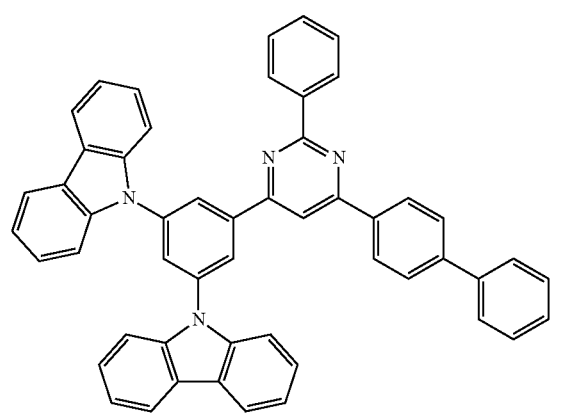
ET21
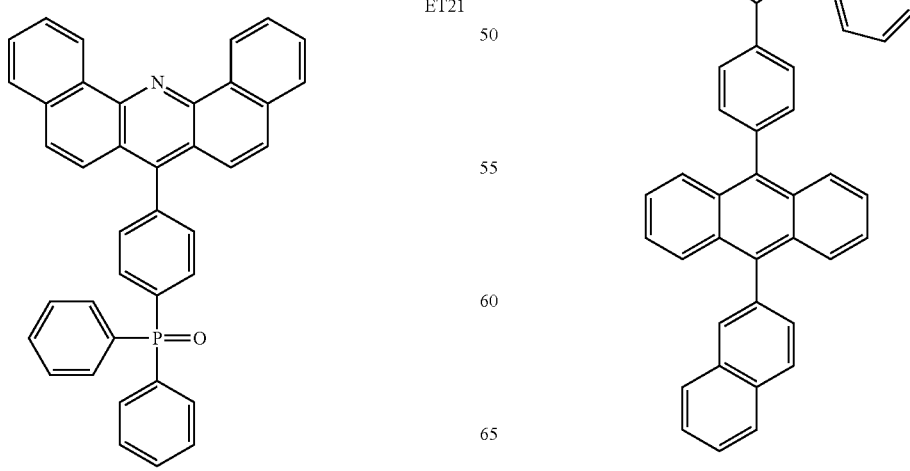
ET22
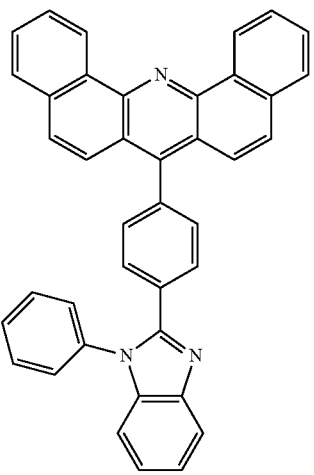
ET23
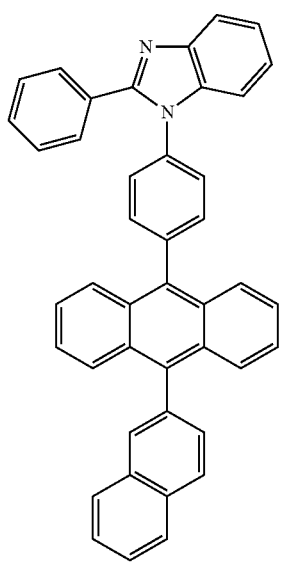
ET24

ET25

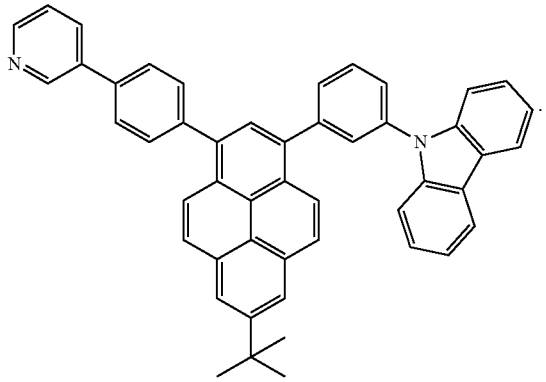

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2:

ET-D1

ET-D2

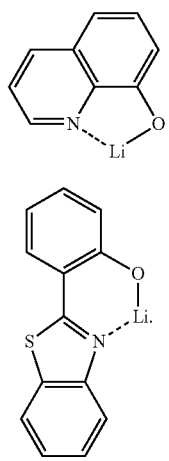

The electron transport region may include an electron injection layer that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, and, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

Another aspect provides a diagnostic composition including at least one organometallic compound represented by Formula 1.

The organometallic compound represented by Formula 1 provides high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent hydrocarbon monocyclic group that has 3 to 10 carbon atoms and at least one carbon-carbon double bond in the ring thereof and that has no aromaticity, and non-limiting examples thereof include a cyclopentenyl group, a cyclohexenyl group, and a cycloheptenyl group. The term "$C_3$-$C_{10}$ cycloalkenylene group," as used herein, refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group," as used herein, refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group," as used herein, refers to a monovalent group having a cyclic aromatic system that has at least one heteroatom selected from N, O, P, Si, and S as a ring-forming atom, in addition to 1 to 60 carbon atoms. The term "$C_1$-$C_{60}$ heteroarylene group" as used herein refers to a divalent group having a carbocyclic aromatic system that has at least one heteroatom selected from N, O, P, Si, and S as a ring-forming atom, in addition to 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

A $C_6$-$C_{60}$ aryloxy group as used herein indicates —$OA_{102}$ (wherein $A_{102}$ is the $C_6$-$C_{60}$ aryl group), and a $C_6$-$C_{60}$ arylthio group indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and having no aromaticity in its entire molecular structure. Examples of the monovalent non-aromatic condensed polycyclic group include a fluorenyl group. The term "divalent non-aromatic condensed polycyclic group," as used herein, refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and having no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The term $C_1$-$C_{30}$ heterocyclic group may be a monocyclic group or a polycyclic group.

At least one substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Examples and Examples. However, the organic light-emitting device is not limited thereto. The wording "'B' was used instead of 'A'" used in describing Synthesis Examples means that a molar equivalent of 'A' was identical to a molar equivalent of 'B'.

EXAMPLES

Synthesis Example 1: Synthesis of Compound 1

Compound 1 was synthesized according to the Reaction Scheme 1 below.

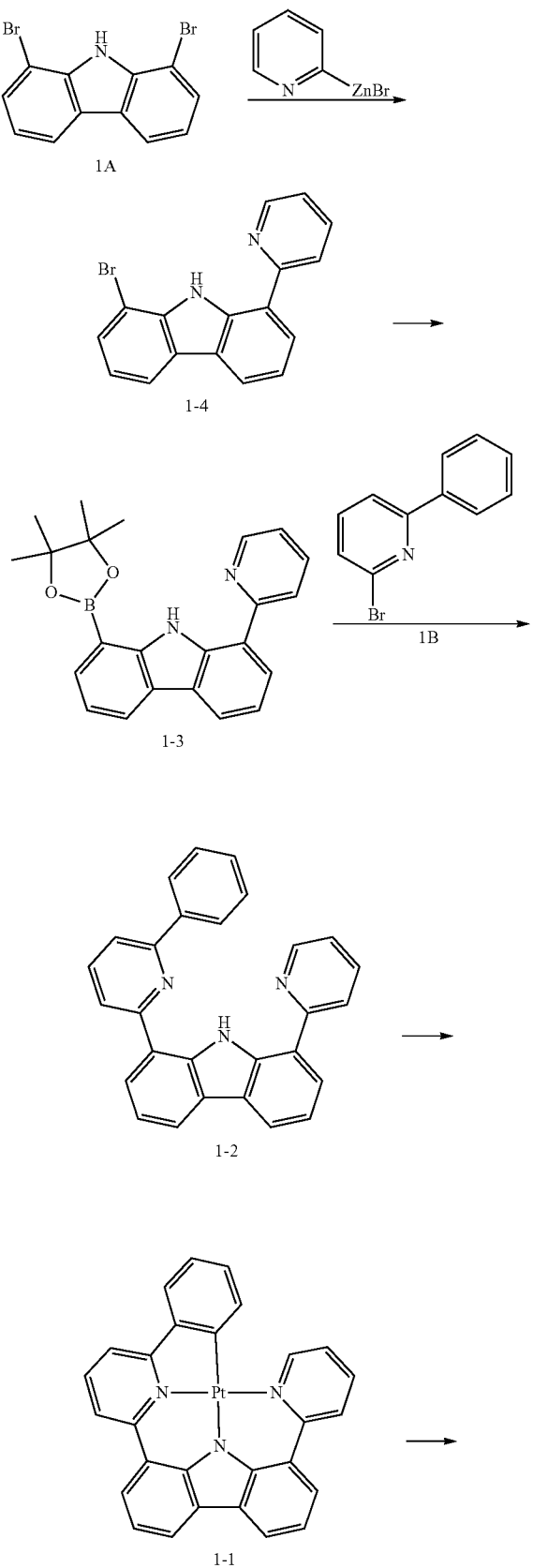

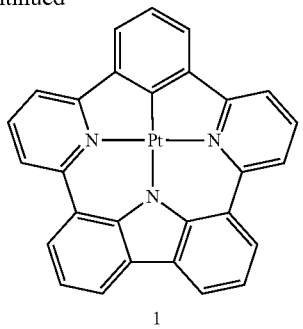

1

1) Synthesis of Intermediate 1-4

11.7 grams (g) (36 millimoles, mmol) of Intermediate 1A and 1.45 g (35 mmol) of 60% sodium hydride were dissolved in 400 milliliters (mL) of tetrahydrofuran (THF), stirred at a temperature of −78° C. for about 10 minutes, and then stirred at room temperature for about 2 hours. 20 mL (1.76 mmol) of tetrakis(triphenylphosphine)palladium(0) and 79 mL (39.5 mmol) of 0.5 molar (M) 2-pyridylzinc bromide, which were dissolved in THF, were added thereto. The resultant mixture was heated under reflux at a temperature of 80° C. for about 16 hours. After the reaction was complete, the resultant mixture was cooled to room temperature, and a saturated sodium hydrogen carbonate aqueous solution was added thereto. The organic layer extracted with dichloromethane was dried over magnesium sulfate, and the solvent was distilled off under reduced pressure. The compound obtained therefrom was separated and purified by column chromatography to obtain 8.5 g (73%) of Intermediate 1-4. The obtained compound was identified by LC-MS.

LC-MS m/z=323.01 $(M+H)^+$.

2) Synthesis of Intermediate 1-3

3.4 g (10.66 mmol) of Intermediate 1-4, 3.3 g (12.80 mmol) of bis(pinacolato)diboron, 3.1 g (31.98 mmol) of potassium acetate, and 0.78 g (1.07 mmol) of Pd(dppf)$_2$Cl$_2$ were mixed with 150 mL of toluene. The resultant mixture was heated to a temperature of 120° C. and stirred under reflux for 8 hours. The reactant obtained therefrom was cooled to room temperature, and the organic layer was extracted by using 300 mL of water and 300 mL of ethyl acetate. The extracted organic layer was dried by using MgSO$_4$, and a solvent was evaporated therefrom. The residue obtained therefrom was separated and purified by silica gel column chromatography to obtain 2.3 g (58%) of Intermediate 1-3. The obtained compound was identified by LC-MS.

LC-MS m/z=371.19 $(M+H)^+$.

3) Synthesis of Intermediate 1-2

2.3 g (6.18 mmol) of Intermediate 1-3, 1.2 g (5.144 mmol) of Intermediate 1B, 1.36 g (12.86 mmol) of sodium carbonate, and 0.4 g (0.36 mmol) of Pd(PPh$_3$)$_4$ were mixed with 60 mL of THF, 20 mL of distilled water, 20 mL of ethanol. The resultant mixture was heated to a temperature of 100° C. and stirred under reflux for 16 hours. The reactant obtained therefrom was cooled to room temperature, and the organic layer was extracted by using 200 mL of water and 200 mL of ethyl acetate. The extracted organic layer was dried by using MgSO$_4$, and a solvent was evaporated therefrom. The residue obtained therefrom was separated and purified by silica gel column chromatography to obtain 2.0 g (81%) of Intermediate 1-2. The obtained compound was identified by LC-MS.

LC-MS m/z=398.16 $(M+H)^+$.

4) Synthesis of Intermediate 1-1

2.0 g (5.01 mmol) of Intermediate 1-2, 2.07 g (5.01 mmol) of potassium tetrachloroplatinate, and 100 mL of acetic acid were mixed, and the resultant mixture was heated to a temperature of 130° C. and stirred under reflux for 16 hours. The reactant obtained therefrom was cooled to room temperature, and the organic layer was extracted by using a sodium bicarbonate aqueous solution, water, and 200 mL of ethyl acetate. The extracted organic layer was dried by using MgSO$_4$, and the solvent was evaporated therefrom. A residue obtained therefrom was separated and purified by silica gel column chromatography to obtain 1.33 g (45%) of Intermediate 1-1. The obtained compound was identified by LC-MS.

LC-MS m/z=591.11 $(M+H)^+$.

5) Synthesis of Compound 1

1.33 g (2.25 mmol) of Intermediate 1-1 was added to a sealed tube and heated to a temperature of 330° C. for 45 hours. The reactant obtained therefrom was cooled to room temperature, added to a sublimation purifier, and then slowly heated to remove a remaining reactant, thereby obtaining 0.25 g (19%) of Compound 1. The obtained compound was identified by LC-MS.

LC-MS m/z=589.09 $(M+H)^+$.

Synthesis Example 2: Synthesis of Compound 3

Compound 3 was synthesized in the same manner as in Synthesis Example 1, except that, in synthesizing Intermediate 1-4, 1,8-dibromo-3,6-di-tert-butyl-9H-carbazole was used instead of Intermediate 1A. The obtained compound was identified by LC-MS.

LC-MS m/z=701.22 $(M+H)^+$.

Synthesis Example 3: Synthesis of Compound 48

Compound 48 was synthesized in the same manner as in Synthesis Example 1, except that, in synthesizing Compound 1, 1,8-dibromo-3,6-di-tert-butyl-9H-carbazole was used instead of Intermediate 1A, (4-([1,1'-biphenyl]-4-yl)pyridin-2-yl)zinc bromide was used instead of 2-pyridylzinc bromide, and 4-([1,1-biphenyl]-4-yl)-2-bromo-6-phenylpyridine was used instead of Intermediate 1B. The obtained compound was identified by LC-MS.

LC-MS m/z=1005.34 $(M+H)^+$.

Synthesis Example 4: Synthesis of Compound 55

Compound 55 was synthesized in the same manner as in Synthesis Example 1, except that, in synthesizing Compound 1, 1,8-dibromo-3,6-di-tert-butyl-9H-carbazole was used instead of Intermediate 1A, (5-fluoro-4-phenylpyridin-2-yl)zinc bromide was used instead of 2-pyridylzinc bromide, and 6-bromo-3-fluoro-2,4-diphenylpyridine was used instead of Intermediate 1B. The obtained compound was identified by LC-MS.

LC-MS m/z=889.26 (M+H)⁺.

Synthesis Example 5: Synthesis of Compound 61

Compound 61 was synthesized in the same manner as in Synthesis Example 1, except that, in synthesizing Compound 1, 1,8-dibromo-3,6-di-tert-butyl-9H-carbazole was used instead of Intermediate 1A, (5-cyano-4-phenylpyridin-2-yl)zinc bromide was used instead of 2-pyridylzinc bromide, and 6-bromo-2,4-diphenylnicotinonitrile was used instead of Intermediate 1B. The obtained compound was identified by LC-MS.
LC-MS m/z=903.27 (M+H)⁺.

Example 1

An ITO glass substrate was cut to a size of 50 mm×50 mm×0.5 mm (mm=millimeter), sonicated with acetone, isopropyl alcohol, pure water each for 15 minutes, and then cleaned by exposure ultraviolet (UV) rays and ozone for 30 minutes.

Then, m-MTDATA was deposited on an ITO electrode (anode) of the ITO glass substrate at a deposition rate of 1 Angstroms per second (Å/sec) to form a hole injection layer having a thickness of 600 Angstroms (Å), and then, α-NPD was deposited on the hole injection layer at a deposition rate of 1 Å/sec to form a hole transport layer having a thickness of 250 Å.

Compound 1 (dopant) and CBP (host) were co-deposited on the hole transport layer at a weight ratio of 2:98 to form an emission layer having a thickness of 400 Å.

BAlq was deposited on the emission layer at a deposition rate of 1 Å/sec to form a hole blocking layer having a thickness of 50 Å, Alq₃ was deposited on the hole blocking layer to form an electron transport layer having a thickness of 300 Å, LiF was deposited on the electron transport layer to form an electron injection layer having a thickness of 10 Å, and Al was vacuum-deposited on the electron injection layer to form a second electrode (cathode) having a thickness of 1,200 Å, thereby completing the manufacture of an organic light-emitting device having a structure of ITO/m-MTDATA (600 Å)/α-NPD (250 Å)/CBP+Compound 6 (2%) (400 Å)/BAlq (50 Å)/Alq₃ (300 Å)/LiF (10 Å)/Al (1,200 Å).

Examples 2 to 5 and Comparative Example A

Organic light-emitting devices were manufactured in the same manner as in Example 1, except that in forming an emission layer, for use as a dopant, corresponding compounds shown in Table 2 were used instead of Compound 1.

Evaluation Example 1: Evaluation of Characteristics of Organic Light-Emitting Devices The driving voltage, light emission efficiency, quantum light emission efficiency, roll-off ratio, maximum emission wavelength, and full width at half maximum (FWHM) of the organic light-emitting devices manufactured according to Examples 1 to 5 and Comparative Example A were evaluated by using a voltage-voltage meter (Keithley 2400) and a luminance meter (Minolta Cs-1000A), and results thereof are shown in Table 2. The roll ratio was calculated by using Equation 20.

Roll off={1−(efficiency(at 9,000 nit)/maximum light emission efficiency)}×100%  Equation 20

TABLE 2

| | Dopant Compound No. | Driving voltage (V) | Emission efficiency (cd/A) | Quantum emission efficiency (%) | Roll-off ratio (%) | Maximum emission wavelength (nm) | FWHM (nm) |
|---|---|---|---|---|---|---|---|
| Example 1 | 1 | 4.48 | 40.2 | 17.4 | 24 | 575 | 56.1 |
| Example 2 | 3 | 4.28 | 37.5 | 18.2 | 21 | 581 | 52.6 |
| Example 3 | 48 | 4.15 | 32.5 | 20.3 | 20 | 604 | 61.3 |
| Example 4 | 55 | 4.46 | 30.8 | 19.3 | 19 | 609 | 67.8 |
| Example 5 | 61 | 4.85 | 26.7 | 17.8 | 22 | 617 | 72.6 |
| Comparative Example A | A | 5.371 | 16.461 | 13.32 | 25.5 | 615 | 68.1 |

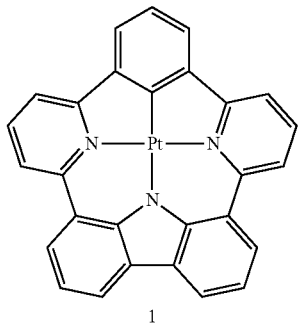

1

TABLE 2-continued
| Dopant Compound No. | Driving voltage (V) | Emission efficiency (cd/A) | Quantum emission efficiency (%) | Roll-off ratio (%) | Maximum emission wavelength (nm) | FWHM (nm) |
| --- | --- | --- | --- | --- | --- | --- |
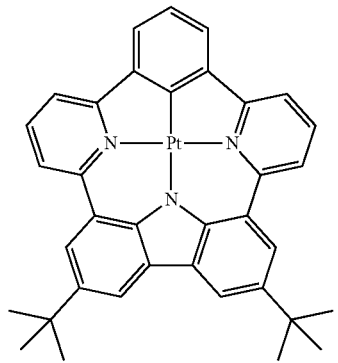
3
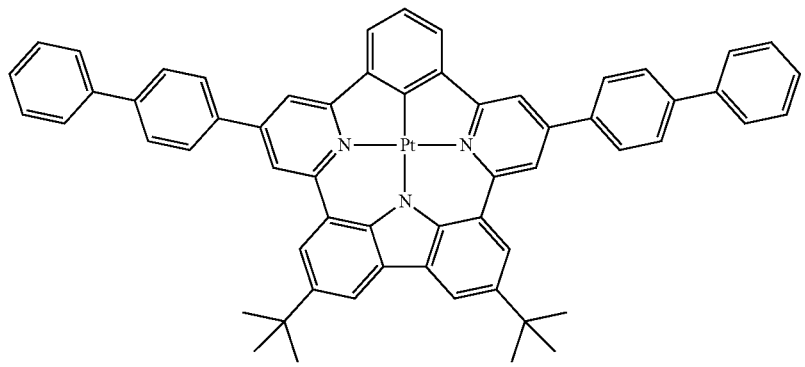
48
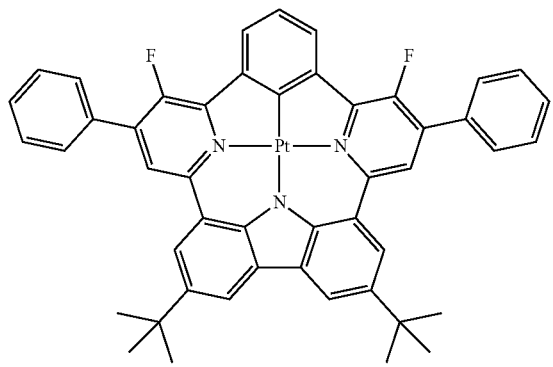
55
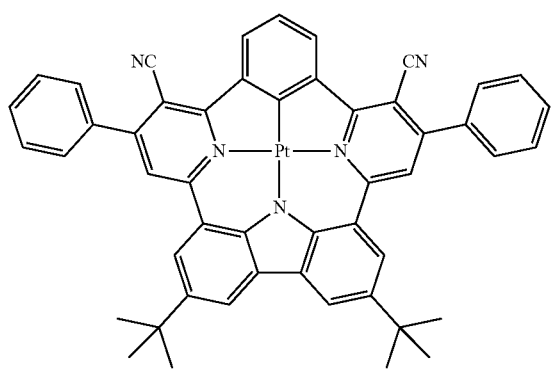
61

TABLE 2-continued

| Dopant Compound No. | Driving voltage (V) | Emission efficiency (cd/A) | Quantum emission efficiency (%) | Roll-off ratio (%) | Maximum emission wavelength (nm) | FWHM (nm) |
|---|---|---|---|---|---|---|

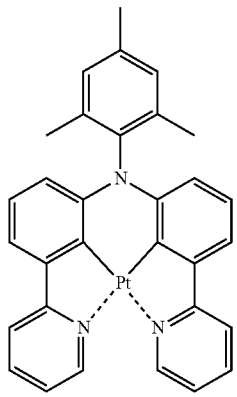

A

Referring to Table 2, it has been confirmed that the organic light-emitting devices of Examples 1 to 5 have improved driving voltage, emission efficiency, quantum emission efficiency, and roll-off ratio characteristics, as compared with those of the organic light-emitting device of Comparative Example A.

Since the organometallic compounds have excellent electrical characteristics and thermal stability, organic light-emitting devices including such organometallic compounds may have excellent driving voltage, emission efficiency, quantum emission efficiency, and roll-off ratio characteristics. Also, due to excellent phosphorescent luminescent characteristics, such organometallic compounds may provide a diagnostic composition having high diagnostic efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope of the present description as defined by the following claims.

What is claimed is:

1. An organometallic compound represented by Formula 1:

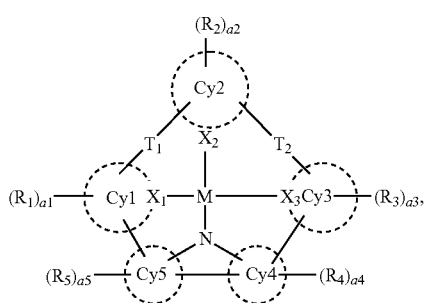

Formula 1 wherein, in Formula 1,

M is Pt or Pd, $X_1$ to $X_3$ are each independently C or N, two bonds selected from a bond between $X_1$ and M, a bond between $X_2$ and M, and a bond between $X_3$ and M are each a coordinate bond, and the other thereof is a covalent bond, Cy1 to Cy5 are each independently selected from a $C_5$-$C_{30}$ carbocyclic group and a $C_1$-$C_{30}$ heterocyclic group, $T_1$ and $T_2$ are each independently selected from a single bond, *—N[($L_6$)$_{b6}$-($R_6$)]—*', *—B($R_6$)—*', *—P($R_6$)—*', *—C($R_6$)($R_7$)—*', *—Si($R_6$)($R_7$)—*', *—Ge($R_6$)($R_7$)—*', *—S—*', *—Se—*', *—O—*', *—C(=O)—*', *—S(=O)—*', *—S(=O)$_2$—*', *—C($R_6$)=($R_7$)—*', *—C(=S)—*', and *—C≡C—*', $L_6$ is selected from a single bond, a substituted or unsubstituted $C_5$-$C_{30}$ carbocyclic group, and a substituted or unsubstituted $C_1$-$C_{30}$ heterocyclic group, b6 is selected from 1 to 3, wherein, when b6 is two or more, two or more groups $L_6$ are identical to or different from each other, $R_6$ and $R_7$ are optionally linked via a first linking group to form a substituted or unsubstituted $C_5$-$C_{30}$ carbocyclic group or a substituted or unsubstituted $C_1$-$C_{30}$ heterocyclic group, $R_1$ to $R_7$ are each independently selected from hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$, a1 to a5 are each independently 0, 1, 2, 3, 4, or 5, two of groups $R_1$ in the number of a1, groups $R_2$ in the number of a2, groups $R_3$ in the number of a3, groups $R_4$ in the number of a4, and groups $R_5$ in the number of a5 are optionally linked to form a substituted or unsubstituted $C_5$-$C_{30}$ carbocyclic group or a substituted or unsubstituted $C_1$-$C_{30}$ heterocyclic group, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is selected from:

deuterium, —F, Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

2. The organometallic compound of claim 1, wherein M is Pt.

3. The organometallic compound of claim 1, wherein $X_1$ to $X_3$ are each N, a bond between $X_1$ and M and a bond between $X_3$ and M are each a coordinate bond, and a bond between $X_2$ and M is a covalent bond;

$X_1$ and $X_3$ are each N, $X_2$ is C, a bond between $X_1$ and M and a bond between $X_3$ and M are each a coordinate bond, and a bond between $X_2$ and M is a covalent bond; or $X_2$ and $X_3$ are each N, $X_1$ is C, a bond between $X_2$ and M and a bond between $X_3$ and M are each a coordinate bond, and a bond between $X_1$ and M is a covalent bond.

4. The organometallic compound of claim 1, wherein Cy1 to Cy5 are each independently selected from a benzene group, a naphthalene group, an anthracene group, a phenanthrene group, a triphenylene group, a pyrene group, a chrysene group, a cyclopentadiene group, a 1,2,3,4-tetrahydronaphthalene group, a pyrrole group, a thiophene group, a furan group, an indole group, an iso-indole group, a benzoborol group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, a tetrazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group.

5. The organometallic compound of claim 1, wherein Cy1 to Cy5 are each independently selected from a benzene group, a naphthalene group, an indole group, an iso-indole group, a dibenzothiophene group, a dibenzofuran group, an azadibenzothiophene group, an azadibenzofuran group, a pyridine group, a pyrimidine group, a pyrazine group, a pyridazine group, a quinoline group, an isoquinoline group, a pyrazole group, and an imidazole group or a benzimidazole group.

6. The organometallic compound of claim 1, wherein $T_1$ and $T_2$ are each a single bond.

7. The organometallic compound of claim 1, wherein $R_1$ to $R_7$ are each independently selected from:
hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, and a $C_1$-$C_{20}$ alkoxy group;
a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;
a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azadibenzofuranyl group, and an azadibenzothiophenyl group;
a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azadibenzofuranyl group, and an azadibenzothiophenyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azadibenzofuranyl group, and an azadibenzothiophenyl group; and —N($Q_1$)($Q_2$), —Si($Q_3$)($Q_4$)($Q_5$), —B($Q_6$)($Q_7$), and —P(=O)($Q_8$)($Q_9$), and $Q_1$ to $Q_9$ are each independently selected from:
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CH_3$, —$CD_2CD_2H$, and —$CD_2CDH_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

8. The organometallic compound of claim 1, wherein $R_1$ to $R_7$ are each independently selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-22, groups represented by Formulae 10-1 to 10-144, and —Si($Q_3$)($Q_4$)($Q_5$):

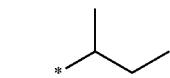
Formula 9-1

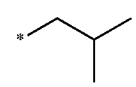
Formula 9-2

Formula 9-3

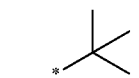
Formula 9-4

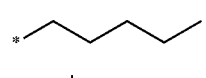
Formula 9-5

Formula 9-6

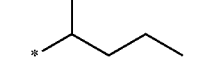
Formula 9-7

Formula 9-8

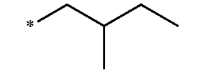
Formula 9-9

Formula 9-10

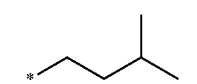
Formula 9-11

Formula 9-12

Formula 9-13

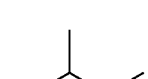
Formula 9-14

Formula 9-15

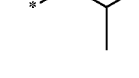
Formula 9-16

Formula 9-17

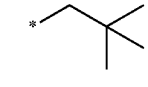
Formula 9-18

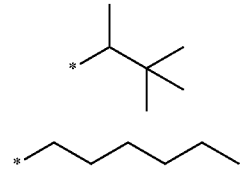
Formula 9-19

Formula 9-20

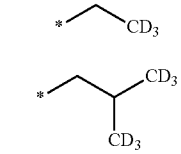
Formula 9-21

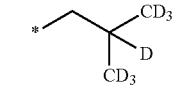

-continued
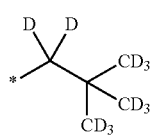
Formula 9-22
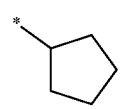
Formula 10-1
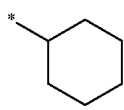
Formula 10-2
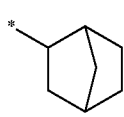
Formula 10-3
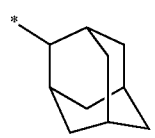
Formula 10-4
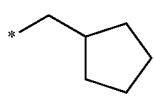
Formula 10-5
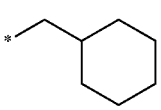
Formula 10-6
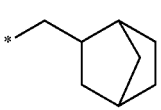
Formula 10-7
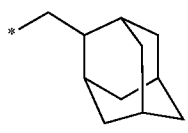
Formula 10-8
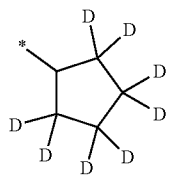
Formula 10-9
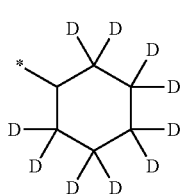
Formula 10-10
-continued
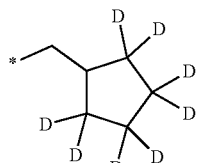
Formula 10-11
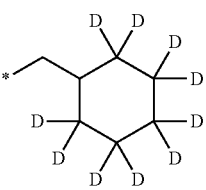
Formula 10-12
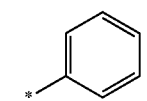
Formula 10-13
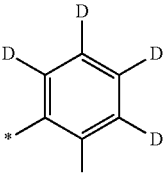
Formula 10-14
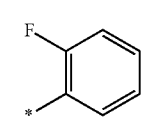
Formula 10-15
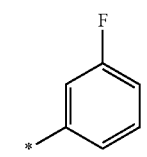
Formula 10-16
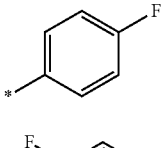
Formula 10-17
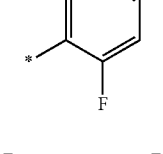
Formula 10-18
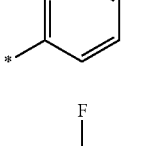
Formula 10-19
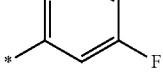
Formula 10-20

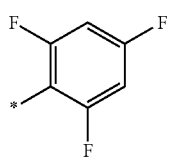
Formula 10-21
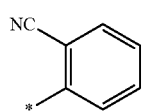
Formula 10-22
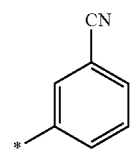
Formula 10-23
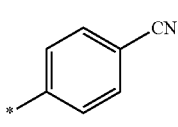
Formula 10-24
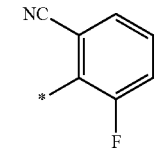
Formula 10-25
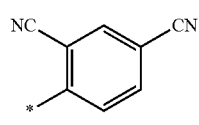
Formula 10-26
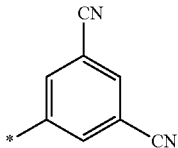
Formula 10-27
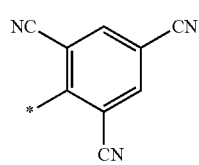
Formula 10-28
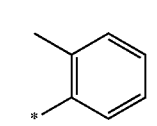
Formula 10-29
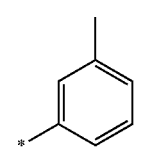
Formula 10-30
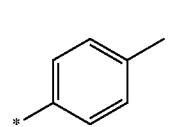
Formula 10-31
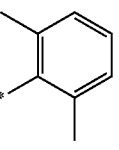
Formula 10-32
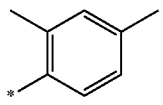
Formula 10-33
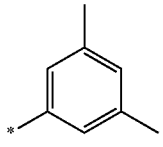
Formula 10-34
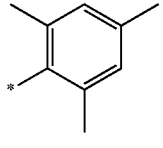
Formula 10-35
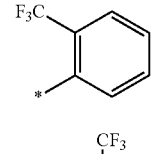
Formula 10-36
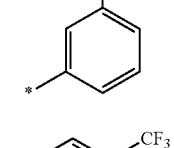
Formula 10-37
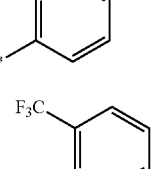
Formula 10-38
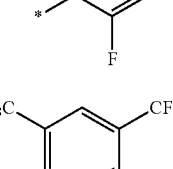
Formula 10-39
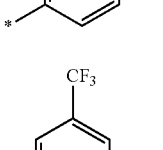
Formula 10-40
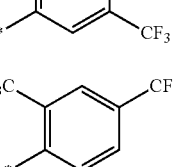
Formula 10-41
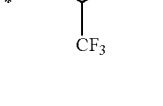
Formula 10-42

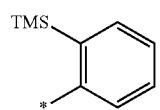
Formula 10-43
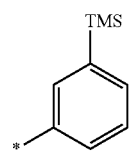
Formula 10-44
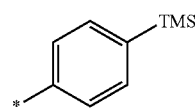
Formula 10-45
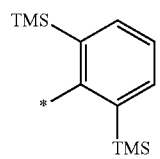
Formula 10-46
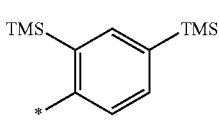
Formula 10-47
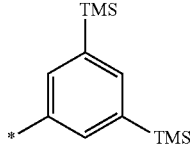
Formula 10-48
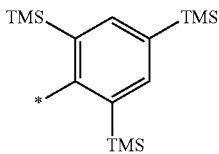
Formula 10-49
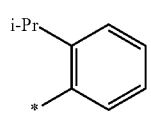
Formula 10-50
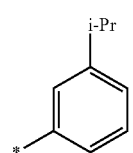
Formula 10-51
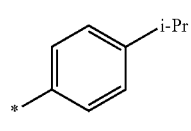
Formula 10-52
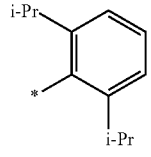
Formula 10-53
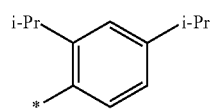
Formula 10-54
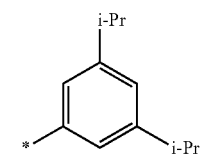
Formula 10-55
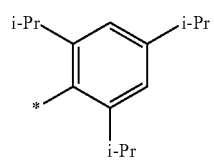
Formula 10-56
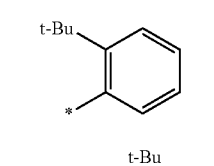
Formula 10-57
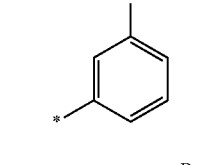
Formula 10-58
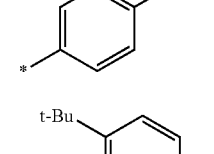
Formula 10-59
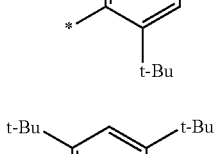
Formula 10-60
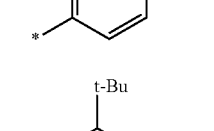
Formula 10-61
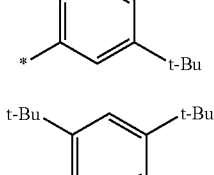
Formula 10-62
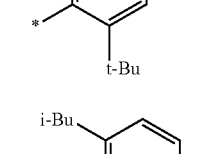
Formula 10-63
Formula 10-64

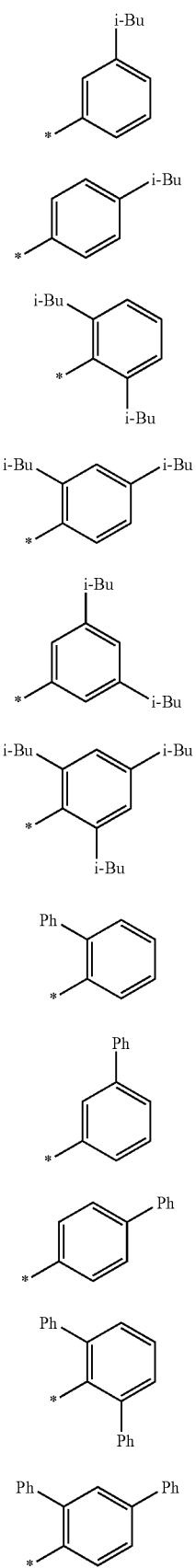
Formula 10-65
Formula 10-66
Formula 10-67
Formula 10-68
Formula 10-69
Formula 10-70
Formula 10-71
Formula 10-72
Formula 10-73
Formula 10-74
Formula 10-75
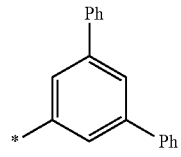
Formula 10-76
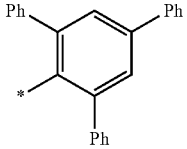
Formula 10-77
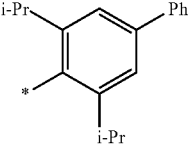
Formula 10-78
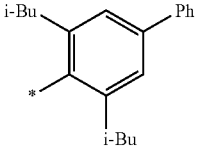
Formula 10-79
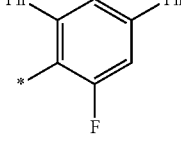
Formula 10-80
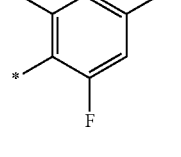
Formula 10-81
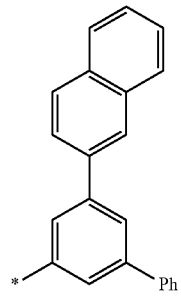
Formula 10-82
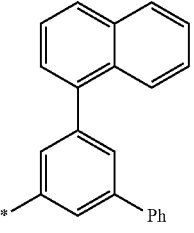
Formula 10-83

Formula 10-84
Formula 10-85
Formula 10-86
Formula 10-87
Formula 10-88
Formula 10-89
Formula 10-90
Formula 10-91
Formula 10-92
Formula 10-93
Formula 10-94
Formula 10-95
Formula 10-96
Formula 10-97
Formula 10-98
Formula 10-99
Formula 10-100
Formula 10-101
Formula 10-102
Formula 10-103
Formula 10-104
Formula 10-105

Formula 10-106

Formula 10-107

Formula 10-108

Formula 10-109

Formula 10-110

Formula 10-111

Formula 10-112

Formula 10-113

Formula 10-114

Formula 10-115

Formula 10-116

Formula 10-117

Formula 10-118

Formula 10-119

Formula 10-120

Formula 10-121

Formula 10-122

Formula 10-123

Formula 10-124
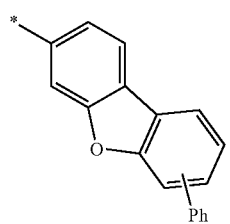
Formula 10-125
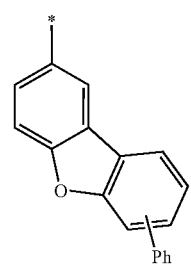
Formula 10-126
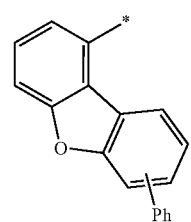
Formula 10-127
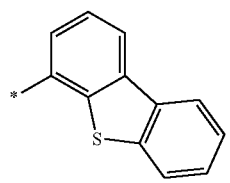
Formula 10-128
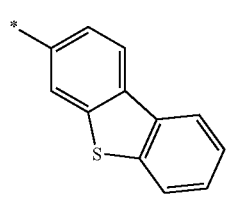
Formula 10-129
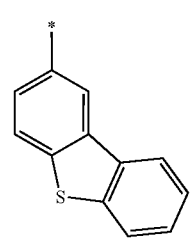
Formula 10-130
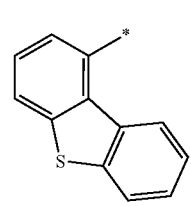
Formula 10-131
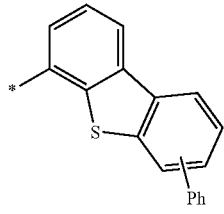
Formula 10-132
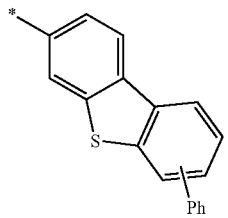
Formula 10-133
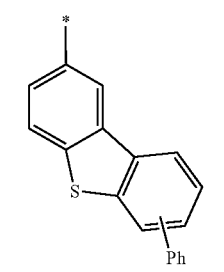
Formula 10-134
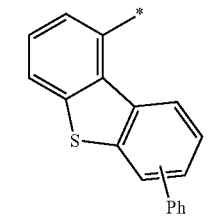
Formula 10-135
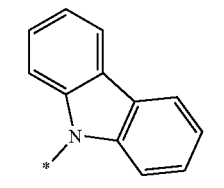
Formula 10-136
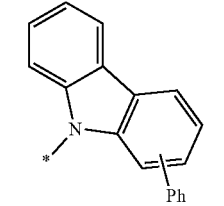
Formula 10-137
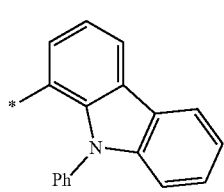

-continued

Formula 10-138
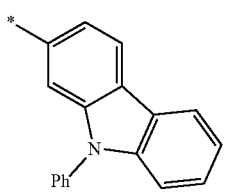

Formula 10-139
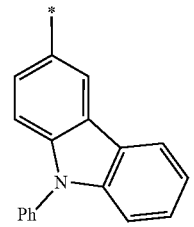

Formula 10-140
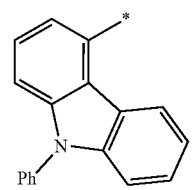

Formula 10-141
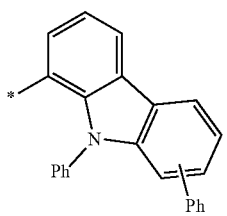

Formula 10-142
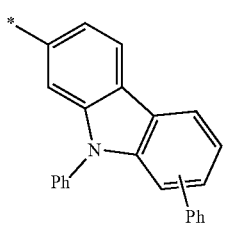

Formula 10-143
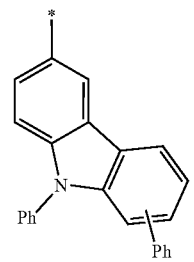

Formula 10-144
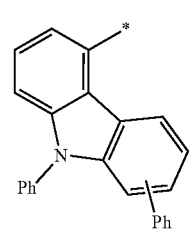

wherein, in Formulae 9-1 to 9-22 and 10-1 to 10-144, i-Pr indicates an iso-propyl group, i-Bu indicates an isobutyl group, t-Bu indicates a tert-butyl group, TMS indicates a trimethylsilyl group, Ph indicates a phenyl group, and * indicates a binding site to a neighboring atom.

9. The organometallic compound of claim 1, wherein a moiety represented by

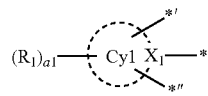

in Formula 1 is selected from groups represented by Formulae Cy1-1 to Cy1-39:

Formula Cy1-1
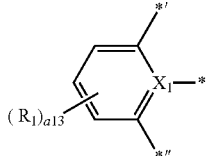

Formula Cy1-2
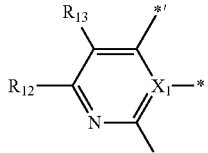

Formula Cy1-3
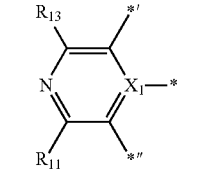

Formula Cy1-4
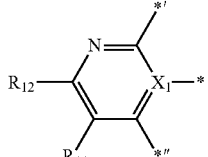

Formula Cy1-5
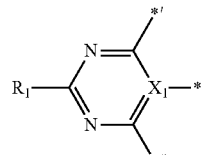

Formula Cy1-6
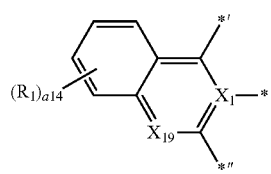

-continued
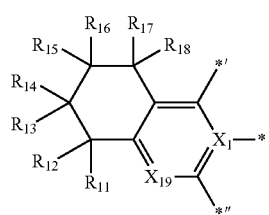
Formula Cy1-7
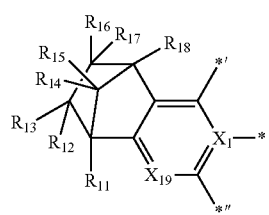
Formula Cy1-8
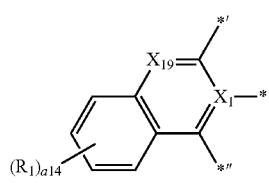
Formula Cy1-9
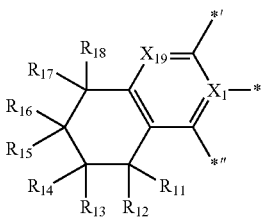
Formula Cy1-10
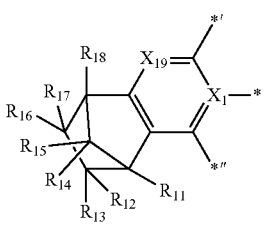
Formula Cy1-11
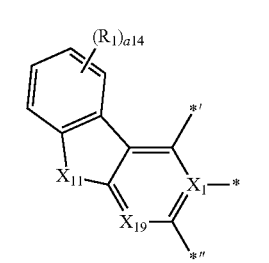
Formula Cy1-12
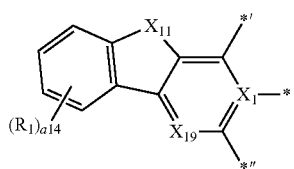
Formula Cy1-13
-continued
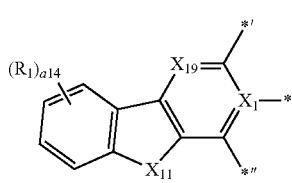
Formula Cy1-14
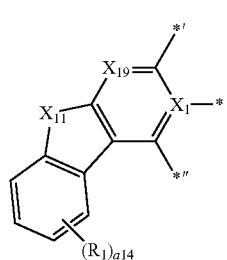
Formula Cy1-15
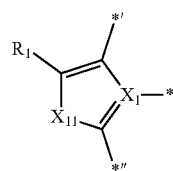
Formula Cy1-16
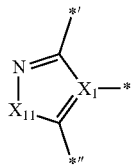
Formula Cy1-17
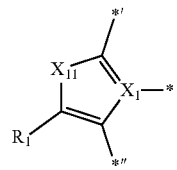
Formula Cy1-18
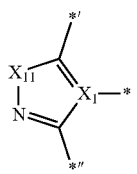
Formula Cy1-19
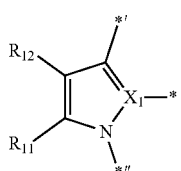
Formula Cy1-20
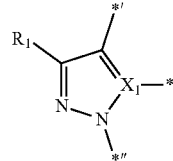
Formula Cy1-21

-continued
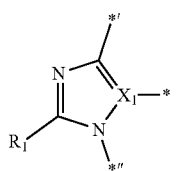
Formula Cy1-22
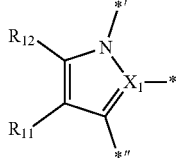
Formula Cy1-23
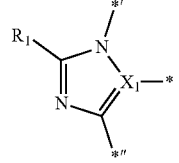
Formula Cy1-24
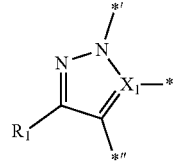
Formula Cy1-25
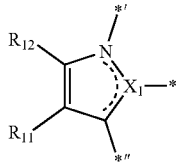
Formula Cy1-26
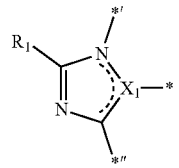
Formula Cy1-27
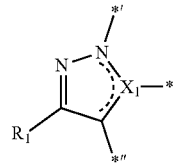
Formula Cy1-28
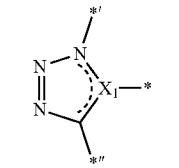
Formula Cy1-29
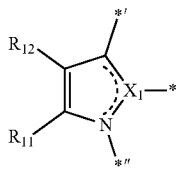
Formula Cy1-30
-continued
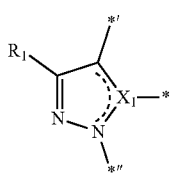
Formula Cy1-31
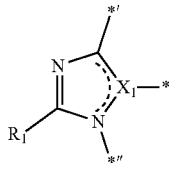
Formula Cy1-32
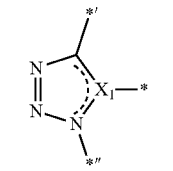
Formula Cy1-33
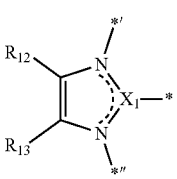
Formula Cy1-34
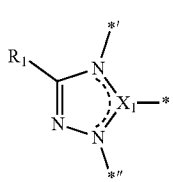
Formula Cy1-35
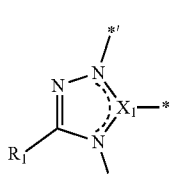
Formula Cy1-36
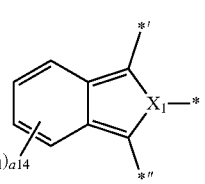
Formula Cy1-37
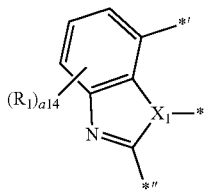
Formula Cy1-38

-continued

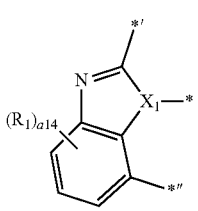

Formula Cy1-39 wherein, in Formulae Cy1-1 to Cy1-39, $X_1$ and $R_1$ are the same as described in claim 1, is O, S, $N(R_{11})$, or $C(R_{11})(R_{12})$, $X_{19}$ is $C(R_{19})$ or N, $R_{11}$ to $R_{19}$ are the same as described in connection with $R_1$ in claim 1, a13 is an integer from 0 to 3, a14 is an integer from 0 to 4, and \*, \*', and \*" each indicate a binding site to a neighboring atom.

10. The organometallic compound of claim 1, wherein a moiety represented by

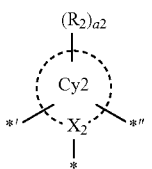

in Formula 1 is selected from groups represented by Formulae Cy2-1 to Cy2-39:

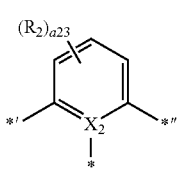

Formula Cy2-1

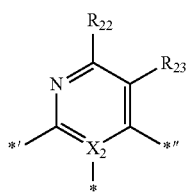

Formula Cy2-2

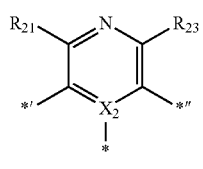

Formula Cy2-3

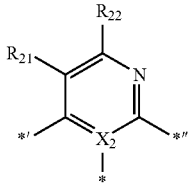

Formula Cy2-4

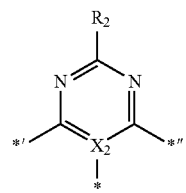

Formula Cy2-5

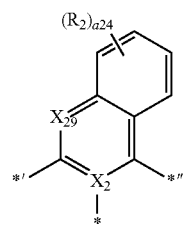

Formula Cy2-6

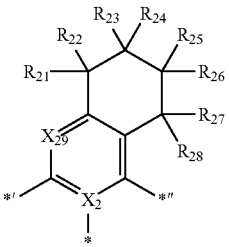

Formula Cy2-7

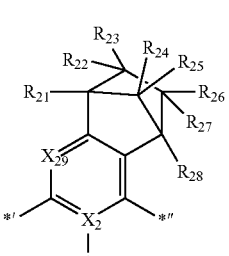

Formula Cy2-8

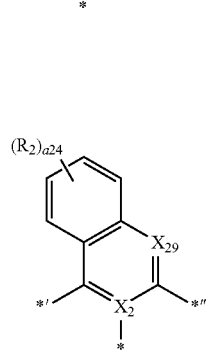

Formula Cy2-9

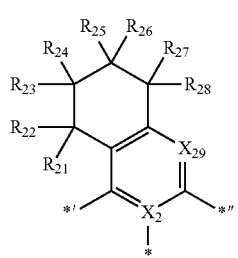

Formula Cy2-10

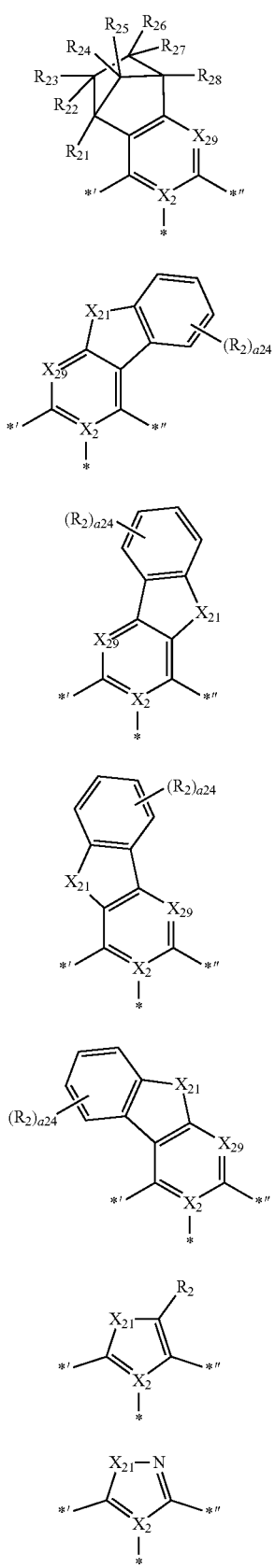
Formula Cy2-11
Formula Cy2-12
Formula Cy2-13
Formula Cy2-14
Formula Cy2-15
Formula Cy2-16
Formula Cy2-17
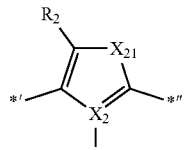
Formula Cy2-18
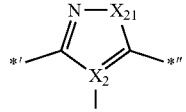
Formula Cy2-19
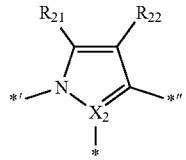
Formula Cy2-20
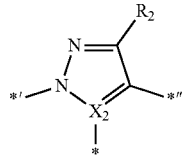
Formula Cy2-21
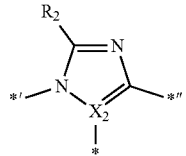
Formula Cy2-22
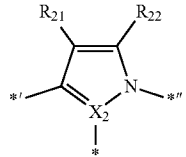
Formula Cy2-23
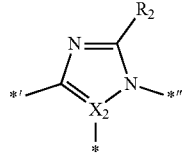
Formula Cy2-24
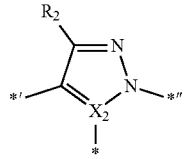
Formula Cy2-25
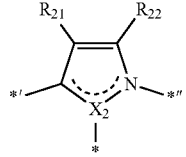
Formula Cy2-26

-continued

Formula Cy2-27
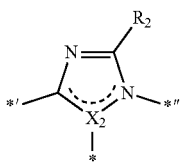

Formula Cy2-28
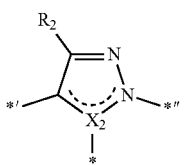

Formula Cy2-29
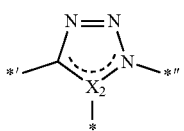

Formula Cy2-30
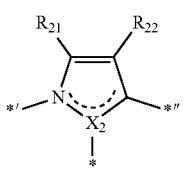

Formula Cy2-31
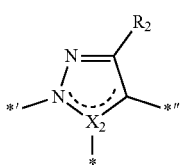

Formula Cy2-32
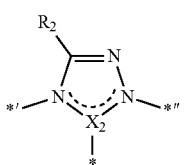

Formula Cy2-33
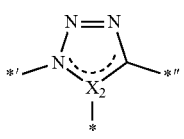

Formula Cy2-34
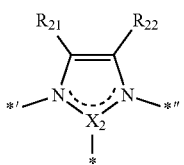

Formula Cy2-35
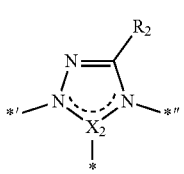

Formula Cy2-36
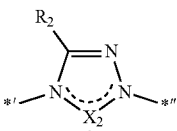

Formula Cy2-37
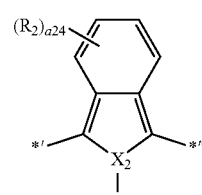

Formula Cy2-38
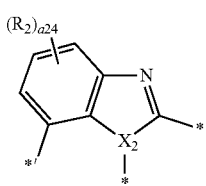

Formula Cy2-39
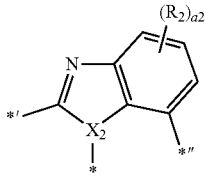

wherein, in Formulae Cy2-1 to Cy2-39, $X_2$ and $R_2$ are the same as described in claim 1, $X_{21}$ is O, S, $N(R_{21})$, or $C(R_{21})(R_{22})$, $X_{29}$ is $C(R_{29})$ or N, $R_{21}$ to $R_{29}$ are the same as described in connection with $R_2$ in claim 1, a23 is an integer from 0 to 3, a24 is an integer from 0 to 4, and \*, \*′, and \*″ each indicate a binding site to a neighboring atom.

11. The organometallic compound of claim 1, wherein a moiety represented by

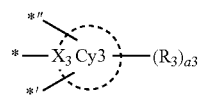

in Formula 1 is selected from groups represented by Formulae Cy3-1 to Cy3-39:

Formula Cy3-1
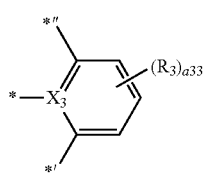

-continued
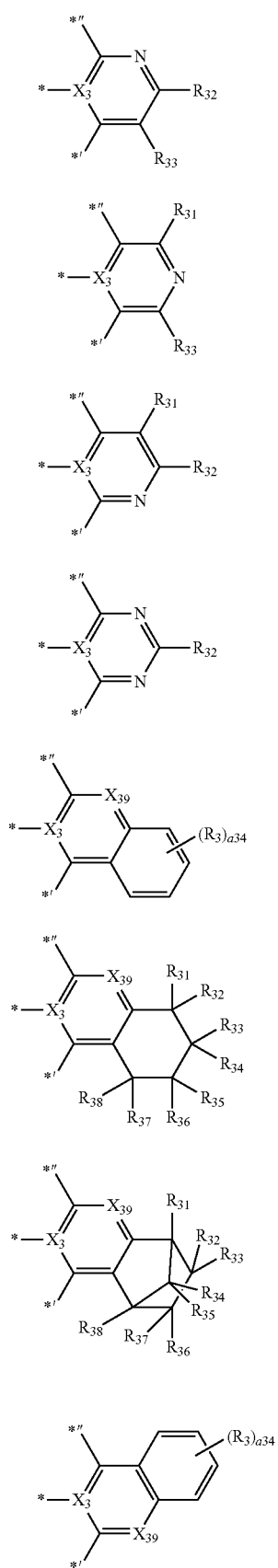
Formula Cy3-2
Formula Cy3-3
Formula Cy3-4
Formula Cy3-5
Formula Cy3-6
Formula Cy3-7
Formula Cy3-8
-continued
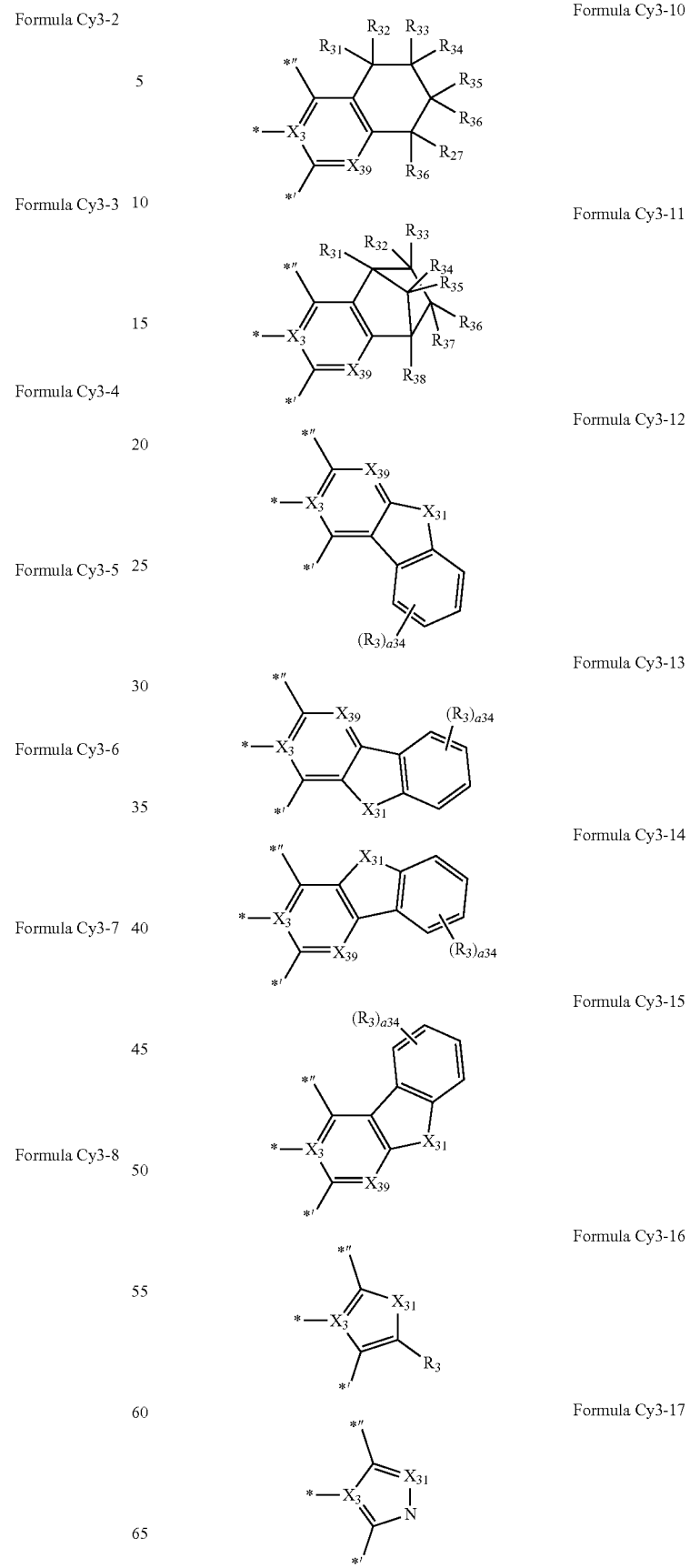
Formula Cy3-10
Formula Cy3-11
Formula Cy3-12
Formula Cy3-13
Formula Cy3-14
Formula Cy3-15
Formula Cy3-16
Formula Cy3-17

Formula Cy3-18
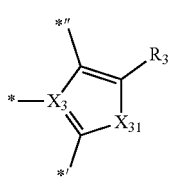
Formula Cy3-19
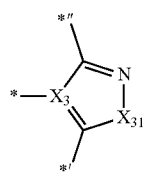
Formula Cy3-20
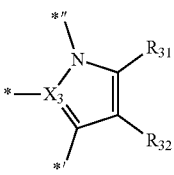
Formula Cy3-21
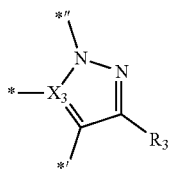
Formula Cy3-22
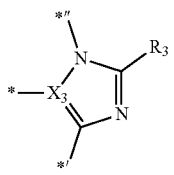
Formula Cy3-23
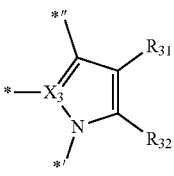
Formula Cy3-24
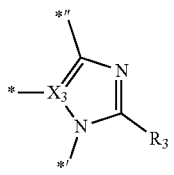
Formula Cy3-25
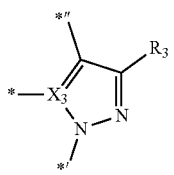
Formula Cy3-26
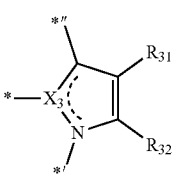
Formula Cy3-27
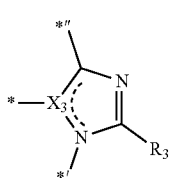
Formula Cy3-28
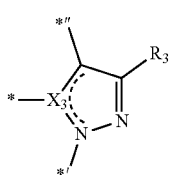
Formula Cy3-29
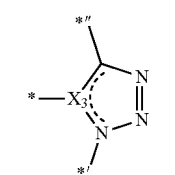
Formula Cy3-30
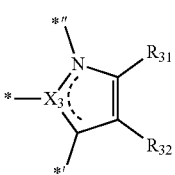
Formula Cy3-31
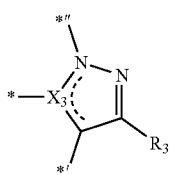
Formula Cy3-32
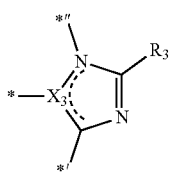
Formula Cy3-33
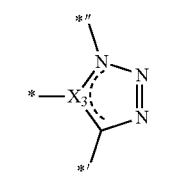
Formula Cy3-34
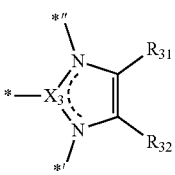
Formula Cy3-35
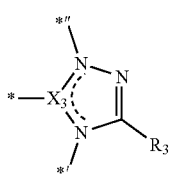

Formula Cy3-36

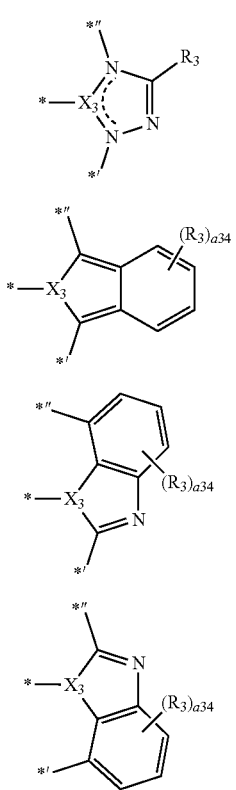

Formula Cy3-37

Formula Cy3-38

Formula Cy3-39 wherein, in Formulae Cy3-1 to Cy3-39,
X$_3$ and R$_3$ are the same as described in claim 1,
X$_{31}$ is O, S, N(R$_{31}$), or C(R$_{31}$)(R$_{32}$),
X$_{39}$ is C(R$_{39}$) or N,
R$_{31}$ to R$_{39}$ are the same as described in connection with R$_3$ in claim 1,
a33 is an integer from 0 to 3,
a34 is an integer from 0 to 4, and
*, *′, and *″ each indicate a binding site to a neighboring atom.

12. The organometallic compound of claim 1, wherein a moiety represented by

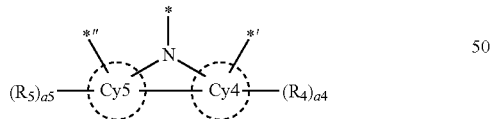

in Formula 1 is selected from groups represented by Formulae Cz-1 to Cz-27:

Formula Cz-1

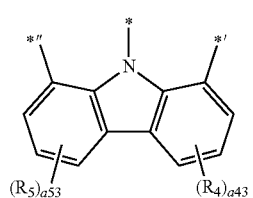

Formula Cz-2

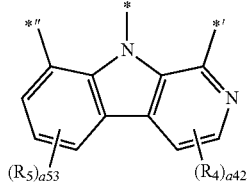

Formula Cz-3

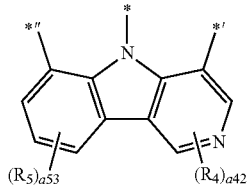

Formula Cz-4

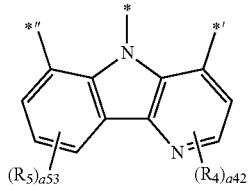

Formula Cz-5

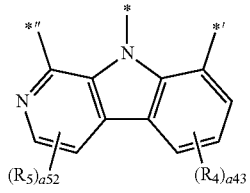

Formula Cz-6

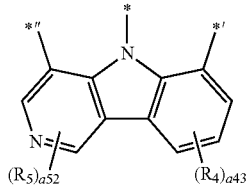

Formula Cz-7

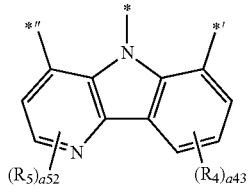

Formula Cz-8

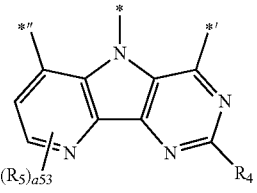

Formula Cz-9

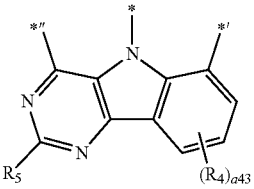

-continued
Formula Cz-10
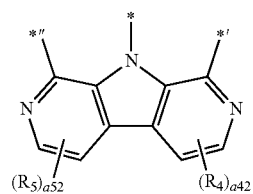
Formula Cz-11
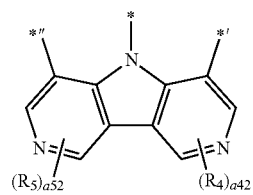
Formula Cz-12
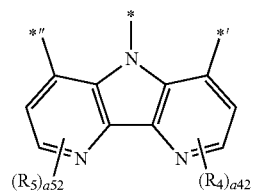
Formula Cz-13
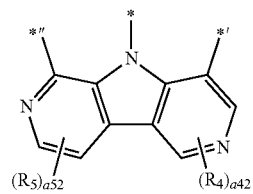
Formula Cz-14
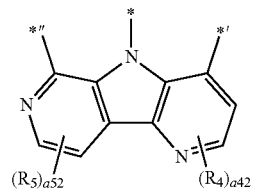
Formula Cz-15
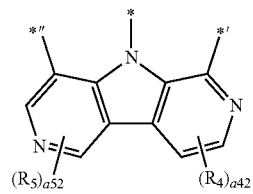
Formula Cz-16
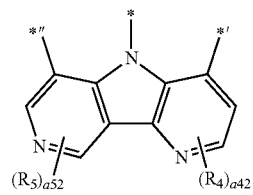
Formula Cz-17
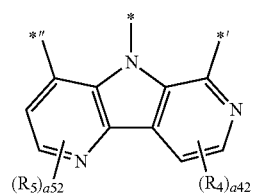
-continued
Formula Cz-18
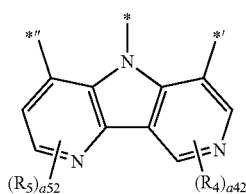
Formula Cz-19
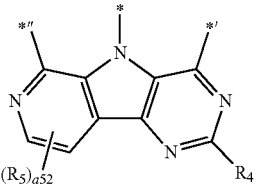
Formula Cz-20
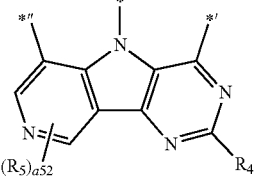
Formula Cz-21
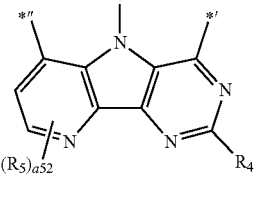
Formula Cz-22
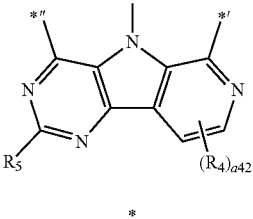
Formula Cz-23
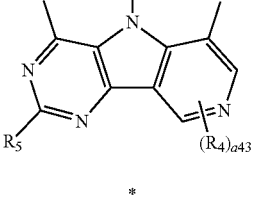
Formula Cz-24
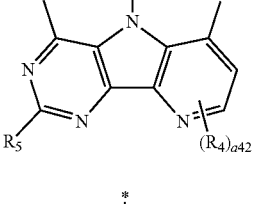
Formula Cz-25
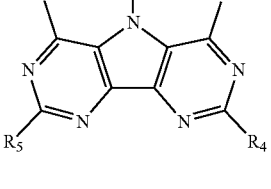

-continued

Formula Cz-26

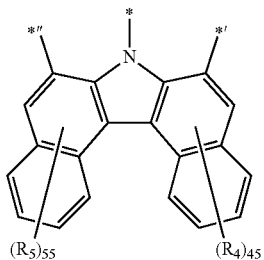

Formula Cz-27

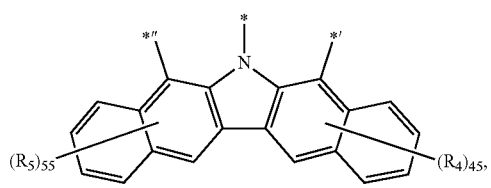

wherein, in Formulae Cz-1 to Cz-27, $R_4$ and $R_5$ are the same as described in claim 1, a42 and a52 are each independently an integer from 0 to 2, a43 and a53 are each independently an integer from 0 to 3, a45 and a55 are each independently an integer from 0 to 5, and \*, \*', and \*" each indicate a binding site to a neighboring atom.

13. The organometallic compound of claim 1, wherein a moiety represented by

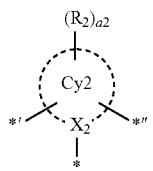

in Formula 1 is selected from groups represented by Formulae Cy1(1) to Cy1(26), a moiety represented by

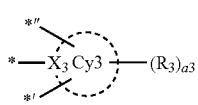

in Formula 1 is selected from groups represented by Formulae Cy2(1) to Cy2(15), a moiety represented by

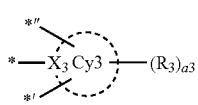

in Formula 1 is selected from groups represented by Formulae Cy3(1) to Cy3(26), and a moiety represented by

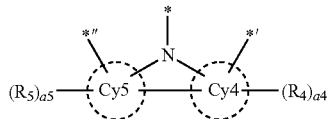

in Formula 1 is selected from groups represented by Formulae Cz(1) to Cz(21):

Formula Cy1(1)

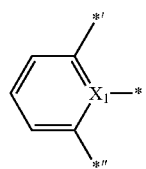

Formula Cy1(2)

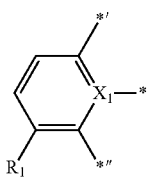

Formula Cy1(3)

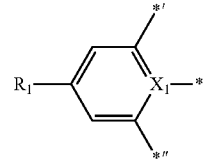

Formula Cy1(4)

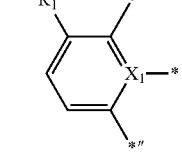

Formula Cy1(5)

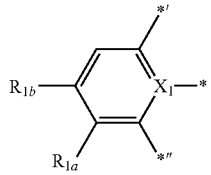

Formula Cy1(6)

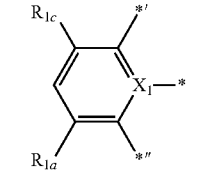

Formula Cy1(7)

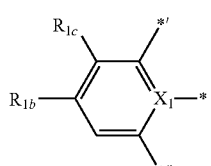

-continued
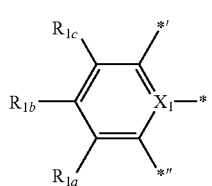
formula Cy1(8)
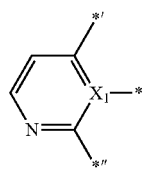
Formula Cy1(9)
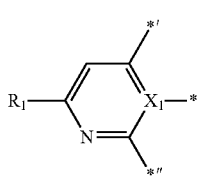
Formula Cy1(10)
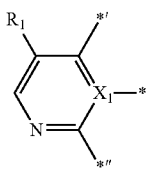
Formula Cy1(11)
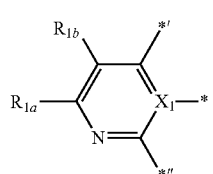
Formula Cy1(12)
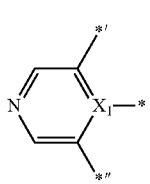
Formula Cy1(13)
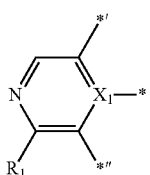
Formula Cy1(14)
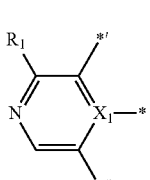
Formula Cy1(15)
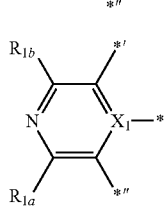
Formula Cy1(16)
-continued
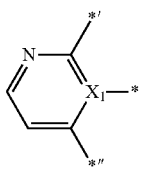
Formula Cy1(17)
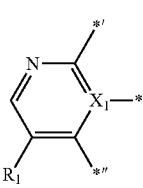
Formula Cy1(18)
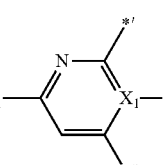
Formula Cy1(19)
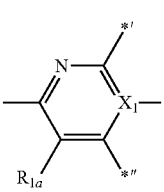
Formula Cy1(20)
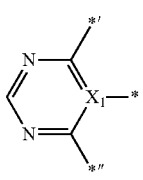
Formula Cy1(21)
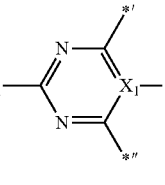
Formula Cy1(22)
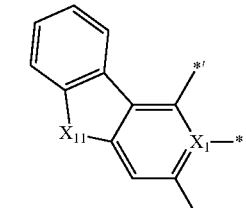
Formula Cy1(23)
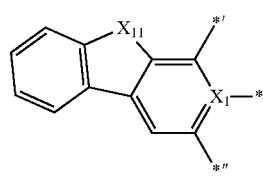
Formula Cy1(24)

Formula Cy1(25)
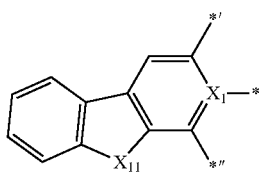
Formula Cy1(26)
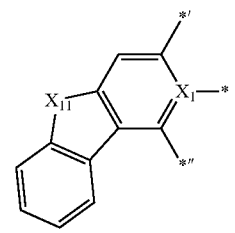
Formula Cy2(1)
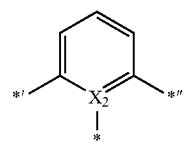
Formula Cy2(2)
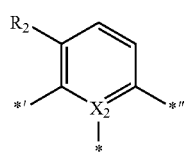
Formula Cy2(3)
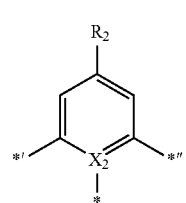
Formula Cy2(4)
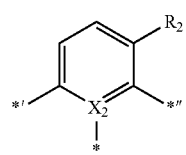
Formula Cy2(5)
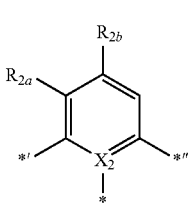
Formula Cy2(6)
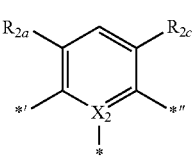
Formula Cy2(7)
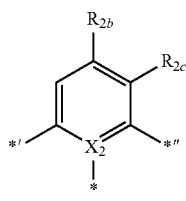
Formula Cy2(8)
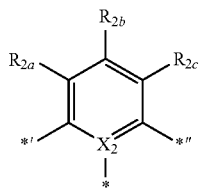
Formula Cy2(9)
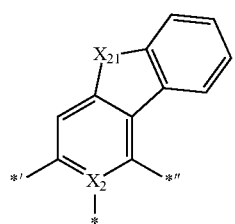
Formula Cy2(10)
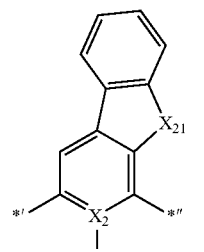
Formula Cy2(11)
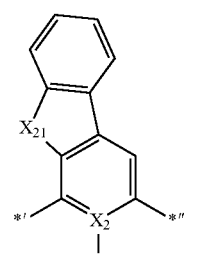
Formula Cy2(12)
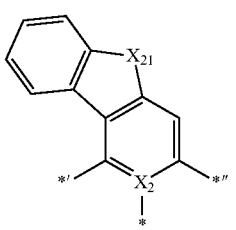
Formula Cy2(13)
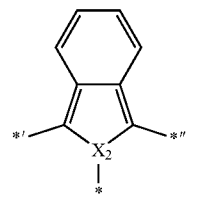
Formula Cy2(14)
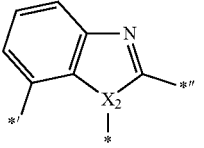

Formula Cy2(15)
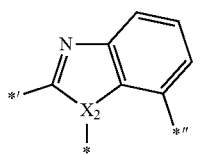
Formula Cy3(1)
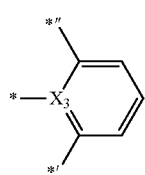
Formula Cy3(2)
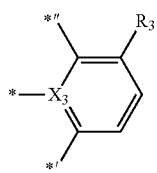
Formula Cy3(3)
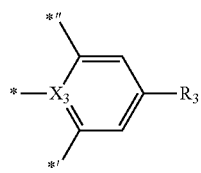
Formula Cy3(4)
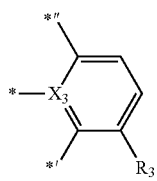
Formula Cy3(5)
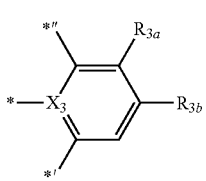
Formula Cy3(6)
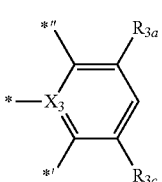
Formula Cy3(7)
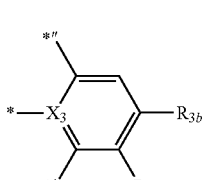
Formula Cy3(8)
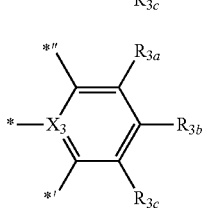
Formula Cy3(9)
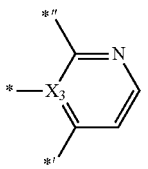
Formula Cy3(10)
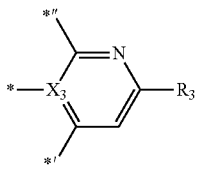
Formula Cy3(11)
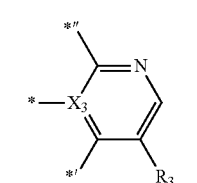
Formula Cy3(12)
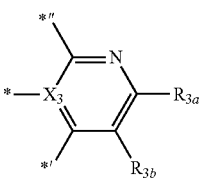
Formula Cy3(13)
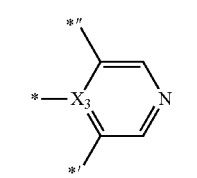
Formula Cy3(14)
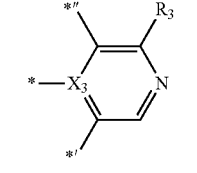
Formula Cy3(15)
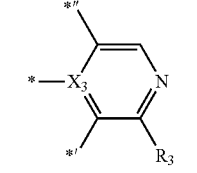
Formula Cy3(16)
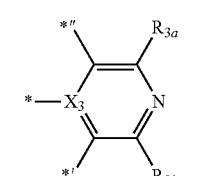
Formula Cy3(17)
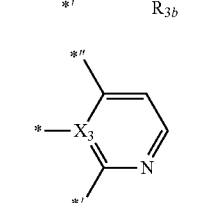

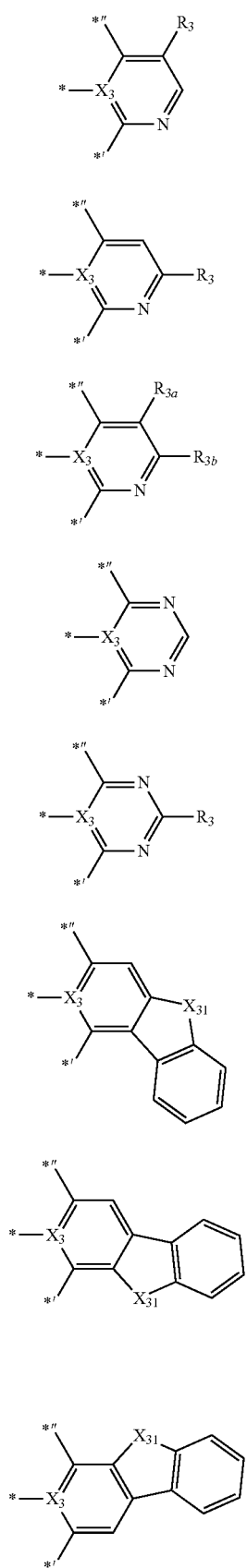
Formula Cy3(18)
Formula Cy3(19)
Formula Cy3(20)
Formula Cy3(21)
Formula Cy3(22)
Formula Cy3(23)
Formula Cy3(24)
Formula Cy3(25)
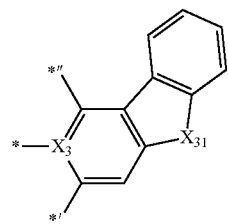
Formula Cy3(26)
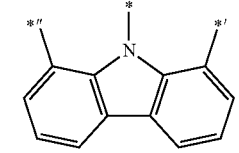
Formula Cz(1)
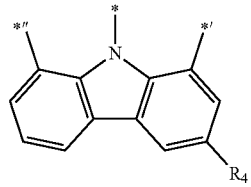
Formula Cz(2)
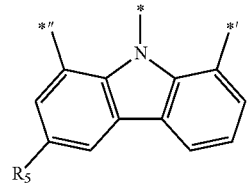
Formula Cz(3)
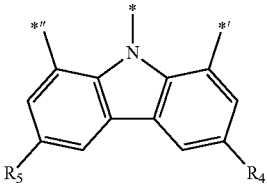
Formula Cz(4)
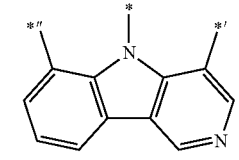
Formula Cz(5)
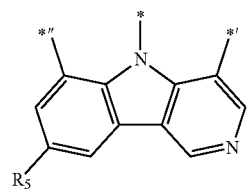
Formula Cz(6)
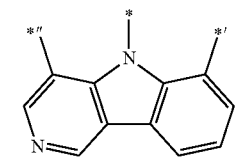
Formula Cz(7)

Formula Cz(8)
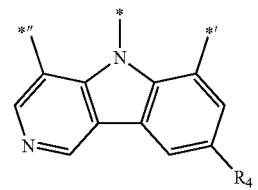

Formula Cz(9)
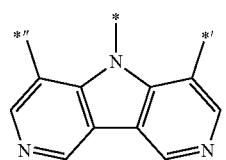

Formula Cz(10)
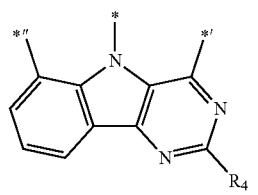

Formula Cz(11)
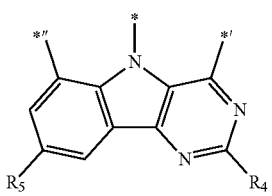

Formula Cz(12)
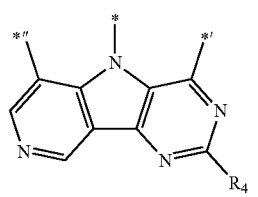

Formula Cz(13)
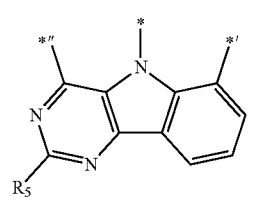

Formula Cz(14)
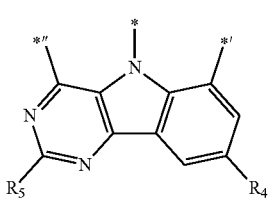

Formula Cz(15)
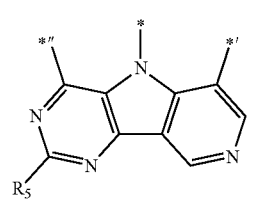

Formula Cz(16)
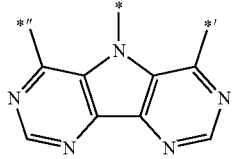

Formula Cz(17)
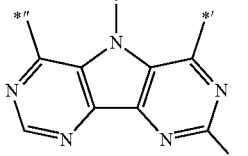

Formula Cz(18)
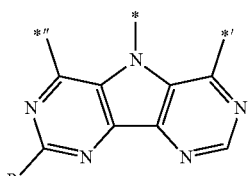

Formula Cz(19)
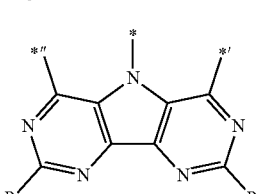

Formula Cz(20)
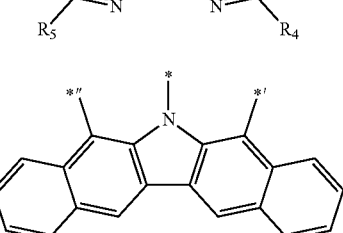

Formula Cz(21)
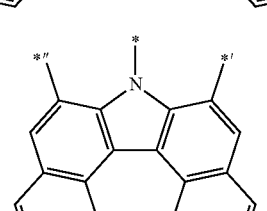

wherein, in Formulae Cy1(1) to Cy1(26), Cy2(1) to Cy2(15), Cy3(1) to Cy3(26), and Cz(1) to Cz(21), $X_1$ to $X_3$ and $R_1$ to $R_5$ are the same as described in claim 1, $X_{11}$ is O, S, N($R_{11}$), or C($R_{11}$)($R_{12}$), $X_{21}$ is O, S, N($R_{21}$), or C($R_{21}$)($R_{22}$), $X_{31}$ is O, S, N($R_{31}$), or C($R_{31}$)($R_{32}$), $R_{1a}$ to $R_{1c}$, $R_{11}$, and $R_{12}$ are the same as described in connection with $R_1$ in claim 1, $R_{2a}$ to $R_{2c}$, $R_{21}$, and $R_{22}$ are the same as described in connection with $R_2$ in claim 1, $R_{3a}$ to $R_{3c}$, $R_{31}$, and $R_{32}$ are the same as described in connection with $R_3$ in claim 1, $R_1$, $R_{1a}$ to $R_{1c}$, $R_2$, $R_{2a}$ to $R_{2c}$, $R_3$, $R_{3a}$ to $R_{3c}$, $R_4$, and $R_5$ are not hydrogen, and \*, \*′, and \*″ each indicate a binding site to a neighboring atom.

14. The organometallic compound of claim 1, wherein the organometallic compound is represented by one of Formulae 1-1 to 1-32:
Formula 1-1
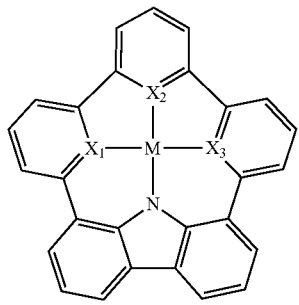
Formula 1-2
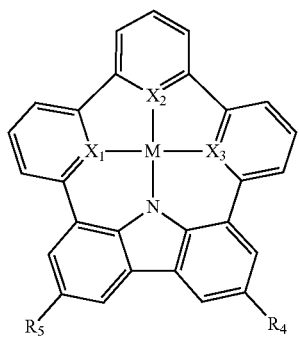
Formula 1-3
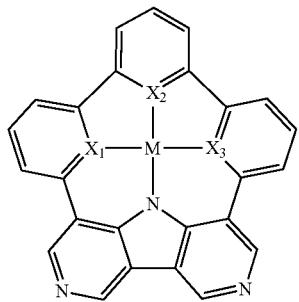
Formula 1-4
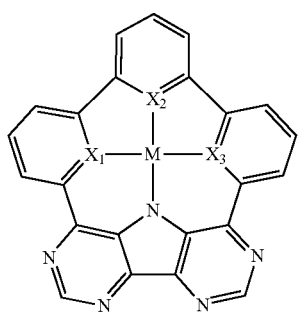
-continued
Formula 1-5
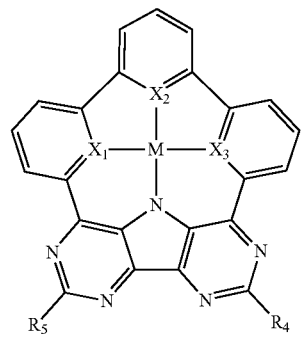
Formula 1-6
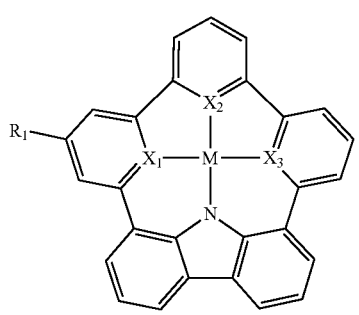
Formula 1-7
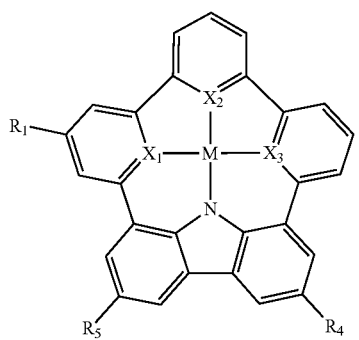
Formula 1-8
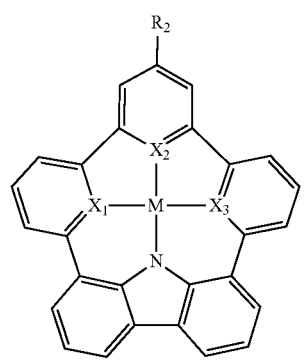

Formula 1-9
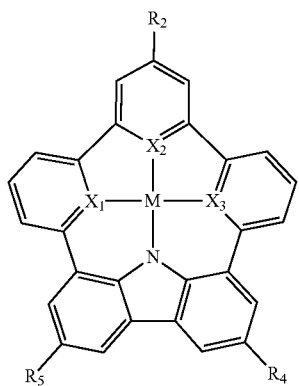
Formula 1-10
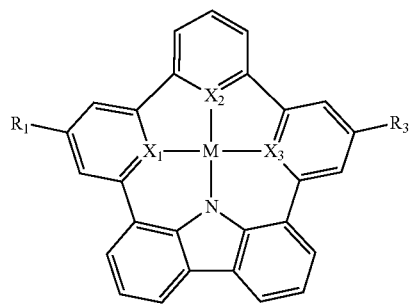
Formula 1-11
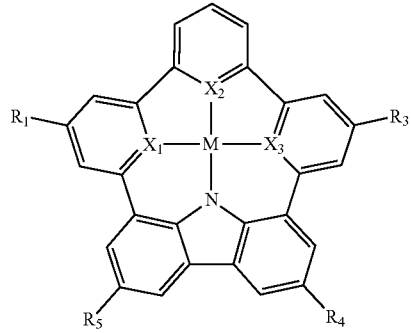
Formula 1-12
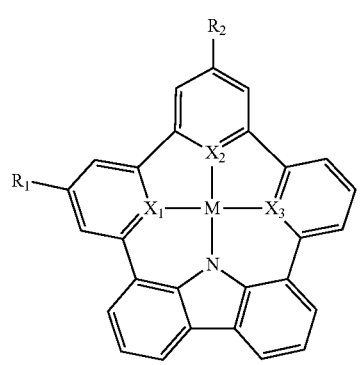
Formula 1-13
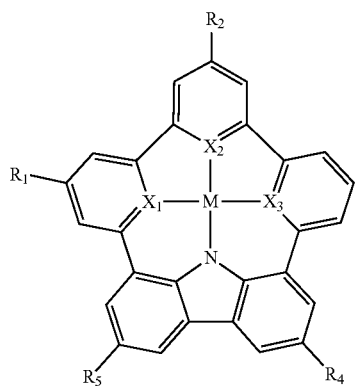
Formula 1-14
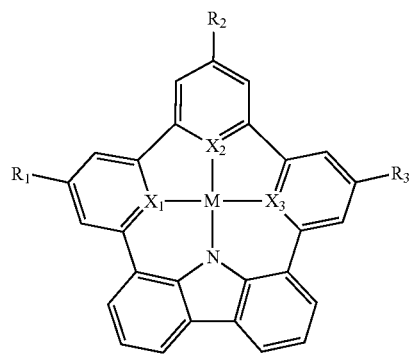
Formula 1-15
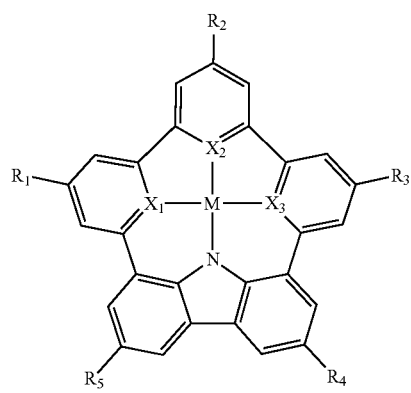
Formula 1-16
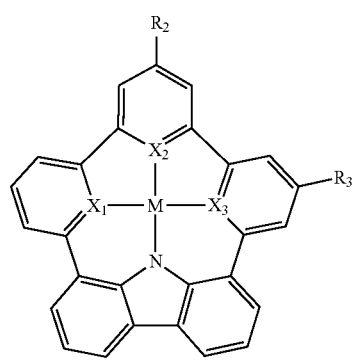

-continued
Formula 1-17
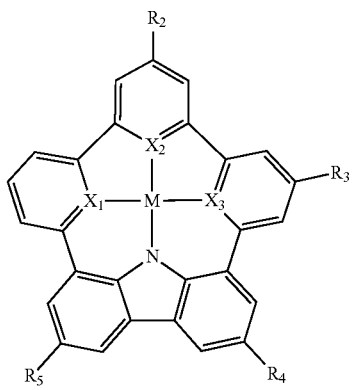
Formula 1-18
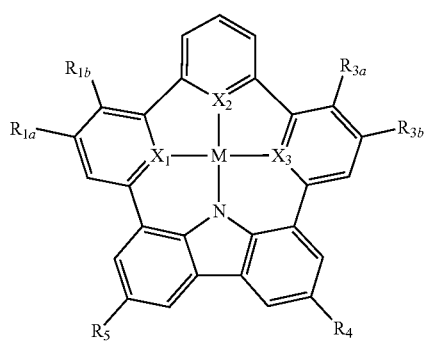
Formula 1-19
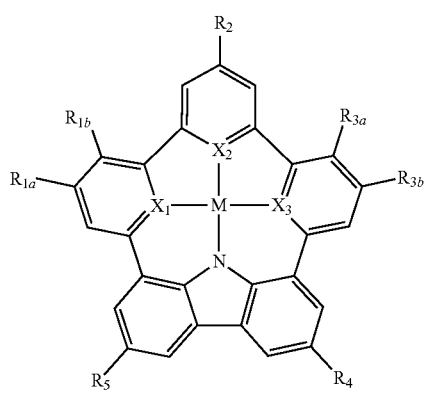
Formula 1-20
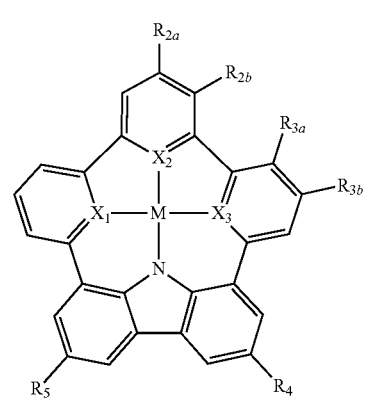
Formula 1-21
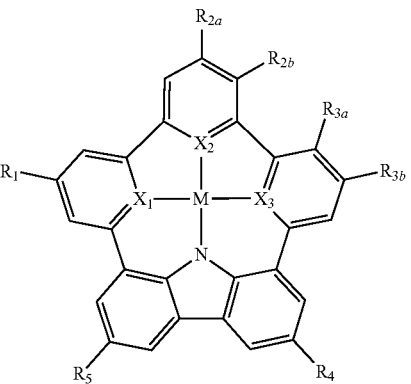
Formula 1-22
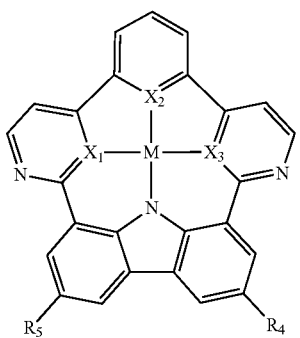
Formula 1-23
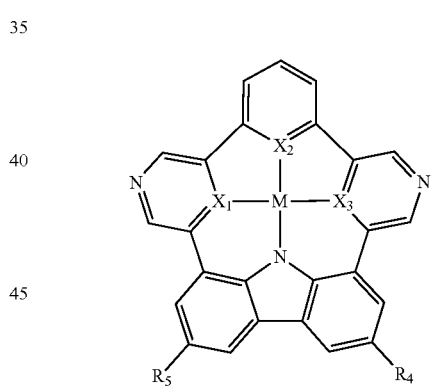
Formula 1-24
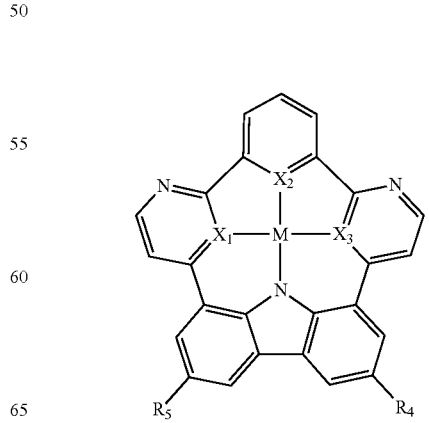

219
-continued
Formula 1-25
Formula 1-26
Formula 1-27
Formula 1-28
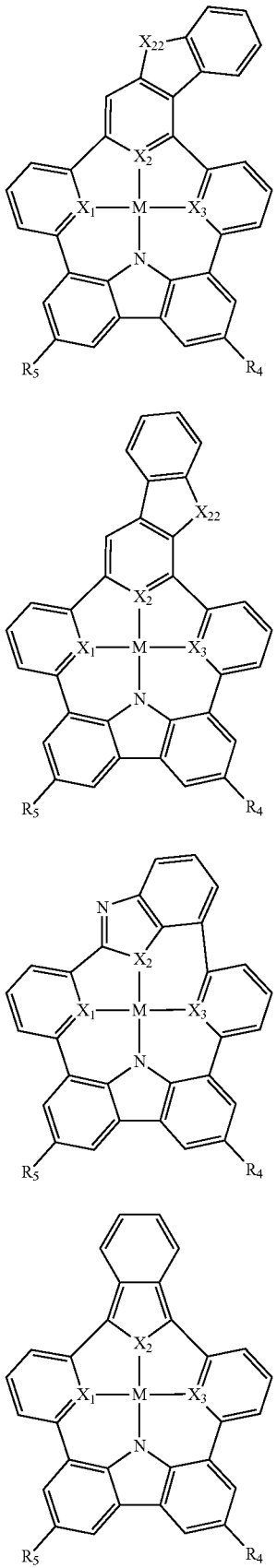
220
-continued
Formula 1-29
Formula 1-30
Formula 1-31
Formula 1-32
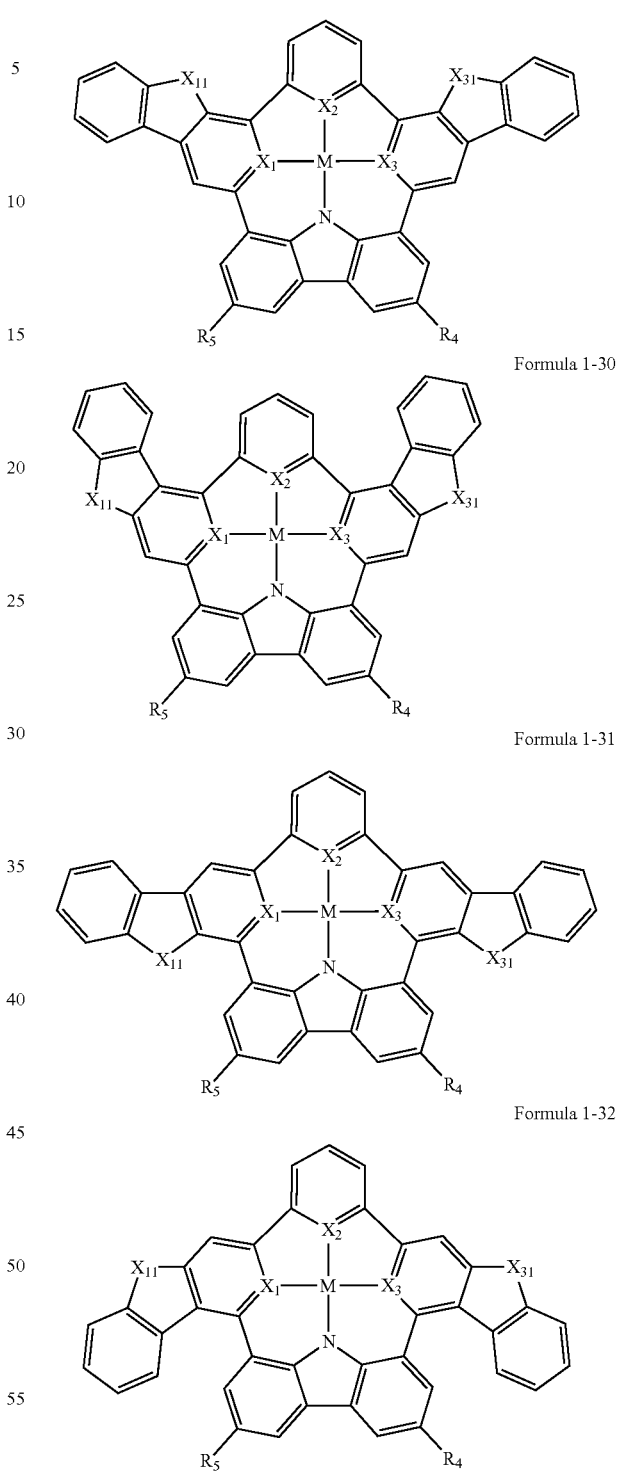
wherein, in Formulae 1-1 to 1-32,
M, $X_1$ to $X_3$, and $R_1$ to $R_5$ are the same as described in claim 1,
$X_{11}$ is O, S, $N(R_{11})$, or $C(R_{11})(R_{12})$,
$X_{21}$ is O, S, $N(R_{21})$, or $C(R_{21})(R_{22})$,
$X_{31}$ is O, S, $N(R_{31})$, or $C(R_{31})(R_{32})$,
$R_{1a}$, $R_{1b}$, $R_{11}$, and $R_{12}$ are the same as described in connection with $R_1$ in claim 1, $R_{2a}$, $R_{2b}$, $R_{21}$, and $R_{22}$ are the same as described in connection with $R_2$ in claim 1, and
$R_{3a}$, $R_{3b}$, $R_{31}$, and $R_{32}$ are the same as described in connection with $R_3$ in claim 1.
15. The organometallic compound of claim 1, wherein the organometallic compound is selected from Compounds 1 to 120:
1
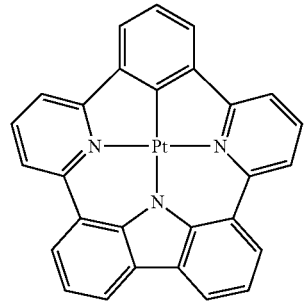
2
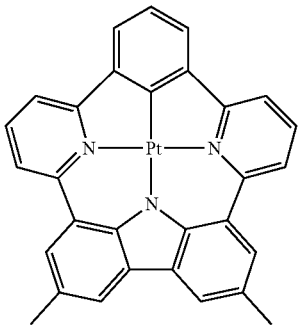
3
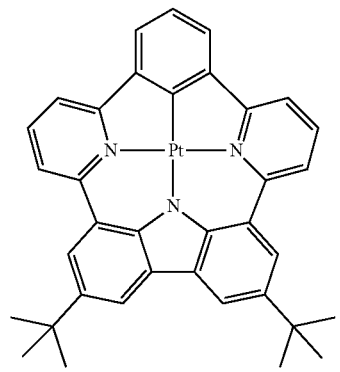
4
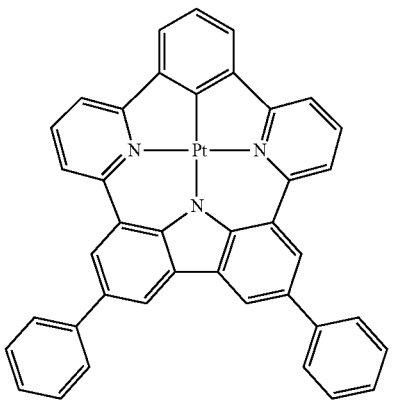
5
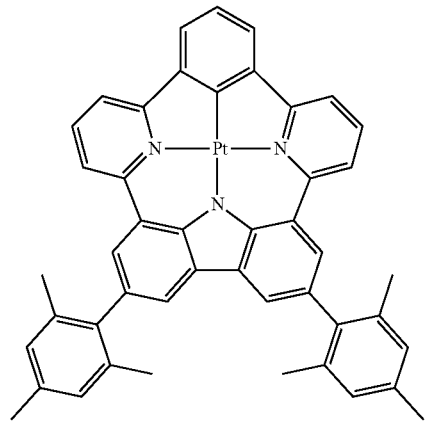
6
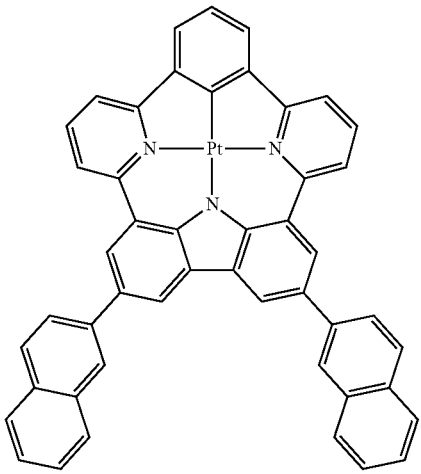
7
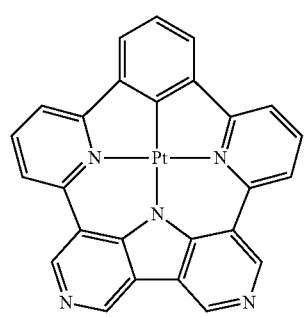
8
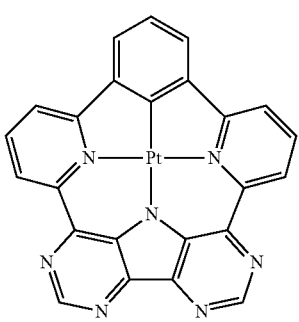

-continued
9
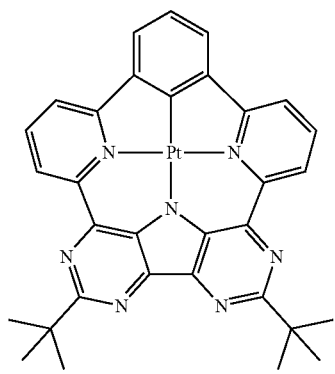
10
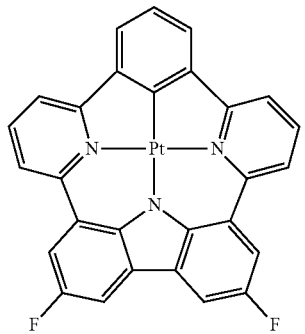
11
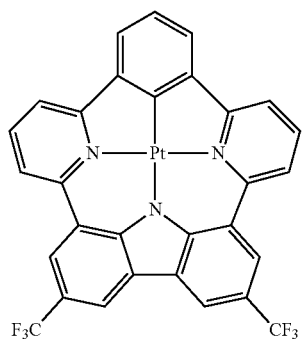
12
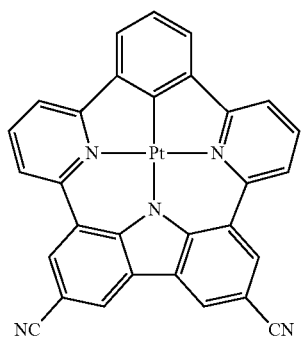
13
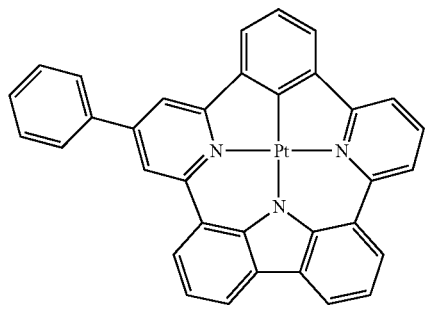
14
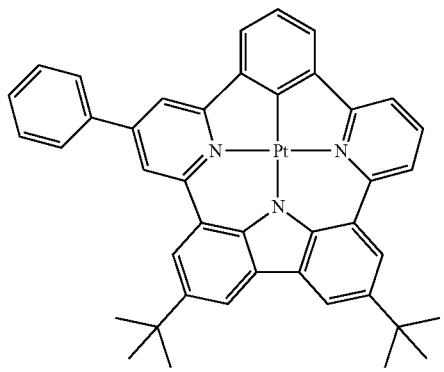
15
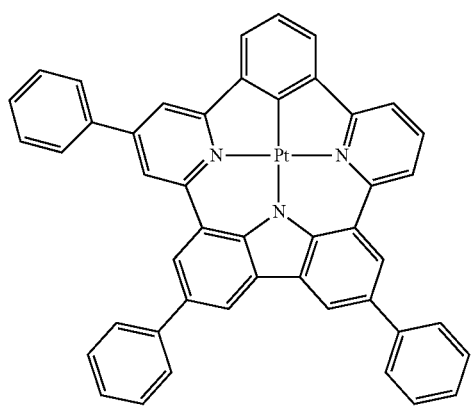
16
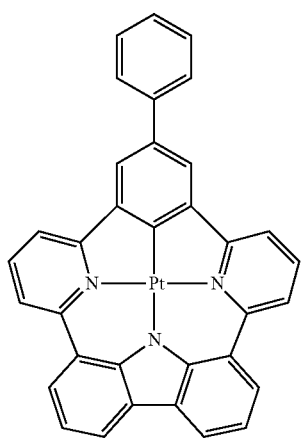

17
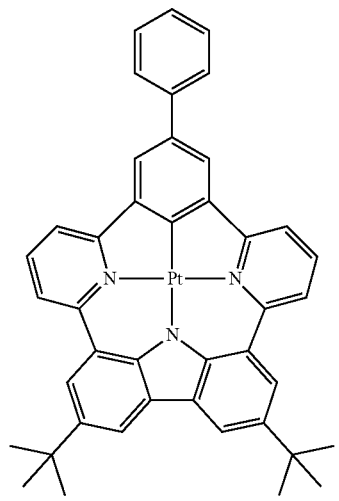
18
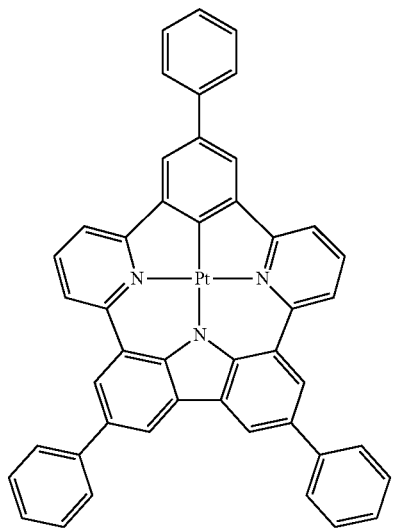
19
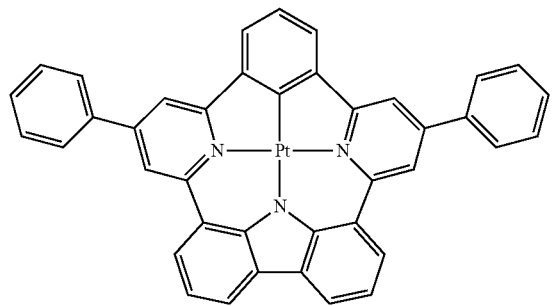
20
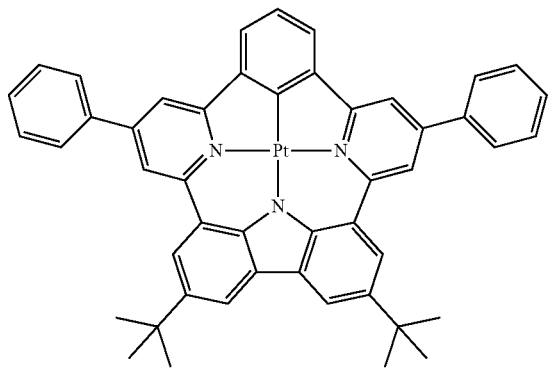
21
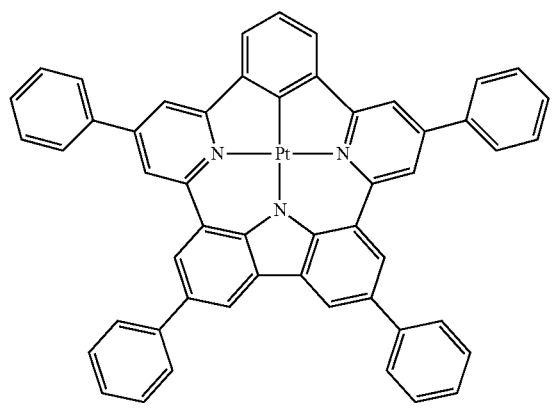
22
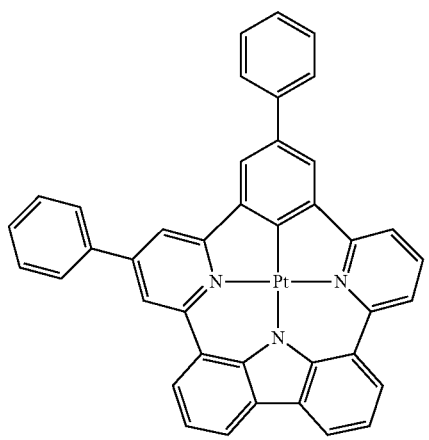

-continued
23
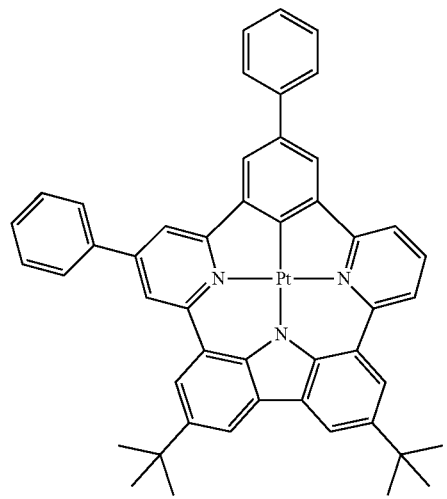
24
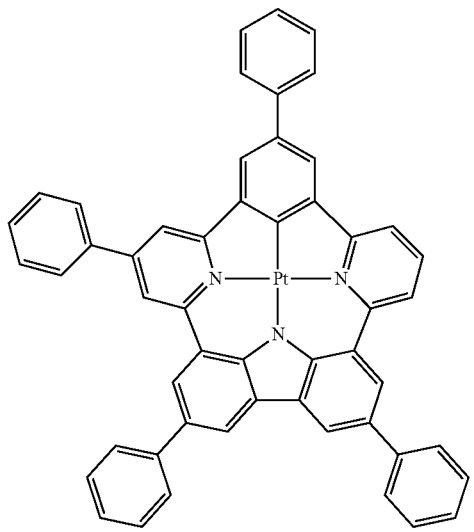
25
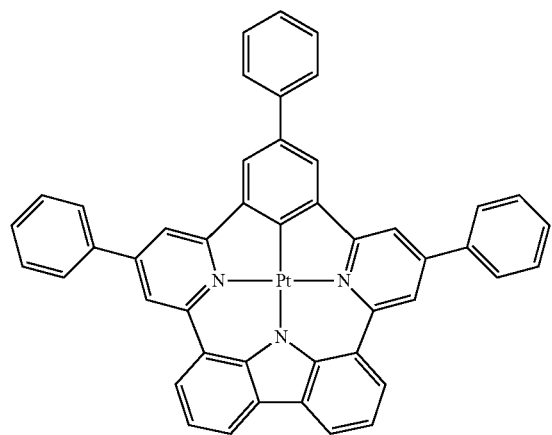
26
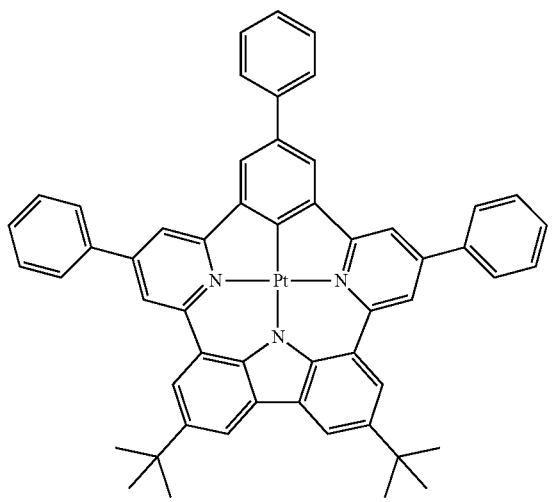
27
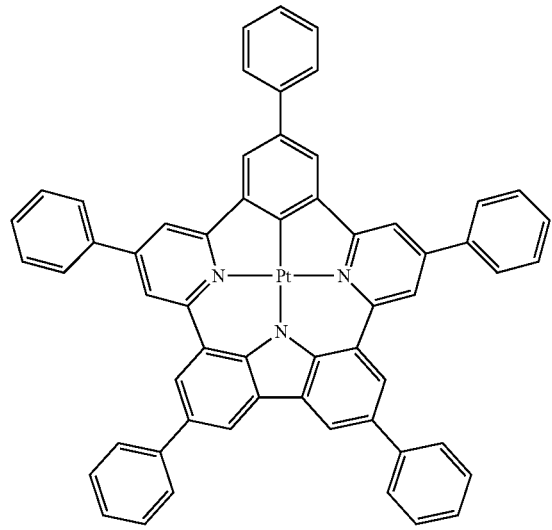
28
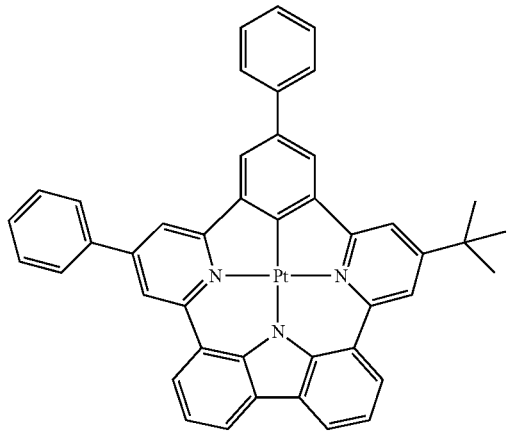

229 230
-continued
29
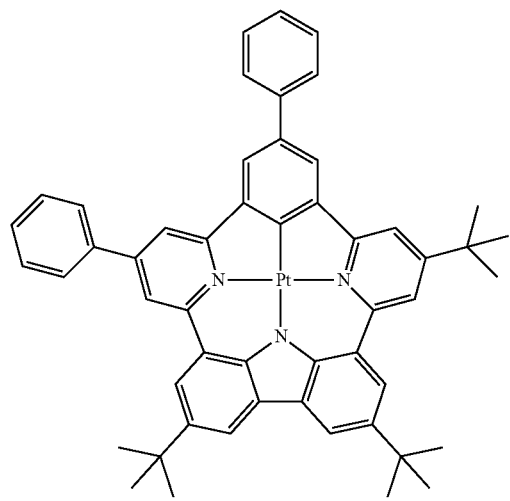
30
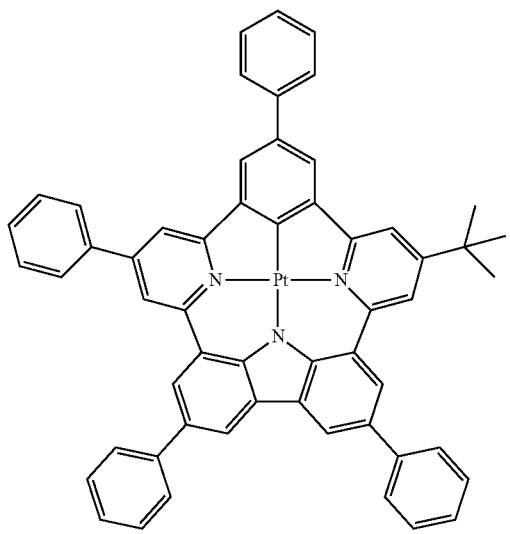
31
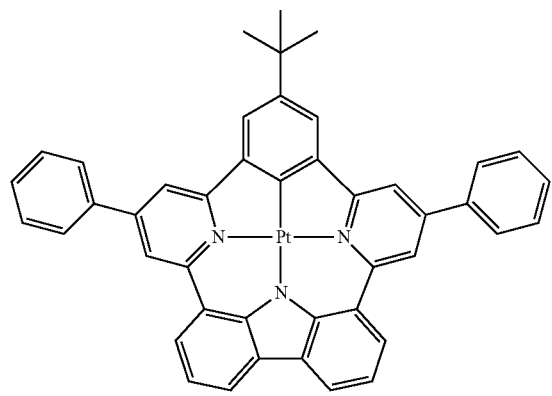
32
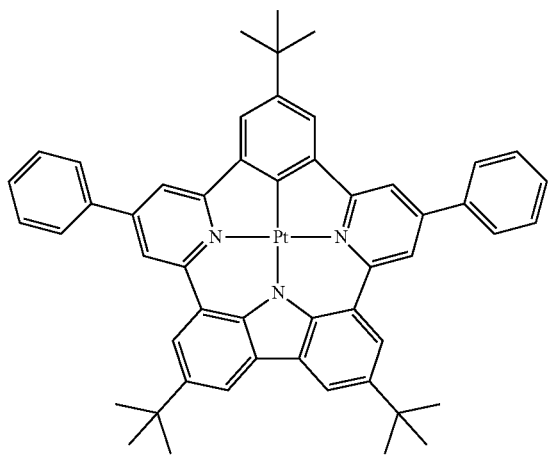
33
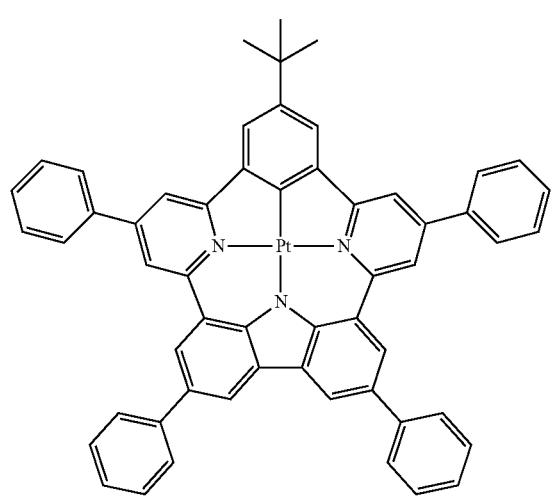
34
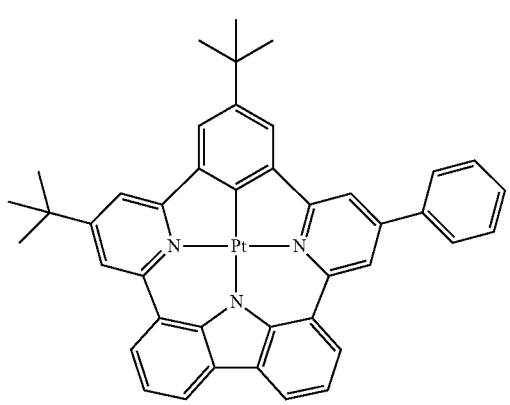

-continued
35
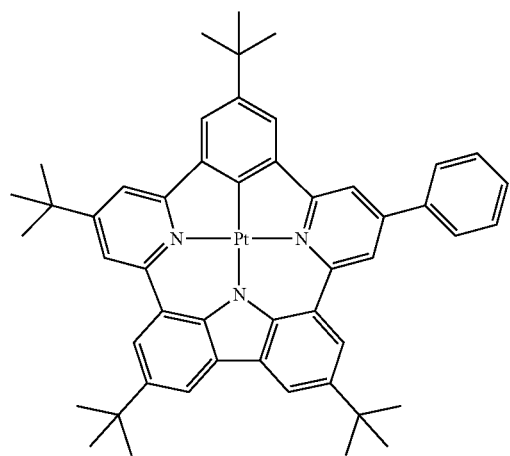
36
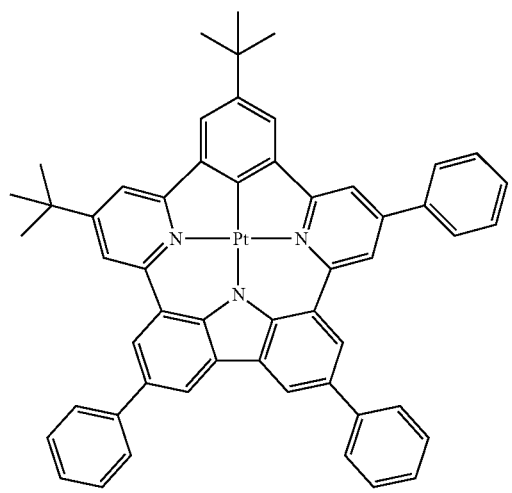
37
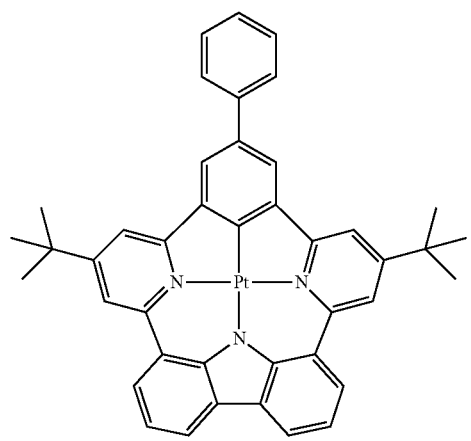
38
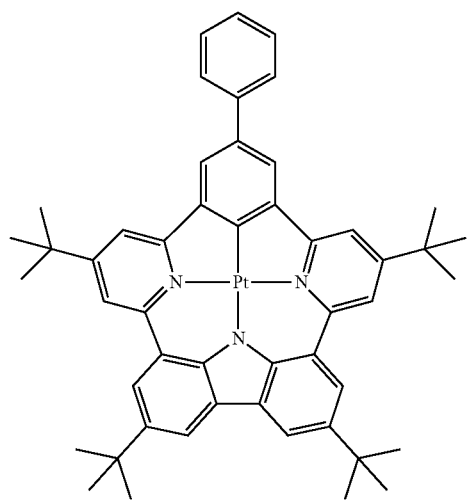
39
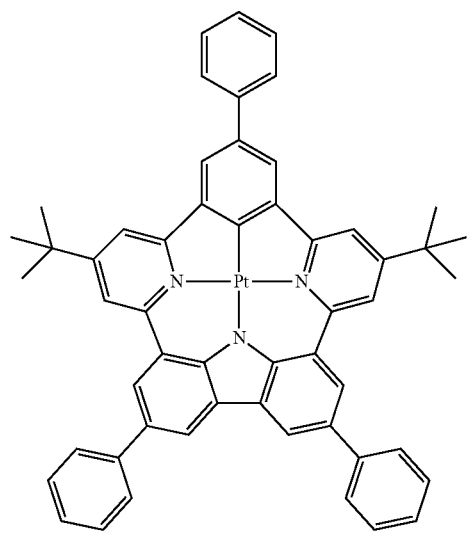
40
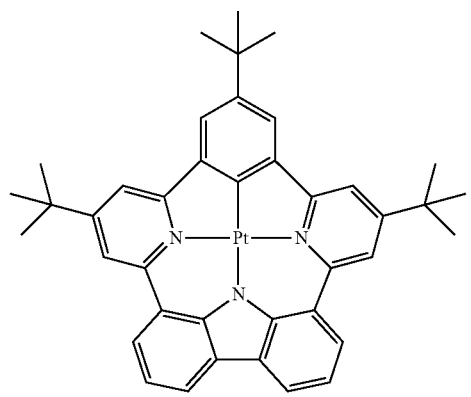

-continued
41
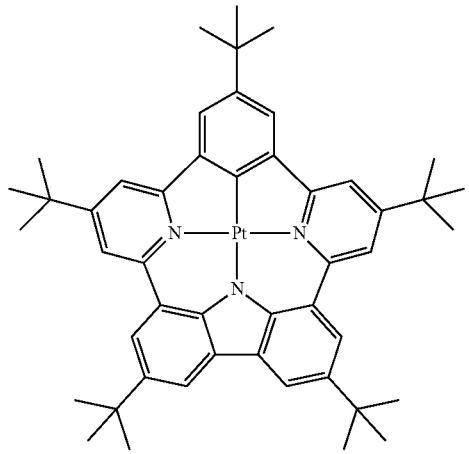
42
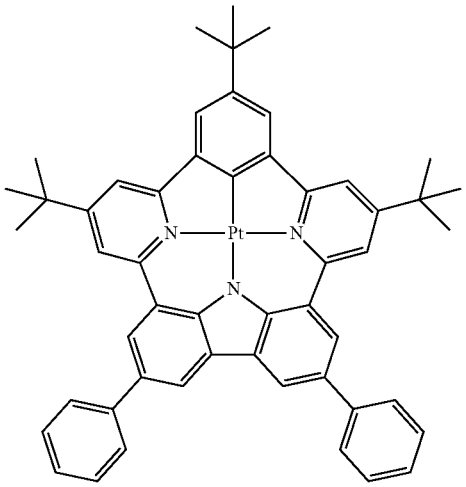
43
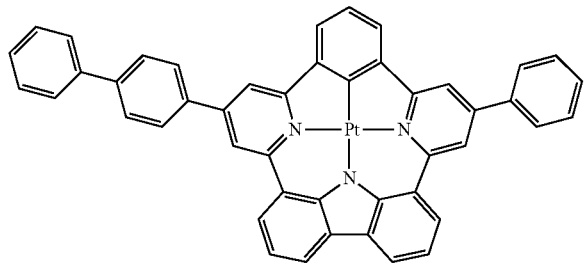
44
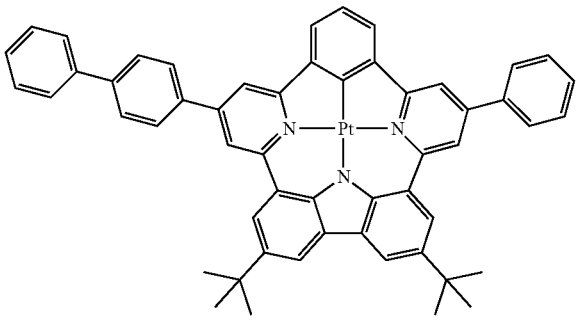
45
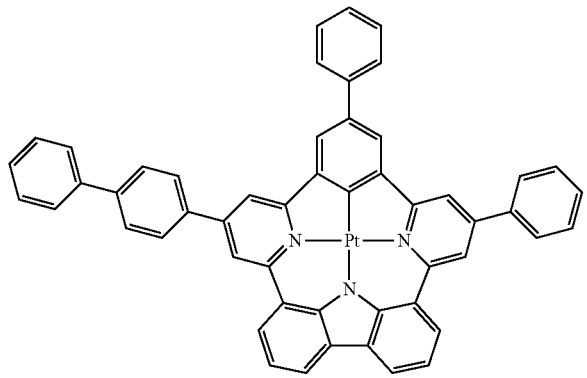
46
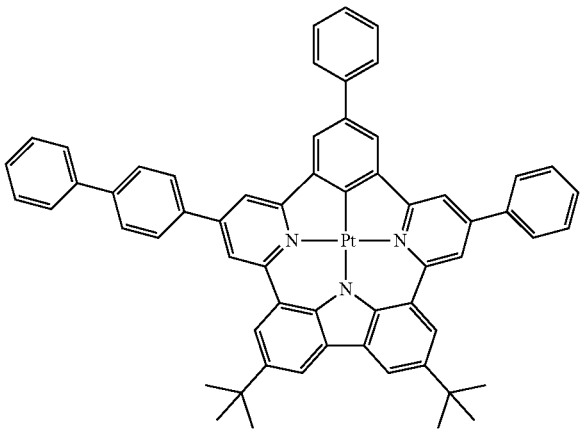
47
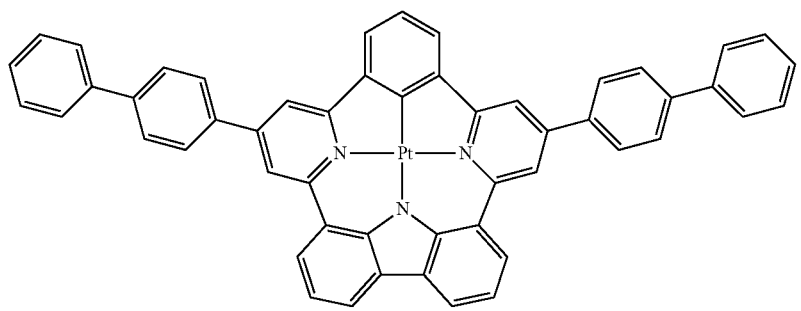

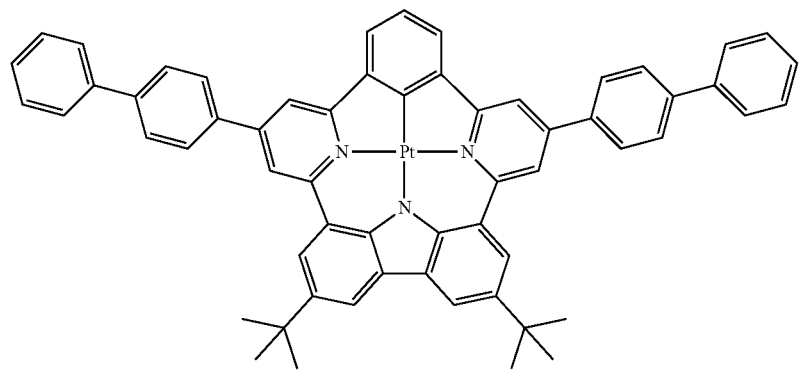
48
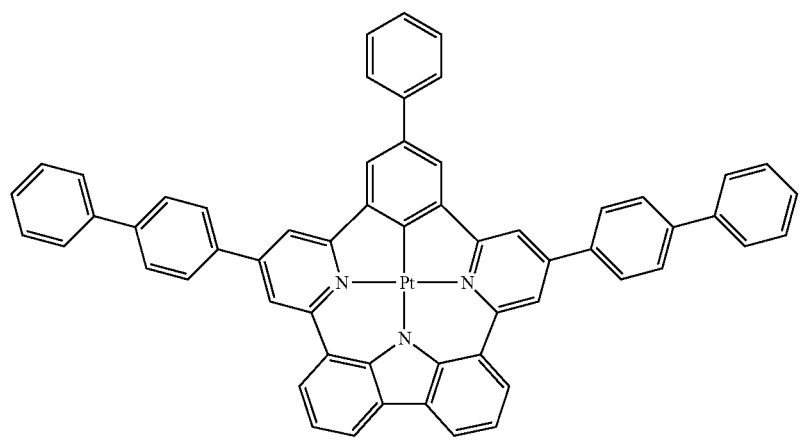
49
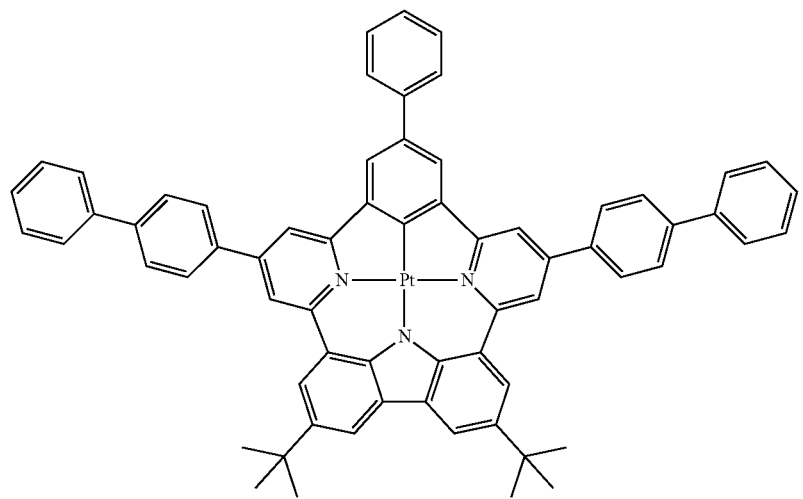
50

51
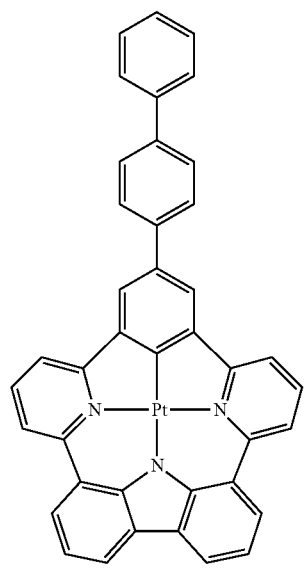
52
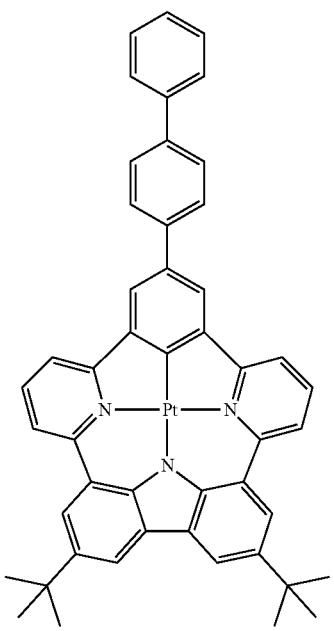
53
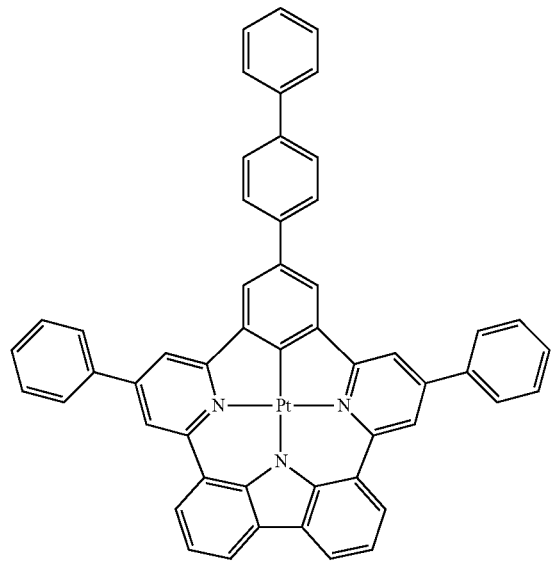
54
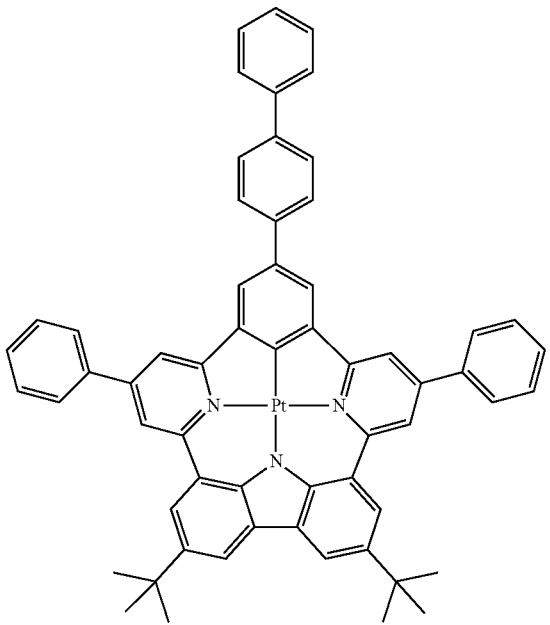

239 240
-continued
55
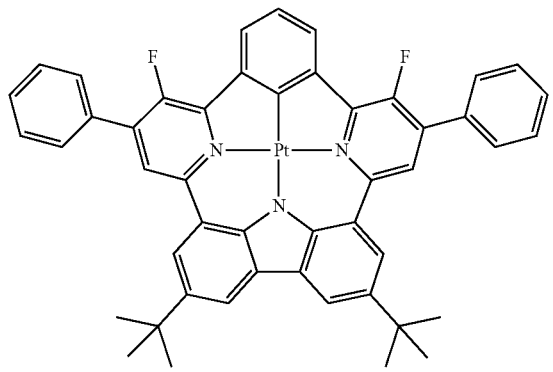
56
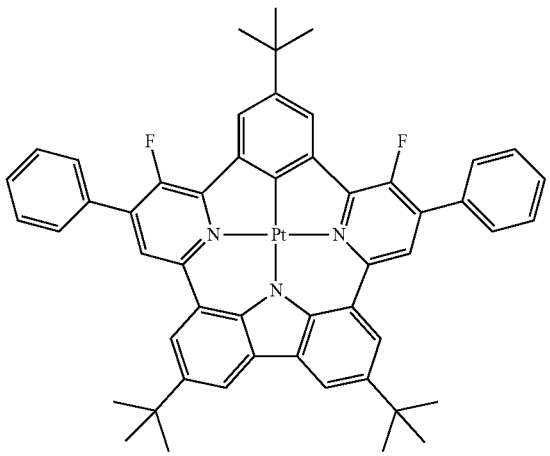
57
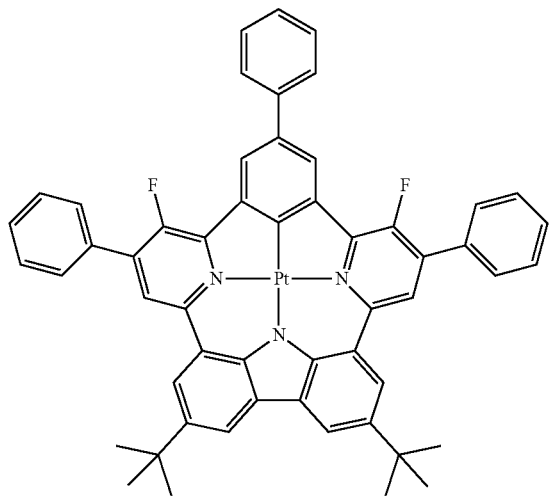
58
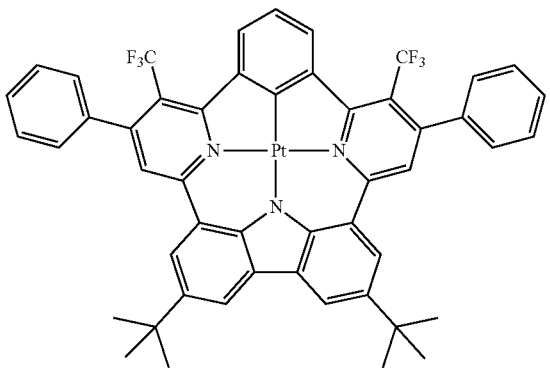
59
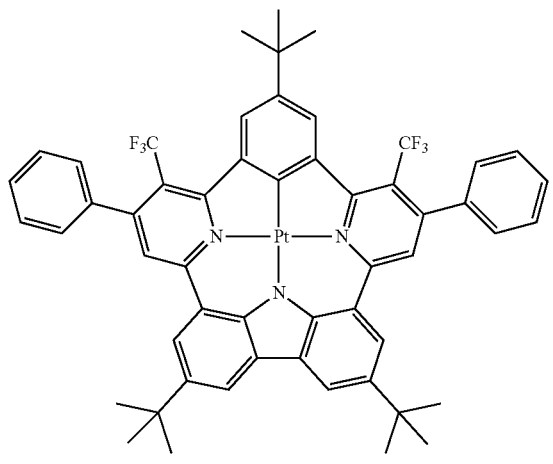
60
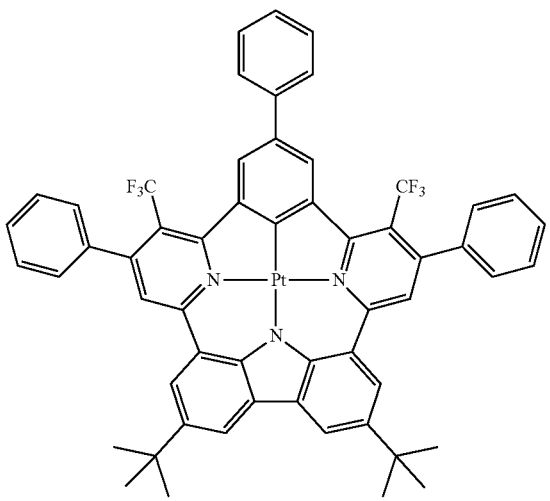

-continued
61
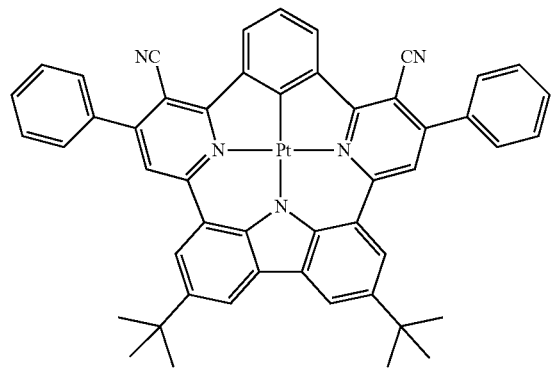
62
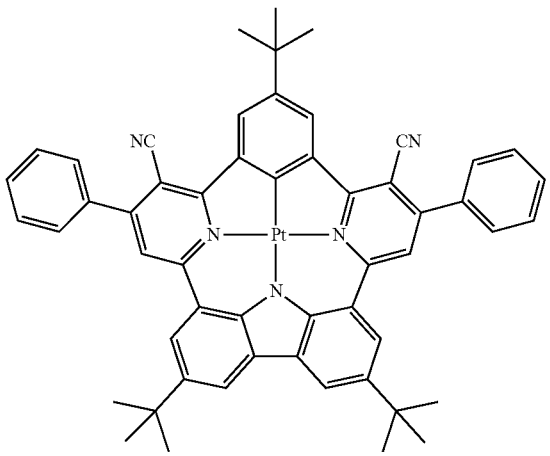
63
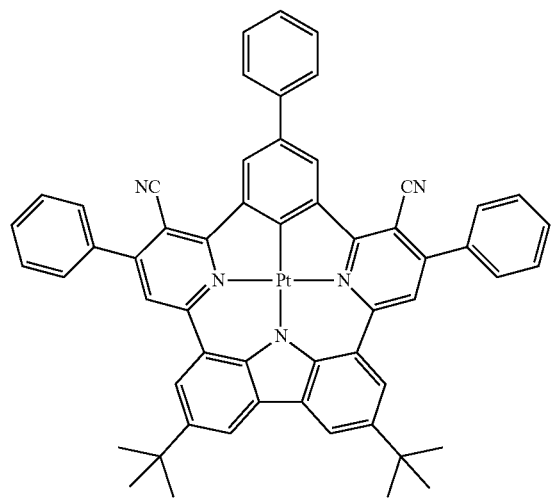
64
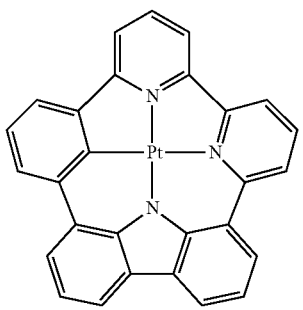
65
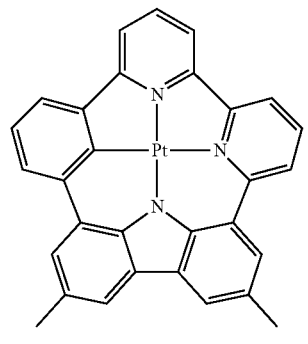
66
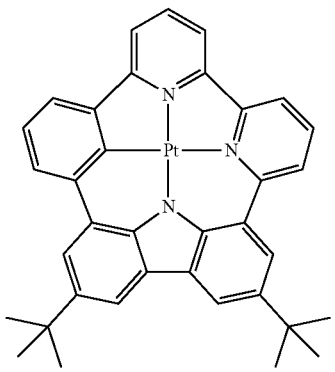

-continued
67
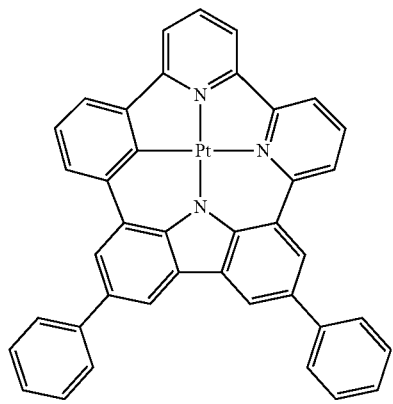
68
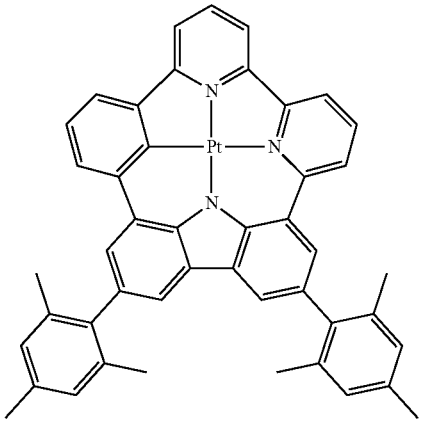
69
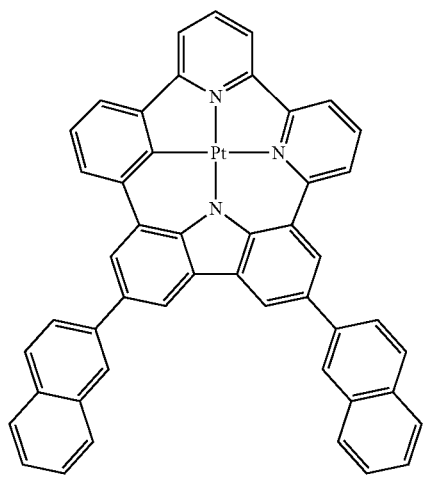
70
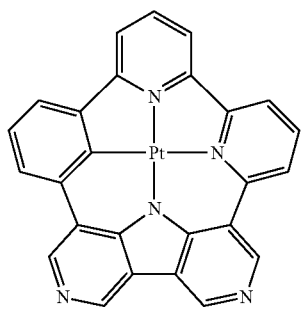
71
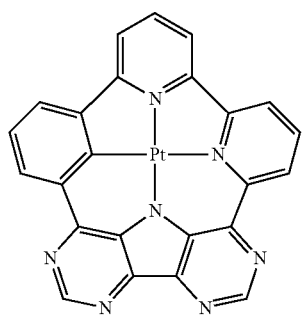
72
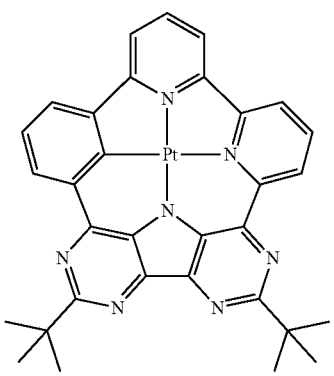
73
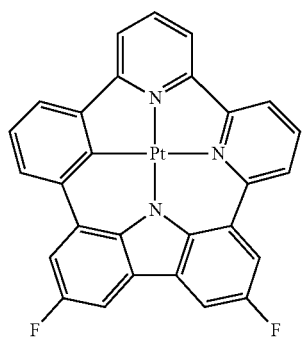
74
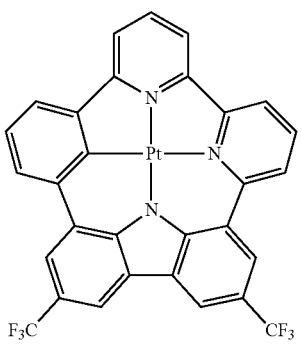

-continued
75
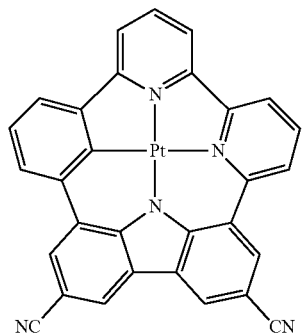
76
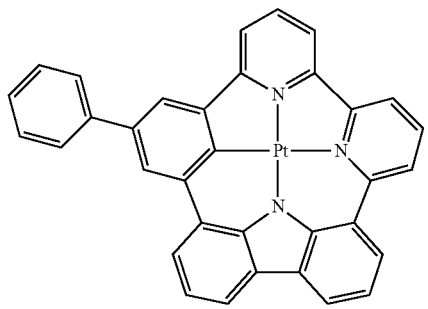
77
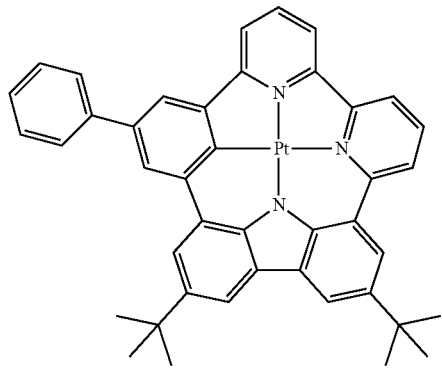
78
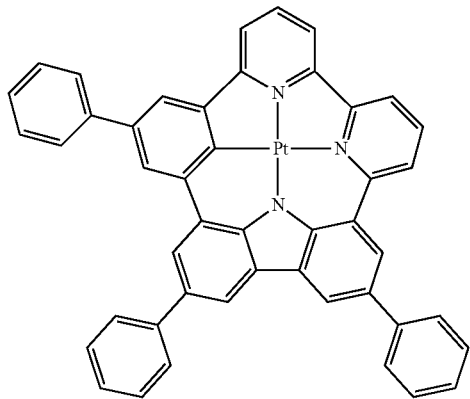
79
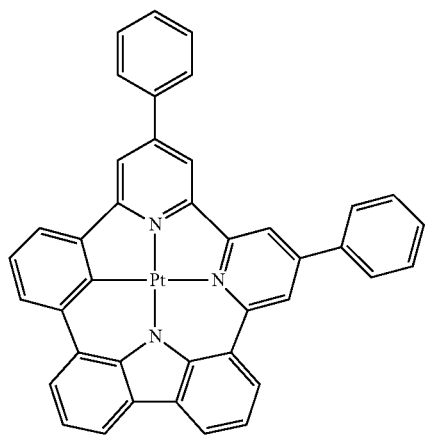
80
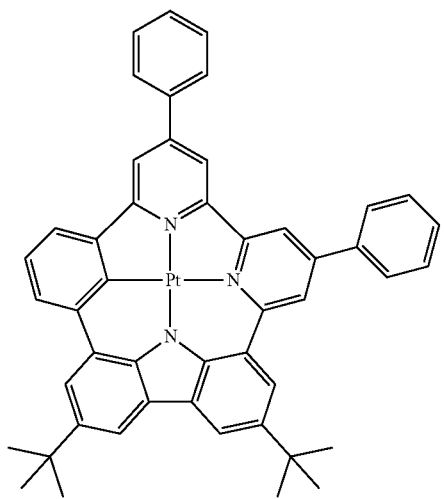

-continued
81
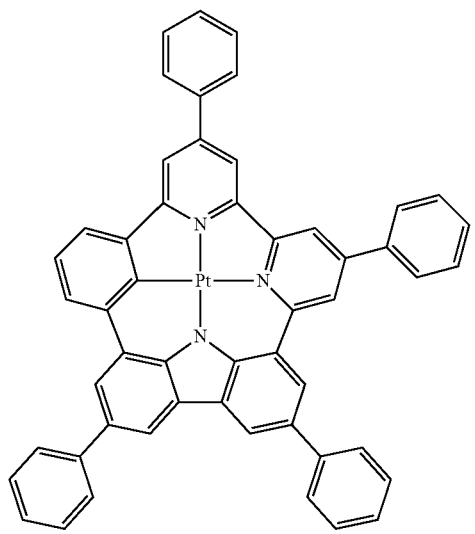
82
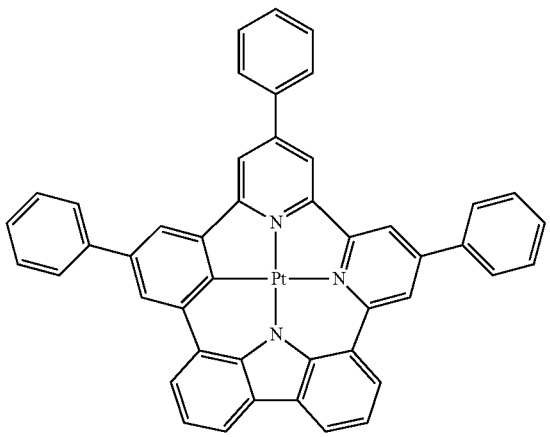
83
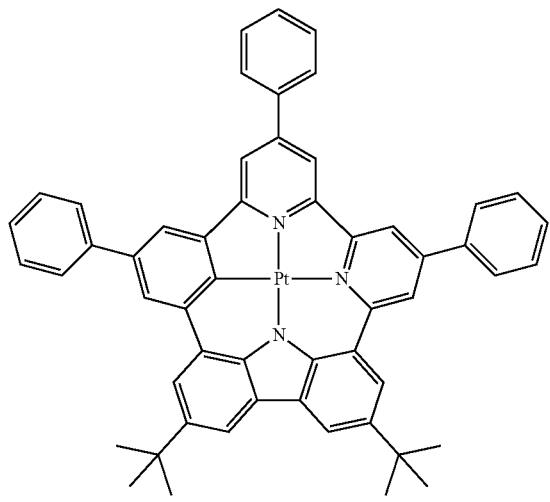
84
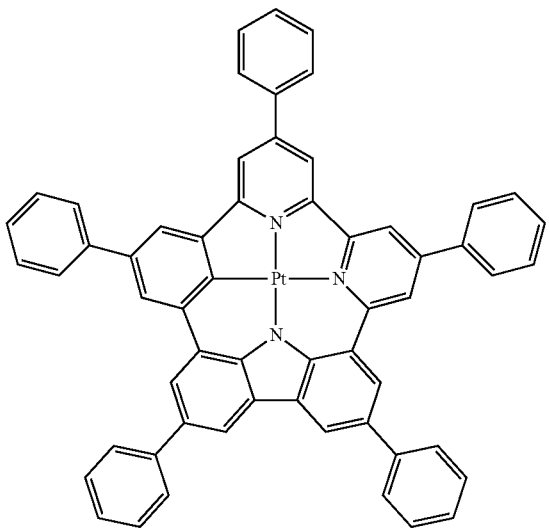
85
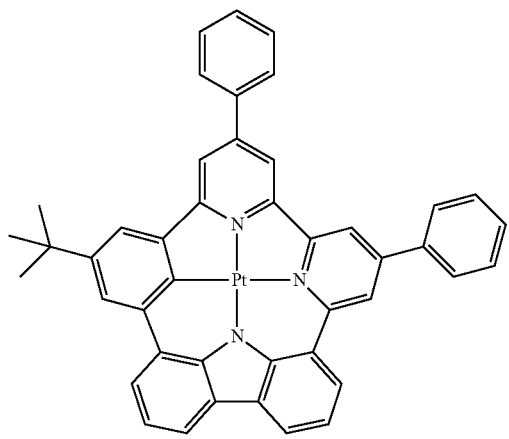
86
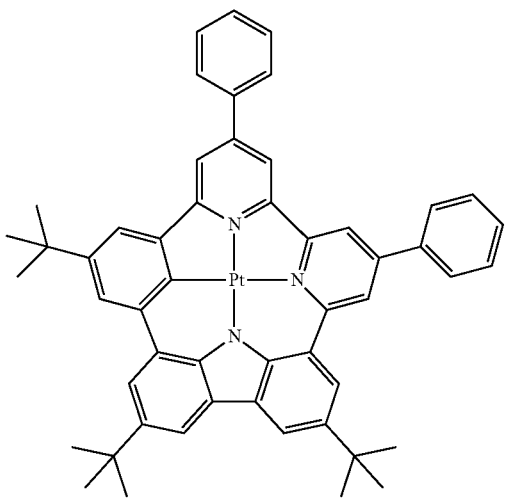

-continued
87
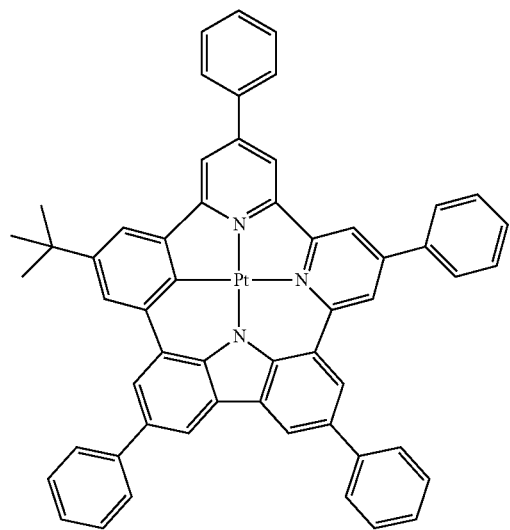
88
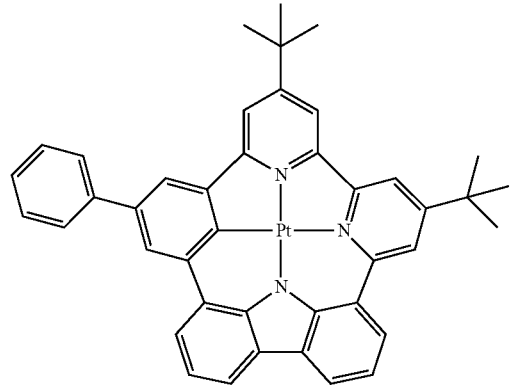
89
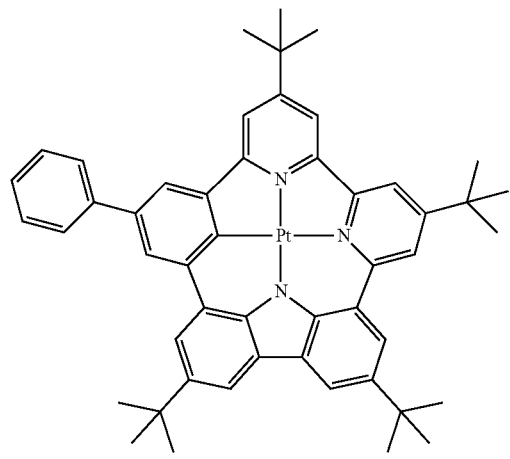
90
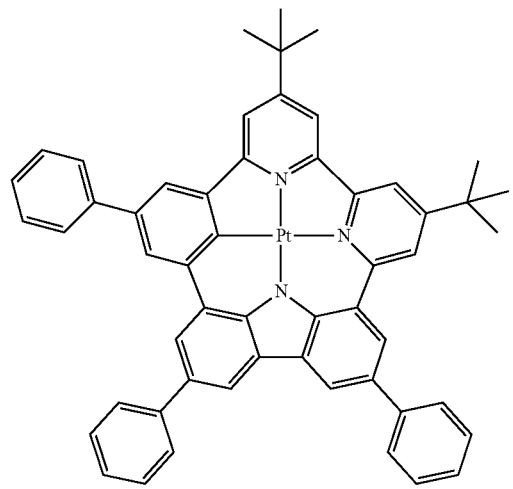
91
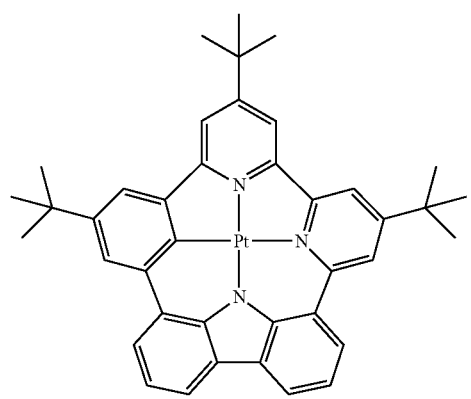
92
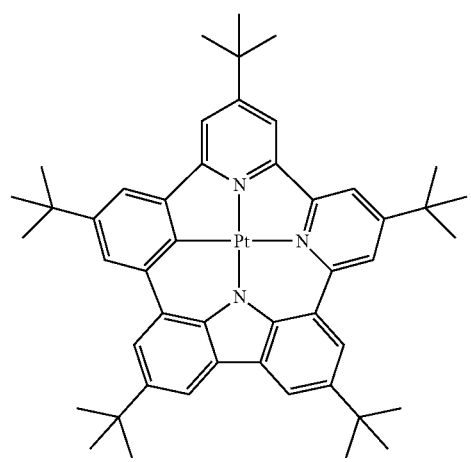

-continued
93
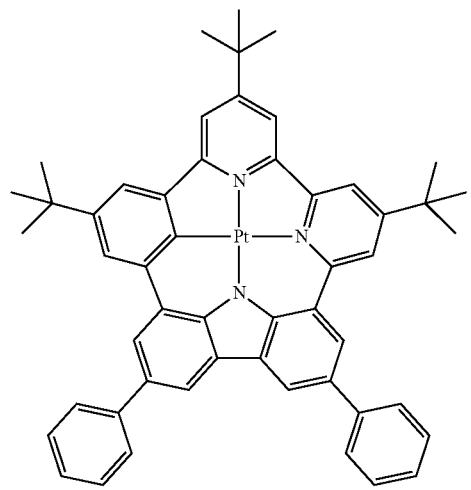
94
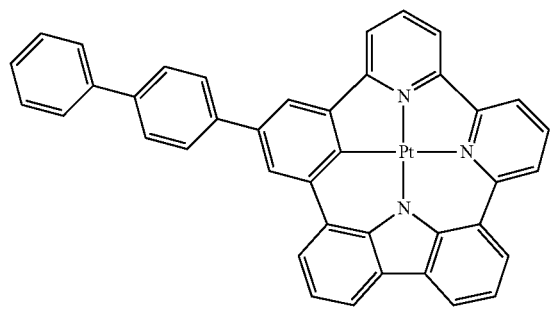
95
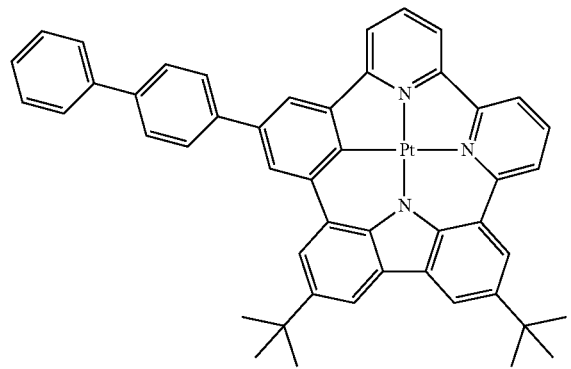
96
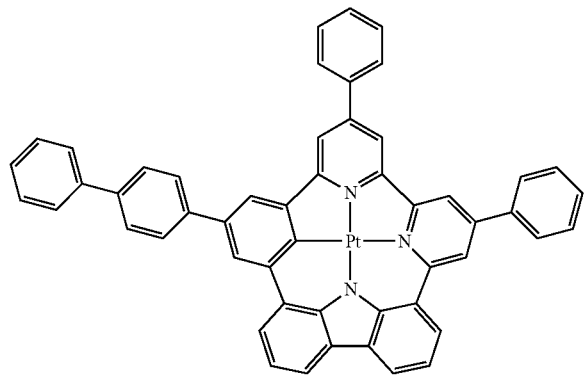
97
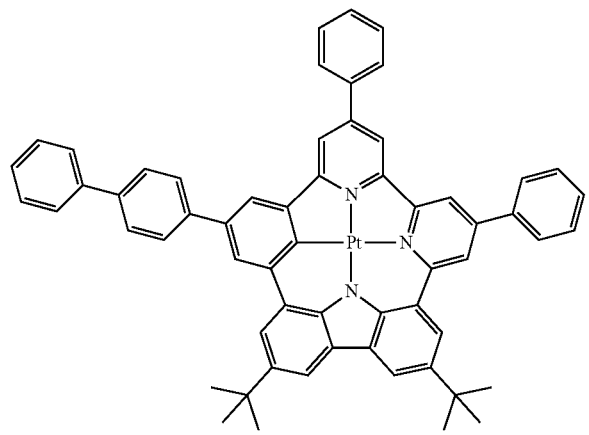
98
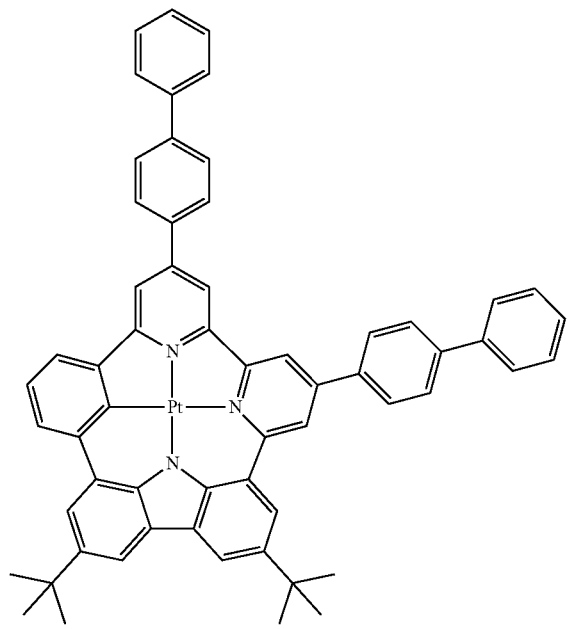

99
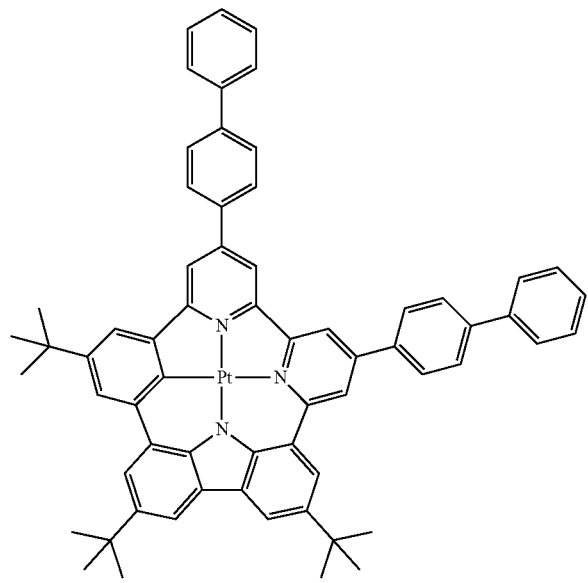
100
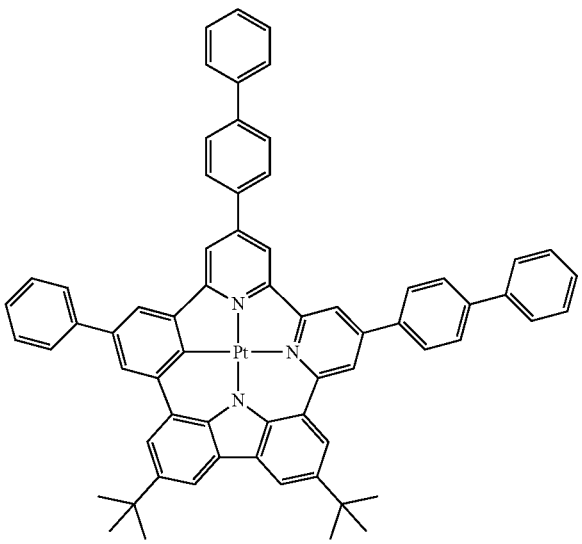
101
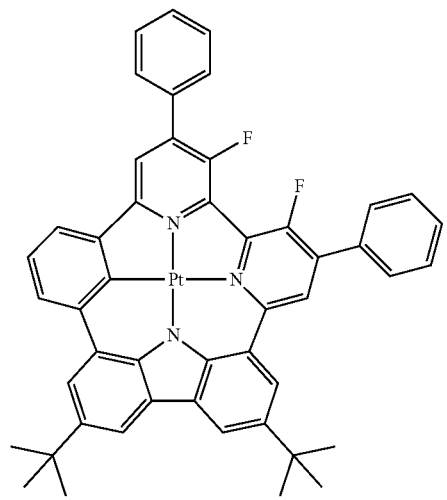
102
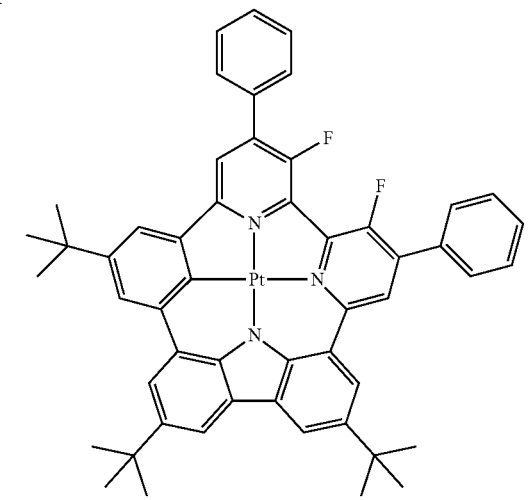
103
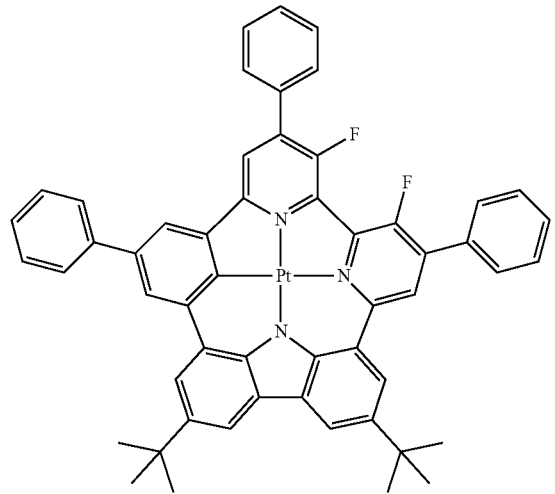
104
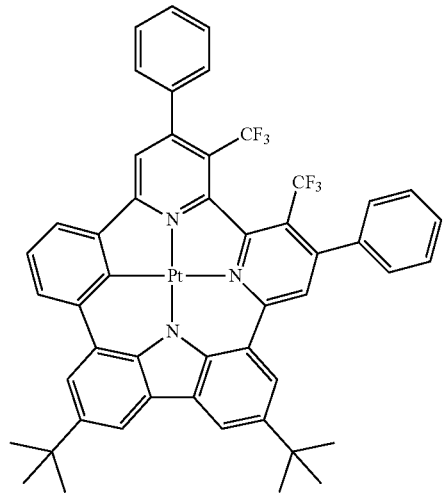

-continued
105
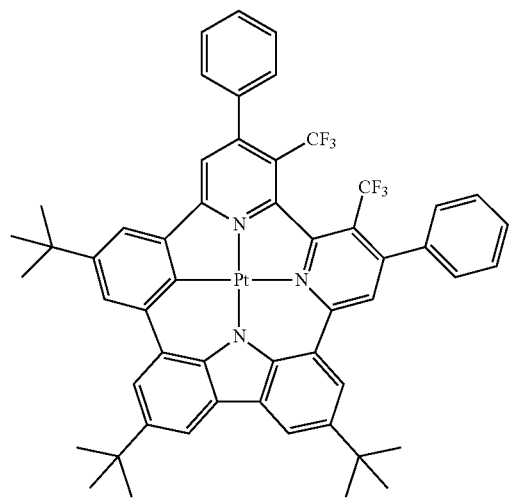
106
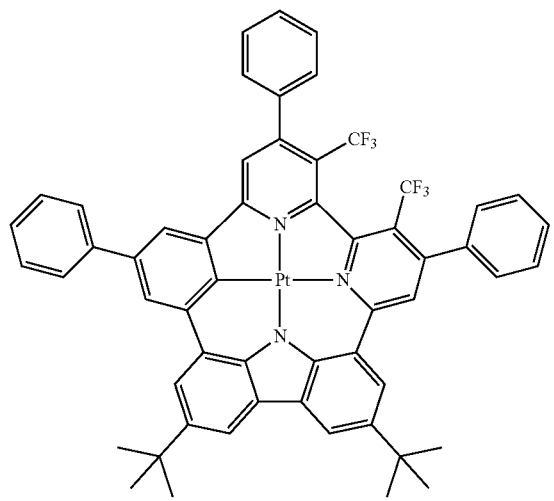
107
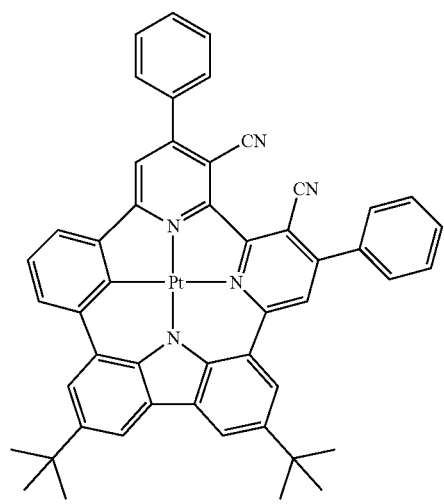
108
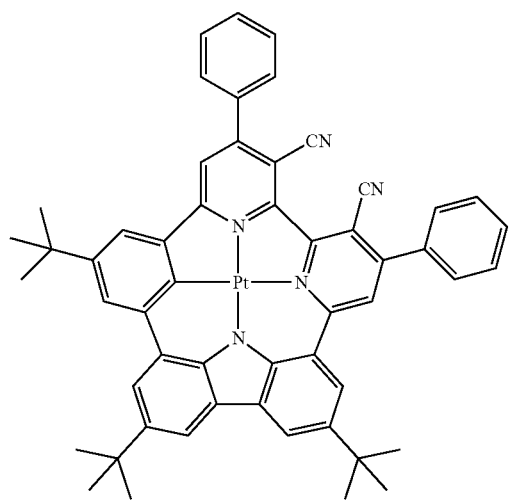
109
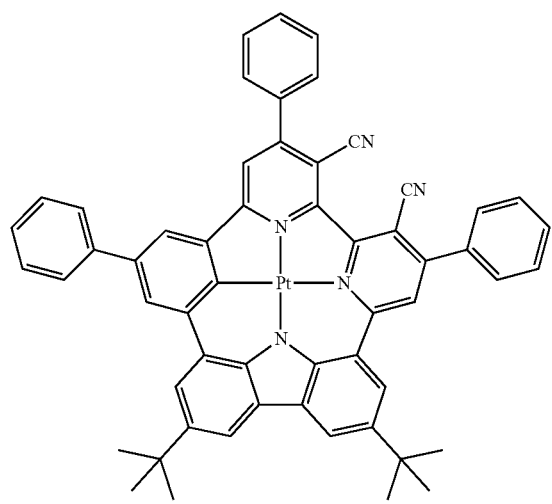
110
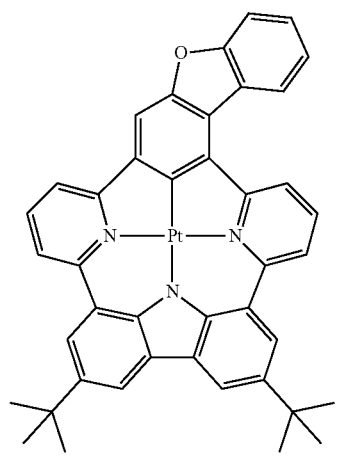

-continued
111 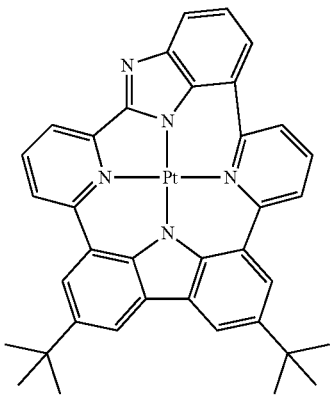
112
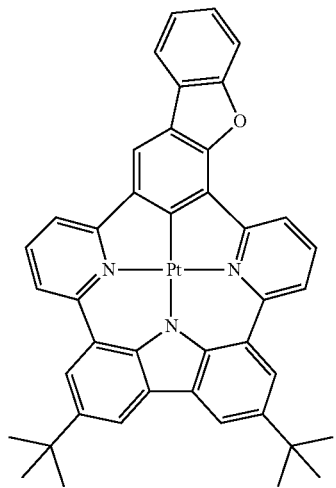
113 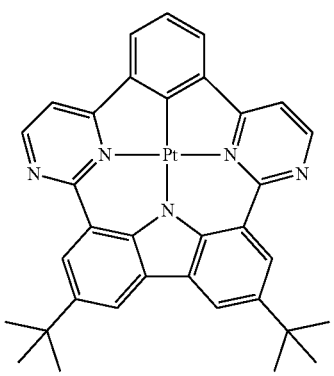
114
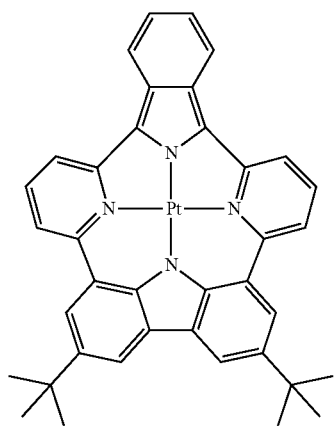
115 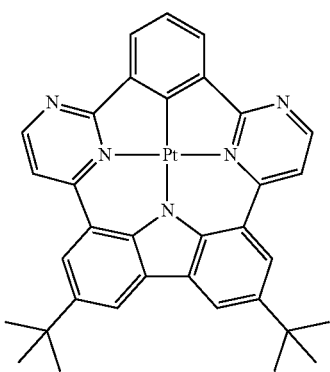
116
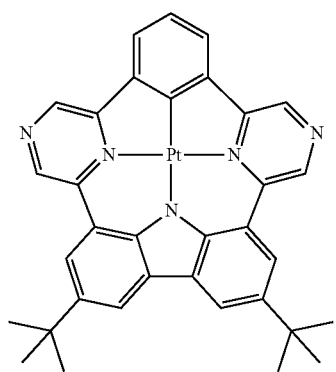

117 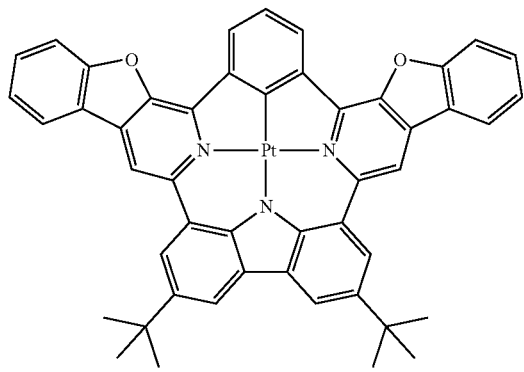

118 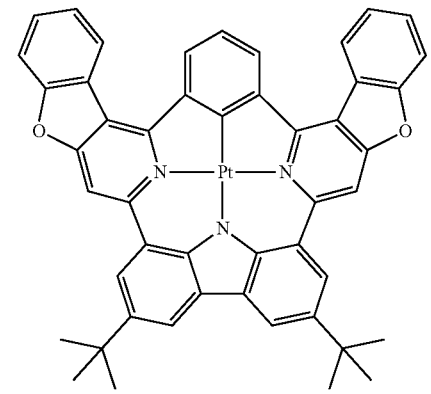

119 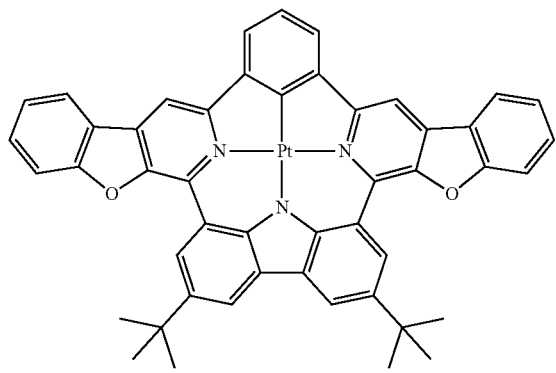

120 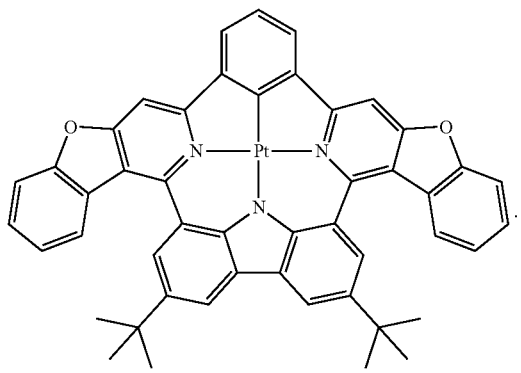

16. An organic light-emitting device comprising:
a first electrode;
a second electrode; and
an organic layer disposed between the first electrode and the second electrode,
wherein the organic layer comprises an emission layer, and
wherein the organic layer comprises at least one organometallic compound of claim 1.

17. The organic light-emitting device of claim 16, wherein
the first electrode is an anode,
the second electrode is a cathode,
the organic layer further comprises a hole transport region disposed between the first electrode and the emission layer and an electron transport region disposed between the emission layer and the second electrode,
wherein the hole transport region comprises a hole injection layer, a hole transport layer, an electron blocking layer, or any combination thereof, and
wherein the electron transport region comprises a hole blocking layer, an electron transport layer, an electron injection layer, or any combination thereof.

18. The organic light-emitting device of claim 16, wherein the emission layer comprises the organometallic compound.

19. The organic light-emitting device of claim 18, wherein the emission layer further comprises a host, and
an amount of the host is larger than an amount of the organometallic compound.

20. A diagnostic composition comprising at least one organometallic compound of claim 1.

* * * * *